United States Patent
Ikeda et al.

(10) Patent No.: US 11,256,169 B2
(45) Date of Patent: Feb. 22, 2022

(54) RESIST COMPOSITION, AND METHOD OF FORMING RESIST PATTERN

(71) Applicant: TOKYO OHKA KOGYO CO., LTD., Kawasaki (JP)

(72) Inventors: Takuya Ikeda, Kawasaki (JP); Nobuhiro Michibayashi, Kawasaki (JP); Mari Murata, Kawasaki (JP); Hiroto Yamazaki, Kawasaki (JP); Masatoshi Arai, Kawasaki (JP); Yoshitaka Komuro, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 260 days.

(21) Appl. No.: 16/421,125

(22) Filed: May 23, 2019

(65) Prior Publication Data
US 2019/0361346 A1     Nov. 28, 2019

(30) Foreign Application Priority Data

May 28, 2018 (JP) .............................. JP2018-101871
May 28, 2018 (JP) .............................. JP2018-101874
May 28, 2018 (JP) .............................. JP2018-101875
May 28, 2018 (JP) .............................. JP2018-101880

(51) Int. Cl.
*G03F 7/004* (2006.01)
*G03F 7/32* (2006.01)
*C08L 33/14* (2006.01)
*C08L 25/08* (2006.01)
*G03F 7/20* (2006.01)

(52) U.S. Cl.
CPC ............ *G03F 7/0045* (2013.01); *C08L 25/08* (2013.01); *C08L 33/14* (2013.01); *G03F 7/325* (2013.01); *G03F 7/2004* (2013.01); *G03F 7/2047* (2013.01)

(58) Field of Classification Search
CPC ...... G03F 7/004; G03F 7/0045; G03F 7/0392; G03F 7/0395; G03F 7/0397; C08L 25/08; C08L 33/14; C08F 220/26; C08F 220/28; C08F 220/281; C07C 381/12
See application file for complete search history.

(56) References Cited

U.S. PATENT DOCUMENTS

| | | |
|---|---|---|
| 7,301,047 B2 | 11/2007 | Yoshida et al. |
| 8,450,041 B2 | 5/2013 | Yamaguchi |
| 8,900,791 B2 | 12/2014 | Tsuchimura et al. |
| 9,023,584 B2 | 5/2015 | Maruyama |
| 9,052,592 B2 | 6/2015 | Nakamura et al. |
| 9,122,154 B2 | 9/2015 | Maruyama |
| 9,128,370 B2 | 9/2015 | Maruyama |
| 9,354,515 B2 | 5/2016 | Nagamine et al. |
| 9,766,541 B2 | 9/2017 | Yamazaki et al. |
| 10,221,131 B2 | 3/2019 | Kaur et al. |
| 10,649,330 B2 | 5/2020 | Arai et al. |
| 2009/0162788 A1 | 6/2009 | Hada et al. |
| 2010/0086873 A1 | 4/2010 | Seshimo et al. |
| 2010/0113818 A1 | 5/2010 | Oh et al. |
| 2011/0287362 A1 | 11/2011 | Seshimo et al. |
| 2017/0299963 A1 | 10/2017 | Fujiwara |

(Continued)

FOREIGN PATENT DOCUMENTS

| | | |
|---|---|---|
| JP | 08027102 A | 1/1996 |
| JP | 2006282652 A | 10/2006 |

(Continued)

OTHER PUBLICATIONS

Machine translation of JP 2008-290980 (no date).*

(Continued)

*Primary Examiner* — Amanda C. Walke
(74) *Attorney, Agent, or Firm* — Knobbe Martens Olson & Bear LLP

(57) ABSTRACT

A resist composition containing a resin component having a structural unit containing a group which is dissociated under the action of an acid and compound represented by the general formula (bd1). In the formula (bd1), $Rx^1$ to $Rx^4$ represent a hydrocarbon group or a hydrogen atom or may be mutually bonded to form a ring structure, $Ry^1$ to $Ry^2$ represent a hydrocarbon group or a hydrogen atom or may be mutually bonded to form a ring structure, and $Rz^1$ to $Rz^4$ represent a hydrocarbon group or a hydrogen atom or may be mutually bonded to form a ring structure. At least one of $Rx^1$ to $Rx^4$, $Ry^1$ to $Ry^2$ and $Rz^1$ to $Rz^4$ has an anion group, the entire anion moiety may be an n-valent anion, and $M^{m+}$ represents an m-valent organic cation

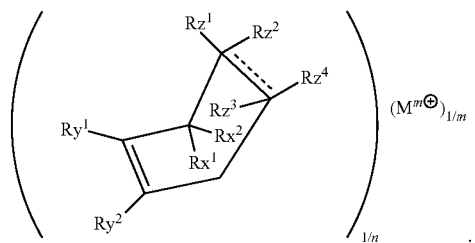

(bd1)

31 Claims, No Drawings

(56) References Cited

U.S. PATENT DOCUMENTS

| | | |
|---|---|---|
| 2018/0144973 A1 | 5/2018 | Ye et al. |
| 2019/0361343 A1 | 11/2019 | Onishi et al. |
| 2019/0361346 A1 | 11/2019 | Ikeda et al. |

FOREIGN PATENT DOCUMENTS

| | | |
|---|---|---|
| JP | 2008290980 A | 12/2008 |
| JP | 2009-014815 A | 1/2009 |
| JP | 2009-149588 A | 7/2009 |
| JP | 2010-113334 A | 5/2010 |
| JP | 2010-250063 A | 11/2010 |
| JP | 2012-003249 A | 1/2012 |
| JP | 5149236 B | 2/2013 |
| JP | 2013-092618 A | 5/2013 |
| JP | 2014-085515 A | 5/2014 |
| JP | 2015090457 A | 5/2015 |
| JP | 2015-194703 A | 11/2015 |
| JP | 2017102267 A | 6/2017 |
| JP | 2018-028574 A | 2/2018 |
| JP | 2018-092159 A | 6/2018 |
| JP | 2019-207297 A | 12/2019 |
| WO | WO 2017/179727 A1 | 10/2017 |

OTHER PUBLICATIONS

Machine translation of JP 2017-102267 (no date).*
Non-Final Office Action dated Apr. 6, 2021, issued in U.S. Appl. No. 16/420,961.
Office Action in Japanese Application No. 2018-101874 dated Nov. 9, 2021.
Office Action in Japanese Application No. 2018-101870 dated Nov. 16, 2021.
Office Action in Japanese Application No. 2018-101872 dated Nov. 16, 2021.
Office Action in Japanese Application No. 2018-101877 dated Nov. 16, 2021.

* cited by examiner

RESIST COMPOSITION, AND METHOD OF FORMING RESIST PATTERN

BACKGROUND OF THE INVENTION

Field of the Invention

The present invention relates to a resist composition and a method of forming a resist pattern.

Priority is claimed on Japanese Patent Application Nos. 2018-101875, 2018-101874, 2018-101880, and 2018-101871, all filed May 28, 2018, the contents of which are incorporated herein by reference.

Description of Related Art

In lithography techniques, for example, a resist film composed of a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions of the resist film become insoluble in a developing solution is called a negative-type.

In recent years, in the production of semiconductor elements and liquid crystal display elements, advances in lithography techniques have led to rapid progress in the field of pattern miniaturization. Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are used in mass production. Furthermore, research is also being conducted into lithography techniques that use an exposure light source having a wavelength shorter (energy higher) than these excimer lasers, such as electron beam (EB), extreme ultraviolet radiation (EUV), and X-rays.

For resist materials, lithography properties such as sensitivity for these types of exposure light sources and a resolution at which patterns with a fine size can be reproduced are required.

As a resist material that satisfies these conditions, a chemically amplified composition is used, which includes a base component that exhibits a changed solubility in a developing solution under the action of an acid and an acid-generator component that generates an acid upon exposure.

For example, in the case where the developing solution is an alkali developing solution (alkali developing process), a chemically amplified positive resist which contains, as a base component (base resin), a resin which exhibits increased solubility in an alkali developing solution under the action of an acid, and an acid generator is typically used. If a resist film formed using such a resist composition is selectively exposed at the time of forming a resist pattern, in exposed areas, an acid is generated from the acid-generator component, and the polarity of the base resin increases by the action of the generated acid, thereby making the exposed areas of the resist film soluble in the alkali developing solution. Thus, by conducting alkali developing, the unexposed portions of the resist film remain to form a positive resist pattern.

On the other hand, when such a base resin is applied to a solvent developing process using a developing solution containing an organic solvent (organic developing solution), the solubility of the exposed portions in an organic developing solution is decreased. As a result, the unexposed portions of the resist film are dissolved and removed by the organic developing solution, and a negative resist pattern in which the exposed portions of the resist film are remaining is formed. Such a solvent developing process for forming a negative-type resist composition is sometimes referred to as "negative-type developing process".

In general, the base resin used for a chemically amplified resist composition contains a plurality of structural units for improving lithography properties and the like.

For example, in the case of a resin composition which exhibits increased solubility in an alkali developing solution by the action of acid, a structural unit containing an acid decomposable group which is decomposed by the action of an acid generated from an acid-generator component and exhibits increased polarity may be used. Further, a structural unit containing a lactone-containing cyclic group or a structural unit containing a polar group such as a hydroxy group is used in combination therewith.

Further, in the formation of a resist pattern, the behavior of an acid generated from the acid-generator component upon exposure is one of the factors which has large influence on the lithography properties.

As the acid generator used in a chemically amplified resist composition, various kinds have been proposed. For example, onium salt acid generators such as iodonium salts and sulfonium salts, oxime sulfonate acid generators, diazomethane acid generators, nitrobenzylsulfonate acid generators, iminosulfonate acid generators, and disulfone acid generators are known.

As onium salt acid generators, those which have an onium ion such as triphenylsulfonium in the cation moiety are mainly used. Generally, as the anion moiety for onium salt acid generators, an alkylsulfonate ion or a fluorinated alkylsulfonate ion in which some or all of the hydrogen atoms within the aforementioned alkylsulfonate ion have been substituted with fluorine atoms is typically used.

Further, in order to improve lithography properties in the formation of a resist pattern, an onium salt acid generator having an anion with a specific structure containing an aromatic ring as the anion moiety has been proposed (for example, refer to Patent Document 1).

PATENT DOCUMENTS

[Patent Document 1] Japanese Patent No. 5149236

SUMMARY OF THE INVENTION

As lithography techniques progress further and miniaturization of resist patterns progress more and more, for example, a target of the lithography performed with an electron beam and EUV is to form fine resist patterns of several tens of nanometers. As the size of a resist pattern decreases accordingly, favorable lithography properties such as high sensitivity and low roughness with respect to an exposure light source are required for the resist composition.

However, in the resist composition containing a conventional onium salt acid generator as described above, there is a problem that it is difficult to obtain a desired resist pattern shape and the like when high sensitivity with respect to an exposure light source such as EUV is attempted, and it is difficult to satisfy all of such properties.

The present invention has been made in view of the above circumstances, and an object of the present invention is to provide a resist composition of which the sensitivity is enhanced, and a resist pattern having a favorable shape with reduced roughness can be formed and a method of forming a resist pattern using the resist composition A first aspect of the present invention is a resist composition that generates an acid upon exposure and exhibits a changed solubility in a developing solution under the action of an acid, including:

a resin component (A1) that exhibits a changed solubility in a developing solution under the action of an acid and a compound (BD1) which is represented by the following general formula (bd1) and has an anion moiety and a cation moiety, wherein the resin component (A1) contains the following resin component (a) or (b):

the resin component (a) having a structural unit (a0-1a) in which a polymerizable group at the $W^1$ site in a compound represented by the following general formula (a0-1a-1) is converted into a main chain; or the resin component (b) (provided that the resin component (a) is excluded) having a structural unit (a0-1b) in which a polymerizable group at the $W^1$ site in a compound represented by the following general formula (a0-1b-1) is converted into a main chain, and at least one structural unit selected from the group consisting of a structural unit (a0-2) in which a polymerizable group at the $W^2$ site in the compound represented by the following general formula (a0-2-1) is converted into a main chain, and a structural unit (a0-3) having a partial structure represented by the following general formula (a0-3):

[Chem. 1]

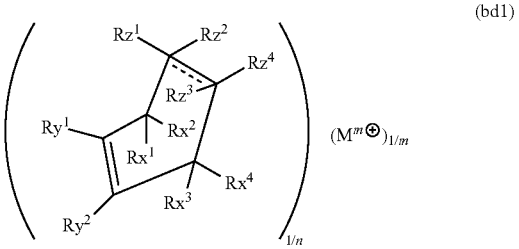

(bd1)

[In the formula, $Rx^1$ to $Rx^4$ each independently represent a hydrocarbon group which may have a substituent or a hydrogen atom or two or more of $Rx^1$ to $Rx^4$ may be mutually bonded to form a ring structure. $Ry^1$ to $Ry^2$ each independently represent a hydrocarbon group which may have a substituent or a hydrogen atom or may be mutually bonded to form a ring structure.

⋯⋯ [Chem. 2]

represents a double bond or a single bond. $Rz^1$ to $Rz^4$ each independently represent, where valence allows, a hydrocarbon group which may have a substituent or a hydrogen atom, or two or more of $Rz^1$ to $Rz^4$ may be mutually bonded to form a ring structure; provided that at least one of $Rx^1$ to $Rx^4$, $Ry^1$ to $Ry^2$ and $Rz^1$ to $Rz^4$ has an anion group, the entire anion moiety may be an n-valent anion. n is an integer of 1 or more. m is an integer of 1 or more, and $M^{m+}$ represents an m-valent organic cation.]

[Chem. 3]

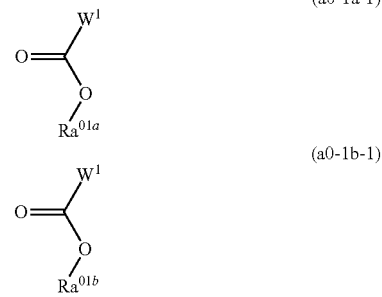

[In the formula, $W^1$ represents a polymerizable group-containing group. $Ra^{01a}$ represents an acid dissociable group in which a carbon atom is bonded to an oxy group (—O—) in the formula, and has a carbon atom constituting a carbon-carbon unsaturated bond to the carbon atom at the α-position. $Ra^{01b}$ represents an acid dissociable group represented by the following general formula (a01-r-1) or general formula (a01-r-2).]

[Chem. 4]

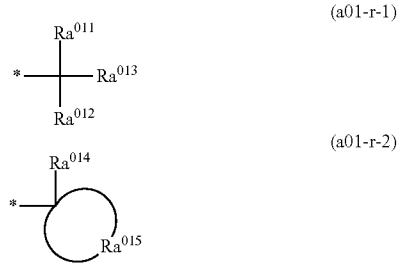

[In the formula, $Ra^{011}$ to $Ra^{013}$ each independently represent a linear or branched aliphatic hydrocarbon group, an alicyclic group having no crosslinked structure, or an aromatic hydrocarbon group. $Ra^{014}$ represents a linear or branched aliphatic hydrocarbon group having 1 to 12 carbon atoms in which some atoms may be substituted with a halogen atom or a hetero atom-containing group or an aryl group having 6 to 12 carbon atoms in which some atoms may be substituted with a halogen atom or a hetero atom-containing group. $Ra^{015}$ represents a group that forms a monocyclic aliphatic cyclic group together with a carbon atom to which $Ra^{014}$ is bonded. * indicates a bond.]

[Chem. 5]

$$\begin{array}{c} W^2 \\ | \\ Wa^{x0} \\ | \\ (OH)_{n_{ax0}} \end{array} \quad (a0\text{-}2\text{-}1)$$

[In the formula, $W^2$ represents a polymerizable group-containing group. $Wa^{x0}$ represents an $(n_{ax0}+1)$-valent aromatic cyclic group which may have a substituent. $Wa^{x0}$ may form a condensed ring with $W^2$. $n_{ax0}$ is an integer of 1 to 3.]

[Chem. 6]

(a0-3)

[In the formula, $R^1$ represents a fluorinated alkyl group having 1 to 12 carbon atoms. $R^2$ represents an organic group having 1 to 12 carbon atoms which may have a fluorine atom, or a hydrogen atom. * indicates a bond.]

A second aspect of the present invention is a method of forming a resist pattern including a process of forming a resist film using the resist composition according to the first aspect on a support a process of exposing the resist film, and a process of developing the resist film after exposure and forming a resist pattern.

According to the resist composition of the present invention, high sensitivity can be achieved and a resist pattern having a favorable shape with reduced roughness can be formed.

DETAILED DESCRIPTION OF THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbons, unless otherwise specified. The same applies for the alkyl group within an alkoxy group.

The term "alkylene group" includes linear, branched or cyclic, divalent saturated hydrocarbons, unless otherwise specified.

A "halogenated alkyl group" is a group in which some or all of the hydrogen atoms of an alkyl group are substituted with halogen atoms. Examples of the halogen atom include a fluorine atom, a chlorine atom, a bromine atom and an iodine atom.

A "fluorinated alkyl group" or a "fluorinated alkylene group" is a group in which some or all of the hydrogen atoms of an alkyl group or an alkylene group have been substituted with a fluorine atom.

The term "structural unit" refers to a monomer unit that contributes to the formation of a polymeric compound (resin, polymer, copolymer).

The case of a description including "may have a substituent" includes both of the case where a hydrogen atom (—H) is substituted with a monovalent group and the case where a methylene group (—CH$_2$—) is substituted with a divalent group.

The term "exposure" is used as a general concept that includes irradiation with any form of radiation.

The "base component" is an organic compound having a film-forming ability and an organic compound having a molecular weight of 500 or more is preferably used. When the molecular weight of the organic compound is 500 or more, the film-forming ability is improved and a nano-level resist pattern can be easily formed. Organic compounds used as the base component are broadly classified into non-polymers and polymers. Generally, regarding the non-polymer, those having a molecular weight of 500 or more and less than 4,000 may be used. Hereinafter, the "low-molecular-weight compound" refers to a non-polymer having a molecular weight of 500 or more and less than 4000. Generally, regarding the polymer, those having a molecular weight of 1,000 or more may be used. Hereinafter, the "resin," "high molecular weight compound" or "polymer" refers to a polymer having a molecular weight of 1,000 or more. Regarding the molecular weight of the polymer, the mass average molecular weight in terms of polystyrene standards obtained through gel permeation chromatography (GPC) is used.

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid (CH$_2$=CH—COOH) has been substituted with an organic group.

The acrylate ester may have a hydrogen atom bonded to the carbon atom at the α-position substituted with a substituent. The substituent ($R^{\alpha 0}$) that substitutes a hydrogen atom bonded to the carbon atom at the α-position is an atom other than hydrogen or a group, and examples thereof include an alkyl group of 1 to 5 carbon atoms and a halogenated alkyl group of 1 to 5 carbon atoms. Further, an acrylate ester having a hydrogen atom bonded to the carbon atom at the α-position substituted with a substituent ($R^{\alpha 0}$) in which the substituent has been substituted with a substituent containing an ester bond (e.g., an itaconic acid diester), or an acrylic acid having a hydrogen atom bonded to the carbon atom at the α-position substituted with a substituent ($R^{\alpha 0}$) in which the substituent has been substituted with a hydroxyalkyl group or a group in which the hydroxy group within a hydroxyalkyl group has been modified (e.g., α-hydroxyalkyl acrylate ester) can be mentioned as an acrylate ester having a hydrogen atom bonded to the carbon atom at the α-position substituted with a substituent. A carbon atom at the α-position of an acrylate ester refers to the carbon atom bonded to the carbonyl group, unless specified otherwise.

Hereafter, an acrylate ester having a hydrogen atom bonded to the carbon atom at the α-position substituted with a substituent is sometimes referred to as "α-substituted acrylate ester". Further, acrylate esters and α-substituted acrylate esters are collectively referred to as "(α-substituted) acrylate ester".

A "structural unit derived from acrylamide" refers to a structural unit that is formed by the cleavage of the ethylenic double bond of acrylamide.

The acrylamide may have a hydrogen atom bonded to the carbon atom at the α-position substituted with a substituent, and may have either or both terminal hydrogen atoms on the amino group of acrylamide substituted with a substituent. A carbon atom at the α-position of an acrylamide refers to the carbon atom bonded to the carbonyl group, unless specified otherwise.

As the substituent which substitutes a hydrogen atom at the α-position of acrylamide, the same substituents as those described above for the substituent ($R^{\alpha 0}$) at the α-position of the aforementioned α-position of the aforementioned α-substituted acrylate ester can be mentioned.

A "structural unit derived from hydroxystyrene" refers to a structural unit that is formed by the cleavage of the ethylenic double bond of hydroxystyrene. A "structural unit derived from a hydroxystyrene derivative" refers to a structural unit that is formed by the cleavage of the ethylenic double bond of a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and which may have a hydrogen atom at the α-position substituted with a substituent; and hydroxystyrene which has a substituent other than a hydroxy group bonded to the benzene ring and may have a hydrogen atom at the α-position substituted with a substituent. Here, the α-position (carbon atom at the α-position) refers to the carbon atom having the benzene ring bonded thereto, unless specified otherwise.

As the substituent which substitutes a hydrogen atom at the α-position of hydroxystyrene, the same substituents as those described above for the substituent at the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and which may have a hydrogen atom at the α-position substituted with a substituent; and benzoic acid which has a substituent other than a hydroxy group and a carboxy group bonded to the benzene ring and may have a hydrogen atom at the α-position substituted with a substituent. Here, the α-position (carbon atom at the α-position) refers to the carbon atom having the benzene ring bonded thereto, unless specified otherwise.

The term "styrene derivative" includes compounds in which the hydrogen atom at the α-position of styrene has been substituted with another substituent such as an alkyl group or a halogenated alkyl group; and derivatives thereof. Examples of the derivatives thereof include hydroxystyrene which has a substituent other than a hydroxy group bonded to the benzene ring and may have a hydrogen atom at the α-position substituted with a substituent. Here, the α-position (carbon atom at the α-position) refers to the carbon atom having the benzene ring bonded thereto, unless specified otherwise.

A "structural unit derived from styrene" or "structural unit derived from a styrene derivative" refers to a structural unit that is formed by the cleavage of the ethylenic double bond of styrene or a styrene derivative.

As the alkyl group as a substituent at the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent at the α-position include groups in which some or all of the hydrogen atoms of the aforementioned "alkyl group as the substituent at the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent at the α-position include groups in which some or all of the hydrogen atoms of the aforementioned "alkyl group as the substituent at the α-position" are substituted with a hydroxy group. The number of hydroxy groups within the hydroxyalkyl group is preferably 1 to 5, and most preferably 1.

In the present specification and claims, some structures represented by chemical formulae may have an asymmetric carbon, such that an enantiomer or a diastereomer may be present. In such a case, one formula represents all isomers. The isomers may be used individually, or in the form of a mixture.

(Resist Composition)

A resist composition according to a first aspect of the present invention generates an acid upon exposure and exhibits a changed solubility in a developing solution under the action of an acid, and includes a base component (A) that exhibits a changed solubility in a developing solution under the action of an acid (hereinafter referred to as a "component (A)") and a compound (BD1) represented by the general formula (bd1) (hereinafter referred to as a "component (BD1)").

Regarding one embodiment of such a resist composition, a resist composition containing the component (A) and an acid-generator component (B) that generates an acid due upon exposure (hereinafter referred to as a "component (B)") may be exemplified. Preferable examples thereof also include a resist composition that further contains a base component (hereinafter referred to as a "component (D)") that traps an acid generated from the component (B) upon exposure (that is, controls acid diffusion) in addition to the component (A) and the component (B).

In the resist composition of the present embodiment, the component (A) includes a resin component (A1) (hereinafter referred to as a "component (A1)") that exhibits a changed solubility in a developing solution under the action of an acid.

The component (BD1) can be used as the component (B) or the component (D) by selecting an anion group in the molecule.

When a resist film is formed using the resist composition of the present embodiment and the resist film is subjected to selective exposure, for example, an acid is generated from the component (B) at the exposed portion of the resist film, and a solubility of the component (A) with respect to a developing solution changes under the action of an acid. On the other hand, since the solubility of the component (A) with respect to a developing solution does not change at the unexposed portion of the resist film, there is a difference in the solubility with respect to the developing solution between the exposed portion and the unexposed portion. Therefore, when the resist film is developed, if the resist composition is of a positive type, the exposed portion of the resist film is dissolved and removed to form a positive type resist pattern, and if the resist composition is of a negative type, the unexposed portion of the resist film is dissolved and removed to form a negative type resist pattern.

In the present specification, a resist composition which forms a positive resist pattern by dissolving and removing the exposed portions of the resist film is called a positive resist composition, and a resist composition which forms a negative resist pattern by dissolving and removing the unexposed portions of the resist film is called a negative resist composition.

The resist composition of the present embodiment may be either a positive resist composition or a negative resist composition. Further, in the present embodiment, the resist composition may be applied to an alkali developing process using an alkali developing solution in the developing treatment, or a solvent developing process using a developing solution containing an organic solvent (organic developing solution) in the developing treatment, and preferably a solvent developing process.

The resist composition of the present embodiment has a function of generating an acid upon exposure, and the component (A) may generate an acid upon exposure, in addition to the component (B).

In the case where the component (A) generates an acid upon exposure, the component (A) is a "base component which generates an acid upon exposure and exhibits changed solubility in a developing solution under the action of an acid".

When the component (A) is a base component that generates an acid upon exposure and exhibits a changed solubility in a developing solution under the action of an acid, the above component (A1) is preferably a high-molecular-weight compound that generates an acid upon exposure and exhibits a changed solubility in a developing solution under the action of an acid. Examples of such a high-molecular-weight compound include a resin having a structural unit that generates an acid upon exposure. Regarding the monomer deriving the structural unit that generates an acid upon exposure, known monomers can be used.

<Component (A)>

In the resist composition of the present embodiment, the component (A) is a base component that exhibits a changed solubility in a developing solution under the action of an acid and includes the above component (A1). When the component (A1) is used, since a polarity of the base component before and after exposure changes, a favorable development contrast can be obtained not only in the alkali developing process but also in the solvent developing process.

When the alkali developing process is applied, a base component including the component (A1) is insoluble in the alkali developing solution before exposure, and for example, when an acid is generated from the component (B) upon exposure, a polarity increases under the action of an acid and the solubility in the alkali developing solution increases. Therefore, in formation of a resist pattern, when the resist composition is applied to a support and the obtained resist film is subjected to selective exposure, solubility of the exposed portion of the resist film in the alkali developing solution is changed from insoluble to soluble, and on the other hand, the unexposed portion of the resist film does not change and remains in an alkali insoluble state and thereby a positive type resist pattern is formed according to alkali developing.

On the other hand, when the solvent developing process is applied, a base component including the component (A1) has high solubility in the organic developing solution before exposure, and for example, when an acid is generated from the component (B) upon exposure, a polarity increases under the action of an acid, and the solubility in the organic developing solution decreases. Therefore, in formation of the resist pattern, when the resist composition is applied to a support, the obtained resist film is subjected to selective exposure, solubility of the exposed portion of the resist film in the organic developing solution is changed from soluble to insoluble. On the other hand, since the unexposed portion of the resist film does not change and remains in a soluble state, when developing performed in the organic developing solution, a contrast can be provided between the exposed portion and the unexposed portion, and a negative type resist pattern is formed.

In the resist composition of the present embodiment, one type of the component (A) may be used alone or two or more thereof may be used in combination.

Component (A1)

The component (A1) is a resin component that exhibits a changed solubility in a developing solution under the action of an acid and is a resin component having a structural unit (a1) containing a group which is dissociated under the action of an acid.

The component (A1) may have other structural units as necessary in addition to the structural unit (a1).

<<Structural Unit (a1)>>

The structural unit (a1) is a structural unit having a group which is dissociated under the action of an acid.

The group which is dissociated under the action of an acid (hereinafter referred to as an "acid dissociable group") has (i) an acid dissociabilty in which a bond between the acid dissociable group and an atom adjacent to the acid dissociable group can be cleaved under the action of an acid or has (ii) a property in which a part of bond is cleaved under the action of an acid, and additionally, a decarboxylation reaction is then caused, and thus a bond between the acid dissociable group and an atom adjacent to the acid dissociable group can be cleaved.

For example, regarding the structural unit (a1), a polar group having a higher polarity than the acid dissociable group when the acid dissociable group is dissociated from the part of the structural unit (a1) under the action of an acid may be exemplified. A polar group having a higher polarity than the acid dissociable group is generated, and as a result, the polarity of the entire component (A1) increases. When the polarity of the entire component (A1) increases, the solubility in the developing solution relatively changes, and when the developing solution is an alkali developing solution, the solubility increases, and when the developing solution is an organic developing solution, the solubility decreases.

Examples of the polar group having a higher polarity than the acid dissociable group include a carboxy group, a hydroxy group, an amino group, and a sulfo group ($-SO_3H$). Among these, a polar group containing $-OH$ in the structure (hereinafter referred to as an "OH-containing polar group") is preferable, a carboxy group or a hydroxy group is more preferable, and a carboxy group is particularly preferable.

Examples of the acid dissociable group include groups which have been proposed as acid dissociable groups for the base resin of a conventional chemically amplified resist composition.

Specific examples of acid dissociable groups for the base resin of a conventional chemically amplified resist composition include the "acetal-type acid dissociable group," "tertiary alkyl ester-type acid dissociable group" and "tertiary alkyloxycarbonyl acid dissociable group" described below.

Acetal Type Acid Dissociable Group:

Examples of the acid dissociable group for protecting a carboxy group or hydroxyl group as the polar group include an acid dissociable group represented by the following general formula (a1-r-1) (hereinafter referred to as an "acetal-type acid dissociable group").

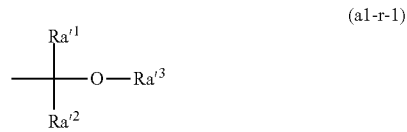

(a1-r-1)

[In the formula, $Ra'^1$ and $Ra'^2$ represent a hydrogen atom or an alkyl group. $Ra'^3$ represents a hydrocarbon group, and $Ra'^3$ may be bonded to any of $Ra'^1$ and $Ra'^2$ to form a ring.]

In the formula (a1-r-1), it is preferable that at least one of $Ra'^1$ and $Ra'^2$ represent a hydrogen atom, and it is more preferable that both of $Ra'^1$ and $Ra'^2$ represent a hydrogen atom.

In the case where $Ra'^1$ or $Ra'^2$ is an alkyl group, as the alkyl group, the same alkyl groups as those described above for the substituent which may be bonded to a carbon atom at the α-position of the aforementioned α-substituted acrylate ester can be mentioned, and an alkyl group of 1 to 5 carbon atoms is preferable. Specific examples include linear or branched alkyl groups. Specific examples of the alkyl group include a methyl group, an ethyl group, a propyl group, an isopropyl group, an n-butyl group, an isobutyl group, a tert-butyl group, a pentyl group, an isopentyl group and a neopentyl group. Of these, a methyl group or an ethyl group is preferable, and a methyl group is particularly preferable.

In formula (a1-r-1), examples of the hydrocarbon group for $Ra'^3$ include a linear or branched alkyl group and a cyclic hydrocarbon group.

The linear alkyl group preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5 carbon atoms. Specific examples include an isopropyl group, an isobutyl group, a tert-butyl group, an isopentyl group, a neopentyl group a 1,1-diethylpropyl group and a 2,2-dimethylbutyl group. Among these, an isopropyl group is preferable.

In the case where $Ra'^3$ represents a cyclic hydrocarbon group, the cyclic hydrocarbon group may be an aliphatic hydrocarbon group or an aromatic hydrocarbon group, and may be polycyclic or monocyclic.

As the monocyclic aliphatic hydrocarbon group, a group in which one hydrogen atom has been removed from a monocycloalkane is preferable. The monocycloalkane preferably has 3 to 6 carbon atoms, and specific examples thereof include cyclopentane and cyclohexane.

As the polycyclic aliphatic hydrocarbon group, a group in which one hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

When the monovalent hydrocarbon group for $Ra'^3$ is an aromatic hydrocarbon group, the aromatic hydrocarbon group is a hydrocarbon group having at least one aromatic ring.

The aromatic ring is not particularly limited, as long as it is a cyclic conjugated compound having (4n+2) π-electrons, and may be either monocyclic or polycyclic. The aromatic ring preferably has 5 to 30 carbon atoms, more preferably 5 to 20 carbon atoms, and still more preferably 6 to 15 carbon atoms, and most preferably 6 to 12 carbon atoms.

Examples of the aromatic ring include aromatic hydrocarbon rings, such as benzene, naphthalene, anthracene and phenanthrene; and aromatic hetero rings in which some of the carbon atoms constituting the aforementioned aromatic hydrocarbon rings have been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group for $Ra'^3$ include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group). The alkylene group bonded to the aforementioned aromatic hydrocarbon ring or the aromatic hetero ring preferably has 1 to 4 carbon atoms, more preferably 1 or 2 carbon atoms, and most preferably 1 carbon atom.

The cyclic hydrocarbon group for $Ra'^3$ may have a substituent. Examples of the substituent include $—R^{P1}$, $—R^{P2}—O—R^{P1}$, $—R^{P2}—CO—R^{P1}$, $—R^{P2}—CO—OR^{P1}$, $—R^{P2}—O—CO—R^{P1}$, $—R^{P2}—OH$, $—R^{P2}—CN$ or $—R^{P2}—COOH$ (hereafter, these substituents are sometimes collectively referred to as "$Ra^{05}$").

Here, $R^{P1}$ is a monovalent chain saturated hydrocarbon group having 1 to 10 carbon atoms, a monovalent aliphatic cyclic saturated hydrocarbon group having 3 to 20 carbon atoms, or a monovalent aromatic hydrocarbon group having 6 to 30 carbon atoms. Further, $R^{P2}$ is a single bond, a divalent chain saturated hydrocarbon group having 1 to 10 carbon atoms, a divalent aliphatic cyclic saturated hydrocarbon group having 3 to 20 carbon atoms, or a divalent aromatic hydrocarbon group having 6 to 30 carbon atoms.

Examples of the monovalent chain saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, and a cyclododecyl group; and a polycyclic aliphatic saturated hydrocarbon group such as a bicyclo[2.2.2]octanyl group, a tricyclo[5.2.1.02,6]decanyl group, a tricyclo[3.3.1.13,7]decanyl group, a tetracyclo[6.2.1.13,6.02,7]dodecanyl group, and an adamantyl group.

Examples of the monovalent aromatic hydrocarbon group having 6 to 30 carbon atoms include a group obtained by removing one hydrogen atom from the aromatic hydrocarbon ring such as benzene, biphenyl, fluorene, naphthalene, anthracene, and phenanthrene.

When $Ra'^3$ is bonded to any of $Ra'^1$ and $Ra'^2$ to form a ring, the cyclic group is preferably a 4- to 7-membered ring, and more preferably a 4- to 6-membered ring. Specific examples of the cyclic group include a tetrahydropyranyl group and a tetrahydrofuranyl group.

Tertiary Alkyl Ester Type Acid Dissociable Group:

Examples of the acid dissociable group for protecting the carboxy group among the above polar groups include an acid dissociable group represented by the following general formula (a1-r-2).

Here, among acid dissociable groups represented by the following formula (a1-r-2), for convenience, a group constituted of alkyl groups will be referred to as a "tertiary alkyl ester type acid dissociable group" below.

[Chem. 8]

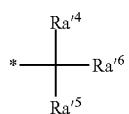

(a1-r-2)

[In the formula, $Ra'^4$ to $Ra'^6$ each represent a hydrocarbon group, and $Ra'^5$ and $Ra'^6$ may be bonded to form a ring.]

Examples of the hydrocarbon group for $Ra'^4$ include a linear or branched alkyl group, a linear or cyclic alkenyl group, and a cyclic hydrocarbon group.

The linear or branched alkyl group and the cyclic hydrocarbon group (for example, a monocyclic aliphatic hydrocarbon group, polycyclic aliphatic hydrocarbon group, or aromatic hydrocarbon group) for $Ra'^4$ are the same as defined for $Ra'^3$.

The linear or cyclic alkenyl group for $Ra'^4$ is preferably an alkenyl group having 2 to 10 carbon atoms.

The hydrocarbon group for $Ra'^5$ and $Ra'^6$ is the same as defined for $Ra'^3$.

Specifically, preferable examples of the acid dissociable group for protecting a carboxy group include a group represented by the following general formula (a1-r2-1), a group represented by the following general formula (a1-r2-2), a group represented by the following general formula (a1-r2-3), and a group represented by the following general formula (a1-r2-4).

[Chem. 9]

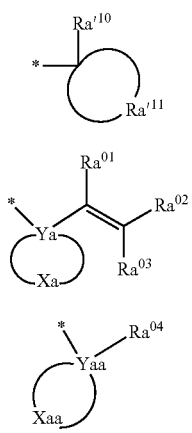

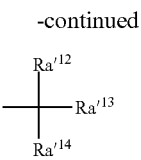

(a1-r2-4)

[In the formula (a1-r2-1), $Ra'^{10}$ represents a linear or branched alkyl group having 1 to 12 carbon atoms in which some atoms may be substituted with a halogen atom or a hetero atom-containing group. $Ra'^{11}$ represents a group that forms an aliphatic cyclic group together with a carbon atom to which $Ra'^{10}$ is bonded.

In the formula (a1-r2-2), Ya represents a carbon atom. Xa represents a group that forms a cyclic hydrocarbon group together with Ya. Some or all of the hydrogen atoms of the cyclic hydrocarbon group may be substituted. $Ra^{01}$ to $Ra^{03}$ each independently represent a hydrogen atom, a monovalent linear saturated hydrocarbon group having 1 to 10 carbon atoms or a monovalent aliphatic cyclic saturated hydrocarbon group having 3 to 20 carbon atoms. Some or all of the hydrogen atoms of the linear saturated hydrocarbon group and the aliphatic cyclic saturated hydrocarbon group may be substituted. Two or more of $Ra^{01}$ to $Ra^{03}$ may be mutually bonded to form a cyclic structure.

In the formula (a1-r2-3), Yaa represents a carbon atom. Xaa represents a group that forms an aliphatic cyclic group together with Yaa. $Ra^{04}$ represents an aromatic hydrocarbon group which may have a substituent.

In the formula (a1-r2-4), $Ra'^{12}$ and $Ra'^{13}$ each independently represent a monovalent linear saturated hydrocarbon group having 1 to 10 carbon atoms or a hydrogen atom. Some or all of the hydrogen atoms of the linear saturated hydrocarbon group may be substituted. $Ra'^{14}$ represents a hydrocarbon group which may have a substituent or is bonded to $Ra'^{13}$ to form a condensed ring which may have a hetero atom. Here, * indicates a bond (the same as below).]

In the formula (a1-r2-1), $Ra'^{10}$ represents a linear or branched alkyl group having 1 to 12 carbon atoms in which some atoms may be substituted with a halogen atom or a hetero atom-containing group.

The linear alkyl group for $Ra'^{10}$ has 1 to 12 carbon atoms, preferably has 1 to 10 carbon atoms, and particularly preferably has 1 to 5 carbon atoms. Specific examples thereof include a methyl group, an ethyl group, an n-propyl group, an n-butyl group, and an n-pentyl group. Among these, a methyl group, an ethyl group or an n-butyl group is preferable, and a methyl group or an ethyl group is more preferable.

The branched alkyl group for $Ra'^{10}$ preferably has 3 to 10 carbon atoms and particularly preferably has 3 to 6 carbon atoms. Specific examples thereof include an isopropyl group, an isobutyl group, a tert-butyl group, an isopentyl group, a neopentyl group, a 1,1-diethylpropyl group, a 1,1-dimethylbutyl group, a 1,1-dimethylpentyl group, and a 2,2-dimethylbutyl group. Among these, an isopropyl group or a tert-butyl group is preferable.

In the alkyl group for $Ra'^{10}$, some atoms may be substituted with a halogen atom or a hetero atom-containing group. For example, some of the hydrogen atoms constituting the alkyl group may be substituted with a halogen atom or a hetero atom-containing group. In addition, some of the carbon atoms constituting the alkyl group (such as a methylene group) may be substituted with a hetero atom-containing group.

Examples of the halogen atom here include a fluorine atom, a chlorine atom, a bromine atom, and an iodine atom. Examples of the hetero atom include an oxygen atom, a sulfur atom, and a nitrogen atom. Examples of the hetero atom-containing group include an oxygen atom (—O—), —C(=O)—O—, —O—C(=O)—, —C(=O)—, —O—C(=O)—O—, —C(=O)—NH—, —NH—, —S—, —S(=O)$_2$—, and —S(=O)$_2$—O—.

In the formula (a1-r2-1), $R^{t11}$ (aliphatic cyclic group formed together with a carbon atom to which $Ra^{t10}$ is bonded) is preferably a group (a group in which one hydrogen atom has been removed from a monocycloalkane and a group in which one hydrogen atom has been removed from a polycycloalkane) exemplified as an a monocyclic or polycyclic aliphatic hydrocarbon group for $Ra^{t3}$ in the formula (a1-r-1). In addition, the aliphatic cyclic group here may be an unsaturated aliphatic cyclic group and examples thereof include a group in which one hydrogen atom has been removed from a monocycloalkene, and a group in which one hydrogen atom has been removed from a polycycloalkene.

The aliphatic cyclic group for $Ra^{t11}$ may have a substituent, and examples thereof include a substituent ($Ra^{05}$) that the cyclic hydrocarbon group for $Ra^{t3}$ may have, and a bivalent group (such as, a methylidene group (=CH$_2$), an ethylidene group, and so on) that substitutes two hydrogen atoms in a methylene group (—CH$_2$—). It is preferable that the bivalent group be bonded to a tertiary carbon atom at the α-position in the formula (a1-r2-1).

In the formula (a1-r2-2), regarding the cyclic hydrocarbon group that Xa forms together with Ya, groups exemplified as a monocyclic or polycyclic aliphatic hydrocarbon group for $Ra^{t3}$ in the formula (a1-r-1) may be exemplified.

The cyclic hydrocarbon group that Xa forms together with Ya may have a substituent. Examples of the substituent include the same substituents that the cyclic hydrocarbon group for $Ra^{t3}$ may have.

In the formula (a1-r2-2), examples of the monovalent saturated chain hydrocarbon group of 1 to 10 carbon atoms for $Ra^{01}$ to $Ra^{03}$ include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms for $Ra^{01}$ to $Ra^{03}$ include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, and a cyclododecyl group; and a polycyclic aliphatic saturated hydrocarbon group such as a bicyclo[2.2.2]octanyl group, a tricyclo[5.2.1.02,6]decanyl group, a tricyclo[3.3.1.13,7]decanyl group, a tetracyclo[6.2.1.13,6.02,7]dodecanyl group, and an adamantyl group.

Among these, in consideration of the ease of synthesis of a monomer compound deriving the structural unit (a0-1), $Ra^{01}$ to $Ra^{03}$ are preferably a hydrogen atom or a monovalent linear saturated hydrocarbon group having 1 to 10 carbon atoms. Among these, a hydrogen atom, a methyl group, or an ethyl group is more preferable, and a hydrogen atom is particularly preferable.

Examples of the substituent of the linear saturated hydrocarbon group or aliphatic cyclic saturated hydrocarbon group represented by $Ra^{01}$ to $Ra^{03}$ include the same groups as for $Ra^{05}$.

Examples of the group having a carbon-carbon double bond generated when two or more of $Ra^{01}$ to $Ra^{03}$ are mutually bonded to form a cyclic structure include a cyclopentenyl group, a cyclohexenyl group, a methylcyclopentenyl group, a methylcyclohexenyl group, a cyclopentylidene ethenyl group, and a cyclohexylidene ethenyl group. Among these, in consideration of the ease of synthesis of a monomer compound deriving the structural unit (a0-1), a cyclopentenyl group, a cyclohexenyl group, or a cyclopentylidene ethenyl group is preferable.

In the formula (a1-r2-3), regarding an aliphatic cyclic group that Xaa forms together with Yaa, groups exemplified as a monocyclic or polycyclic aliphatic hydrocarbon group for $Ra^{t3}$ in the formula (a1-r-1) are preferable.

In the formula (a1-r2-3), examples of the aromatic hydrocarbon group for $Ra^{04}$ include a group in which one or more hydrogen atoms have been removed from an aromatic hydrocarbon ring having 5 to 30 carbon atoms. Among these, $Ra^{04}$ is preferably a group in which one or more hydrogen atoms have been removed from an aromatic hydrocarbon ring having 6 to 15 carbon atoms, more preferably a group in which one or more hydrogen atoms have been removed from benzene, naphthalene, anthracene or phenanthrene, still more preferably a group in which one or more hydrogen atoms have been removed from benzene, naphthalene or anthracene, particularly preferably a group in which one or more hydrogen atoms have been removed from benzene or naphthalene, and most preferably a group in which one or more hydrogen atoms have been removed from benzene.

Examples of the substituent that $Ra^{04}$ in the formula (a1-r2-3) may have include a methyl group, an ethyl group, a propyl group, a hydroxyl group, a carboxyl group, a halogen atom (such as, for example, a fluorine atom, a chlorine atom, a bromine atom, and so on), an alkoxy group (such as, for example, a methoxy group, an ethoxy group, a propoxy group, a butoxy group, and so on), and an alkyloxycarbonyl group.

In the formula (a1-r2-4), $Ra^{t12}$ and $Ra^{t13}$ each independently represent a monovalent linear saturated hydrocarbon group having 1 to 10 carbon atoms or a hydrogen atom. Examples of a monovalent linear saturated hydrocarbon group having 1 to 10 carbon atoms for $Ra^{t12}$ and $Ra^{t13}$ include the same monovalent linear saturated hydrocarbon group having 1 to 10 carbon atoms for $Ra^{01}$ to $Ra^{03}$. Some or all of the hydrogen atoms that the linear saturated hydrocarbon group has may be substituted.

Among these, $Ra^{t12}$ and $Ra^{t13}$ are preferably a hydrogen atom or an alkyl group having 1 to 5 carbon atoms, more preferably an alkyl group having 1 to 5 carbon atoms, still more preferably a methyl group or an ethyl group, and particularly preferably a methyl group.

When the linear saturated hydrocarbon group represented by $Ra^{t12}$ and $Ra^{t13}$ is substituted, examples of the substituent include the same groups for $Ra^{05}$.

In the formula (a1-r2-4), $Ra^{t14}$ represents a hydrocarbon group which may have a substituent. Examples of the hydrocarbon group for $Ra^{t14}$ include a linear or branched alkyl group and a cyclic hydrocarbon group.

The linear alkyl group for $Ra^{t14}$ preferably has 1 to 5 carbon atoms, more preferably 1 to 4 carbon atoms, and most preferably 1 or 2 carbon atoms. Specific examples thereof include a methyl group, an ethyl group, an n-propyl group, an n-butyl group, and an n-pentyl group. Among these, a methyl group, an ethyl group or an n-butyl group is preferable, and a methyl group or an ethyl group is more preferable.

The branched alkyl group for $Ra^{t14}$ preferably has 3 to 10 carbon atoms, and more preferably 3 to 5 carbon atoms. Specific examples thereof include an isopropyl group, an isobutyl group, a tert-butyl group, an isopentyl group, a neopentyl group, a 1,1-diethylpropyl group, and a 2,2-dimethylbutyl group, and an isopropyl group is preferable.

When $Ra'^{14}$ is a cyclic hydrocarbon group, the hydrocarbon group may be an aliphatic hydrocarbon group or an aromatic hydrocarbon group and may be a polycyclic group or a monocyclic group.

Regarding the monocyclic aliphatic hydrocarbon group, a group in which one hydrogen atom has been removed from a monocycloalkane is preferable. The monocycloalkane preferably has 3 to 6 carbon atoms, and specific examples thereof include cyclopentane and cyclohexane.

Regarding the polycyclic aliphatic hydrocarbon group, a group in which one hydrogen atom has been removed from a polycycloalkane is preferable, and the polycycloalkane group preferably has 7 to 12 carbon atoms. Examples of the polycycloalkane include adamantane, norbornane, isobornane, tricyclodecane and tetracyclododecane.

As an aromatic hydrocarbon group for $Ra'^{14}$, the same aromatic hydrocarbon groups as those for $Ra^{04}$ may be exemplified. Among these, $Ra'^{14}$ is preferably a group in which one or more hydrogen atoms are removed from an aromatic hydrocarbon ring having 6 to 15 carbon atoms, more preferably a group in which one or more hydrogen atoms are removed from benzene, naphthalene, anthracene or phenanthrene, still more preferably a group in which one or more hydrogen atoms are removed from benzene, naphthalene or anthracene, particularly preferably a group in which one or more hydrogen atoms are removed from naphthalene or anthracene, and most preferably a group in which one or more hydrogen atoms are removed from naphthalene.

Examples of the substituent that $Ra'^{14}$ may have include the same groups as for the substituent that $Ra^{04}$ may have.

In the case where $Ra'^{14}$ in general formula (a1-r2-4) is a naphthyl group, a position which is bonded to a tertiary carbon atom in general formula (a1-r2-4) may be 1-position and 2-position of the naphthyl group.

In the case where $Ra'^{14}$ in general formula (a1-r2-4) is an anthryl group, a position which is bonded to a tertiary carbon atom in general formula (a1-r2-4) may be any one of the 1-position, 2-position, and 9-position of the anthryl group.

Alternatively, $Ra'^{14}$ in the formula (a1-r2-4) may be bonded to $Ra'^{13}$ to form a condensed ring which may have a hetero atom.

Examples of a ring structure of a condensed ring formed when $Ra'^{14}$ and $Ra'^{13}$ are bonded include a condensed ring of an alicyclic hydrocarbon and an aromatic hydrocarbon. Such a condensed ring may have a hetero atom. Examples of the hetero atom include an oxygen atom, a sulfur atom, and a nitrogen atom.

In the condensed ring formed when $Ra'^{14}$ and $Ra'^{13}$ are bonded, the ring structure of the alicyclic hydrocarbon part may be monocyclic or polycyclic, and may have a hetero atom. In the condensed ring formed when $Ra'^{14}$ and $Ra'^{13}$ are bonded, the ring structure of the aromatic hydrocarbon part may be monocyclic or polycyclic, and may have a hetero atom.

Tertiary Alkyloxycarbonyl Acid Dissociable Group:

Examples of the acid dissociable group for protecting a hydroxyl group as the polar group include an acid dissociable group represented by the following general formula (a1-r-3) (hereinafter referred to as a "tertiary alkyloxycarbonyl acid dissociable group" for convenience).

[Chem. 10]

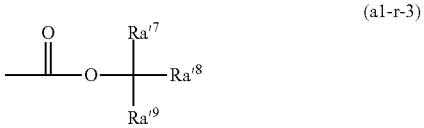

(a1-r-3)

[In the formula, $Ra'^7$ to $Ra'^9$ each represent an alkyl group.]

In the formula (a1-r-3), $Ra'^7$ to $Ra'^9$ are preferably an alkyl group having 1 to 5 carbon atoms and more preferably an alkyl group having 1 to 3 carbon atoms.

In addition, the total number of carbon atoms in each alkyl group is preferably 3 to 7, more preferably 3 to 5, and most preferably 3 to 4.

Examples of the structural unit (a1) include a structural unit derived from an acrylic ester in which a hydrogen atom bonded to a carbon atom at the α-position may be substituted with a substituent, a structural unit derived from an acrylamide, a structural unit in which at least some of hydrogen atoms in hydroxyl groups of a structural unit derived from hydroxystyrene or a hydroxystyrene derivative are protected by a substituent having an acid decomposable group, and a structural unit in which at least some of hydrogen atoms in —C(=O)—OH's of a structural unit derived from vinyl benzoic acid or a vinyl benzoic acid derivative are protected by a substituent having an acid decomposable group.

In the resist composition of the present embodiment, at least a part of the structural unit (a1) is preferably a structural unit (a0-1a) or a structural unit (a0-1b) represented by the following general formula (a0-1-1). In the structural unit (a0-1a), $Ra^{001}$ in the following general formula (a0-1-1) is an acid dissociable group in which a carbon atom is bonded to an oxy group (—O—) in the formula, and is an acid dissociable group in which a carbon atom constituting a carbon-carbon unsaturated bond is provided to the carbon atom at the α-position. In the structural unit (a0-1b), $Ra^{001}$ in the following general formula (a0-1-1) is an acid dissociable group having a monocyclic group or a chain-like protection group to be described below.

[Chem. 11]

(a0-1-1)

[In the formula, $W^1$ represents a polymerizable group-containing group. $Ra^{001}$ represents an acid dissociable group.]

The component (A1) included in the resist composition of the present embodiment may be a resin component having a structural unit (a0-1a) (hereinafter referred to as a "component (A1a)."

In addition, the component (A1) may be a resin component having the structural unit (a0-1b) and a structural unit (a0-2) to be described below (hereinafter referred to as a "component (A1b)").

In addition, the component (A1) may be a resin component having the structural unit (a1) and a structural unit (a0-3) to be described below (hereinafter referred to as a "component (A1c)"). The structural unit (a1) of the component (A1c) is preferably the structural unit (a0-1a) or the structural unit (a0-1b).

[Component (A1a)]

The component "A1a" is a resin component having the structural unit (a0-1a) as the structural unit (a1). The structural unit (a0-1a) is a structural unit in which a polymerizable group in the compound represented by the following general formula (a0-1a-1) is converted into a main chain.

[Chem. 12]

(a0-1a-1)

[In the formula, $W^1$ represents a polymerizable group-containing group. $Ra^{01a}$ represents an acid dissociable group in which a carbon atom is bonded to an oxy group (—O—) in the formula, and has a carbon atom constituting a carbon-carbon unsaturated bond to the carbon atom at the α-position.]

The component (A1a) may have other structural units as necessary in addition to the structural unit (a0-1a).

<<Structural Unit (a0-1a)>>

The structural unit (a0-1a) is specifically a structural unit in which a polymerizable group in the compound represented by the general formula (a0-1a-1) is converted into a main chain.

In the formula (a0-1a-1), $W^1$ represents a polymerizable group-containing group.

The "polymerizable group" at the $W^1$ site is a group that enables a compound having a polymerizable group to be polymerized according to radical polymerization, or the like, and refers to, for example, a group having multiple bonds between carbon atoms such as an ethylenic double bond.

The phrase "the polymerizable group is converted into a main chain" means that multiple bonds in the polymerizable group are cleaved to form a main chain. For example, in the case of a monomer having an ethylenic double bond, the phrase means that the ethylenic double bond is cleaved and a single bond between carbon atoms forms a main chain.

Examples of the polymerizable group at the $W^1$ site include a vinyl group, an allyl group, an acryloyl group, a methacryloyl group, a fluorovinyl group, a difluorovinyl group, a trifluorovinyl group, a difluorotrifluoromethyl vinyl group, a trifluoroaryl group, a perfluoroallyl group, a trifluoromethyl acryloyl group, a nonyl fluorobutyl acryloyl group, a vinyl ether group, a fluorine-containing vinyl ether group, an allyl ether group, a fluorine-containing allyl ether group, a styryl group, a vinyl naphthyl group, a fluorine-containing styryl group, a fluorine-containing vinyl naphthyl group, a norbornyl group, a fluorine-containing norbornyl group, and a silyl group.

The polymerizable group-containing group may be a group constituted of only a polymerizable group or a group constituted of a polymerizable group and a group other than the polymerizable group. Examples of the group other than the polymerizable group include a bivalent hydrocarbon group which may have a substituent and a bivalent linking group containing a hetero atom.

Preferable examples of $W^1$ include a group represented by the chemical formula: $C(R^{X11})(R^{X12})=C(R^{X13})-Ya^{x0}-$.

In the chemical formula, $R^{X11}$, $R^{X12}$ and $R^{X13}$ each represent a hydrogen atom, an alkyl group having 1 to 5 carbon atoms or a halogenated alkyl group having 1 to 5 carbon atoms, and Ya' represents a single bond or a bivalent linking group.

In the chemical formula, the alkyl group having 1 to 5 carbon atoms for $R^{X11}$, $R^{X12}$ and $R^{X13}$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which some or all of the hydrogen atoms of the alkyl group having 1 to 5 carbon atoms are substituted with a halogen atom. Examples of the halogen atom include a fluorine atom, a chlorine atom, a bromine atom, and an iodine atom, and a fluorine atom is particularly preferable.

Among these, $R^{X11}$ and $R^{X12}$ are preferably a hydrogen atom, an alkyl group having 1 to 5 carbon atoms or a fluorinated alkyl group having 1 to 5 carbon atoms, and in terms of industrial availability, a hydrogen atom or a methyl group is more preferable, and a hydrogen atom is particularly preferable.

In addition, $R^{X13}$ is preferably a hydrogen atom, an alkyl group having 1 to 5 carbon atoms or a fluorinated alkyl group having 1 to 5 carbon atoms, and in terms of industrial availability, a hydrogen atom or a methyl group is more preferable.

In the chemical formula, the bivalent linking group for $Ya^{x0}$ is not particularly limited, and suitable examples thereof include a bivalent hydrocarbon group which may have a substituent and a bivalent linking group containing a hetero atom.

Bivalent Hydrocarbon Group which May have a Substituent:

When $Ya^{x0}$ is a bivalent hydrocarbon group which may have a substituent, the hydrocarbon group may be an aliphatic hydrocarbon group or an aromatic hydrocarbon group.

Aliphatic Hydrocarbon Group for $Ya^{x0}$

The aliphatic hydrocarbon group refers to a hydrocarbon group having no aromaticity. The aliphatic hydrocarbon group may be saturated or unsaturated and is generally preferably saturated.

Examples of the aliphatic hydrocarbon group include a linear or branched aliphatic hydrocarbon group and an aliphatic hydrocarbon group containing a ring in the structure.

Linear or Branched Aliphatic Hydrocarbon Group

The linear aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—CH$_2$-1, an ethylene group [—(CH$_2$)$_2$—], a trimethylene group [—(CH$_2$)$_3$—], a tetramethylene group [—(CH$_2$)$_4$-] and a pentamethylene group [—(CH$_2$)$_5$—].

The branched aliphatic hydrocarbon group preferably has 2 to 10 carbon atoms, more preferably 3 to 6, still more preferably 3 or 4, and most preferably 3.

As the branched aliphatic hydrocarbon group, branched alkylene groups are preferred, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)

($CH_2CH_2CH_3$)—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group having 1 to 5 carbon atoms substituted with a fluorine atom and a carbonyl group.

Aliphatic Hydrocarbon Group Containing a Ring in the Structure

As examples of the hydrocarbon group containing a ring in the structure thereof, a cyclic aliphatic hydrocarbon group containing a hetero atom in the ring structure thereof and may have a substituent (a group in which two hydrogen atoms have been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic group is interposed within the aforementioned linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which 2 hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which some or all of the hydrogen atoms within the aforementioned alkyl groups have been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

Aromatic Hydrocarbon Group for $Ya^{x0}$

The aromatic hydrocarbon group is a hydrocarbon group having at least one aromatic ring.

The aromatic ring is not particularly limited as long as it is a cyclic conjugated compound having (4n+2) π-electrons and it may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Here, carbon atoms in the substituent are not included in the number of carbon atoms. Examples of the aromatic ring include aromatic hydrocarbon rings, such as benzene, naphthalene, anthracene and phenanthrene; and aromatic hetero rings in which some of the carbon atoms constituting the aforementioned aromatic hydrocarbon rings have been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which two hydrogen atoms have been removed from the aforementioned aromatic hydrocarbon ring or aromatic hetero ring (arylene group or heteroarylene group); a group in which two hydrogen atoms have been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (a group in which one hydrogen atom has been removed from the aryl group within the aforementioned arylalkyl group such as a benzyl group, a phenethyl group, a 1-naphthylmethyl group, a 2-naphthylmethyl group, a 1-naphthylethyl group, or a 2-naphthylethyl group, or a heteroarylalkyl group). The alkylene group which is bonded to the aforementioned aryl group or heteroaryl group preferably has 1 to 4 carbon atoms, more preferably 1 or 2 carbon atoms, and most preferably 1 carbon atom.

With respect to the aromatic hydrocarbon group, a hydrogen atom within the aromatic hydrocarbon group may be substituted with a substituent. For example, a hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is particularly desirable.

As the alkoxy group, the halogen atom and the halogenated alkyl group for the substituent, the same groups as the aforementioned substituent groups for substituting a hydrogen atom within the cyclic aliphatic hydrocarbon group can be used.

Bivalent linking group containing a hetero atom:

In the case where $Ya^{x0}$ represents a divalent linking group containing a hetero atom, preferable examples of die linking group include —O—, —C(=O)—O—, —C(=O)—, —O—C(=O)—O—, —C(=O)—NH—, —NH—, —NH—C(=NH)— (H may be substituted with a substituent such as an alkyl group, an acyl group or the like), —S—, —S(=O)$_2$—, —S(=O)$_2$—O—, and a group represented by general formulae: —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$— or —$Y^{21}$—S(=O)$_2$—O—$Y^{22}$— [In the formulae, $Y^{21}$ and $Y^{22}$ each independently represent a divalent hydrocarbon group which may have a substituent, O represents an oxygen atom, and m' is an integer of 0 to 3.].

When the bivalent linking group containing a hetero atom is —C(=O)—NH—, —C(=O)—NH—C(=O)—, —NH—, or —NH—C(=NH)—, H may be substituted with a substituent such as an alkyl group and an acyl group. The substituent (such as, an alkyl group, an acyl group, and so on) preferably has 1 to 10 carbon atoms, more preferably 1 to 8 carbon atoms, and particularly preferably 1 to 5 carbon atoms.

In the general formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$— or —$Y^{21}$—S(=O)$_2$—O—$Y^{22}$—, $Y^{21}$ and $Y^{22}$ each independently represent a bivalent hydrocarbon group which may have a substituent. Regarding the bivalent hydrocarbon group, the same as those described for the bivalent linking group (a bivalent hydrocarbon group which may have a substituent) may be exemplified.

$Y^{21}$ is preferably a linear aliphatic hydrocarbon group and more preferably a linear alkylene group, still more preferably a linear alkylene group having 1 to 5 carbon atoms, and particularly preferably a methylene group or an ethylene group.

$Y^{22}$ is preferably a linear or branched aliphatic hydrocarbon group, and more preferably a methylene group, an ethylene group or an alkyl methylene group. The alkyl group within the alkyl methylene group is preferably a linear alkyl group having 1 to 5 carbon atoms, more preferably a linear alkyl group having 1 to 3 carbon atoms, and most preferably a methyl group.

In the group represented by the formula —[$Y^{21}$—C(=O)—O]$_{m''}$—$Y^{22}$—, m'' is an integer of 0 to 3, preferably an integer of 0 to 2, more preferably 0 or 1, and most preferably 1. Namely, it is particularly desirable that the group represented by the formula —[$Y^{21}$—C(=O)—O]$_{m''}$—$Y^{22}$— is a group represented by the formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In the above, $Ya^{x0}$ is preferably an ester bond [—C(=O)—O—, —O—C(=O)—], an ether bond (—O—), a linear or branched alkylene group, an aromatic hydrocarbon group or a combination thereof, or a single bond. Among these, $Ya^{x0}$ is more preferably an ester bond [—C(=O)—O—, —O—C(=O)—], a linear or branched alkylene group, or a combination thereof, or a single bond, and Among these, a single bond is particularly preferable.

In the formula (a0-1a-1), $Ra^{01a}$ represents an acid dissociable group in which a carbon atom is bonded to an oxy group (—O—) in the formula, and has a carbon atom constituting a carbon-carbon unsaturated bond to the carbon atom at the α-position.

"The carbon atom at the α-position" refers to a first carbon atom adjacent to the carbon atom bonded to an oxy group (—O—) in the formula (a0-1a-1).

Examples of the acid dissociable group for $Ra^{01a}$ include a group having a carbon atom constituting a carbon-carbon unsaturated bond at the α-position of the carbon atom bonded to an oxy group within the acid dissociable group represented by the general formula (a1-r-1) or the acid dissociable group represented by the general formula (a1-r-2). Among these, $Ra^{01a}$ is an acid dissociable group represented by the general formula (a1-r-2) and more preferably a group having a carbon atom constituting a carbon-carbon unsaturated bond at the α-position of the carbon atom bonded to an oxy group.

Specifically, preferable examples of the acid dissociable group represented by the general formula (a1-r-2) include a group represented by the general formula (a1-r2-1), a group represented by die general formula (a1-r2-2), a group represented by the general formula (a1-r2-3), and a group represented by the general formula (a1-r2-4).

In the general formula (a0-1a-1), $Ra^{01a}$ is preferably a group having a carbon atom constituting a carbon-carbon unsaturated bond at the α-position of the carbon atom bonded to an oxygen atom in the general formula (a0-1a-1) within the acid dissociable group represented by any of the formulae (a1-r2-1) to (a1-r2-4). More specifically, the followings are exemplified.

(1) In the group represented by the general formula (a1-r2-1), $Ra'^{10}$ represents an alkyl group having 1 to 12 carbon atoms; $Ra'^{11}$ represents an acid dissociable group which is a group that forms an aliphatic cyclic group having a carbon-carbon unsaturated bond together with a carbon atom to which $Ra'^{10}$ is bonded; provided that a carbon atom constituting a carbon-carbon unsaturated bond is provided at the α-position of the carbon atom to which $Ra'^{10}$ is bonded. The aliphatic cyclic group is preferably a group in which one hydrogen atom has been removed from a monocycloalkene or a group in which one hydrogen atom has been removed from a polycycloalkene. The monocycloalkene preferably has 3 to 6 carbon atoms, and specific examples thereof include cyclopentene and cyclohexene. The polycycloalkene preferably has 7 to 12 carbon atoms.

(2) A group represented by the general formula (a1-r2-2).

(3) A group represented by the general formula (a1-r2-3); provided that a carbon atom constituting an aromatic hydrocarbon ring or an aromatic hetero ring is provided at the α-position of Yaa (carbon atom).

(4) In the group represented by the general formula (a1-r2-4), $Ra'^{12}$ and $Ra'^{13}$ each represent a monovalent linear saturated hydrocarbon group having 1 to 10 carbon atoms, and $Ra'^{14}$ represents an acid dissociable group that is an aromatic hydrocarbon group which may have a substituent; or $Ra'^{12}$ is a monovalent linear saturated hydrocarbon group having 1 to 10 carbon atoms and an acid dissociable group in which $Ra'^{13}$ and $Ra'^{14}$ are bonded to form a condensed ring that may have a hetero atom; provided that a carbon atom constituting an aromatic hydrocarbon ring is provided at the α-position of the carbon atom to which $Ra'^{12}$ is bonded.

Within the group represented by the formula (a1-r2-1), specific examples of the acid dissociable group for $Ra^{01a}$ are shown below. * indicates a bond with an oxy group (—O—) in the general formula (a0-1a-1).

[Chem. 13]
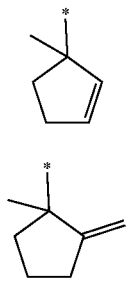
(r-pr-s19)
(r-pr-s20)
Within the group represented by the formula (a1-r2-2), specific examples of the acid dissociable group for $Ra^{01a}$ are shown below. * indicates a bond with an oxy group (—O—) in the general formula (a0-1a-1).
[Chem. 14]
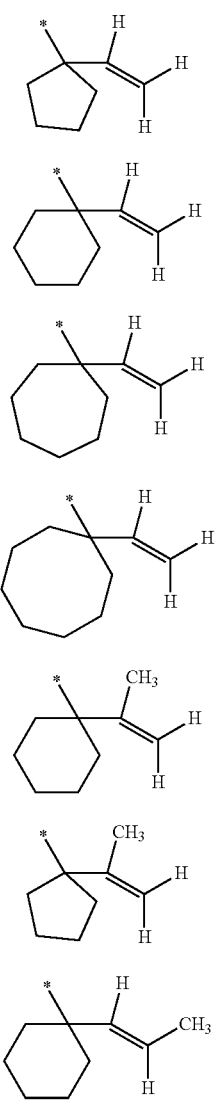
(r-pr-sv1)
(r-pr-sv2)
(r-pr-sv3)
(r-pr-sv4)
(r-pr-sv5)
(r-pr-sv6)
(r-pr-sv7)
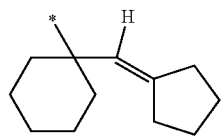
(r-pr-sv8)
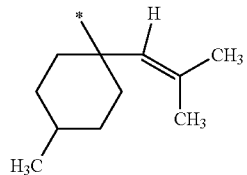
(r-pr-sv9)
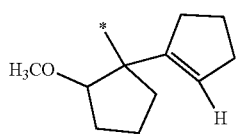
(r-pr-sv10)
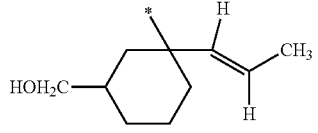
(r-pr-sv11)
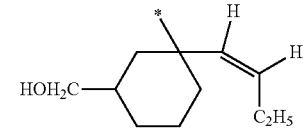
(r-pr-sv12)
[Chem. 15]
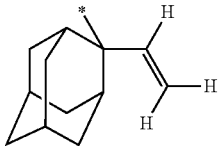
(r-pr-mv1)
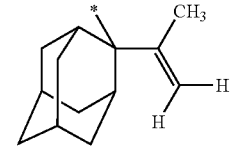
(r-pr-mv2)
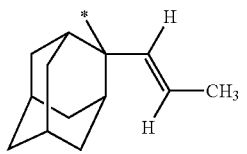
(r-pr-mv3)
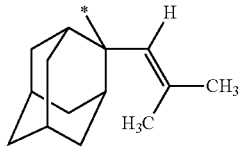
(r-pr-mv4)
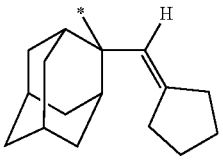
(r-pr-mv5)

-continued
(r-pr-mv6)
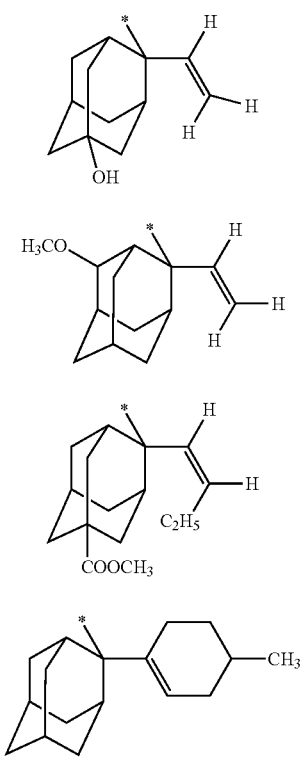
(r-pr-mv7)
(r-pr-mv8)
(r-pr-mv9)
[Chem. 16]
(r-pr-mv10)
(r-pr-mv11)
(r-pr-mv12)
(r-pr-mv13)
(r-pr-mv14)
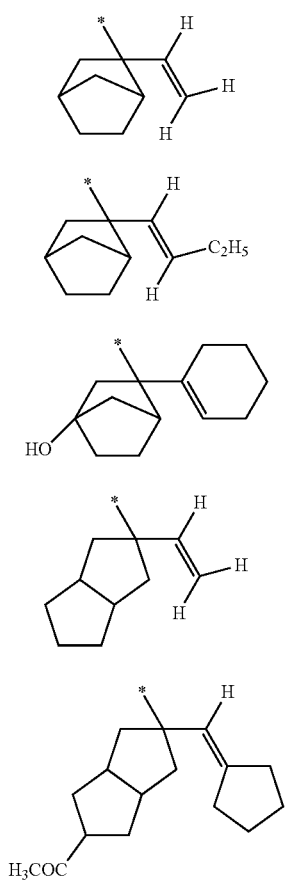
-continued
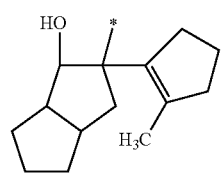 (r-pr-mv15)
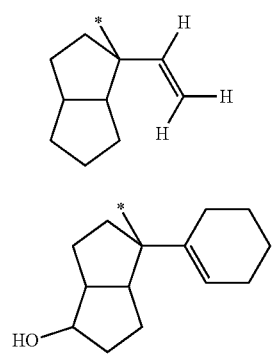 (r-pr-mv16)
(r-pr-mv17)
(r-pr-mv18)
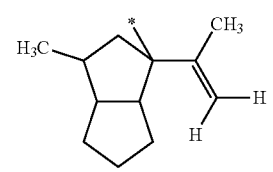 (r-pr-mv19)
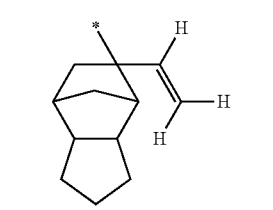 (r-pr-mv20)
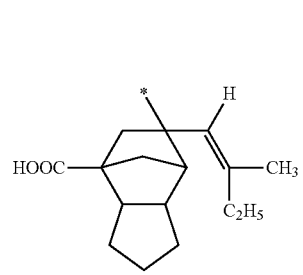
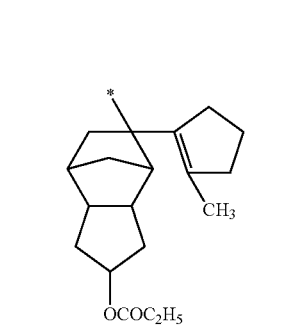 (r-pr-mv21)
Within the group represented by the formula (a1-r2-3), specific examples of the acid dissociable group for $Ra^{001}$ are shown below. * indicates a bond with an oxy group (—O—) in the general formula (a0-1a-1).

[Chem. 17]
(r-pr-sa1)
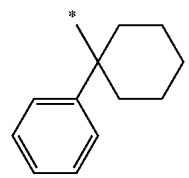
(r-pr-sa2)
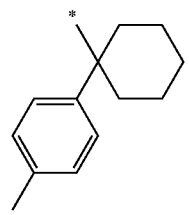
(r-pr-sa3)
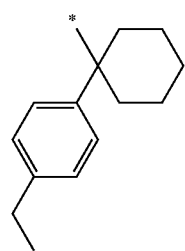
(r-pr-sa4)
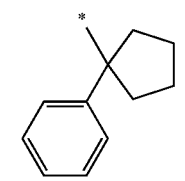
(r-pr-sa5)
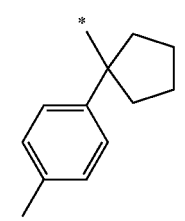
(r-pr-sa6)
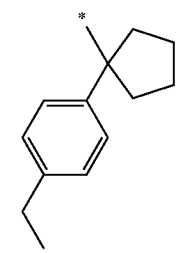
(r-pr-sa7)
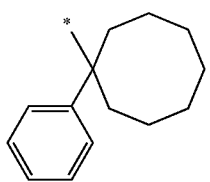
(r-pr-sa8)
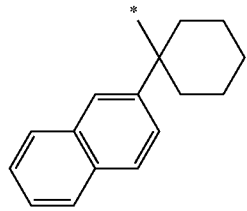
(r-pr-sa9)
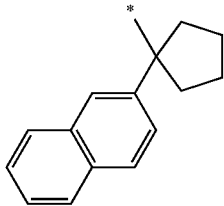
(r-pr-ma1)
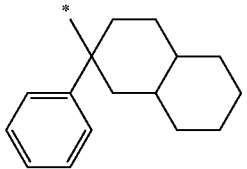
(r-pr-ma2)
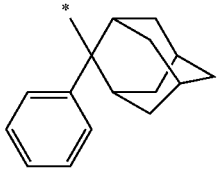
Within the group represented by the formula (a1-r2-4a), specific examples of the acid dissociable group for $Ra^{01a}$ are shown below. * indicates a bond with an oxy group (—O—) in the general formula (a0-1a-1).
[Chem. 18]
(r-pr-cm5)
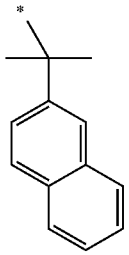
(r-pr-cm6)
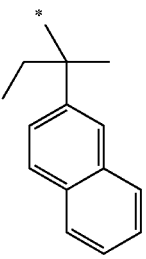

(r-pr-cm7) 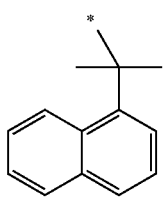

(r-pr-cm8) 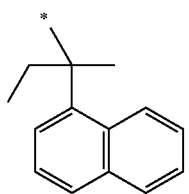

(r-pr-cs4) 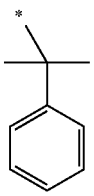

(r-pr-cs5) 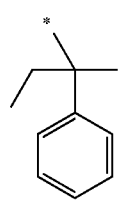

(r-pr-fr1) 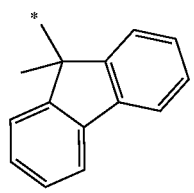

(r-pr-fr2) 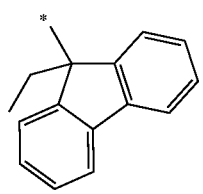

(r-pr-fr3) 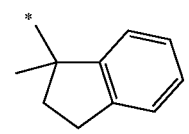

(r-pr-fr4) 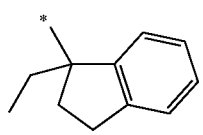

(r-pr-fr5) 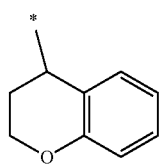

Preferable specific examples of the structural unit (a0-1a) include a structural unit represented by the following general formula (a0-1a-u1).

[Chem. 19]

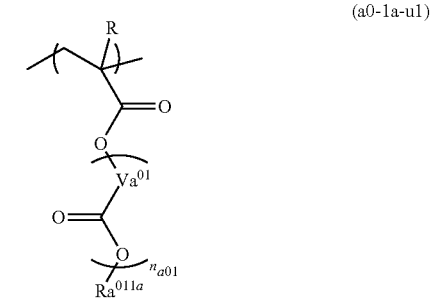

(a0-1a-u1)

[In the formula, R represents a hydrogen atom, an alkyl group having 1 to 5 carbon atoms, or a halogenated alkyl group having 1 to 5 carbon atoms. $Va^{01}$ represents a bivalent hydrocarbon group which may have an ether bond, $n_{a01}$ is an integer of 0 to 2. $Ra^{011a}$ is an acid dissociable group represented by the general formula (a1-r-2) and is a group having a carbon atom constituting a carbon-carbon unsaturated bond at the α-position of the carbon atom bonded to an oxy group (—O—) in the formula.]

In the formula (a0-1a-u1), an alkyl group having 1 to 5 carbon atoms for R is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which some or all of the hydrogen atoms of the alkyl group having 1 to 5 carbon atoms are substituted with a halogen atom. Examples of the halogen atom include a fluorine atom, a chlorine atom, a bromine atom, and an iodine atom, and a fluorine atom is particularly preferable.

R is preferably a hydrogen atom, an alkyl group having 1 to 5 carbon atoms or a fluorinated alkyl group having 1 to 5 carbon atoms, and in terms of industrial availability, a hydrogen atom or a methyl group is most preferable.

In the formula (a0-1a-u1), the bivalent hydrocarbon group for $Va^{01}$ may be an aliphatic hydrocarbon group or an aromatic hydrocarbon group.

The aliphatic hydrocarbon group as the bivalent hydrocarbon group for $Va^{01}$ may be saturated or unsaturated, and is generally preferably saturated.

More specifically, examples of the aliphatic hydrocarbon group include a linear or branched aliphatic hydrocarbon group and an aliphatic hydrocarbon group containing a ring in the structure.

The linear aliphatic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)_5$—].

The branched aliphatic hydrocarbon group preferably has 2 to 10 carbon atoms, more preferably 3 to 6, still more preferably 3 or 4, and most preferably 3.

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. The linear or branched aliphatic hydrocarbon group is the same as defined for the aforementioned linear aliphatic hydrocarbon group or the aforementioned branched aliphatic hydrocarbon group.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the poly cycloalkane include adamantane, norbornane, isobornane, tricyclodecane and tetracyclododecane.

The aromatic hydrocarbon group as the bivalent hydrocarbon group for $Va^{01}$ is a hydrocarbon group having an aromatic ring.

The aromatic hydrocarbon group preferably has 3 to 30 carbon atoms, more preferably 5 to 30 carbon atoms, still more preferably 5 to 20 carbon atoms, particularly preferably 6 to 15 carbon atoms, and most preferably 6 to 12 carbon atoms. Here, carbon atoms in the substituent are not included in the number of carbon atoms.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which some of the carbon atoms constituting the aforementioned aromatic hydrocarbon rings have been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atoms, more preferably 1 or 2, and most preferably 1.

In the formula (a0-1a-u1), $n_{a01}$ is an integer of 0 to 2, and is preferably 0 or 1, and more preferably 0.

In the formula (a0-1a-u1), $Ra^{011a}$ represents an acid dissociable group represented by the formula (a1-r-2) and is a group having a carbon atom constituting a carbon-carbon unsaturated bond at the α-position of the carbon atom bonded to an oxy group (—O—) in the formula.

Preferable examples of the acid dissociable group represented by the general formula (a1-r-2) include those provided as exemplary examples of $Ra^{01a}$ in the general formula (a0-1a-1).

Specific examples of the structural unit (a0-1a) are shown below. In the following formulae, $R^\alpha$ represents a hydrogen atom, a methyl group or a trifluoromethyl group.

[Chem. 20]

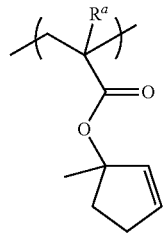

(a0-1a-u101)

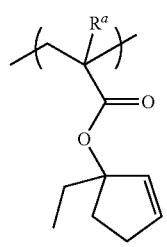

(a0-1a-u102)

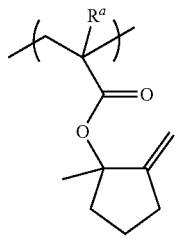

(a0-1a-u103)

[Chem. 21]
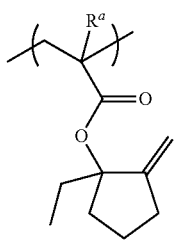 (a0-1a-u104)
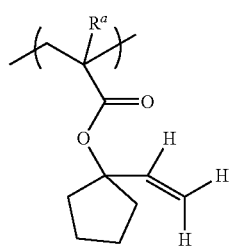 (a0-1a-u111)
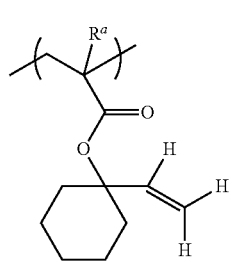 (a0-1a-u112)
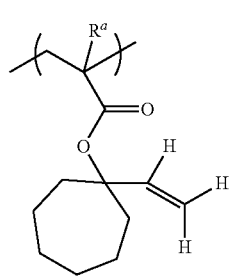 (a0-1a-u113)
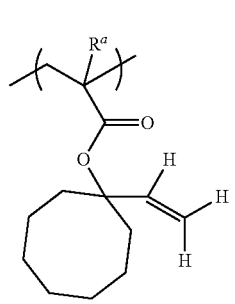 (a0-1a-u114)
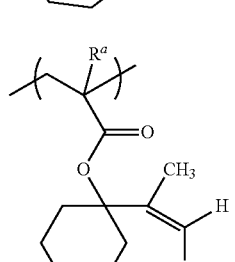 (a0-1a-u115)
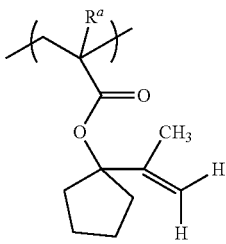 (a0-1a-u116)
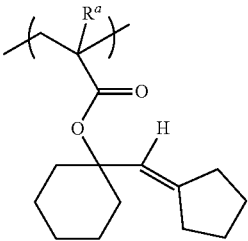 (a0-1a-u117)
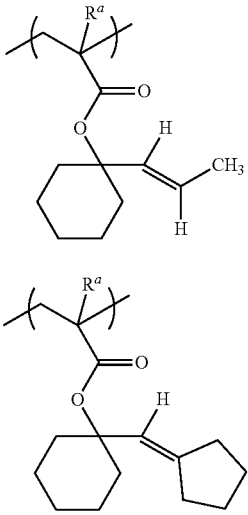 (a0-1a-u118)
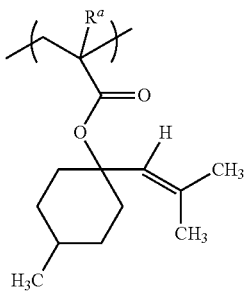 (a0-1a-u119)
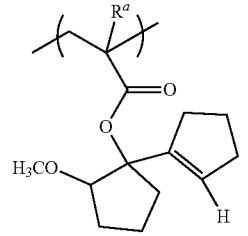 (a0-1a-u120)
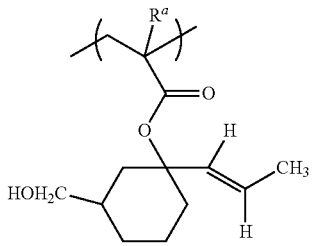 (a0-1a-u121)

-continued
(a0-1a-u122)
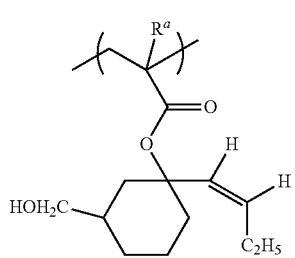
[Chem. 22]
(a0-1a-u123)
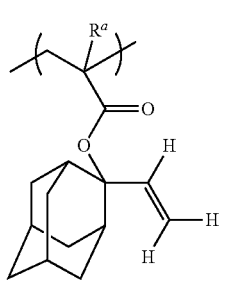
(a0-1a-u124)
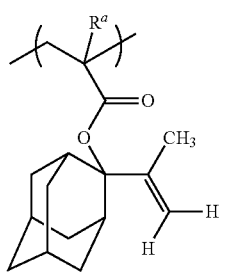
(a0-1a-u125)
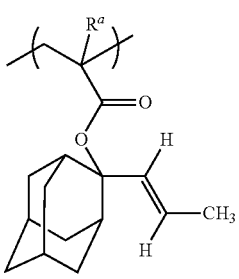
(a0-1a-u126)
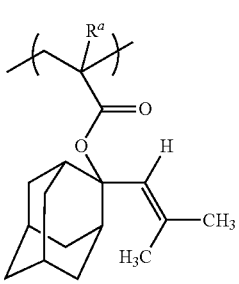
-continued
(a0-1a-u127)
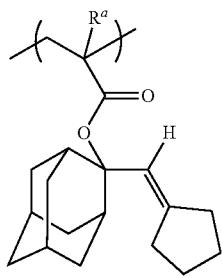
(a0-1a-u128)
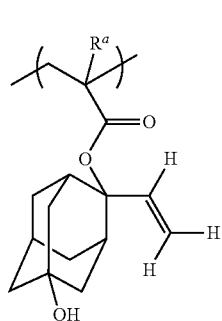
(a0-1a-u129)
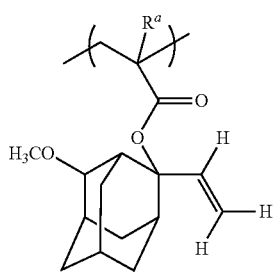
(a0-1a-u130)
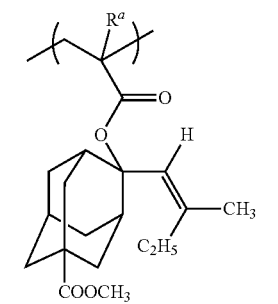
(a0-1a-u131)
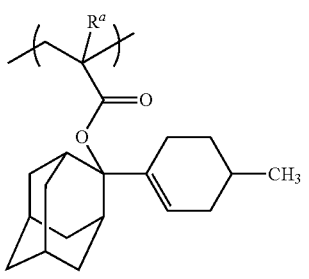

[Chem. 23]
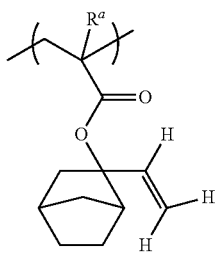 (a0-1a-u132)
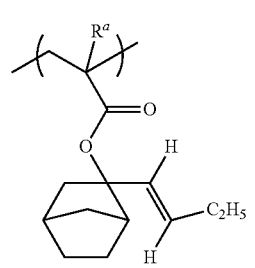 (a0-1a-u133)
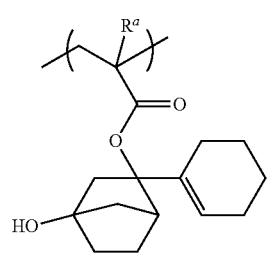 (a0-1a-u134)
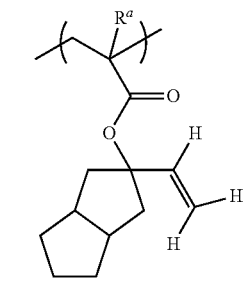 (a0-1a-u135)
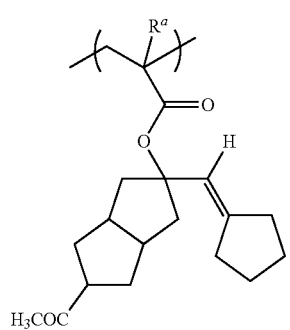 (a0-1a-u136)
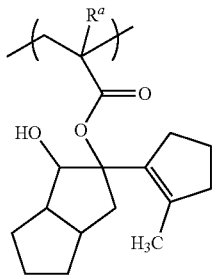 (a0-1a-u137)
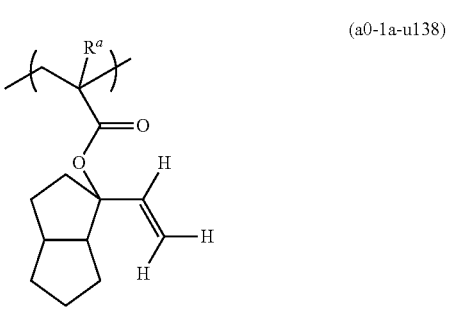 (a0-1a-u138)
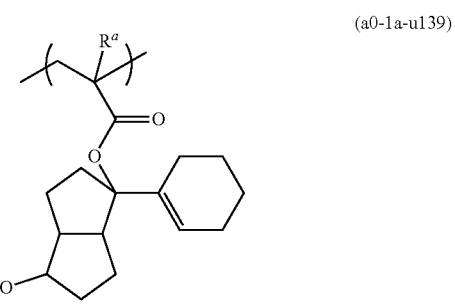 (a0-1a-u139)
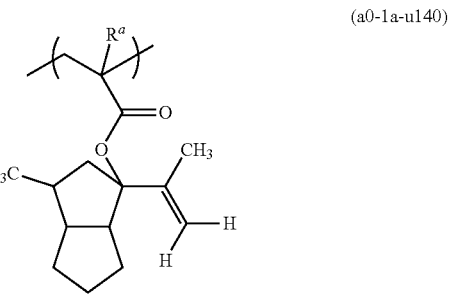 (a0-1a-u140)
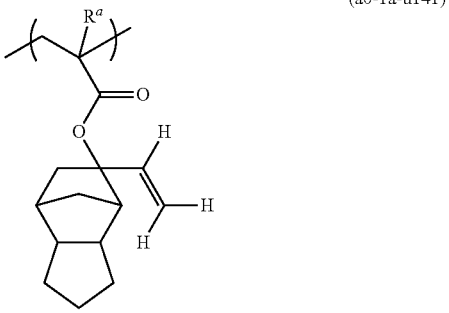 (a0-1a-u141)

(a0-1a-u142)
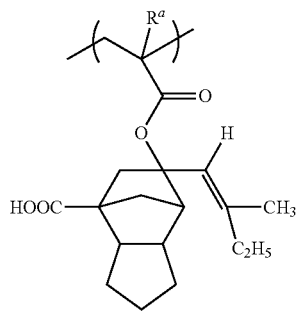
(a0-1a-u143)
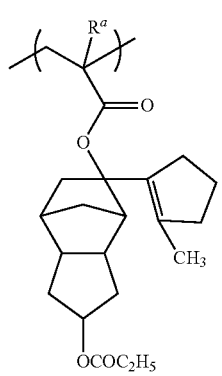
[Chem. 24]
(a0-1a-u151)
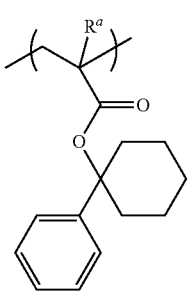
(a0-1a-u152)
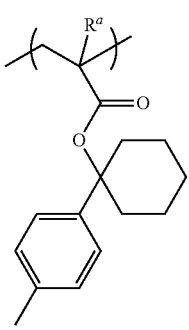
(a0-1a-u153)
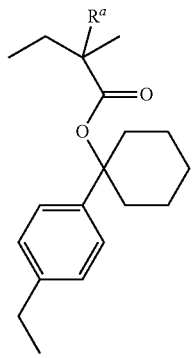
(a0-1a-u154)
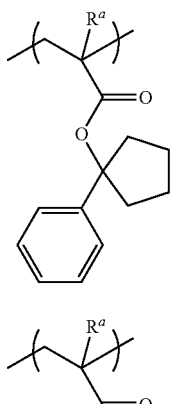
(a0-1a-u155)
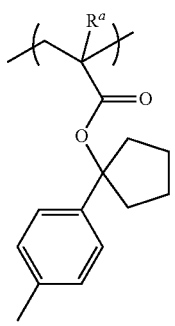
(a0-1a-u156)
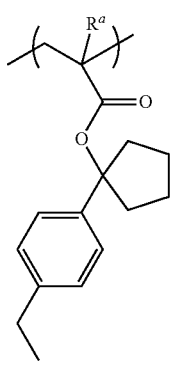
(a0-1a-u157)
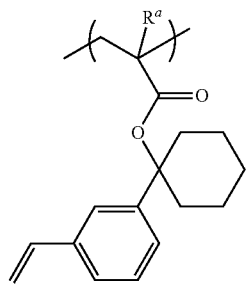

-continued
(a0-1a-u158)
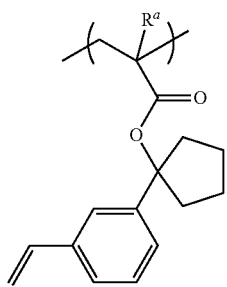
(a0-1a-u159)
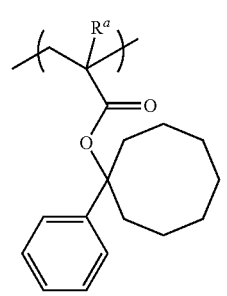
(a0-1a-u160)
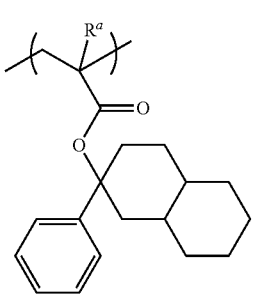
(a0-1a-u161)
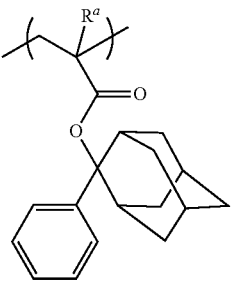
(a0-1a-u162)
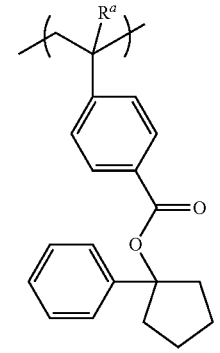
-continued
(a0-1a-u163)
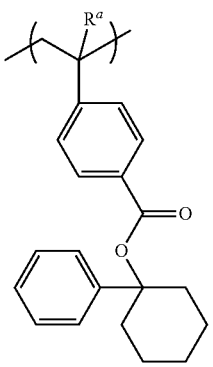
[Chem. 25]
(a0-1a-u171)
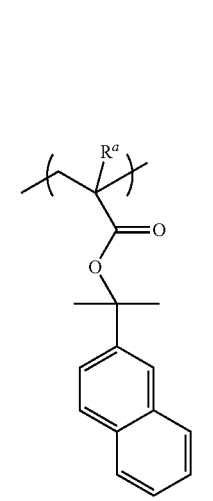
(a0-1a-u172)
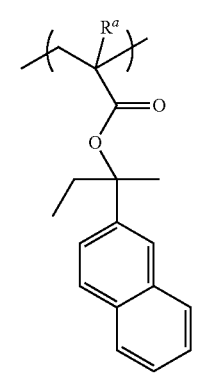
(a0-1a-u173)
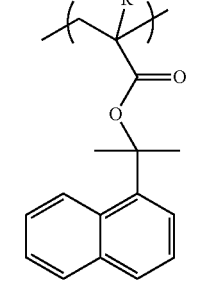

(a0-1a-u174)
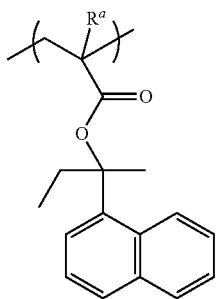

(a0-1a-u175)
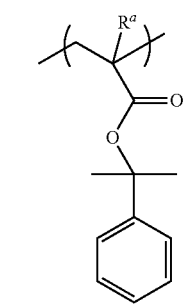

(a0-1a-u176)
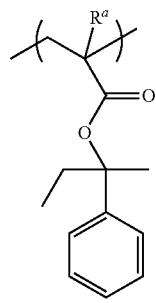

(a0-1a-u177)
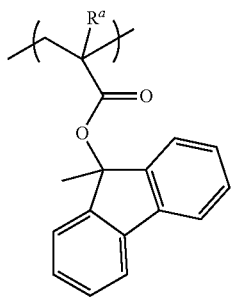

(a0-1a-u178)
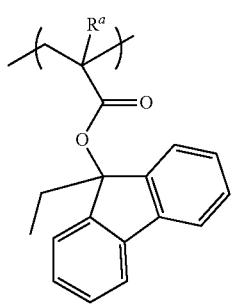

(a0-1a-u179)
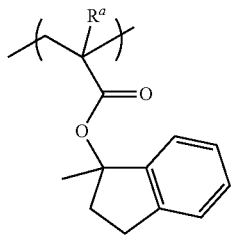

(a0-1a-u180)
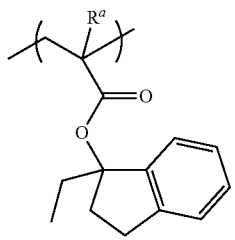

(a0-1a-u181)
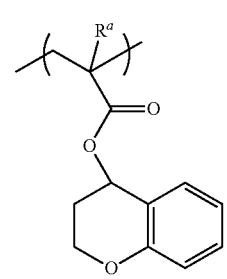

Among the above examples, the structural unit (a0-1a) is preferably at least one selected from among the group consisting of structural units represented by the chemical formulae (a0-1a-u101) to (a0-1a-u104), chemical formulae (a0-1a-u111) to (a0-1a-u143), chemical formulae (a0-1a-u151) to (a0-1a-u163), and chemical formulae (a0-1a-u171) to (a0-1a-u181).

The structural unit (a0-1a) of the component (A1a) may be of one type, or two or more types.

In the component (A1a), a proportion of the structural unit (a0-1a) is preferably 20 to 80 mol %, more preferably 35 to 65 mol %, and particularly preferably 40 to 60 mol % with respect to the total (100 mol %) of all structural units constituting the component (A1a).

When a proportion of the structural unit (a0-1a) is equal to or more than a lower limit of the preferable range, lithography properties such as sensitivity, resolution, and roughness are improved. In addition, when the proportion thereof is equal to or less than an upper limit, a balance with other structural units can be achieved and various lithography properties become favorable.

In addition, when (A1a) has a structural unit (a1) (hereinafter referred to as a "structural unit a1-1a") other than the structural unit (a0-1a) in addition to the structural unit (a0-1a), in the component (A1a), a proportion of the structural unit (a0-1a) in the structural unit (a1) is preferably 50 mol % or more, more preferably 80 mol % or more, still more preferably 90 mol % or more, and may be 100 mol % and is particularly preferably 100 mol % with respect to the total (100 mol %) of the structural unit (a1).

Structural Unit (a1-1a):

The structural unit (a1-1a) is a structural unit (a1) other than the structural unit (a0-1a).

The structural unit (a1-1a) is preferably a structural unit derived from an acrylic ester in which a hydrogen atom bonded to a carbon atom at the α-position may be substituted with a substituent.

Preferable specific examples of the structural unit (a1-1a) include structural units represented by the following general formula (a1-1a-1) or (a1-1a-2).

[Chem. 26]

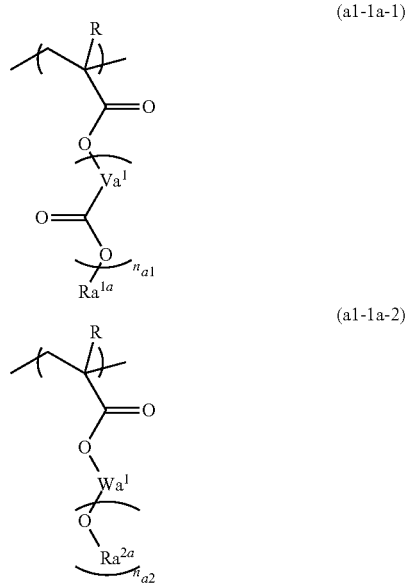

[In the formula, R represents a hydrogen atom, an alkyl group having 1 to 5 carbon atoms or a halogenated alkyl group having 1 to 5 carbon atoms. $Va^1$ represents a bivalent hydrocarbon group which may have an ether bond. $n_{a1}$ is an integer of 0 to 2. $Ra^{1a}$ represents an acid dissociable group represented by the general formula (a1-r-1) or (a1-r-2). $Wa^1$ represents a hydrocarbon group having a valency of $n_{a2}+1$. $n_{a2}$ is an integer of 1 to 3. $Ra^{2a}$ represents an acid dissociable group represented by the general formula (a1-r-1) or (a1-r-3); provided that the acid dissociable group is an acid dissociable group in which a carbon atom is bonded to an oxy group (—O—) in the formula, excluding those having a carbon atom constituting a carbon-carbon unsaturated bond provided at the α-position of the carbon atom.]

In the formula (a1-1a-1), the alkyl group having 1 to 5 carbon atoms for R is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which some or all of the hydrogen atoms of the alkyl group having 1 to 5 carbon atoms are substituted with a halogen atom Examples of the halogen atom include a fluorine atom, a chlorine atom, a bromine atom, and an iodine atom, and a fluorine atom is particularly preferable.

R is preferably a hydrogen atom, an alkyl group having 1 to 5 carbon atoms or a fluorinated alkyl group having 1 to 5 carbon atoms, and in terms of industrial availability, a hydrogen atom or a methyl group is most preferable.

In the formula (a1-1a-1), $Va^1$ represents a bivalent hydrocarbon group which may have an ether bond. The bivalent hydrocarbon group for $Va^1$ may be an aliphatic hydrocarbon group or an aromatic hydrocarbon group. The bivalent hydrocarbon group (aliphatic hydrocarbon group, aromatic hydrocarbon group) for $Va^1$ is the same as the bivalent hydrocarbon group (aliphatic hydrocarbon group, aromatic hydrocarbon group) for $Va^{01}$ in the formula (a0-1a-u1).

In the formula (a1-1a-2), a hydrocarbon group having a valency of $n_{a2}+1$ for $Wa^1$ may be an aliphatic hydrocarbon group or an aromatic hydrocarbon group. The aliphatic hydrocarbon group refers to a hydrocarbon group having no aromaticity and may be saturated or unsaturated, and is generally preferably saturated. Examples of the aliphatic hydrocarbon group include a linear or branched aliphatic hydrocarbon group, aliphatic hydrocarbon group containing a ring in the structure and a group in which a linear or branched aliphatic hydrocarbon group and an aliphatic hydrocarbon group containing a ring in the structure are combined.

The valency of $n_{a2}+1$ is preferably divalent, trivalent or tetravalent, and more preferably divalent or trivalent.

Specific examples of the structural unit represented by the formula (a1-1a-1) are shown below. In the following formulae, $R^\alpha$ represents a hydrogen atom, a methyl group or a trifluoromethyl group.

[Chem. 27]

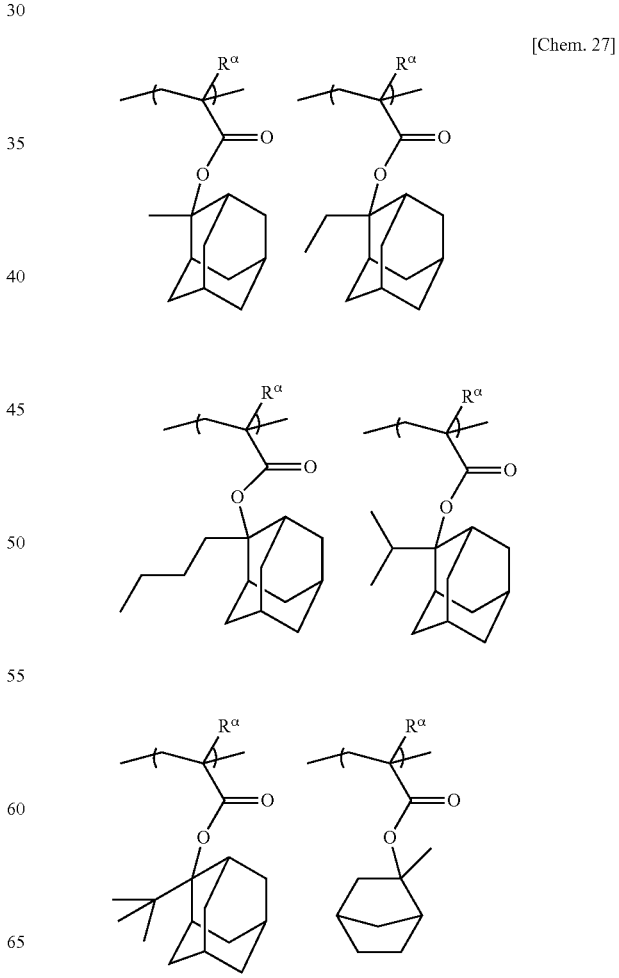

49
-continued
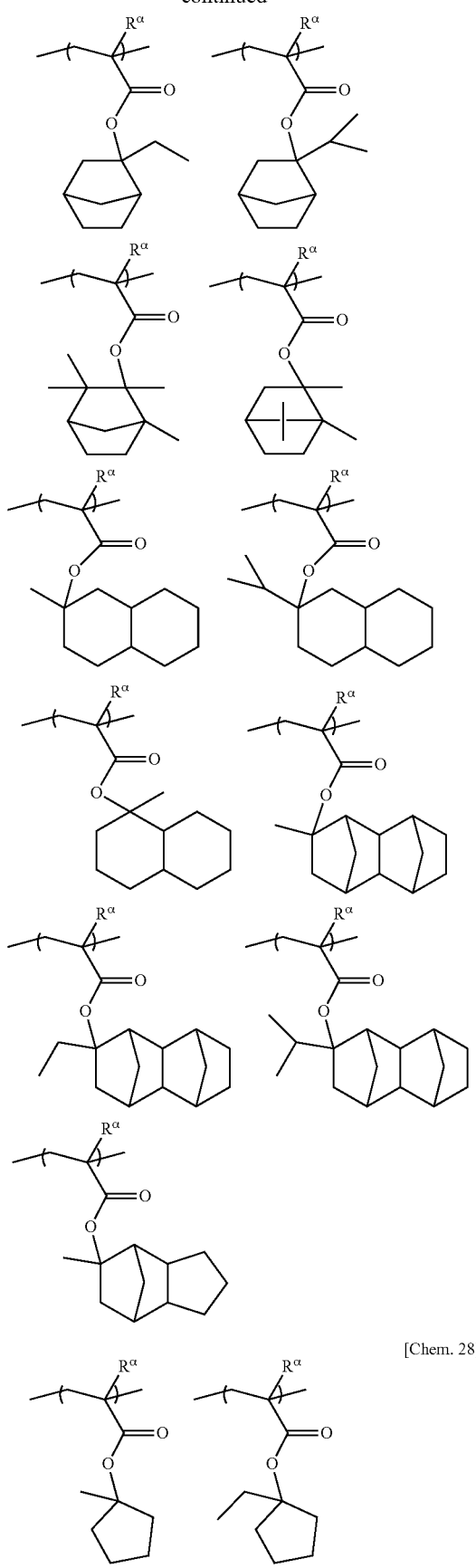
[Chem. 28]
50
-continued
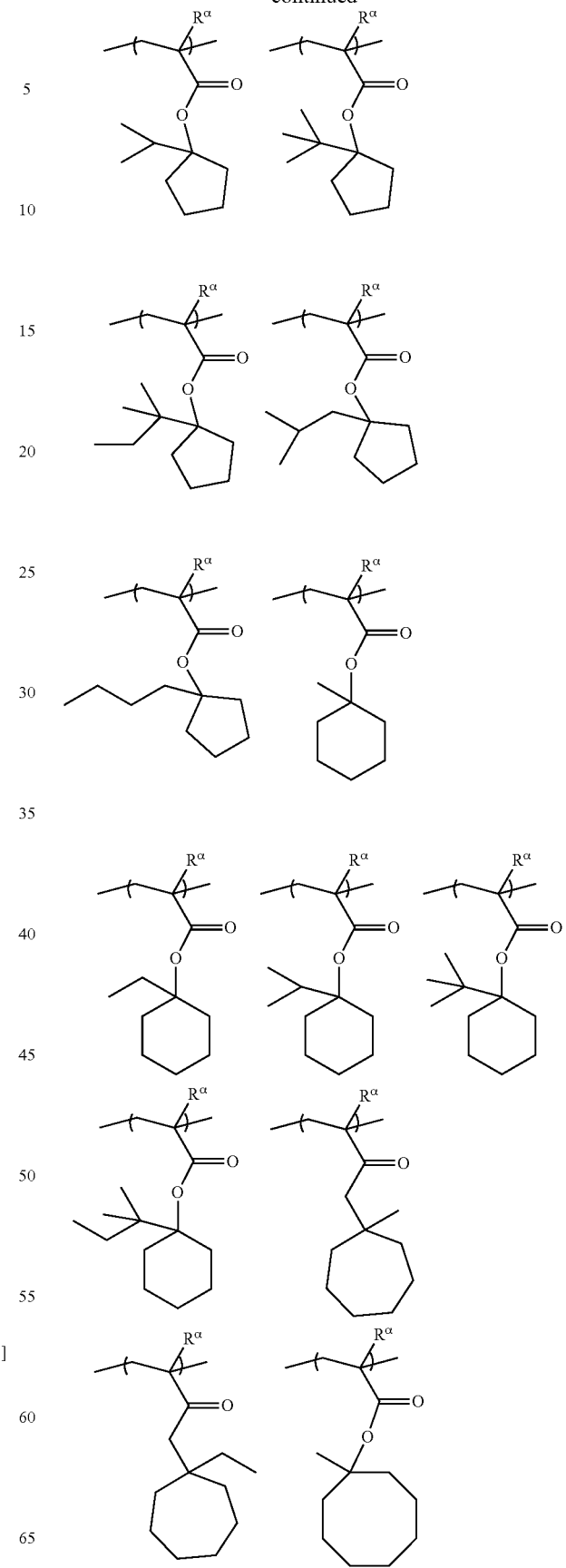

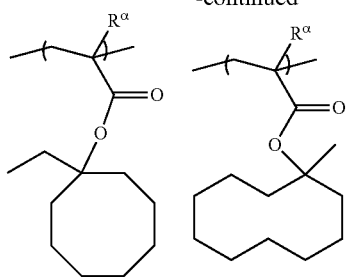
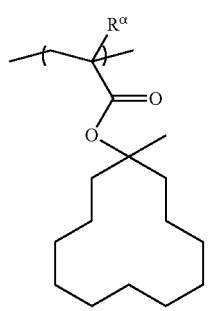
[Chem. 29]
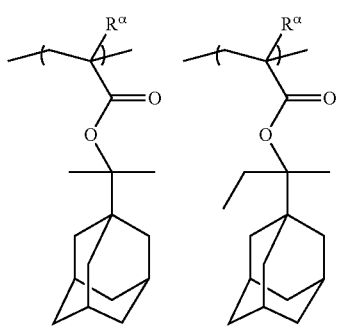
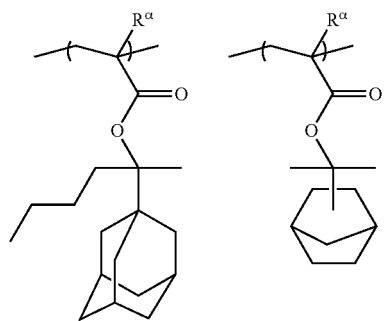
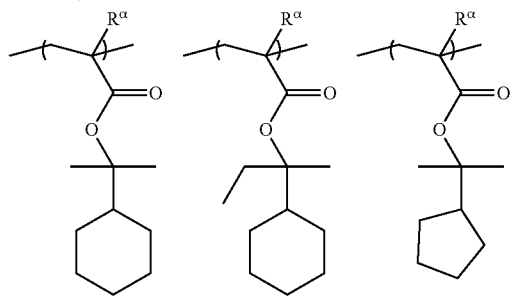
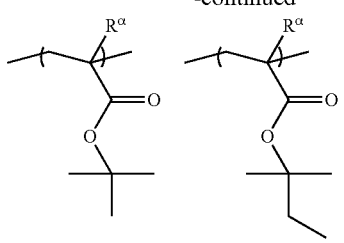
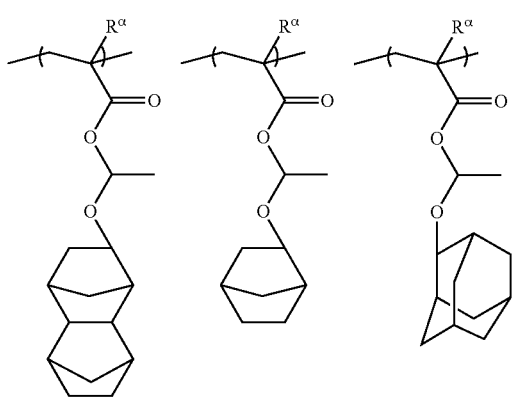
[Chem. 30]
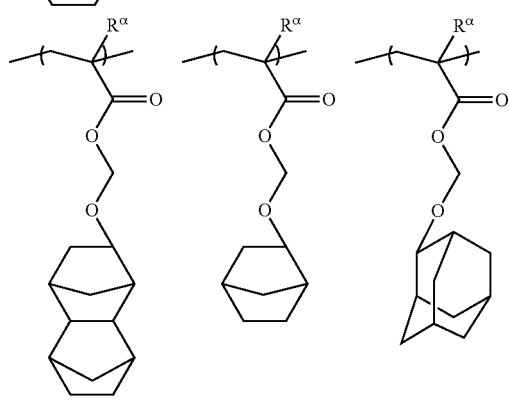
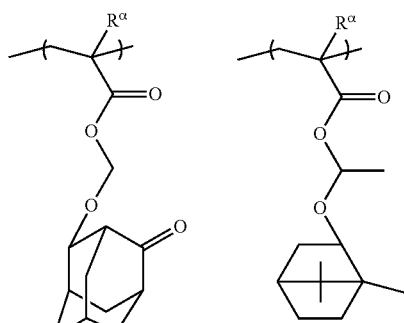
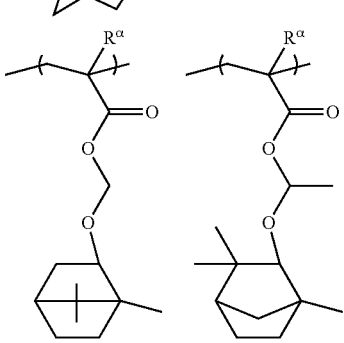

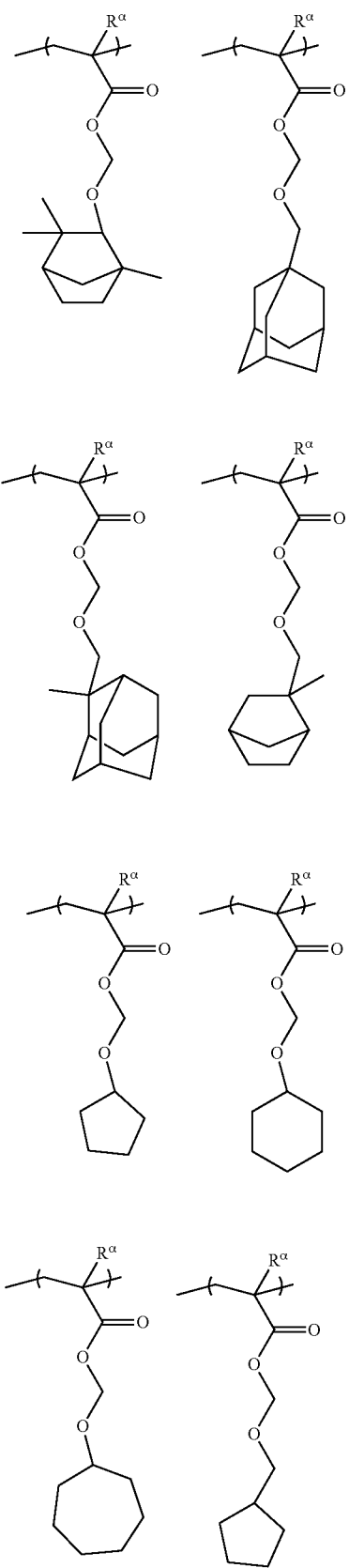
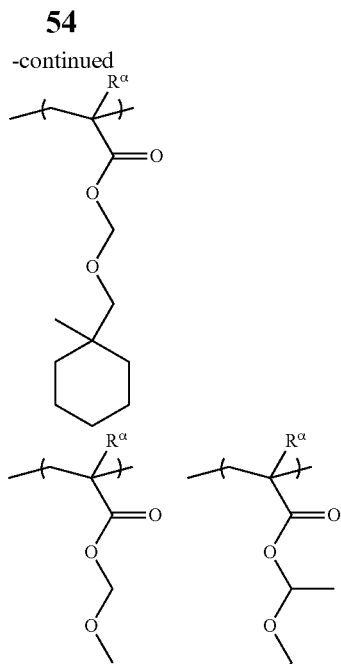
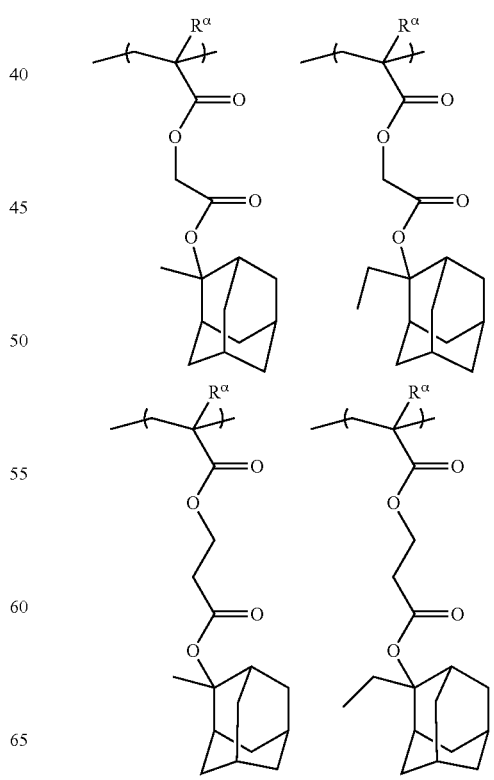

-continued
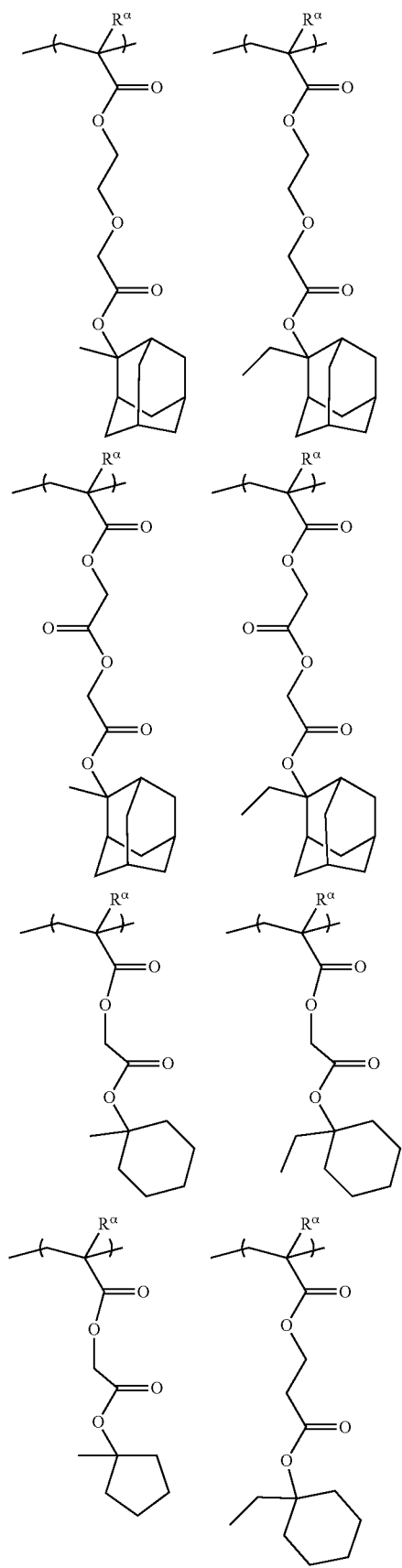
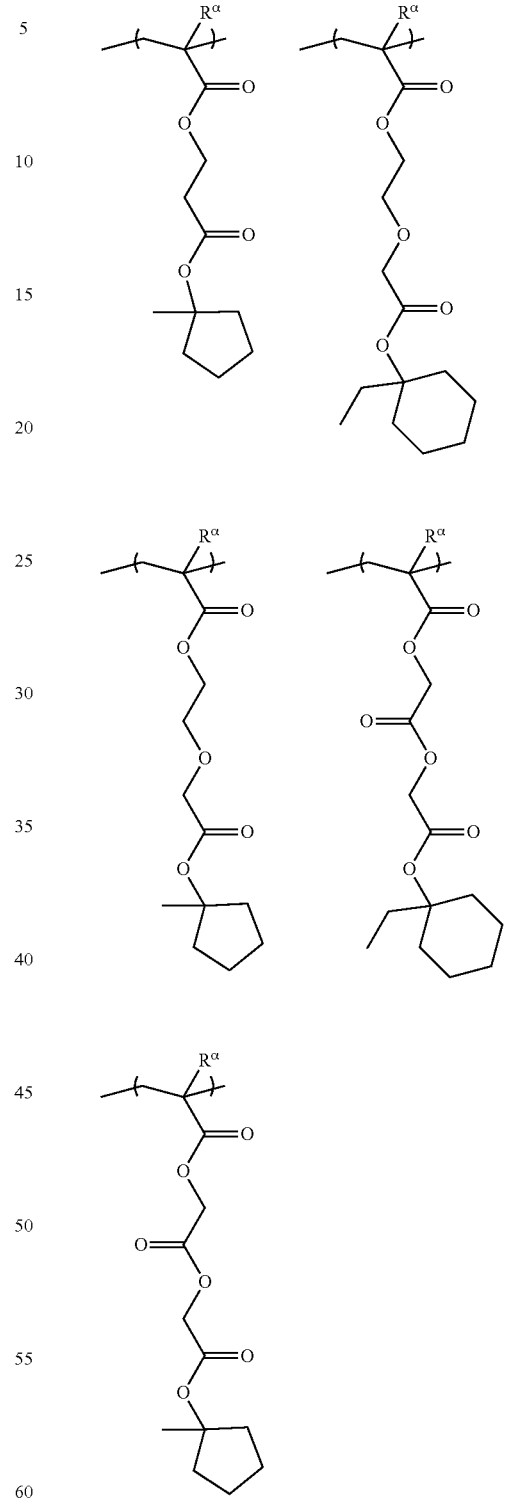
Specific examples of the structural unit represented by the formula (a1-1a-2) are shown below. In the following formulae, $R^\alpha$ represents a hydrogen atom, a methyl group or a trifluoromethyl group.

[Chem. 33]

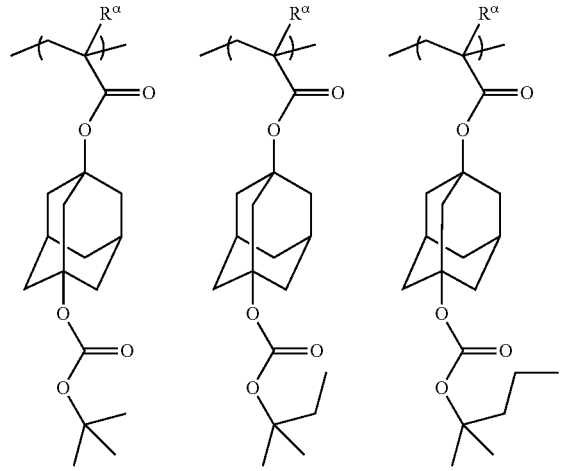

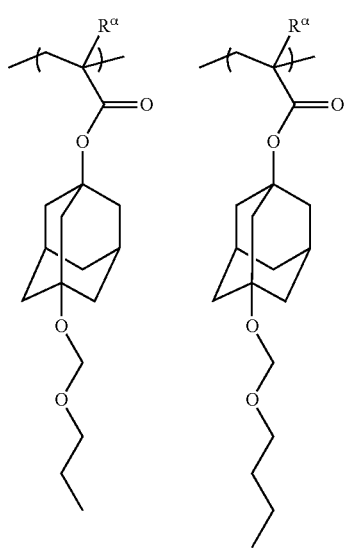

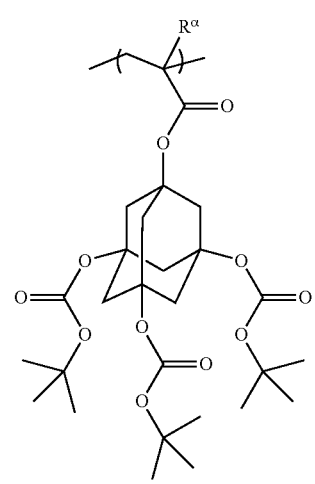

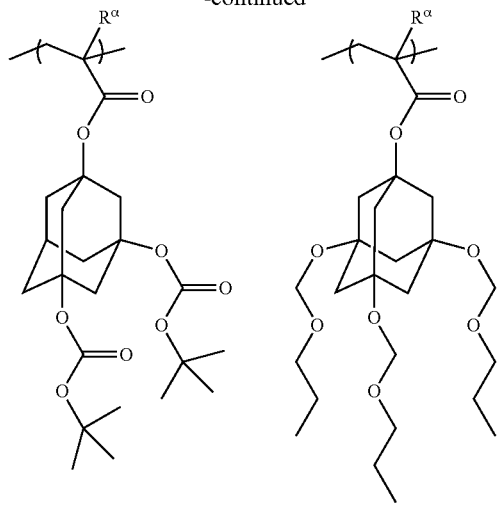

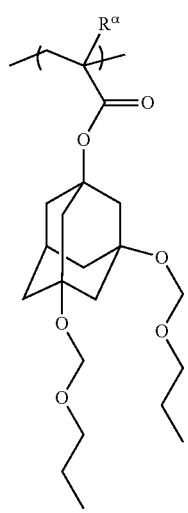

The structural unit (a1-1a) of the component (A1a) may be of one type or two or more types.

When the component (A1a) has the structural unit (a-1a), a proportion of the structural unit (a1-1a) in the component (A1a) is preferably 1 to 50 mol %, more preferably 5 to 45 mol %, and most preferably 5 to 30 mol % with respect to the total (100 mol %) of all structural units constituting the component (A1a).

When a proportion of the structural unit (a1-1a) is equal to or more than a lower limit a resist pattern can be easily obtained. In addition, when the proportion thereof is equal to or less than an upper limit, a balance with other structural units can be achieved.

<<Other Structural Units>>

The component (A1a) may have another structural unit other than the structural unit (a1) in addition to the above structural unit (a1).

Examples of the other structural unit include a structural unit (a0-2) in which a polymerizable group in the compound represented by the following general formula (a0-2-1) is converted into a main chain; a structural unit (a2) containing a lactone-containing cyclic group, an —SO$_2$— containing cyclic group or a carbonate-containing cyclic group (provided that those corresponding to the structural unit (a1) are excluded); a structural unit (a3) containing an aliphatic hydrocarbon group containing a polar group (provided that those corresponding to the structural unit (a1) or the structural unit (a2) are excluded); a structural unit (a9) represented by the following general formula (a9-1); a structural unit derived from styrene; a structural unit derived from a styrene derivative (provided that those corresponding to the structural unit (a0-2) are excluded); and a structural unit containing a non-acid dissociable aliphatic cyclic group.

Structural Unit (a0-2):

The component (A1a) may further have a structural unit (a0-2) in which a polymerizable group in a compound represented by the following general formula (a0-2-1) is converted into a main chain in addition to the above structural unit (a1).

[Chem. 34]

(a0-2-1)

[In the formula, $W^2$ represents a polymerizable group-containing group. $Wa^{x0}$ represents an $(n_{ax0}+1)$-valent aromatic cyclic group which may have a substituent. $Wa^{x0}$ may form a condensed ring with $W^2$. $n_{ax0}$ is an integer of 1 to 3.]

In the formula (a0-2-1), $W^2$ represents a polymerizable group-containing group. The polymerizable group-containing group for $W^2$ is the same polymerizable group-containing group for $W^1$ in the formula (a0-1a-1).

Preferable examples of $W^2$ include the group represented by the above chemical formula: $C(R^{X11})(R^{X12})=C(R^{X13})-Ya^{x0}-$.

In the chemical formula, $R^{X11}$, $R^{X12}$ and $R^{X13}$ each represent a hydrogen atom, an alkyl group having 1 to 5 carbon atoms or a halogenated alkyl group having 1 to 5 carbon atoms, and $Ya^{x0}$ represents a single bond or a bivalent linking group.

At $W^2$, $R^{X11}$ and $R^{X12}$ are preferably a hydrogen atom, an alkyl group having 1 to carbon atoms or a fluorinated alkyl group having 1 to 5 carbon atoms, and in terms of industrial availability, a hydrogen atom or a methyl group is more preferable, and a hydrogen atom is particularly preferable.

In addition, at $W^2$, $R^{X13}$ is preferably a hydrogen atom, an alkyl group having 1 to 5 carbon atoms or a fluorinated alkyl group having 1 to 5 carbon atoms, and in terms of industrial availability, a hydrogen atom or a methyl group is more preferable, and a hydrogen atom is most preferable.

$Ya^{x0}$ for $W^2$ is preferably an ester bond [—C(=O)—O—, —O—C(=O)—], an ether bond (—O—), a linear or branched alkylene group, or a combination thereof, or a single bond. Among these, an ester bond [—C(=O)—O—, —O—C(=O)—], a linear or branched alkylene group, or a combination thereof, or a single bond is more preferable, and an ester bond [—C(=O)—O—, —O—C(=O)—] or a single bond is particularly preferable.

In the formula (a0-2-1), $Wa^{x0}$ is an $(n_{ax0}+1)$-valent aromatic cyclic group which may have a substituent.

Examples of the aromatic cyclic group for $Wa^{x0}$ include a group in which $(n_{ax0}+1)$ hydrogen atoms have been removed from an aromatic ring. Here, the aromatic ring is not particularly limited as long as it is a cyclic conjugated compound having (4n+2) π-electrons and it may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms.

Examples of the aromatic ring include aromatic hydrocarbon rings, such as benzene, naphthalene, anthracene and phenanthrene; and aromatic hetero rings in which some of the carbon atoms constituting the aforementioned aromatic hydrocarbon rings have been substituted with a hetero atom Examples of the hetero atom within the aromatic hetero rings include an oxygen atom, a sulfur atom and a nitrogen atom. Specific examples of the aromatic hetero ring include a pyridine ring and a thiophene ring.

Examples of the substituent that $Wa^{x0}$ may have include a carboxy group, a halogen atom (such as, a fluorine atom, a chlorine atom, a bromine atom, and so on), an alkoxy group (such as, a methoxy group, an ethoxy group, a propoxy group, a butoxy group, and so on), and an alkyloxycarbonyl group.

In the formula (a0-2-1), $Wa^{x0}$ may form a condensed ring together with $W^2$.

When $W^2$ and $Wa^{x0}$ form a condensed ring, examples of the ring structure thereof include a condensed ring of an alicyclic hydrocarbon and an aromatic hydrocarbon. A condensed ring formed of $Wa^{x0}$ and $W^2$ may contain a hetero atom.

The part of the alicyclic hydrocarbon in the condensed ring formed of $W^2$ and $Wa^{x0}$ may be monocyclic or polycyclic.

Examples of the condensed ring formed of $W^2$ and $Wa^{x0}$ include a condensed ring formed of the polymerizable group at the $W^2$ site and $Wa^{x0}$, and a condensed ring formed of a group other than the polymerizable group at the $W^2$ site and $Wa^{x0}$.

The condensed ring formed of $W^2$ and $Wa^{x0}$ may have a substituent. Examples of the substituent include a methyl group, an ethyl group, a propyl group, a hydroxy group, a hydroxyalkyl group, a carboxy group, a halogen atom (such as, a fluorine atom, a chlorine atom, a bromine atom, and so on), an alkoxy group (such as, a methoxy group, an ethoxy group, a propoxy group, a butoxy group, and so on), an acyl group, an alkyloxycarbonyl group, and an alkyl carbonyloxy group.

Specific examples of the condensed ring formed of $W^2$ and $Wa^{x0}$ are shown below. $W^\alpha$ represents a polymerizable group. ** indicates a bond with a hydroxy group.

[Chem. 35]

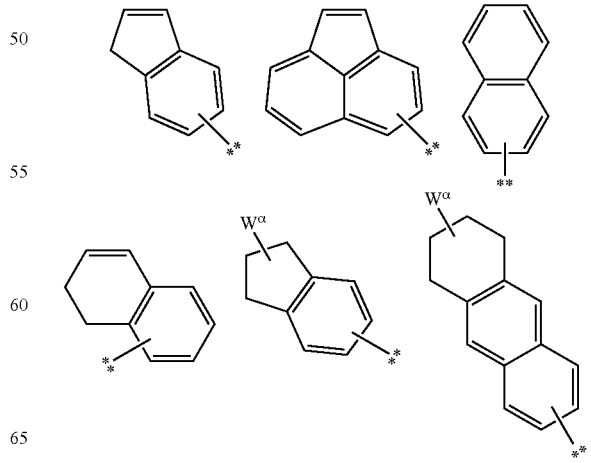

-continued

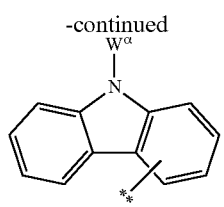

In the formula (a0-2-1), $n_{ax0}$ is an integer of 1 to 3, and is preferably 1 or 2, and more preferably 1.

Preferable examples of the structural unit (a0-2) include a structural unit represented by the following general formula (a0-2-u1).

[Chem. 36]

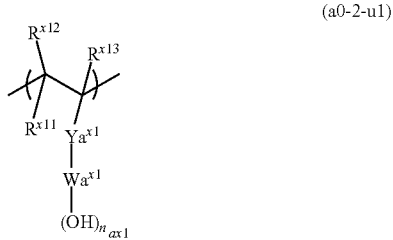

(a0-2-u1)

[In the formula, $R^{X11}$, $R^{X12}$ and $R^{X13}$ each independently represent a hydrogen atom, an alkyl group having 1 to 5 carbon atoms, or a halogenated alkyl group having 1 to 5 carbon atoms. $Ya^{x1}$ represents a single bond or a bivalent linking group. $Wa^{x1}$ represents an ($n_{ax1}$+1)-valent aromatic cyclic group which may have a substituent; provided that $Ya^{x1}$ and $Wa^{x1}$ may form a condensed ring, or $R^{X11}$, $Ya^{x1}$, and $Wa^{x1}$ may form a condensed ring. $n_{ax1}$ is an integer of 1 to 3.]

In the formula (a0-2-u1), $R^{X11}$, $R^{X12}$ and $R^{X13}$ each independently represent a hydrogen atom, an alkyl group having 1 to 5 carbon atoms or a halogenated alkyl group having 1 to 5 carbon atoms.

Description of the alkyl group having 1 to 5 carbon atoms for $R^{X11}$, $R^{X12}$ and $R^{X13}$ is the same as that of the halogenated alkyl group having 1 to 5 carbon atoms.

In the formula (a0-2-u1), $R^{X11}$ and $R^{X12}$ are preferably a hydrogen atom, an alkyl group having 1 to 5 carbon atoms or a fluorinated alkyl group having 1 to 5 carbon atoms, and in terms of industrial availability, and more preferably a hydrogen atom or a methyl group, and particularly preferably a hydrogen atom.

In the formula (a0-2-u1), $R^{XT3}$ is preferably a hydrogen atom, an alkyl group having 1 to 5 carbon atoms or a fluorinated alkyl group having 1 to 5 carbon atoms, and in terms of industrial availability, a hydrogen atom or a methyl group is particularly preferable.

In the formula (a0-2-u1), $Ya^{x1}$ represents a single bond or a bivalent linking group.

Suitable examples of the bivalent linking group for $Ya^{x1}$ include a bivalent hydrocarbon group which may have a substituent, and a bivalent linking group containing a hetero atom. Examples of the bivalent hydrocarbon group which may have a substituent and the bivalent linking group containing a hetero atom for $Ya^{x1}$ include the same as those provided for the bivalent linking group (a bivalent hydrocarbon group which may have a substituent and a bivalent linking group containing a hetero atom) for $Ya^{x0}$ described above.

Among these, $Ya^{x1}$ is preferably an ester bond [—C(=O)—O—, —O—C(=O)—], an ether bond (—O—), —C(=O)—NH—, a linear or branched alkylene group, or a combination thereof, or a single bond. Among these, an ester bond [—C(=O)—O—, —O—C(=O)—], a linear or branched alkylene group, or a combination thereof, or a single bond is more preferable, and an ester bond [—C(=O)—O—, —O—C(=O)—] or a single bond is particularly preferable.

In the formula (a0-2-u1), $Wa^{x1}$ represent an ($n_{ax1}$+1)-valent aromatic cyclic group which may have a substituent.

Description of the aromatic cyclic group for $Wa^{x1}$ is the same as that of $Wa^{x0}$ in the formula (a0-2-1).

Provided that, in the formula (a0-2-u1), $Ya^{x1}$ and $Wa^{x1}$ may form a condensed ring; or $R^{X11}$, $Ya^{x1}$, and $Wa^{x1}$ may form a condensed ring.

Description of such a condensed ring is the same as that of the condensed ring formed of $W^2$ and $Wa^{x0}$ described above (a condensed ring formed of the polymerizable group at the $W^2$ site and $Wa^{x0}$, and a condensed ring formed of a group other than the polymerizable group at the $W^2$ site and $Wa^{x0}$).

Specific examples when $R^{X11}$, $Ya^{x1}$ and $Wa^{x1}$ in the formula (a0-2-u1) form a condensed ring are shown below. ** indicates a bond with a hydroxy group.

[Chem. 37]

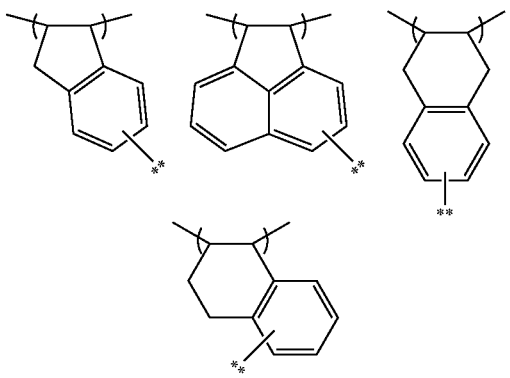

Specific examples when $Ya^{x1}$ and $Wa^{x1}$ in the formula (a0-2-u1) form a condensed ring are shown below. * indicates a bond with a carbon atom to which $R^{X13}$ is bonded which is a carbon atom consisting a main chain. ** indicates a bond with a hydroxy group.

[Chem. 38]

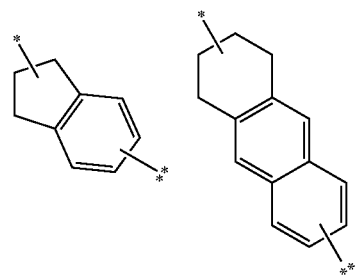

-continued

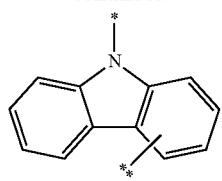

In the formula (a0-2-u1), $n_{ax1}$ is an integer of 1 to 3 and is preferably 1 or 2, and more preferably 1.

When $Y_{a}^{x1}$ and $W_{a}^{z1}$ do not form a condensed ring in die formula (a0-2-u1), a preferable example is a structural unit represented by the following general formula (a0-2-u1-1).

[Chem. 39]

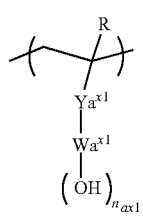

(a0-2-u1-1)

[In the formula, R represents a hydrogen atom, an alkyl group having 1 to 5 carbon atoms or a halogenated alkyl group having 1 to 5 carbon atoms. $Y_{a}^{x1}$ represents a single bond or a bivalent linking group. $W_{a}^{x1}$ represents an ($n_{ax1}$+1)-valent aromatic hydrocarbon group. $n_{ax1}$ is an integer of 1 to 3.]

In the formula (a0-2-u1-1), R represents a hydrogen atom, an alkyl group having 1 to 5 carbon atoms or a halogenated alkyl group having 1 to 5 carbon atoms.

The alkyl group having 1 to 5 carbon atoms for R is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms for R is a group in which some or all of the hydrogen atoms of the alkyl group having 1 to 5 carbon atoms are substituted with a halogen atom Examples of the halogen atom include a fluorine atom, a chlorine atom, a bromine atom, and an iodine atom, and a fluorine atom is particularly preferable.

R is preferably a hydrogen atom, an alkyl group having 1 to 5 carbon atoms or a fluorinated alkyl group having 1 to 5 carbon atoms, and in terms of industrial availability, a hydrogen atom or a methyl group is most preferable.

In the formula (a0-2-u1-1), $Y_{a}^{x1}$, $W_{a}^{x1}$, and $n_{ax1}$ are the same as $Y_{a}^{x1}$, $W_{a}^{x1}$, and $n_{ax1}$ in the formula (a0-2-u1-1), and preferable examples thereof are the same as those above.

Specific examples of the structural unit (a0-2) are shown below.

In the following formula, $R^{\alpha}$ represents a hydrogen atom, a methyl group or a trifluoromethyl group.

[Chem. 40]

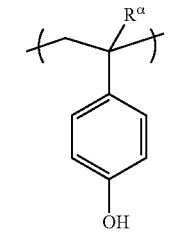
(a0-2-u01)

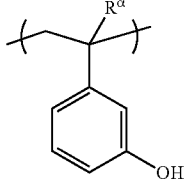
(a0-2-u02)

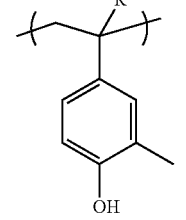
(a0-2-u03)

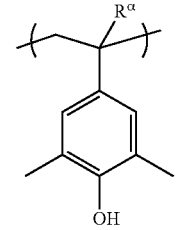
(a0-2-u04)

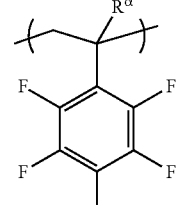
(a0-2-u05)

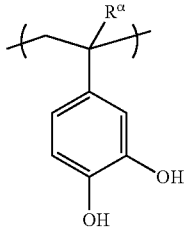
(a0-2-u06)

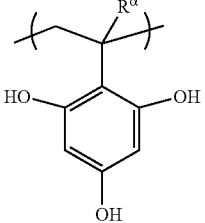
(a0-2-u07)

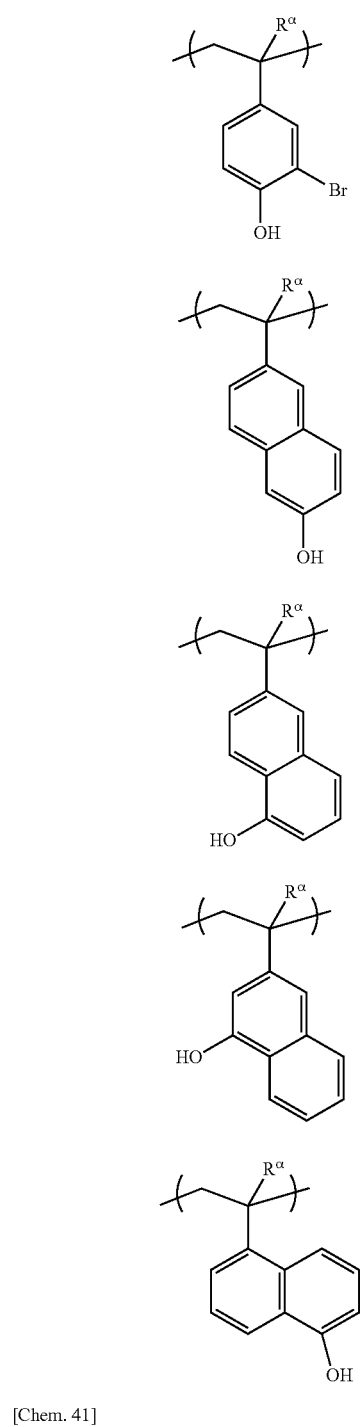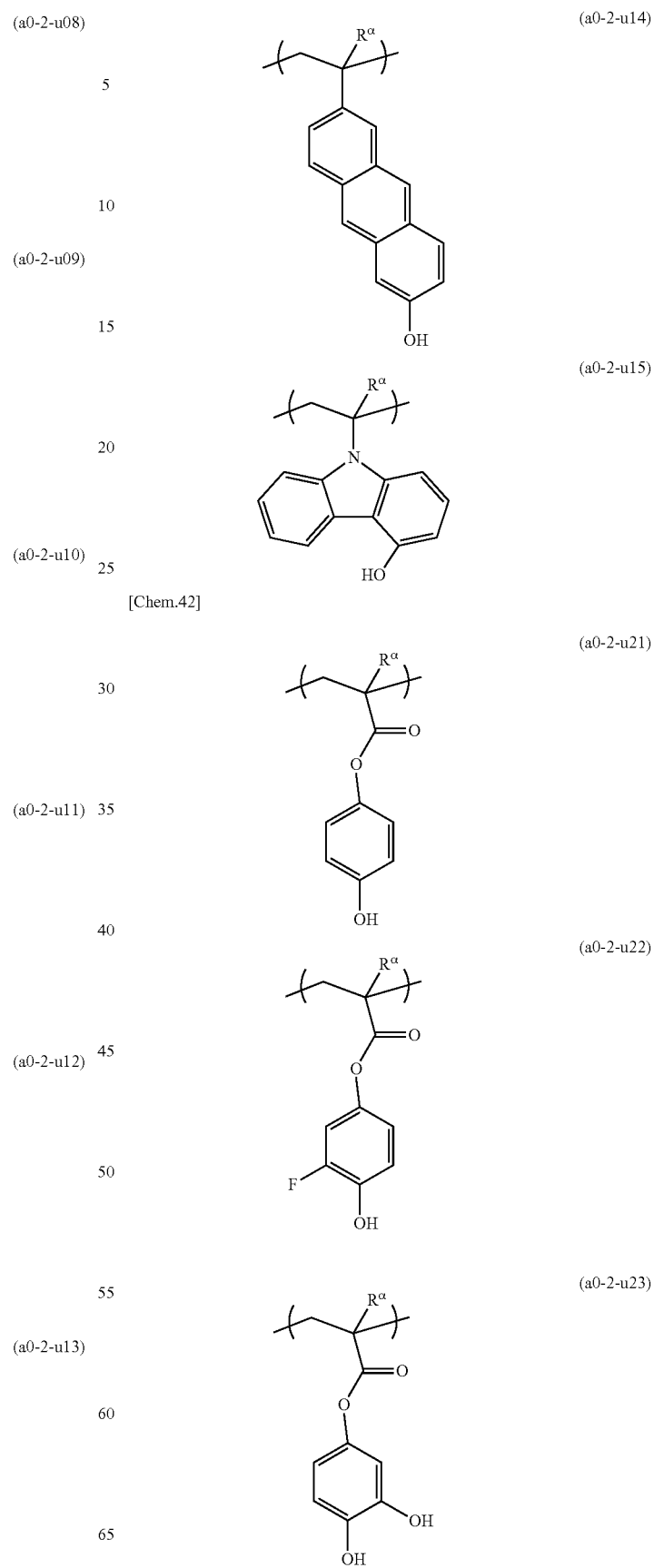

(a0-2-u24)
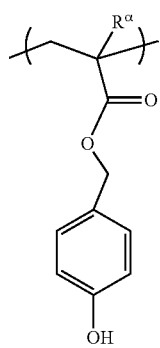
(a0-2-u25)
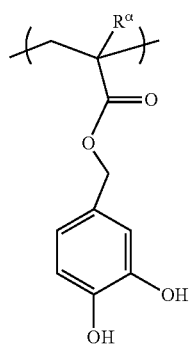
(a0-2-u26)
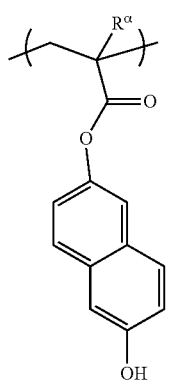
(a0-2-u27)
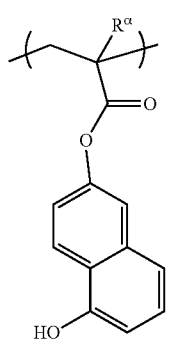
(a0-2-u28)
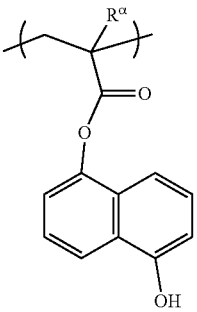
(a0-2-u29)
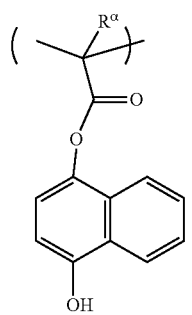
(a0-2-u30)
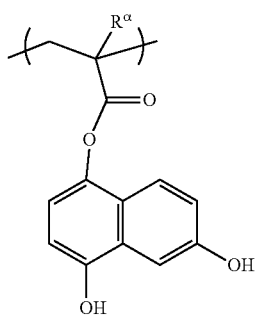
(a0-2-u31)
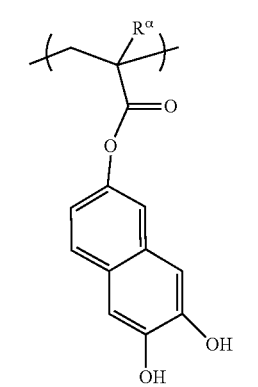
(a0-2-u32)
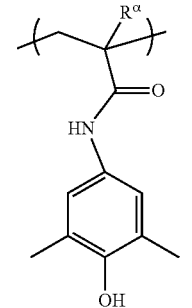

(a0-2-u33)

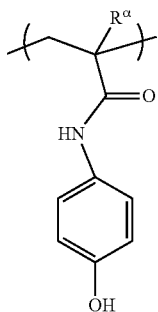

[Chem.43]

(a0-2-u41)

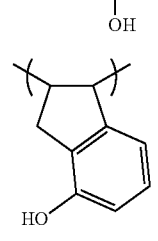

(a0-2-u42)

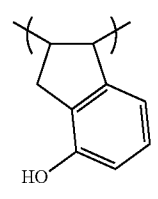

(a0-2-u43)

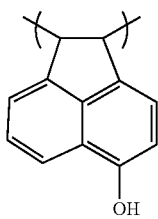

(a0-2-u44)

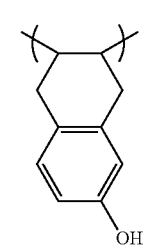

(a0-2-u45)

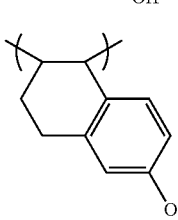

Among the above examples, the structural unit (a0-2) is preferably at least one selected from among the group consisting of structural units represented by the chemical formulae (a0-2-u01) to (a0-2-u15), chemical formulae (a0-2-u21) to (a0-2-u36), and chemical formulae (a0-2-u41) to (a0-2-u45).

Among these, die structural unit (a0-2) is particularly preferably at least one selected from among the group consisting of structural units represented by the chemical formulae (a0-2-u01) to (a0-2-u12), and chemical formulae (a0-2-u21) to (a0-2-u34).

The structural unit (a0-2) of the component (A1a) may be of one type or two or more types.

In the component (A1a), when a proportion of the structural unit (a0-2) is, for example, 0 to 80 mol %, preferably 10 to 80 mol %, more preferably 20 to 70 mol %, and particularly preferably 30 to 60 mol % with respect to the total (100 mol %) of all structural units constituting the component (A1a).

When a proportion of the structural unit (a0-2) is equal to or more than a lower limit of the preferable range, lithography properties such as sensitivity, resolution, and roughness are improved. In addition, when the proportion thereof is equal to or less than an upper limit, a balance with other structural units can be achieved and various lithography properties become favorable.

Structural Unit (a2):

The component (A1a) may further have a structural unit (a2) containing a lactone-containing cyclic group, an —SO$_2$— containing cyclic group or a carbonate-containing cyclic group (provided that those corresponding to the structural unit (a1) are excluded) in addition to the structural unit (a1) or the structural unit (a1) and the structural unit (a0-2).

When the component (A1a) is used to form a resist film, the lactone-containing cyclic group, the —SO$_2$— containing cyclic group or the carbonate-containing cyclic group of the structural unit (a2) is useful to improve the adhesion of the resist film to the substrate. In addition, when the structural unit (a2) is provided, for example, lithography properties and the like become favorable, according to effects of appropriately adjusting an acid diffusion length, improving adhesion of the resist film to the substrate, and appropriately adjusting the solubility during development.

The term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group for the structural unit (a2) is not particularly limited, and an arbitrary structural unit may be used. Specific examples thereof include groups represented by the following general formulae (a2-r-1) to (a2-r-7).

[Chem.44]

(a2-r-1)

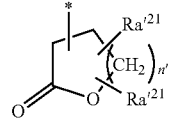

(a2-r-2)

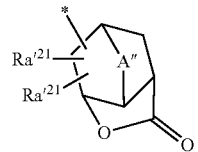

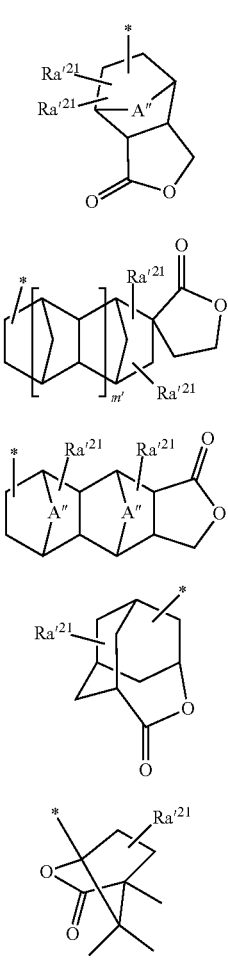

[In the formulae, each $Ra'^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom, an alkyl group, a lactone-containing cyclic group, a carbonate-containing cyclic group or an —SO$_2$— containing cyclic group; A" represents an oxygen atom (—O—), a sulfur atom (—S—) or an alkylene group of 1 to 5 carbon atoms which may contain an oxygen atom or a sulfur atom; n' is an integer of 0 to 2; and m' represents 0 or 1.]

In formulae (a2-r-1) to (a2-r-1) the alkyl group for $Ra'^{21}$ is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

Preferable examples of the alkoxy group for $Ra'^{21}$ include an alkoxy group having 1 to 6 carbon atoms. The alkoxy group is preferably linear or branched. Specifically, a group in which the alkyl group provided as an exemplary example of the alkyl group for $Ra'^{21}$ and an oxygen atom (—O—) are linked is an exemplary example.

Examples of the halogen atom for $Ra'^{21}$ include a fluorine atom, a chlorine atom, a bromine atom, and an iodine atom, and a fluorine atom is preferable.

Examples of the halogenated alkyl group for $Ra'^{21}$ include a group in which some or all of the hydrogen atoms of the alkyl group for $Ra'^{21}$ may be substituted with a halogen atom. The halogenated alkyl group is preferably a fluorinated alkyl group and particularly preferably a perfluoro alkyl group.

In —COOR", and —OC(=O)R" for $Ra'^{21}$, each R" is a hydrogen atom, an alkyl group, a lactone-containing cyclic group, a carbonate-containing cyclic group, or an —SO$_2$— containing cyclic group.

The alkyl group for R" may be linear, branched, or cyclic, and preferably has 1 to 15 carbon atoms.

When R" is a linear or branched alkyl group, it preferably has 1 to 10 carbon atoms, more preferably 1 to 5 carbon atoms, and particularly preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. Specific examples include groups in which one or more hydrogen atoms have been removed from a monocycloalkane or a poly cycloalkane such as a bicycloalkane, tricycloalkane or tetracycloalkane which may or may not be substituted with a fluorine atom or a fluorinated alkyl group. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecene.

Examples of the lactone-containing cyclic group for R" include groups represented by the aforementioned general formulae (a2-r-1) to (a2-r-7).

The carbonate-containing cyclic group for R" is the same as defined for the carbonate-containing cyclic group described later. Specific examples of the carbonate-containing cyclic group include groups represented by general formulae (ax3-r-1) to (ax3-r-3).

The —SO$_2$— containing cyclic group for R" is the same as defined for the —SO$_2$-containing cyclic group described later. Specific examples of the —SO$_2$— containing cyclic group include groups represented by general formulae (a5-r-1) to (a5-r-4).

The hydroxyalkyl group for $Ra'^{21}$ preferably has 1 to 6 carbon atoms, and specific examples thereof include the alkyl groups for $Ra'^{21}$ in which at least one hydrogen atom has been substituted with a hydroxy group.

In the general formulae (a2-r-2), (a2-r-3), and (a2-r-5), the alkylene group having 1 to 5 carbon atoms for A" is preferably a linear or branched alkylene group, and examples thereof include a methylene group, an ethylene group, an n-propylene group, and an isopropylene group. When the alkylene group contains an oxygen atom or a sulfur atom, specific examples thereof include a group in which —O— or —S— is provided at the terminals of the alkylene group or interposed between carbon atoms, for example, —O—CH$_2$—, —CH$_2$—O—CH$_2$—, —S—CH$_2$—, and —CH$_2$—S—CH$_2$—. A" is preferably an alkylene group having 1 to 5 carbon atoms or —O—, more preferably an alkylene group having 1 to 5 carbon atoms and most preferably a methylene group.

Specific examples of the groups represented by die general formulae (a2-r-1) to (a2-r-7) are shown below.

[Chem. 45]
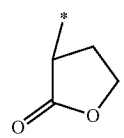 (r-lc-1-1)
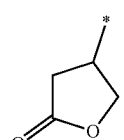 (r-lc-1-2)
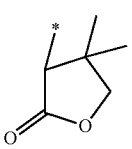 (r-lc-1-3)
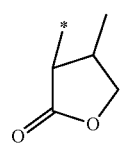 (r-lc-1-4)
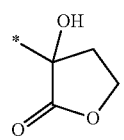 (r-lc-1-5)
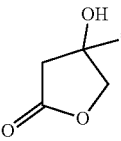 (r-lc-1-6)
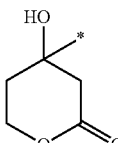 (r-lc-1-7)
 (r-lc-2-1)
 (r-lc-2-2)
-continued
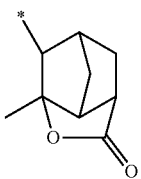 (r-lc-2-3)
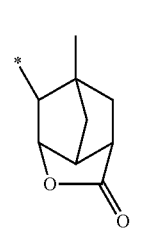 (r-lc-2-4)
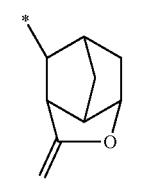 (r-lc-2-5)
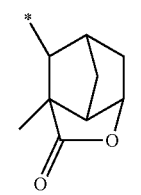 (r-lc-2-6)
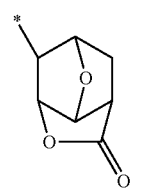 (r-lc-2-7)
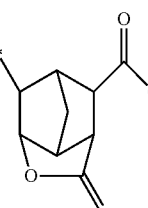 (r-lc-2-8)
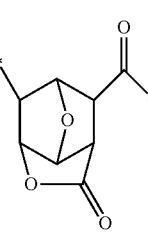 (r-lc-2-9)

(r-lc-2-10)
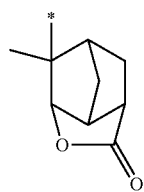
(r-lc-2-11)
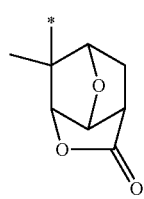
(r-lc-2-12)
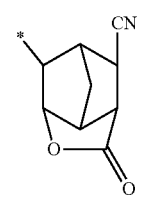
(r-lc-2-13)
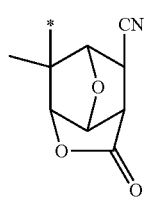
(r-lc-2-14)
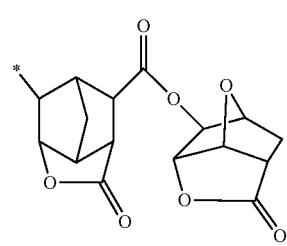
(r-lc-2-15)
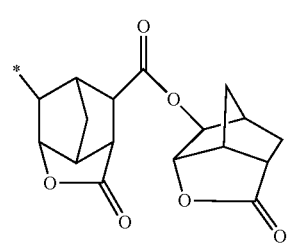
(r-lc-2-16)
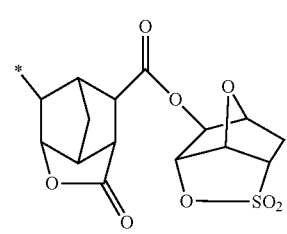
(r-lc-2-17)
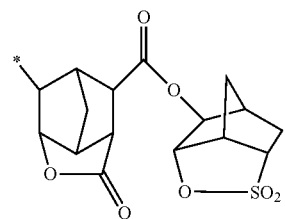
(r-lc-2-18)
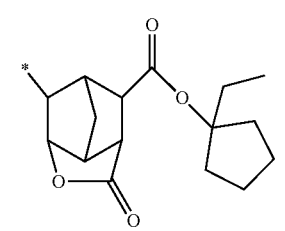
(r-lc-3-1)
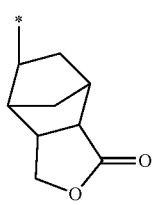
(r-lc-3-2)
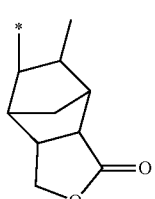
(r-lc-3-3)
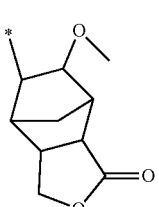
(r-lc-3-4)
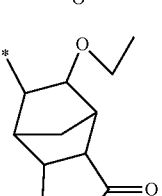
(r-lc-3-5)
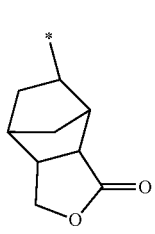

[Chem. 46]
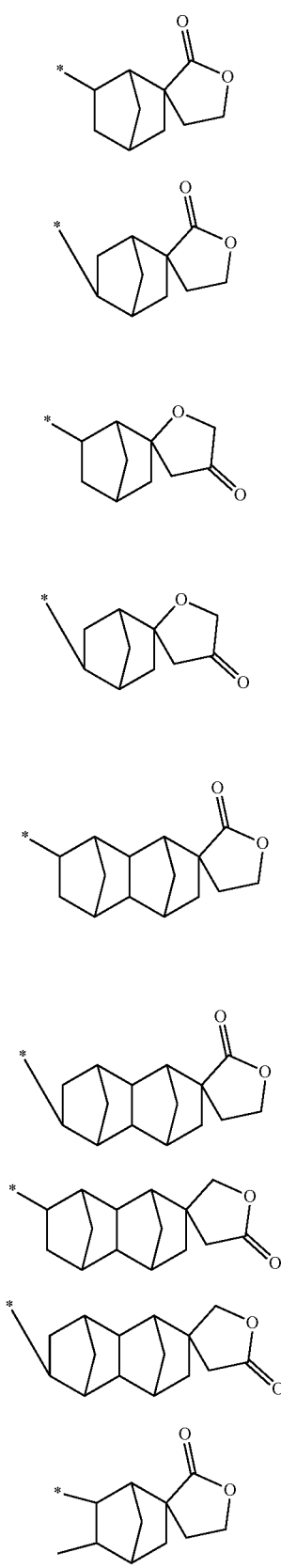
(r-lc-4-1)
(r-lc-4-2)
(r-lc-4-3)
(r-lc-4-4)
(r-lc-4-5)
(r-lc-4-6)
(r-lc-4-7)
(r-lc-4-8)
(r-lc-4-9)
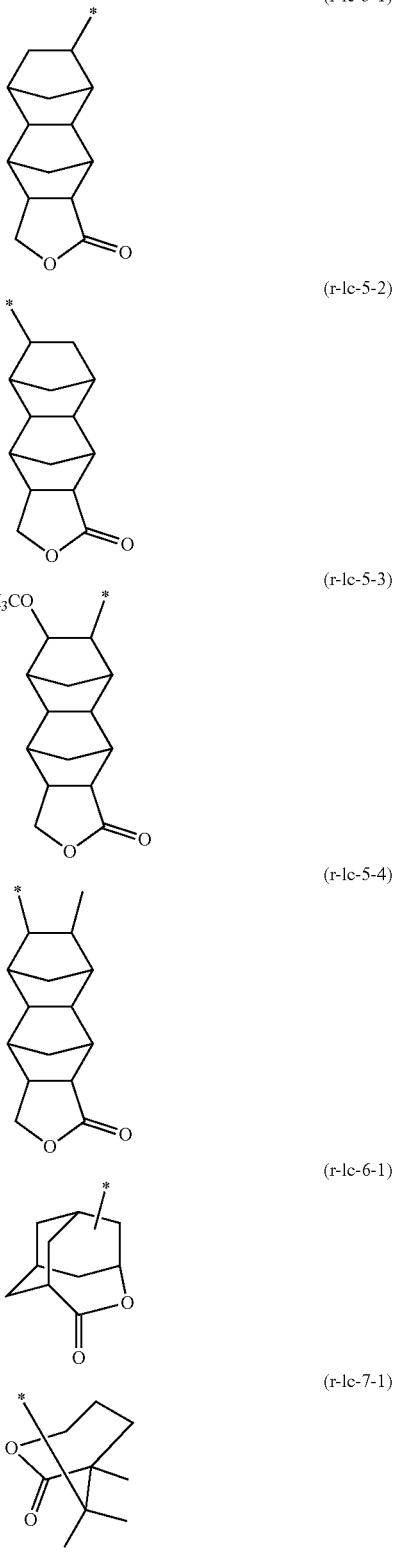
(r-lc-5-1)
(r-lc-5-2)
(r-lc-5-3)
(r-lc-5-4)
(r-lc-6-1)
(r-lc-7-1)
An "—$SO_2$— containing cyclic group" refers to a cyclic group having a ring containing —$SO_2$— within the ring structure thereof, i.e., a cyclic group in which the sulfur atom (S) within —$SO_2$— forms part of the ring framework of the cyclic group. The ring containing —$SO_2$— within the ring framework thereof is counted as the first ring. A cyclic group in which the only ring structure is the ring that contains —SO₂— in the ring framework thereof is referred to as a monocyclic group, and a group containing other ring structures is described as a polycyclic group regardless of the structure of the other rings. The —SO₂— containing cyclic group may be either a monocyclic group or a polycyclic group.

As the —SO₂— containing cyclic group, a cyclic group containing —O—SO₂— within the ring framework thereof, i.e., a cyclic group containing a sultone ring in which —O—S— within the —O—SO₂— group forms part of the ring framework thereof is particularly desirable.

More specific examples of the —SO₂— containing cyclic group include groups represented by general formulas (a5-r-1) to (a5-r-4) shown below.

[Chem. 47]

(a5-r-1)

(a5-r-2)

(a5-r-3)

(a5-r-4)

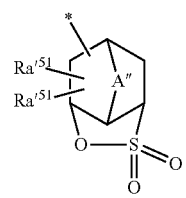
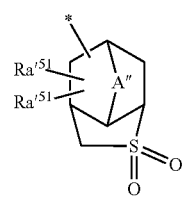
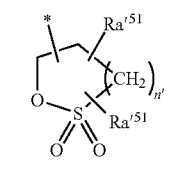
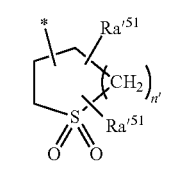

[In the formulae, each $Ra'^{51}$ independently represents a hydrogen atom, an alkyl group, an alkoxy group, a halogen atom, a halogenated alkyl group, a hydroxy group, —COOR″, —OC(=O)R″, a hydroxyalkyl group or a cyano group; R″ represents a hydrogen atom, an alkyl group, a lactone-containing cyclic group, a carbonate-containing cyclic group or an —SO₂— containing cyclic group; A″ represents an oxygen atom, a sulfur atom or an alkylene group of 1 to 5 carbon atoms which may contain an oxygen atom or a sulfur atom; and n′ is an integer of 0 to 2.]

In general formulae (a5-r-1) and (a5-r-2), A″ is the same as defined for A″ in general formulae (a2-r-2), (a2-r-3) and (a2-r-5).

Examples of the alkyl group, alkoxy group, halogen atom, halogenated alkyl group, —COOR″, —OC(=O)R″ and hydroxyalkyl group for $Ra'^{51}$ include the same groups as those described above in the explanation of $Ra'^{21}$ in the general formulae (a2-r-1) to (a2-r-7). Specific examples of the groups represented by the aforementioned general formulae (a5-r-1) to (a5-r-4) are shown below. In the formulae shown below, "Ac" represents an acetyl group.

[Chem. 48]

(r-sl-1-1)

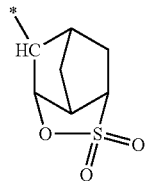

(r-sl-1-2)

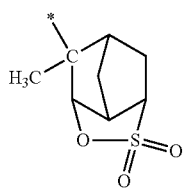

(r-sl-1-3)

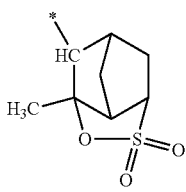

(r-sl-1-4)

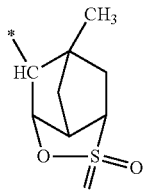

(r-sl-1-5)

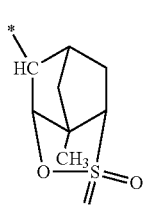

(r-sl-1-6)

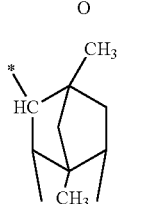

(r-sl-1-7)

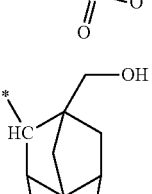

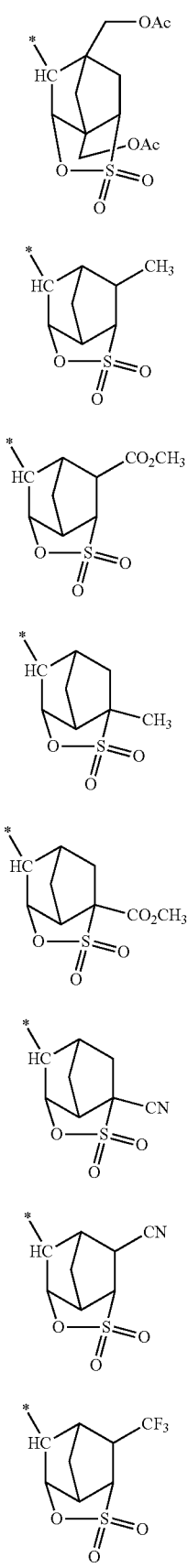
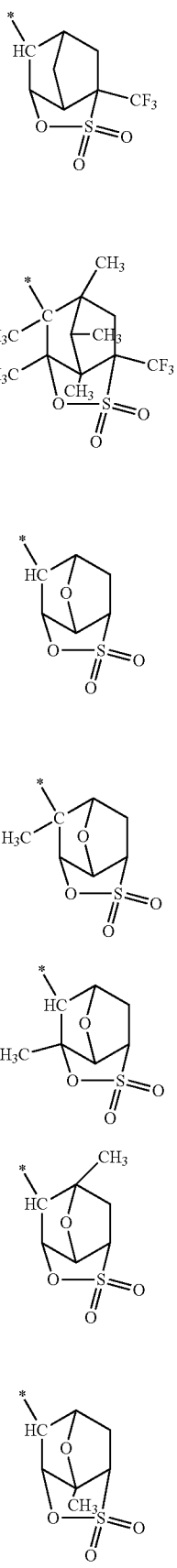

-continued (r-s1-1-23) 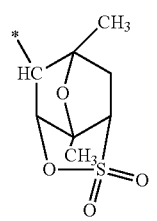

(r-s1-1-24) 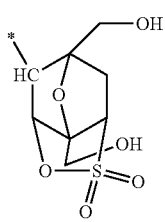

(r-s1-1-25) 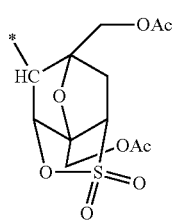

(r-s1-1-26) 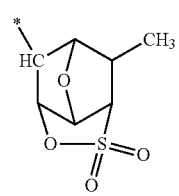

(r-s1-1-27) 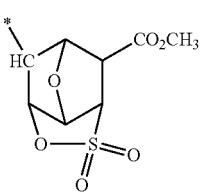

(r-s1-1-28) 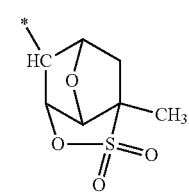

(r-s1-1-29) 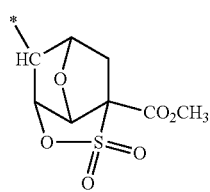

(r-s1-1-30) 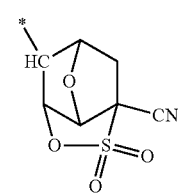

-continued (r-s1-1-31) 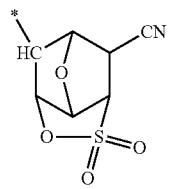

(r-s1-1-32) 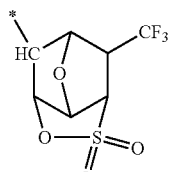

(r-s1-1-33) 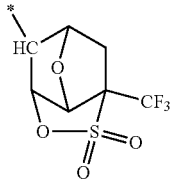

[Chem. 50]

(r-s1-2-1) 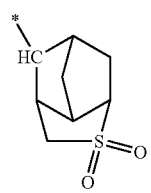

(r-s1-2-2) 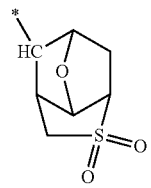

(r-s1-3-1) 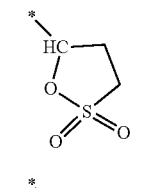

(r-s1-4-1) 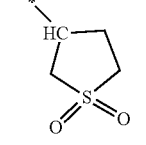

The term "carbonate-containing cyclic group" refers to a cyclic group including a ring containing a —O—C(=O)—O— structure (carbonate ring). The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group is not particularly limited, and an arbitrary group may be used. Specific examples include groups represented by general formulae (ax3-r-1) to (ax3-r-3) shown below.

[Chem. 51]

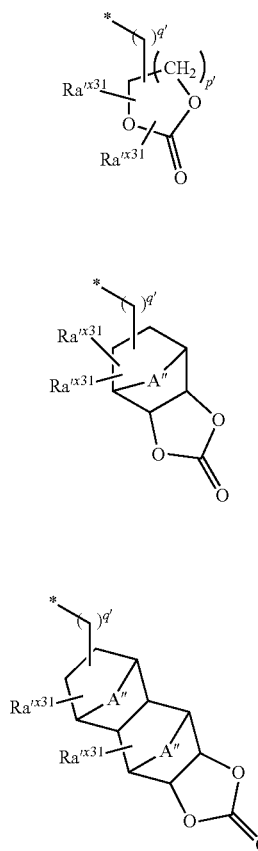

(ax3-r-1)

(ax3-r-2)

(ax3-r-3)

[In the formulae, each $Ra'^{x31}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom, an alkyl group, a lactone-containing cyclic group, a carbonate-containing cyclic group or an —$SO_2$— containing cyclic group; A" represents an oxygen atom, a sulfur atom or an alkylene group of 1 to 5 carbon atoms which may contain an oxygen atom or a sulfur atom; p' is an integer of 0 to 3; and q' represents 0 or 1.]

In general formulae (ax3-r-2) and (ax3-r-3), A" is the same as defined for A" in general formulae (a2-r-2), (a2-r-3) and (a2-r-5).

Examples of the alkyl group, alkoxy group, halogen atom, halogenated alkyl group, —COOR", —OC(=O)R" and hydroxyalkyl group for $Ra'^{31}$ include the same groups as those described above in the explanation of $Ra'^{21}$ in the general formulas (a2-r-1) to (a2-r-7).

Specific examples of the groups represented by the aforementioned general formulae (ax3-r-1) to (ax3-r-3) are shown below.

[Chem. 52]

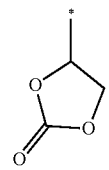

(r-cr-1-1)

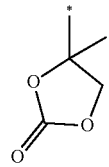

(r-cr-1-2)

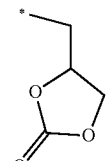

(r-cr-1-3)

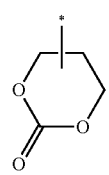

(r-cr-1-4)

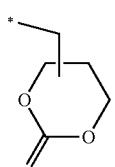

(r-cr-1-5)

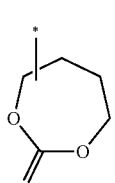

(r-cr-1-6)

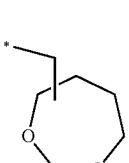

(r-cr-1-7)

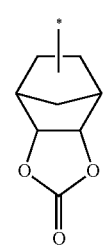

(r-cr-2-1)

(r-cr-2-2)
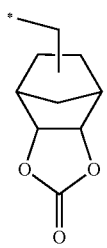

(r-cr-2-3)
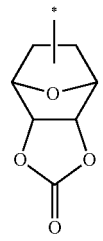

(r-cr-2-4)
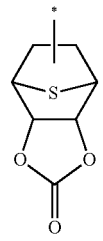

(r-cr-3-1)
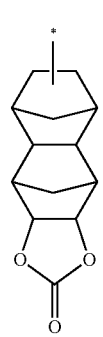

(r-cr-3-2)
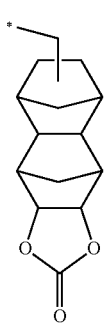

(r-cr-3-3)
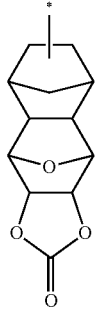

(r-cr-3-4)
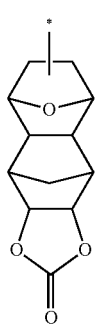

(r-cr-3-5)

As the structural unit (a2), a structural unit derived from an acrylate ester which may have the hydrogen atom bonded to a carbon atom at the α-position substituted with a substituent is preferable.

The structural unit (a2) is preferably a structural unit represented by general formula (a2-1) shown below.

[Chem. 53]

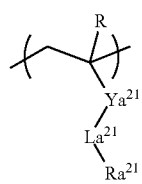

(a2-1)

[In the formula, R represents a hydrogen atom, an alkyl group of 1 to 5 carbon atoms or a halogenated alkyl group of 1 to 5 carbon atoms; $Ya^{21}$ represents a single bond or a divalent linking group; $La^{21}$ represents —O—, —COO—, —CON(R')—, —OCO—, —CONHCO— or —CONHCS—; and R' represents a hydrogen atom or a methyl group; provided that, when $La^{21}$ represents —O—, Ya$^{21}$ does not represent —CO—; and Ra$^{21}$ represents a lactone-containing cyclic group, a carbonate-containing cyclic group or an —SO$_2$— containing cyclic group.]

In the formula (a2-1), R is the same as defined above. As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the formula (a2-1), the bivalent linking group for Ya$^{21}$ is not particularly limited, and preferable examples thereof include a bivalent hydrocarbon group which may have a substituent and a bivalent linking group containing a hetero atom. Description of a bivalent hydrocarbon group which may have a substituent and a bivalent linking group containing a hetero atom for Ya$^{21}$ is the same as that of the bivalent linking group for Ya$^{x0}$ described above (a bivalent hydrocarbon group which may have a substituent and a bivalent linking group containing a hetero atom).

Ya$^{21}$ is preferably a single bond, an ester bond [—C(=O)—O—], an ether bond (—O—), a linear or branched alkylene group, or a combination thereof.

In the formula (a2-1), Ra$^{21}$ represents a lactone-containing cyclic group, an —SO$_2$— containing cyclic group or a carbonate-containing cyclic group.

Preferable examples of the lactone-containing cyclic group, the —SO$_2$— containing cyclic group and the carbonate-containing cyclic group for Ra$^{21}$ include groups represented by general formulae (a2-r-1) to (a2-r-7), groups represented by general formulae (a5-r-1) to (a5-r-4) and groups represented by general formulae (ax3-r-1) to (ax3-r-3).

Among the above examples, a lactone-containing cyclic group or a —SO$_2$— containing cyclic group is preferable, and a group represented by general formula (a2-r-1), (a2-r-2), (a2-r-6) or (a5-r-1) is more preferable. Specifically, a group represented by any of chemical formulae (Hc-1-1) to (Mc-1-7), (r-1c-2-1) to (r-1c-2-18), (Hc-6-1), (r-s1-1-1) and (r-s1-1-18) is still more preferable.

The structural unit (a2) of the component (A1a) may be of one type or two or more types.

When the component (A1a) has the structural unit (a2), a proportion of the structural unit (a2) is preferably 1 to 50 mol %, more preferably 5 to 45 mol %, still more preferably 10 to 40 mol %, and particularly preferably 10 to 30 mol % with respect to the total (100 mol %) of all structural units constituting the component (A1a).

When the proportion of the structural unit (a2) is equal to or more than a preferable lower limit, according to the above effects, an effect obtained by die inclusion of the structural unit (a2) is sufficiently obtained, and when the proportion thereof is equal to or less than an upper limit, a balance with other structural units can be achieved, and various lithography properties become favorable.

Structural Unit (a3):

The component (A1a) may further have a structural unit (a3) containing a polar group-containing aliphatic hydrocarbon group (provided that those corresponding to the structural unit (a1) or structural unit (a2) are excluded) in addition to the structural unit (a1) or in addition to the structural unit (a1) and the structural unit (a0-2). When the component (A1a) has the structural unit (a3), the hydrophilicity of the component (A) is improved, which contributes to improvement of the resolution. In addition, the acid diffusion length can be appropriately adjusted.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of die aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a poly cycloalkane such as adamantane, norbornane, isobornane, tricyclodecane or tetracyclododecene. Of these polycyclic groups, groups in which two or more hydrogen atoms have been removed from adamantane, norbornane or tetracyclododecene are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to a carbon atom at the α-position substituted with a substituent and contains a polar group-containing aliphatic hydrocarbon group.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid.

On the other hand, in the structural unit (a3), when the hydrocarbon group within the polar group-containing aliphatic hydrocarbon group is a polycyclic group, structural units represented by formulas (a3-1), (a3-2), and (a3-3) shown below are preferable.

[Chem. 54]

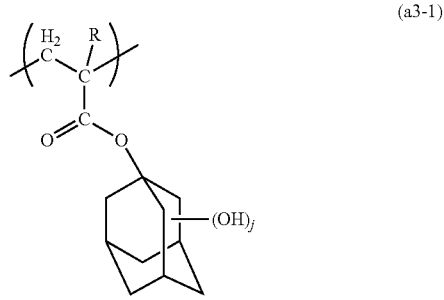

(a3-1)

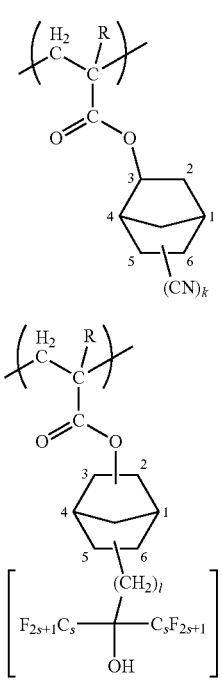

(a3-2)

(a3-3)

[In the formulas, R is the same as defined above; j is an integer of 1 to 3; k is an integer of 1 to 3; V is an integer of 1 to 3; 1 is an integer of 1 to 5; and s is an integer of 1 to 3.]

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to die 3rd position of die adamantyl group.

In formula (a3-2), k is preferably 1. The cyano group is preferably bonded to the 5th or 6th position of the norbornyl group.

In formula (a3-3), V is preferably 1.1 is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

The structural unit (a3) of the component (A1a) may be of one type or two or more types.

When the component (A1a) has the structural unit (a3), a proportion thereof is preferably 1 to 40 mol %, more preferably 2 to 30 mol %, still more preferably 5 to 25 mol %, and particularly preferably 5 to 20 mol % with respect to the total of all structural units constituting the component (A1a).

When the proportion of the structural unit (a3) is equal to or more than a preferable lower limit, according to the above effects, an effect obtained by die inclusion of the structural unit (a3) is sufficiently obtained, and when the proportion thereof is equal to or less than a preferable upper limit, a balance with other structural units can be achieved, and various lithography properties become favorable.

Structural Unit (a9):

The component (A1a) may further have a structural unit (a9) represented by the following general formula (a9-1) in addition to the structural unit (a1) or in addition to the structural unit (a1) and the structural unit (a0-2).

[Chem. 55]

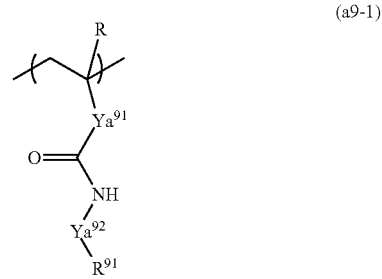

(a9-1)

[In the formula, R represents a hydrogen atom, an alkyl group of 1 to 5 carbon atoms or a halogenated alkyl group of 1 to 5 carbon atoms; $Ya^{91}$ represents a single bond or a divalent linking group; $Ya^{92}$ represents a divalent linking group; and $R^{91}$ represents a hydrocarbon group which may have a substituent.]

In the general formula (a9-1), R is the same as defined above.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the formula (a9-1), examples of the bivalent linking group for $Ya^{91}$ include the same as those provided for the bivalent linking group (a bivalent hydrocarbon group which may have a substituent and a bivalent linking group containing a hetero atom) for $Ya^{x0}$ described above. Among these, $Ya^{91}$ is preferably a single bond.

In the formula (a9-1), examples of the bivalent linking group for $Ya^{92}$ include the same as those provided for the bivalent linking group (a bivalent hydrocarbon group which may have a substituent and a bivalent linking group containing a hetero atom) for $Ya^{x0}$ described above.

In the bivalent linking group for $Ya^{92}$, the bivalent hydrocarbon group which may have a substituent is preferably a linear or branched aliphatic hydrocarbon group.

In addition, in die bivalent linking group for $Ya^{92}$, examples of the bivalent linking group containing a hetero atom include —O—, —C(=O)—O—, —C(=O)—, —O—C(=O)—O—, —C(=O)—NH—, —NH—, —NH—C(=NH)— (H may be substituted with a substituent such as an alkyl group or an acyl group), —S—, —S(=O)$_2$—, —S(=O)$_2$—O—, —C(=S)—, a group represented by the general formula —$Y^{21}$—O—$Y^{22}$—, —$Y^{21}$—O—, —$Y^{21}$—C(=O)—O—, —C(=O)—O—$Y^{21}$, [$Y^{21}$—C(=O)—O]$_{m'}$, —$Y^{22}$— or —$Y^{21}$—O—C(=O)—$Y^{22}$— [In the formula, $Y^{21}$ and $Y^{22}$ each independently represent a bivalent hydrocarbon group which may have a substituent, O represents an oxygen atom, and m' is an integer of 0 to 3.]. Among these, —C(=O)— or —C(=S)— is preferable.

In general formula (a9-1), examples of the hydrocarbon group for $R^{91}$ include an alkyl group, a monovalent alicyclic hydrocarbon group, an aryl group and an aralkyl group.

The alkyl group for $R^{91}$ preferably has 1 to 8 carbon atoms, more preferably 1 to 6 carbon atoms, and still more preferably 1 to 4 carbon atoms. The alkyl group may be linear or branched. Specific examples of preferable alkyl groups include a methyl group, an ethyl group, a propyl group, a butyl group, a hexyl group and an octyl group.

The monovalent alicyclic hydrocarbon group for $R^{91}$ preferably has 3 to 20 carbon atoms, more preferably 3 to 12 carbon atoms, and may be polycyclic or monocyclic. The monocyclic alicyclic hydrocarbon group is preferably a group in which one or more hydrogen atoms have been removed from a monocycloalkane. The monocycloalkane preferably has 3 to 6 carbon atoms, and specific examples thereof include cyclobutane, cyclopentane, and cyclohexane. The polycyclic alicyclic hydrocarbon group is preferably a group in which one or more hydrogen atoms have been removed from a poly cycloalkane, and the poly cycloalkane preferably has 7 to 12 carbon atoms, and specific examples thereof include adamantane, norbornane, isobornane, tricyclodecane, and tetracyclododecene.

The aryl group for $R^{91}$ preferably has 6 to 18 carbon atoms, and more preferably 6 to 10 carbon atoms. Specifically, a phenyl group is particularly desirable.

As the aralkyl group for $R^{91}$, an aralkyl group in which an alkylene group having 1 to 8 carbon atoms has been bonded to the aforementioned "aryl group for $R^{91}$" is preferable, an aralkyl group in which an alkylene group of 1 to 6 carbon atoms has been bonded to the aforementioned "aryl group for $R^{91}$" is more preferable, and an aralkyl group in which an alkylene group having 1 to 4 carbon atoms has been bonded to the aforementioned "aryl group for $R^{91}$" is most preferable.

The hydrocarbon group for $R^{91}$ preferably has some or all of the hydrogen atoms within the hydrocarbon group substituted with fluorine, and the hydrocarbon group more preferably has 30 to 100% of the hydrogen atoms substituted with fluorine. Among these, a perfluoroalkyl group in which all of the hydrogen atoms within the alkyl group have been substituted with fluorine atoms is particularly desirable.

The hydrocarbon group for $R^{91}$ may have a substituent. Examples of the substituent include a halogen atom, an oxo group (=O), a hydroxy group (—OH), an amino group (—NH$_2$) and —SO$_2$—NH$_2$. Further, part of the carbon atoms constituting the hydrocarbon group may be substituted with a substituent containing a hetero atom Examples of the substituent containing a hetero atom include —O—, —NH—, —N=, —C(=O)—O—, —S—, —S(=O)$_2$— and —S(=O)$_2$—O—.

As the hydrocarbon group for $R^{91}$, examples of the hydrocarbon group having a substituent include lactone-containing cyclic groups represented by the aforementioned general formulae (a2-r-1) to (a1-r-1).

Further, as $R^{91}$, examples of the hydrocarbon group having a substituent include —SO$_2$— containing cyclic groups represented by general formulae (a5-r-1) to (a5-r-4); and substituted aryl groups and monocyclic heterocyclic groups represented by chemical formulae shown below.

[Chem. 56]

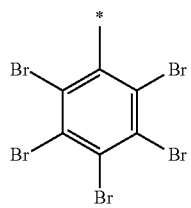
(r-ar-1)

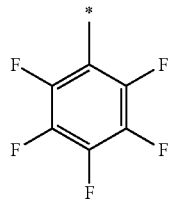
(r-ar-2)

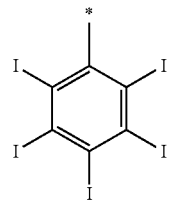
(r-ar-3)

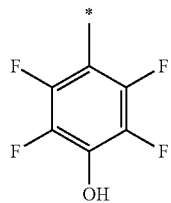
(r-ar-4)

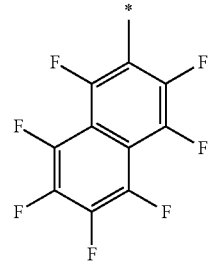
(r-ar-5)

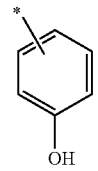
(r-ar-6)

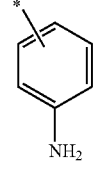
(r-ar-7)

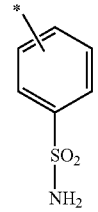
(r-ar-8)

(r-hr-1) 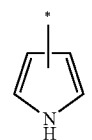

(r-hr-2) 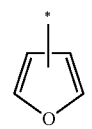

(r-hr-3) 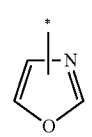

(r-hr-4) 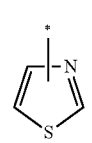

(r-hr-5) 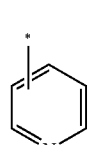

(r-hr-6) 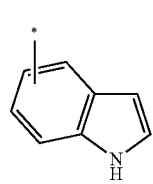

(r-hr-7) 

(r-hr-8) 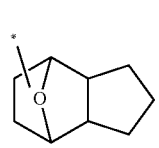

(r-hr-9) 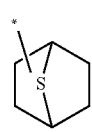

(r-hr-10) 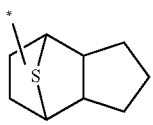

(r-hr-11) 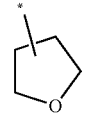

(r-hr-12) 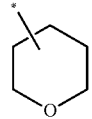

(r-hr-13) 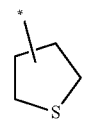

(r-hr-14) 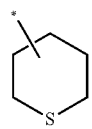

(r-hr-15) 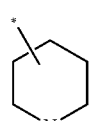

(r-hr-16) 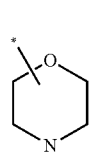

As the structural unit (a9), a structural unit represented by general formula (a9-1) shown below is preferable.

[Chem. 57]

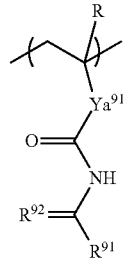

(a9-1-1)

[In the formula, R is the same as defined above; $Ya^{91}$ represents a single bond or a divalent linking group; $R^{91}$ represents a hydrocarbon group optionally having a substituent; and $Ya^{92}$ represents an oxygen atom or a sulfur atom.]

In the general formula (a9-1-1), descriptions of $Ya^{91}$, $R^{91}$, and R are the same as above. In addition, $R^{92}$ represents an oxygen atom or a sulfur atom.

Specific examples of the structural unit represented by the formula (a9-1) or general formula (a9-1-1) are shown below. In the following formula, $R^{\alpha}$ represents a hydrogen atom, a methyl group or a trifluoromethyl group.

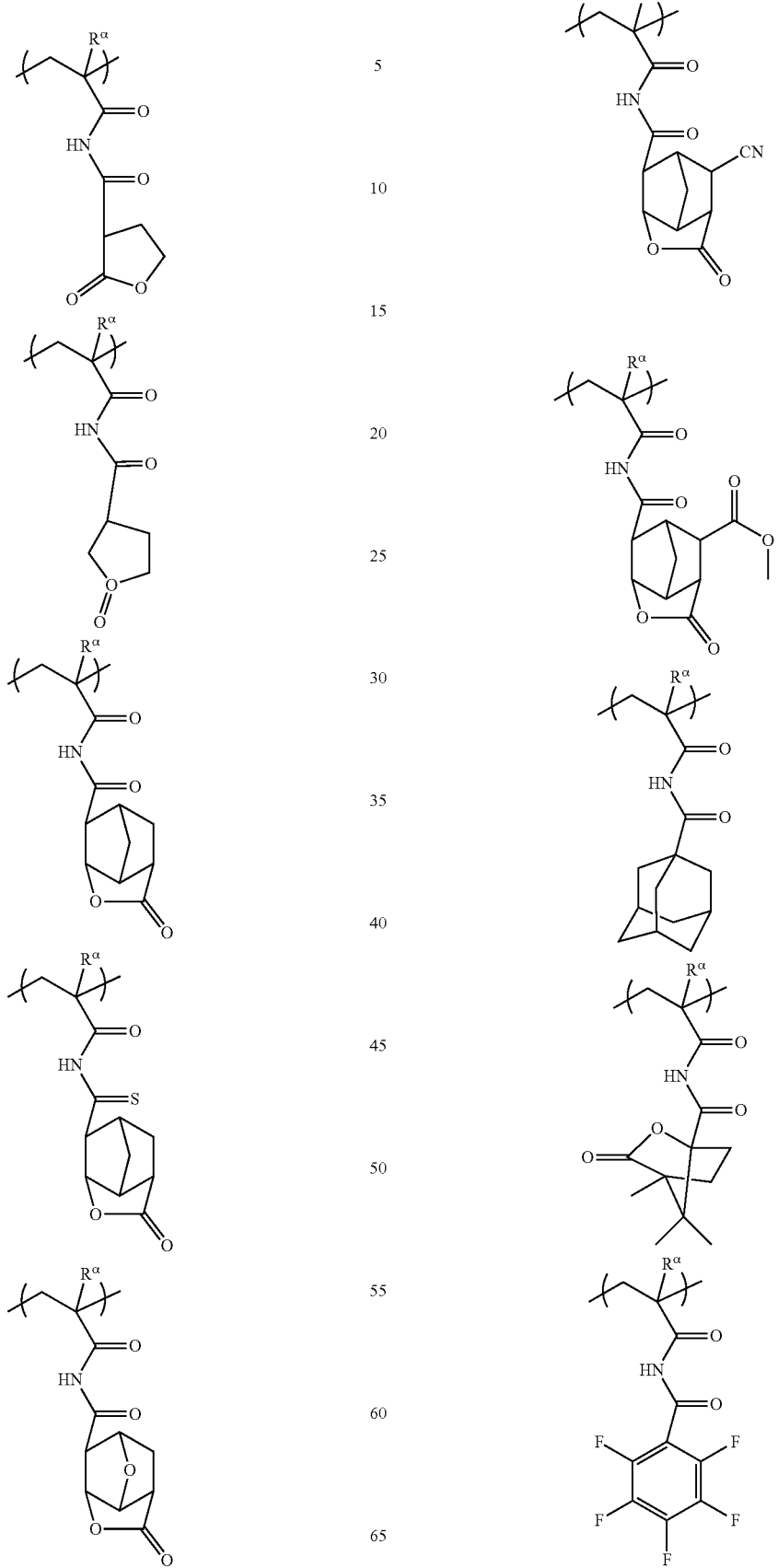

99
-continued
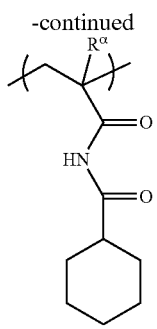
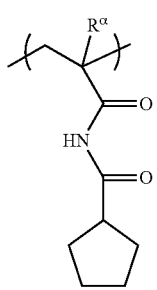
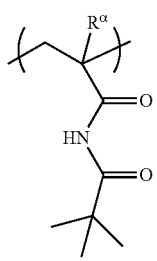
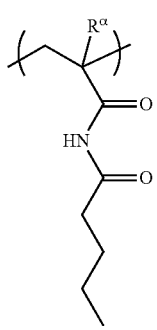
[Chem. 59]
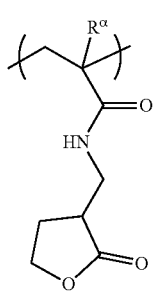
100
-continued
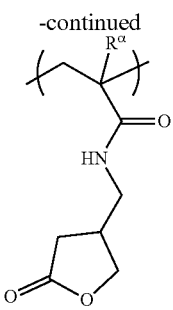
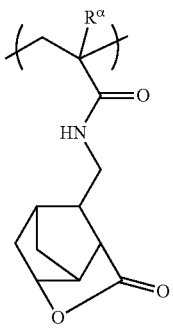
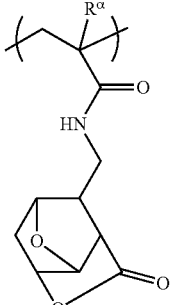
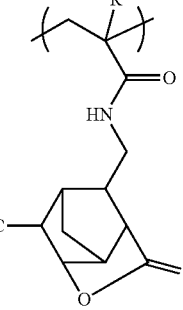
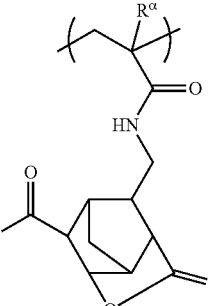

[Chem. 60]

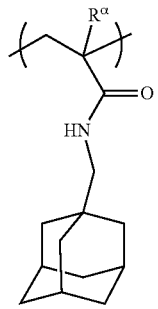

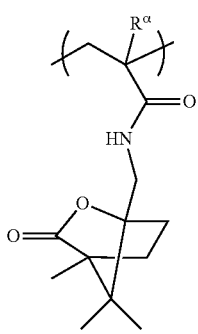

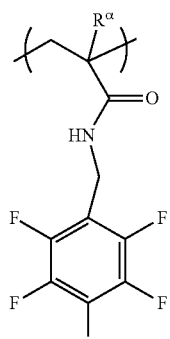

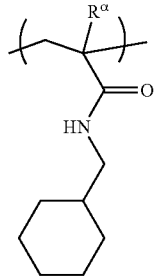

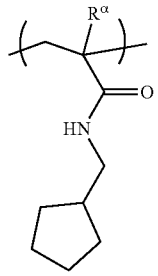

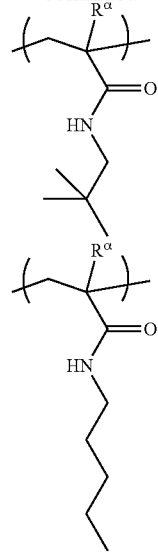

The structural unit (a9) of the component (A1a) may be of one type or two or more types.

When the component (A1a) has the structural unit (a9), a proportion of the structural unit (a9) is preferably 1 to 40 mol %, more preferably 3 to 30 mol %, still more preferably 5 to 25 mol %, and particularly preferably 10 to 20 mol % with respect to the total (100 mol %) of all structural units constituting the component (A1a).

When the proportion of the structural unit (a9) is equal to or more than a lower limit for example, effects of appropriately adjusting an acid diffusion length, improving the adhesion of the resist film to the substrate, appropriately adjusting the solubility during development, and improving etching resistance are obtained, and when the proportion thereof is equal to or less than an upper limit, a balance with other structural units can be achieved, and various lithography properties become favorable.

In the resist composition, one type of the component (A1a) may be used alone or two or more thereof may be used in combination.

In the resist composition of the present embodiment, the resin component as the component (A1a) has the structural unit (a0-1), and one type of a polymer may be used alone or two or more types thereof may be used in combination.

For example, preferable examples of the component (A1a) include those containing a copolymer having the structural unit (a1), and as necessary, other structural units (hereinafter this copolymer will be referred to as a "component (A1a-1)").

Examples of the preferable component (A1a-1) include a high-molecular-weight compound having a repeating structure of the structural unit (a0-1a) and the structural unit (a2), and a high-molecular-weight compound having a repeating structure of the structural unit (a0-1a) and the structural unit (a0-2).

In addition to the combination of the above two structural units, as additional third or three or more structural units, the structural units described above may be appropriately combined according to a desired effect. Examples of a preferable third structural unit include a structural unit (a2), a structural unit (a3) and a structural unit (a0-2).

The component (A1a) can be produced by dissolving monomers deriving structural units in a polymerization solvent, and adding a radical polymerization initiator, for example, azobisisobutyronitrile (AIBN), or dimethyl azobisisobutyrate (for example, V-601) thereto for polymerization. Alternatively, the component (A1a) can be produced by dissolving a monomer that derives a structural unit (a0-1) and as necessary, a precursor monomer (a monomer with a protected functional group) that derives a structural unit other than the structural unit (a0-1) in a polymerization solvent, adding the above radical polymerization initiator thereto for polymerization, and then causing a deprotection reaction. Here, in the polymerization, for example, a chain transfer agent such as HS—$CH_2$—$CH_2$—$CH_2$—$C(CF_3)_2$—OH may be used in combination to introduce a —$C(CF_3)_2$—OH group at the terminal. In this manner, a copolymer in which a hydroxyalkyl group in which some of hydrogen atoms of the alkyl group are substituted with a fluorine atom is introduced is effective in reducing developing defects and LER (line edge roughness: un-uniform unevennesses of line side walls).

The mass average molecular weight (Mw) (in terms of polystyrene standards according to gel permeation chromatography (GPC)) of the component (A1a) is not particularly limited, and is preferably 1,000 to 50,000, more preferably 2,000 to 30,000, and most preferably 3,000 to 20,000.

When Mw of the component (A1a) is equal to or less than an upper limit of this preferable range, the solubility in a resist solvent is sufficient for use as a resist, and when Mw of the component (A1a) is equal to or more than a lower limit of this preferable range, the dry etching resistance and the resist pattern cross-sectional shape become favorable.

The dispersity (Mw/Mn) of the component (A1a) is not particularly limited, and is preferably 1.0 to 4.0, more preferably 1.0 to 3.0, and particularly preferably 1.1 to 2.0. Here, Mn indicates a number average molecular weight.

Component (A2a)

In the resist composition of the present embodiment, as the component (A), a base component that is configured to exhibit a changed solubility in a developing solution under the action of an acid (hereinafter referred to as a "component (A2a)") which does not correspond to the component (A1a) may be used in combination.

The component (A2a) is not particularly limited, and any one selected from among many components conventionally known as a base component for a chemically amplified resist composition may be used Regarding the component (A2), a high-molecular-weight compound or a low-molecular-weight compound may be used alone or two or more thereof may be used in combination.

A proportion of the component (A1a) in the component (A) is preferably 25 mass % or more, more preferably 50 mass % or more, and still more preferably 75 mass % or more, and may be 100 mass % with respect to the total mass of the component (A). When the proportion is 25 mass % or more, a resist pattern having excellent various lithography properties such as high sensitivity and resolution, and improved roughness is easily formed. Particularly, such effects are significant in lithography using an electron beam or EUV.

In the resist composition of the present embodiment, the amount of the component (A) may be adjusted according to the thickness of the resist film to be formed and die like.

[Component (A1b)]

The component "A1b" is a resin component that has the structural unit (a0-1b) as the structural unit (a1), and the structural unit (a0-2). The structural unit (a0-1b) is a structural unit in which a polymerizable group in a compound represented by the following general formula (a0-1-1b) is converted into a main chain. The structural unit (a0-2) is the same as the structural unit (a0-2) described in die above [Component (A1a)].

[Chem. 61]

(a0-1b-1)

[In the formula, $W^1$ represents a polymerizable group-containing group. $Ra^{01b}$ represents an acid dissociable group represented by the following general formula (a01-r-1) or general formula (a01-r-2).]

[Chem. 62]

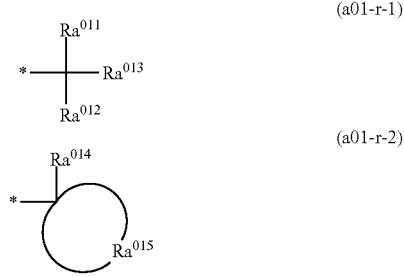

(a01-r-1)

(a01-r-2)

[In the formula, $Ra^{011}$ to $Ra^{013}$ each independently represent a linear or branched aliphatic hydrocarbon group, an alicyclic group having no crosslinked structure, or an aromatic hydrocarbon group. $Ra^{014}$ represents a linear or branched aliphatic hydrocarbon group having 1 to 12 carbon atoms in which some atoms may be substituted with a halogen atom or a hetero atom-containing group or an aryl group having 6 to 12 carbon atoms in which some atoms may be substituted with a halogen atom or a hetero atom-containing group. $Ra^{015}$ represents a group that forms a monocyclic aliphatic cyclic group together with a carbon atom to which $Ra^{014}$ is bonded. * indicates a bond.]

<<Structural Unit (a0-1b)>>

The structural unit (a0-1b) is specifically a structural unit in which a polymerizable group in the compound represented by the general formula (a0-1b-1) is converted into a main chain.

In the formula (a0-1b-1), $W^1$ represents a polymerizable group-containing group, and is the same as $W^1$ in the formula (a0-1a-1) described above.

Here, preferable examples of $W^1$ include a group represented by the chemical formula: $C(R^{X11})(R^{X12})=C(R^{X13})$-$Ya^{x0}$-.

In the chemical formula, $R^{X11}$, $R^{X12}$ and $R^{X13}$ each represent a hydrogen atom, an alkyl group having 1 to 5 carbon atoms or a halogenated alkyl group having 1 to 5 carbon atoms, and $Ya^{x0}$ represents a single bond or a bivalent linking group.

Here, $R^{X11}$ and $R^{X12}$ are preferably a hydrogen atom, an alkyl group having 1 to carbon atoms or a fluorinated alkyl group having 1 to 5 carbon atoms, and in terms of industrial availability, a hydrogen atom or a methyl group is more preferable, and a hydrogen atom is particularly preferable.

Here, $R^{X13}$ is preferably a hydrogen atom, an alkyl group having 1 to 5 carbon atoms or a fluorinated alkyl group having 1 to 5 carbon atoms, and in terms of industrial availability, a hydrogen atom or a methyl group is more preferable, and a methyl group is particularly preferable.

Here, $Ya^{x0}$ is preferably an ester bond [—C(=O)—O—, —O—C(=O)—], an ether bond (—O—), a linear or branched alkylene group, or a combination thereof. Among these, an ester bond [—C(=O)—O—, —O—C(=O)—], a linear or branched alkylene group, or a combination thereof is more preferable, and an ester bond [—C(=O)—O—, —O—C(=O)—], or a combination of a linear or branched alkylene group and an ester bond [—C(=O)—O—, —O—C(=O)—] is particularly preferable.

In the formula (a0-1b-1), $Ra^{01b}$ represents an acid dissociable group represented by the general formula (a01-r-1) or die general formula (a01-r-2).

In the formula (a01-r-1), $Ra^{011}$ to $Ra^{013}$ each independently represent a linear or branched aliphatic hydrocarbon group, an alicyclic group having no crosslinked structure, or an aromatic hydrocarbon group.

The aliphatic hydrocarbon group for $Ra^{011}$ to $Ra^{013}$ may be a saturated aliphatic hydrocarbon group or an unsaturated aliphatic hydrocarbon group, and is preferably a saturated aliphatic hydrocarbon group. Examples of the saturated aliphatic hydrocarbon group for $Ra^{011}$ to $Ra^{013}$ include a linear or branched alkyl group.

The linear alkyl group for $Ra^{011}$ to $Ra^{013}$ preferably has 1 to 20 carbon atoms, more preferably 1 to 15 carbon atoms, and still more preferably 1 to 10 carbon atoms, and particularly preferably 1 to 5 carbon atoms. Specific examples thereof include a methyl group, an ethyl group, an n-propyl group, an n-butyl group, and an n-pentyl group. Among these, a methyl group, an ethyl group or an n-butyl group is preferable, and a methyl group or an ethyl group is more preferable.

The branched alkyl group for $Ra^{011}$ to $Ra^{013}$ preferably has 3 to 20 carbon atoms, more preferably 3 to 15 carbon atoms, still more preferably 3 to 10 carbon atoms, and particularly preferably 3 to 5 carbon atoms. Specific examples thereof include an isopropyl group, an isobutyl group, a tert-butyl group, an isopentyl group, a neopentyl group, a 1,1-diethylpropyl group, and a 2,2-dimethylbutyl group. Among these, an isopropyl group is preferable.

The alicyclic group having no crosslinked structure for $Ra^{011}$ to $Ra^{013}$ may be a monocyclic group or a polycyclic group. Examples of the monocyclic alicyclic group include a group in which one or more hydrogen atoms have been removed from a monocycloalkane. The monocycloalkane preferably has 3 to 6 carbon atoms, and specific examples thereof include cyclopentane and cyclohexane. Examples of the polycyclic alicyclic group include a group in which one or more hydrogen atoms have been removed from a polycycloalkane. Examples of the polycycloalkane include a polycycloalkane having a condensed ring-based polycyclic framework such as decalin, perhydroazulene, perhydroanthracene, and a ring structure having a steroid framework. Among these, a monocyclic alicyclic group is preferable and a group in which one or more hydrogen atoms have been removed from cyclopentane or cyclohexane is more preferable.

The aromatic hydrocarbon group for $Ra^{011}$ to $Ra^{013}$ is a hydrocarbon group having at least one aromatic ring. The aromatic ring is not particularly limited as long as it is a cyclic conjugated compound having (4n+2) π-electrons, and it may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Specific examples of the aromatic ring include an aromatic hydrocarbon ring such as benzene, naphthalene, anthracene, and phenanthrene; and an aromatic hetero ring in which some of carbon atoms constituting the aromatic hydrocarbon ring are substituted with a hetero atom. Examples of the hetero atom in the aromatic hetero ring include an oxygen atom, a sulfur atom, and a nitrogen atom. Specific examples of the aromatic hetero ring include a pyridine ring, a pyrrole ring, and a thiophene ring.

Specific examples of the aromatic hydrocarbon group for $Ra^{011}$ to $Ra^{013}$ include a group in which one hydrogen atom has been removed from the aromatic hydrocarbon ring or the aromatic hetero ring (an aryl group or a hetero aryl group); a group in which one hydrogen atom has been removed from an aromatic compound having two or more aromatic rings (for example, biphenyl, fluorene); and a group in which one hydrogen atom of the aromatic hydrocarbon ring or the aromatic hetero ring is substituted with an alkylene group (for example, an arylalkyl group such as a benzyl group, a phenethyl group, a 1-naphthylmethyl group, a 2-naphthylmethyl group, a 1-naphthylethyl group, and a 2-naphthylethyl group). The number of carbon atoms of the alkylene group bonded to the aromatic hydrocarbon ring or the aromatic hetero ring is preferably 1 to 4, more preferably 1 to 2, and particularly preferably 1.

In the formula (a01-r-2), $Ra^{014}$ represents a linear or branched aliphatic hydrocarbon group having 1 to 12 carbon atoms in which some atoms may be substituted with a halogen atom or a hetero atom-containing group or an aryl group having 6 to 12 carbon atoms in which some atoms may be substituted with a halogen atom or a hetero atom-containing group.

The aliphatic hydrocarbon group for $Ra^{014}$ may be a saturated aliphatic hydrocarbon group or an unsaturated aliphatic hydrocarbon group. Examples of the saturated aliphatic hydrocarbon group for $Ra^{014}$ include a linear or branched alkyl group. Examples of the unsaturated aliphatic hydrocarbon group for $Ra^{014}$ include a linear or branched alkenyl group.

The linear alkyl group for $Ra^{014}$ has 1 to 12 carbon atoms, preferably 1 to 10 carbon atoms, and particularly preferably 1 to 5 carbon atoms. Specific examples thereof include a methyl group, an ethyl group, an n-propyl group, an n-butyl group, and an n-pentyl group. Among these, a methyl group, an ethyl group or an n-butyl group is preferable, and a methyl group or an ethyl group is more preferable.

The branched alkyl group for $Ra^{014}$ preferably has 3 to 10 carbon atoms and particularly preferably has 3 to 6 carbon atoms. Specific examples thereof include an isopropyl group, an isobutyl group, a tert-butyl group, an isopentyl group, a neopentyl group, a 1,1-diethylpropyl group, a 1,1-dimethylbutyl group, a 1,1-dimethylpentyl group, and a 2,2-dimethylbutyl group. Among these, an isopropyl group or a tert-butyl group is preferable.

The linear or branched alkenyl group for $Ra^{014}$ has 2 to 12 carbon atoms, preferably 2 to 10 carbon atoms, more preferably 2 to 5 carbon atoms, still more preferably 2 to 4 carbon atoms, and particularly preferably 2 carbon atoms. Examples of the linear alkenyl group include a vinyl group, a propenyl group (allyl group), and a butynyl group. Examples of the branched alkenyl group include a 1-methylvinyl group, a 2-methylvinyl group, a 1-methylpropenyl group, and a 2-methylpropenyl group. Among these, a linear alkenyl group is preferable, a vinyl group or a propenyl group is more preferable, and a vinyl group is particularly preferable.

In the linear or branched aliphatic hydrocarbon group having 1 to 12 carbon atoms for $Ra^{014}$, some atoms may be substituted with a halogen atom or a hetero atom-containing group. For example, some of hydrogen atoms constituting an aliphatic hydrocarbon group may be substituted with a halogen atom or a hetero atom-containing group. In addition, some of carbon atoms (such as a methylene group) constituting an aliphatic hydrocarbon group may be substituted with a hetero atom-containing group.

Examples of the halogen atom here include a fluorine atom, a chlorine atom, a bromine atom, and an iodine atom Examples of the hetero atom include an oxygen atom, a sulfur atom, and a nitrogen atom Examples of the hetero atom-containing group include an oxygen atom (—O—), —C(=O)—O—, —O—C(=O)—, —C(=O)—, —O—C(=O)—O—, —C(=O)—NH—, —NH—, —S—, —S(=O)$_2$—, and —S(=O)$_2$—O—.

The aryl group for $Ra^{014}$ has 6 to 12 carbon atoms, and specific examples thereof include benzene and naphthalene. The aryl group may have an alkyl group (preferably an alkyl group having 1 to 5 carbon atoms) as a substituent.

In the aryl group for $Ra^{014}$, some atoms may be substituted with a halogen atom or a hetero atom-containing group. For example, some of hydrogen atoms constituting an aryl group may be substituted with a halogen atom or a hetero atom-containing group. In addition, some of carbon atoms constituting an aryl group may be substituted with a hetero atom-containing group (that is, it may be a hetero aryl group). Here, the halogen atom, the hetero atom, and the hetero atom-containing group are the same as above.

In the formula (a01-r-2), $Ra^{015}$ is a group that forms a monocyclic aliphatic cyclic group together with a carbon atom to which $Ra^{014}$ is bonded. Examples of the monocyclic aliphatic cyclic group include a group in which one or more hydrogen atoms have been removed from a monocycloalkane. The monocycloalkane preferably has 3 to 8 carbon atoms, and specific examples thereof include cyclopentane, cyclohexane, and cyclooctane.

The monocyclic aliphatic cyclic group may have a substituent. Examples of the substituent include an alkyl group, an alkoxy group, a halogen atom, a halogenated alkyl group, a hydroxy group, a hydroxyalkyl group, an acyl group, an alkylcarbonyloxy group, and a carbonyl group (oxo group).

Specific examples of the acid dissociable group represented by the general formula (a01-r-1) are shown below. * indicates a bond.

[Chem. 63]

(r-pr-c1)

(r-pr-c2)

(r-pr-c3)

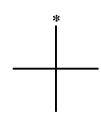

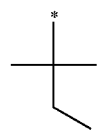

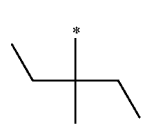

[Chem. 64]

(r-pr-c4)

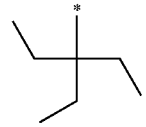

(r-pr-c5)

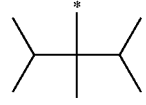

(r-pr-c6)

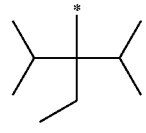

(r-pr-c7)

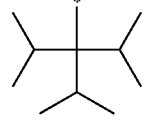

(r-pr-cs1)

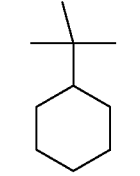

(r-pr-cs2)

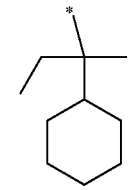

(r-pr-cs3)

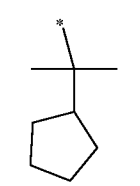

(r-pr-cs4)

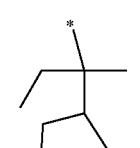

(r-pr-cs5)

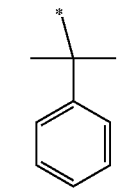

(r-pr-cs6)
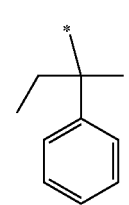
(r-pr-cm5)
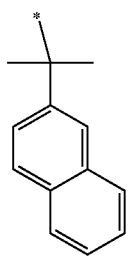
(r-pr-cm6)
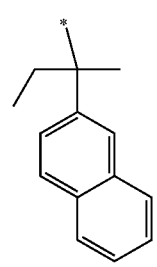
(r-pr-cm7)
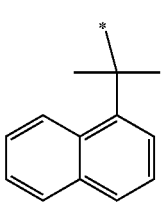
(r-pr-cm8)
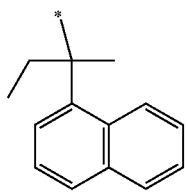
Specific examples of the acid dissociable group represented by the general formula (a01-r-2) are shown below. * indicates a bond.
[Chem. 65]
(r-pr-s1)
(r-pr-s2)
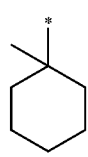
(r-pr-s3)
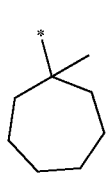
(r-pr-s4)
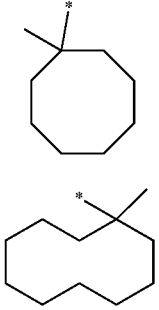
(r-pr-s5)
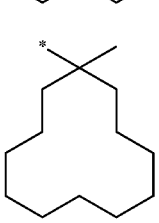
(r-pr-s6)
(r-pr-s7)
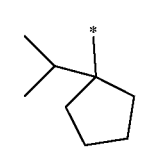
(r-pr-s8)
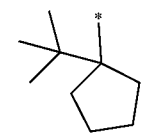
(r-pr-s9)
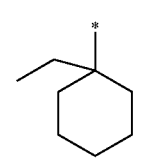
(r-pr-s10)
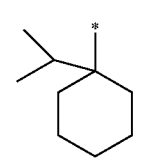
(r-pr-s11)
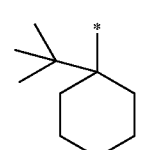
(r-pr-s12)
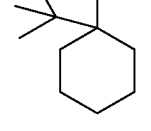

(r-pr-s13) 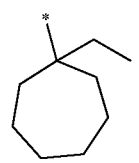
(r-pr-s14) 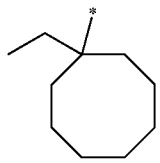
(r-pr-s15) 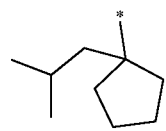
(r-pr-s16) 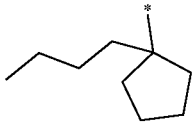
(r-pr-s17) 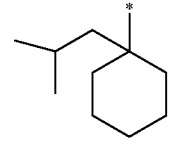
(r-pr-s18) 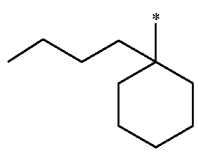
(r-pr-s19) 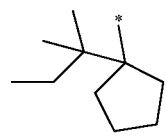
(r-pr-s20) 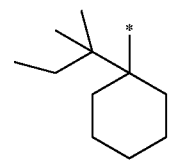
[Chem. 66]
(r-pr-s21) 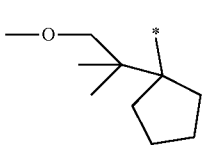
(r-pr-s22) 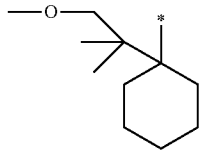
(r-pr-s23) 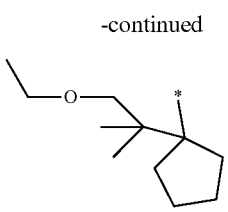
(r-pr-s24) 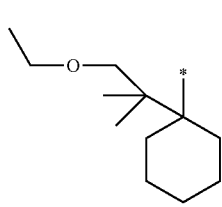
[Chem. 67]
(r-pr-sv1) 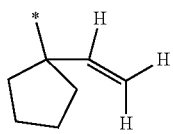
(r-pr-sv2) 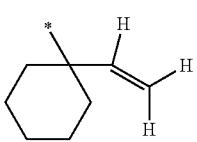
(r-pr-sv3) 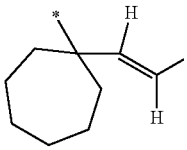
(r-pr-sv4) 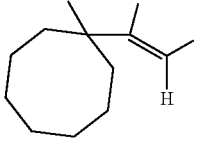
(r-pr-sv5) 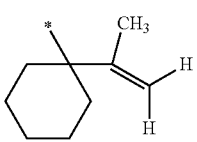
(r-pr-sv6) 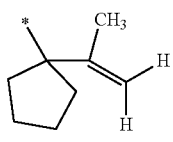
(r-pr-sv7) 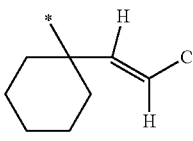
(r-pr-sv8) 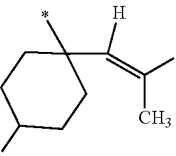

(r-pr-sv9) 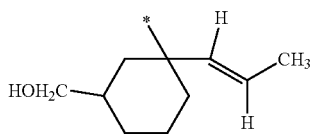

(r-pr-sv10) 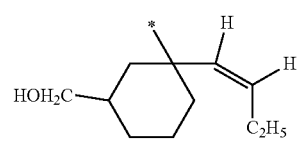

[Chem. 68]

(r-pr-sa1) 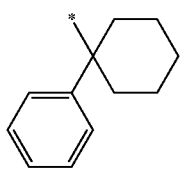

(r-pr-sa2) 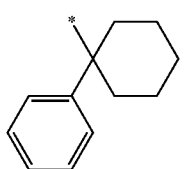

(r-pr-sa3) 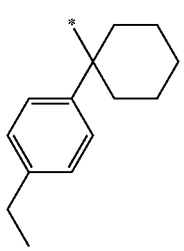

(r-pr-sa4) 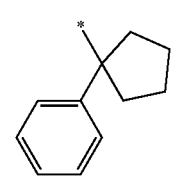

(r-pr-sa5) 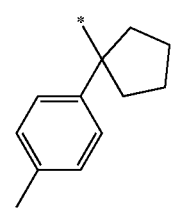

(r-pr-sa6) 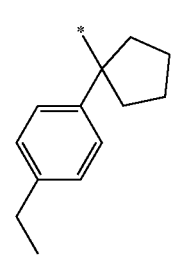

(r-pr-sa7) 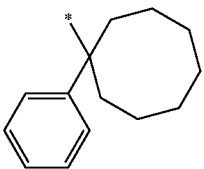

(r-pr-sa8) 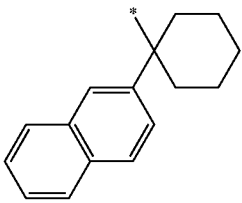

(r-pr-sa9) 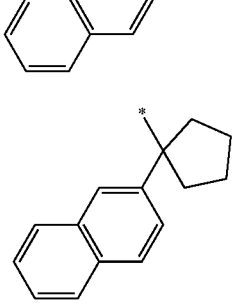

Preferable specific examples of the structural unit (a0-1b) include a structural unit represented by the following general formula (a0-1b-u1).

[Chem. 69]

(a0-1b-u1) 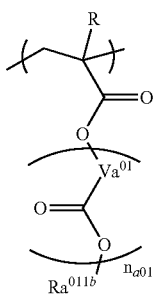

[In the formula, R represents a hydrogen atom, an alkyl group having 1 to 5 carbon atoms or a halogenated alkyl group having 1 to 5 carbon atoms. $Va^{01}$ represents a bivalent hydrocarbon group which may have an ether bond. $n_{a01}$ is an integer of 0 to 2. $Ra^{011b}$ represents an acid dissociable group represented by the general formula (a01-r-1) or general formula (a01-r-2).]

In the general formula (a0-1b-u1), R, $Va^{01}$, and inn are the same as R, $Va^{01}$, and $n_{a01}$ in the general formula (a0-1a-u1), and preferable examples thereof are the same as those above.

In the general formula (a0-1b-u1), $Ra^{011b}$ represents an acid dissociable group represented by the general formula (a01-r-1) or general formula (a01-r-2), and is the same as $Ra^{01b}$ in the general formula (a0-1b-1).

Specific examples of the structural unit (a0-1b) are shown below.

In the following formula, $R^\alpha$ represents a hydrogen atom, a methyl group or a trifluoromethyl group.

[Chem. 70]
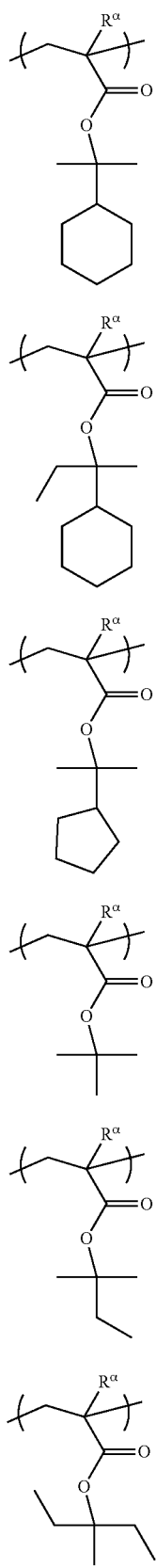
(a0-1b-1)
(a0-1b-2)
(a0-1b-3)
(a0-1b-4)
(a0-1b-5)
(a0-1b-6)
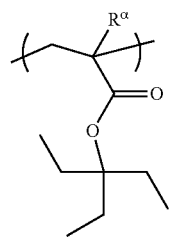
(a0-1b-7)
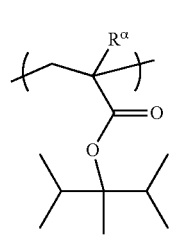
(a0-1b-8)
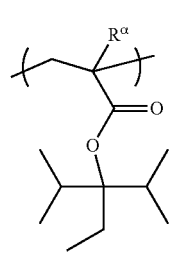
(a0-1b-9)
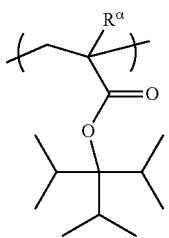
(a0-1b-10)
[Chem. 71]
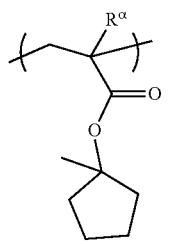
(a0-1b-11)
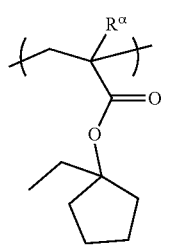
(a0-1b-12)

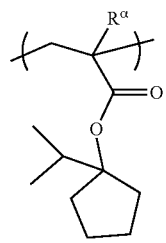 (a0-1b-13)
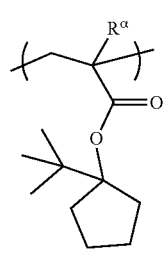 (a0-1b-14)
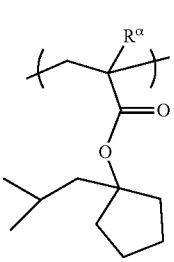 (a0-1b-15)
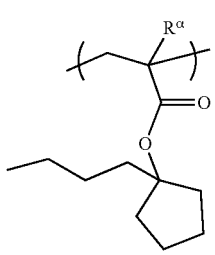 (a0-1b-16)
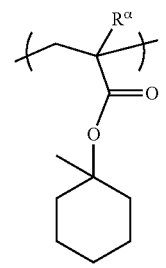 (a0-1b-17)
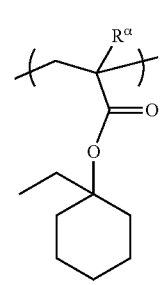 (a0-1b-18)
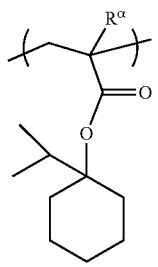 (a0-1b-19)
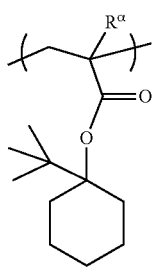 (a0-1b-20)
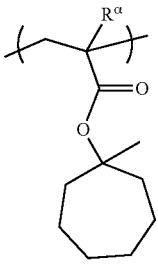 (a0-1b-21)
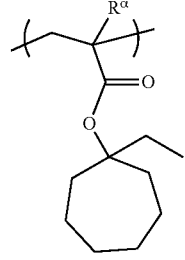 (a0-1b-22)
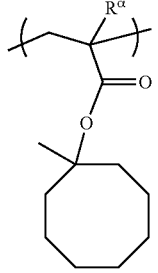 (a0-1b-23)
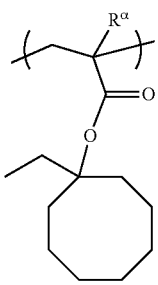 (a0-1b-24)

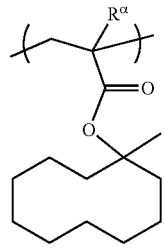
(a0-1b-25)
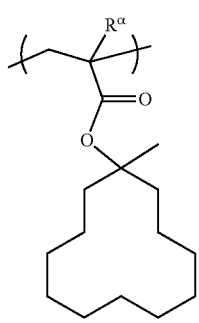
(a0-1b-26)
[Chem. 72]
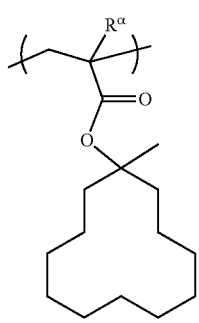
(a0-1b-27)
(a0-1b-28)
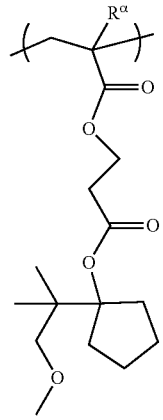
(a0-1b-29)
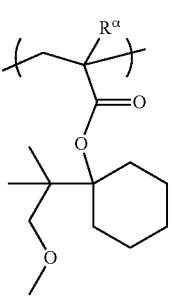
(a0-1b-30)
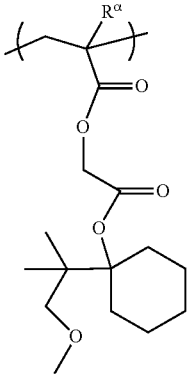
(a0-1b-31)
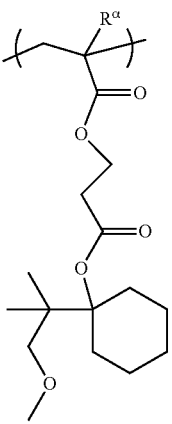
(a0-1b-32)

(a0-1b-33)
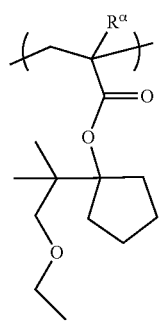
(a0-1b-34)
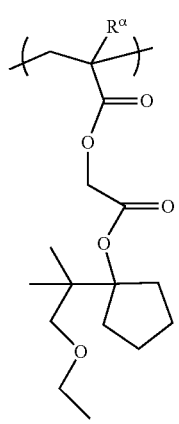
(a0-1b-35)
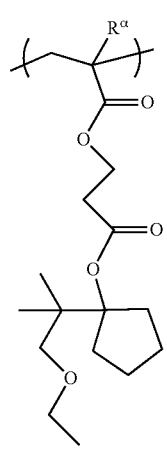
(a0-1b-36)
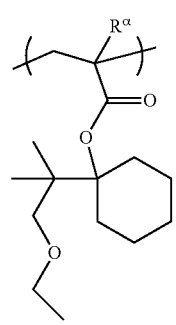
(a0-1b-37)
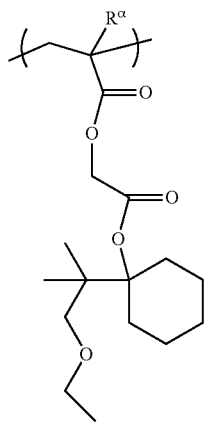
(a0-1b-38)
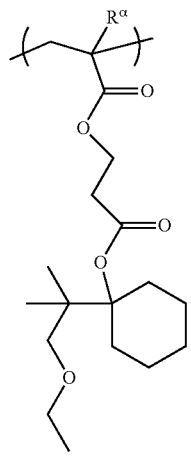
[Chem. 73]
(a0-1b-39)
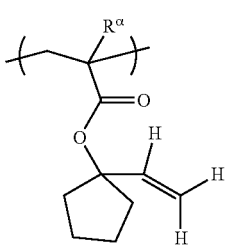
(a0-1b-40)
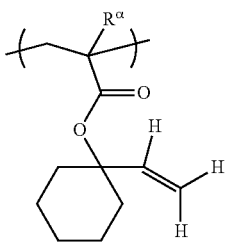

(a0-1b-41)
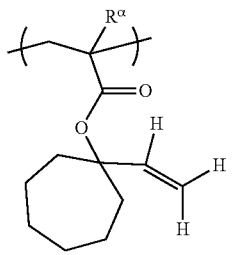
(a0-1b-42)
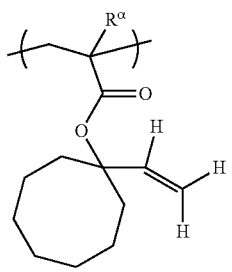
(a0-1b-43)
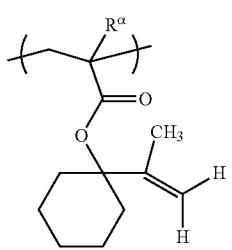
(a0-1b-44)
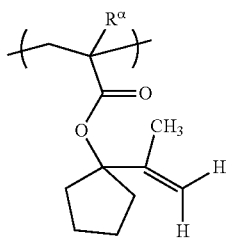
(a0-1b-45)
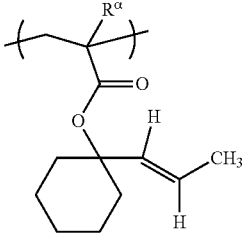
(a0-1b-46)
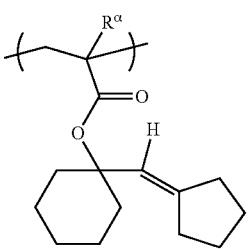
(a0-1b-47)
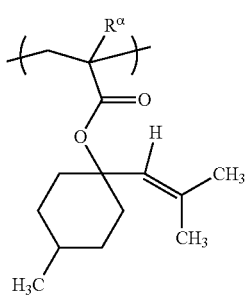
(a0-1b-48)
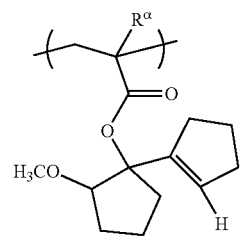
(a0-1b-49)
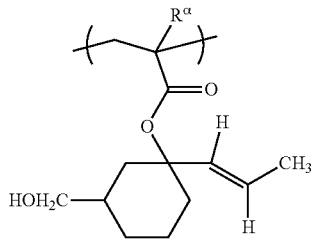
(a0-1b-50)
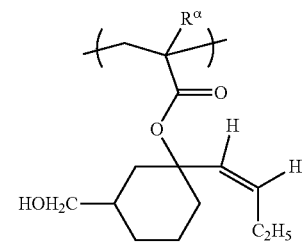
[Chem. 74]
(a0-1b-51)
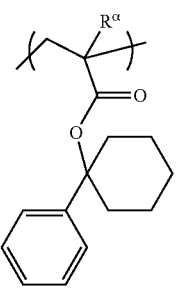

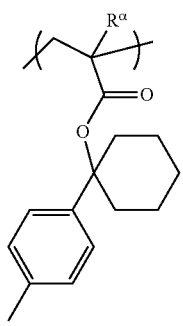 (a0-1b-52)
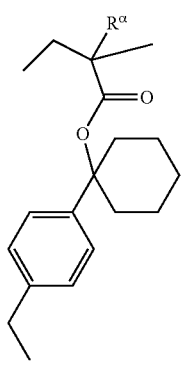 (a0-1b-53)
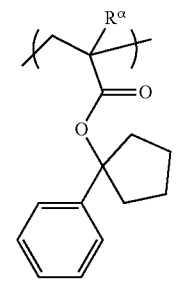 (a0-1b-54)
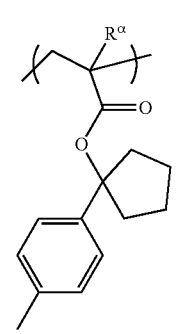 (a0-1b-55)
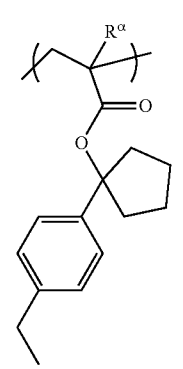 (a0-1b-56)
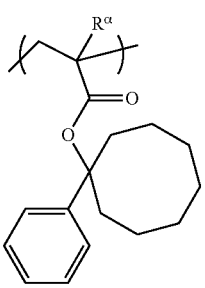 (a0-1b-57)
[Chem. 75]
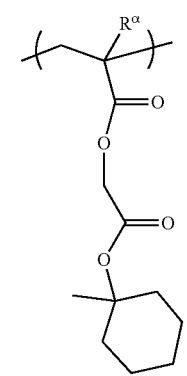 (a0-1b-58)
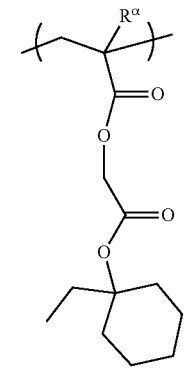 (a0-1b-59)
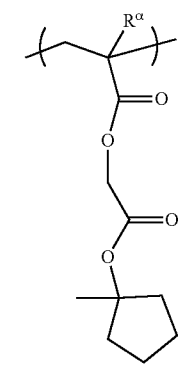 (a0-1b-60)

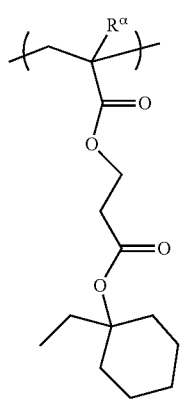
(a0-1b-61)
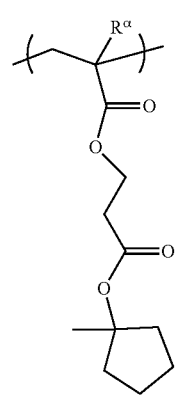
(a0-1b-62)
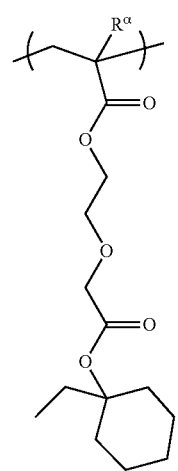
(a0-1b-63)
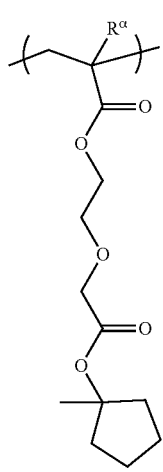
(a0-1b-64)
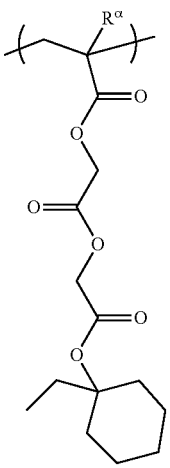
(a0-1b-65)
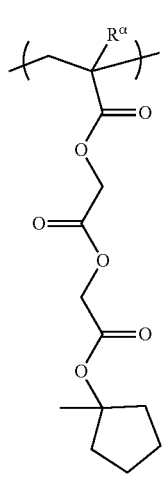
(a0-1b-66)

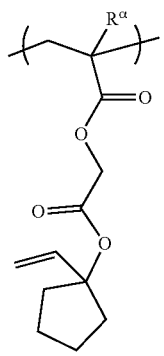

(a0-1b-67)

The structural unit (a0-1b) of the component (A1b) may be of one type or two or more types.

In the component (A1b), a proportion of the structural unit (a0-1b) is preferably 30 to 70 mol %, more preferably 35 to 65 mol %, and particularly preferably 40 to 60 mol % with respect to the total (100 mol %) of all structural units constituting the component (A1b).

When the proportion of the structural unit (a0-1b) is equal to or more than a lower limit of the preferable range, a resist pattern can be easily obtained, and lithography properties such as sensitivity, resolution, and roughness reduction are further improved, and when the proportion thereof is equal to or less than an upper limit of the preferable range, a balance with other structural unit can be easily achieved.

<<Structural Unit (a0-2)>>

The structural unit (a0-2) is a structural unit in which a polymerizable group in the compound represented by the general formula (a0-2-1) is converted into a main chain.

The structural unit (a0-2) is the same as the structural unit (a0-2) described in the above [Component (A1a)], and preferable examples thereof are the same as those above.

The structural unit (a0-2) of the component (A1b) may be of one type or two or more types.

In the component (A1b), a proportion of the structural unit (a0-2) is preferably to 70 mol %, more preferably 25 to 65 mol %, and particularly preferably 30 to 60 mol % with respect to the total (100 mol %) of all structural units constituting the component (A1b).

When the proportion of the structural unit (a0-2) is equal to or more than a lower limit of the preferable range, lithography properties such as sensitivity, resolution, and roughness are improved. In addition, when the proportion thereof is equal to or less than an upper limit, a balance with other structural units can be achieved and various lithography properties become favorable.

<<Other Structural Units>>

The component (A1b) may have another structural unit other than the above structural unit (a0-1) and structural unit (a0-2).

Examples of the other structural unit include a structural unit (a1) (hereinafter referred to as a "structural unit (a1-1b)") other than the structural unit (a0-1b), a structural unit (a2) having a lactone-containing cyclic group, an —SO$_2$— containing cyclic group or a carbonate-containing cyclic group (provided that those corresponding to the structural unit (a1) are excluded), a structural unit (a3) having a polar group-containing aliphatic hydrocarbon group (provided that those corresponding to the structural unit (a0-2), structural unit (a1) or structural unit (a2) are excluded), a structural unit (a9) represented by the general formula (a9-1), a structural unit derived from styrene, a structural unit derived from a styrene derivative (provided that those corresponding to the structural unit (a0-2) are excluded), and a structural unit having a non-acid dissociable aliphatic cyclic group.

Structural unit (a1-1b):

The structural unit (a1-1b) is a structural unit (a1) other than the structural unit (a0-1b).

The acid dissociable group in the structural unit (a1-1b) is a group excluding the acid dissociable group represented by the general formula (a01-r-1) and the acid dissociable group represented by the general formula (a01-r-2), and examples thereof include those hitherto proposed as an acid dissociable group for a base resin for a chemically amplified resist.

Specific examples of those proposed as an acid dissociable group for a base resin for a chemically amplified resist include the above "acetal-type acid dissociable group," "tertiary alkyloxycarbonyl acid dissociable group," and "tertiary alkyl ester type acid dissociable group."

Examples of die tertiary alkyl ester type acid dissociable group as the structural unit (a1-1b) include an acid dissociable group represented by the following general formula (a1-r-2b).

[Chem. 76]

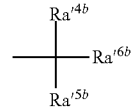

(a1-r-2b)

[In the formula, $Ra'^{4b}$ represents an alicyclic group having a crosslinked structure. $Ra'^{4b}$ and $Ra'^{4b}$ represent a hydrocarbon group; provided that $Ra'^{4b}$ and $Ra'^{4b}$ may be mutually bonded to form a ring.]

Examples of the alicyclic group having a crosslinked structure for $Ra'^{4b}$ include a cyclic unsaturated alicyclic group and a polycycloalkane having a cross-linked ring polycyclic framework.

The cyclic unsaturated alicyclic group for $Ra'^{4b}$ is preferably an alkenyl group having 2 to 10 carbon atoms. Examples of the poly cycloalkane having a cross-linked ring polycyclic framework for $Ra'^{4}$ include adamantane, norbornane, isobornane, tricyclodecane, and tetracyclododecene.

The hydrocarbon group for $Ra'^{4b}$ and $Ra'^{4b}$ is the same as that of $Ra'^{3b}$.

When $Ra'^{4b}$ and $Ra'^{4b}$ are mutually bonded to form a ring, a preferable example is a group represented by die following general formula (a1-r2-1b). On the other hand, when $Ra'^{4b}$ and $Ra'^{4b}$ are not bonded to each other, a preferable example is a group represented by the following general formula (a1-r2-2b).

[Chem. 77]

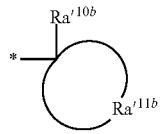

(a1-r2-1b)

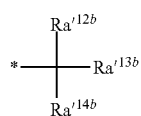

(a1-r2-2b)

[Chem. 78]

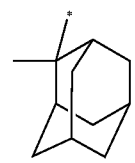

(r-pr-m1)

[In the formula (a1-r2-1b), Ra'¹⁰ⓑ represents an alkyl group having 1 to 10 carbon atoms. Ra'¹¹$b$ represents a group that forms an alicyclic group having a crosslinked structure together with a carbon atom to which Ra'¹⁰$b$ is bonded. In the formula (a1-r2-2), Ra'¹²$b$ represents an alicyclic group having a crosslinked structure. Ra'¹³$b$ and Ra'¹⁴$b$ each independently represent a monovalent linear saturated hydrocarbon group having 1 to 10 carbon atoms or a hydrogen atom some or all of the hydrogen atoms of the linear saturated hydrocarbon group may be substituted. * indicates a bond (hereinafter the same).]

In the formula (a1-r2-1b), the alkyl group having 1 to 10 carbon atoms for Ra'¹⁰$b$ may be linear or branched.

The linear alkyl group for Ra'¹⁰$b$ preferably has 1 to 5 carbon atoms, more preferably 1 to 4 carbon atoms, and most preferably 1 or 2 carbon atoms. Specific examples thereof include a methyl group, an ethyl group, an n-propyl group, an n-butyl group, and an n-pentyl group. Among these, a methyl group, an ethyl group or an n-butyl group is preferable, and a methyl group or an ethyl group is more preferable.

The branched alkyl group for Ra'¹⁰$b$ preferably has 3 to 10 carbon atoms and more preferably 3 to 5 carbon atoms. Specific examples thereof include an isopropyl group, an isobutyl group, a tert-butyl group, an isopentyl group, a neopentyl group, a 1,1-diethylpropyl group, and a 2,2-dimethylbutyl group, and an isopropyl group is preferable.

In the formula (a1-r2-1b), the alicyclic group having a crosslinked structure formed of Ra'¹¹$b$ together with a carbon atom to which Ra'¹⁰$b$ is bonded is preferably a group in which one hydrogen atom has been removed from a polycycloalkane having a crosslinked structure, and the poly cycloalkane preferably has 7 to 12 carbon atoms, and specific examples thereof include adamantane, norbornane, isobornane, tricyclodecane, and tetracyclododecene. Among these, a group in which one hydrogen atom has been removed from adamantane is particularly preferable.

In the formula (a1-r2-2b), examples of the alicyclic group having a crosslinked structure for Ra'¹²$b$ include the same as those provided for the alicyclic group having a crosslinked structure formed of Ra'¹¹$b$ together with a carbon atom to which Ra'¹⁰$b$ is bonded described above.

Preferably, the monovalent linear saturated hydrocarbon groups having 1 to 10 carbon atoms for Ra'¹³$b$ and Ra'¹⁴$b$ each independently represent an alkyl group having 1 to 10 carbon atoms and examples thereof include the same as those provided for the alkyl group having 1 to 10 carbon atoms for Ra'¹⁰$b$ in the formula (a1-r2-1b). Some or all of the hydrogen atoms of the linear saturated hydrocarbon group may be substituted.

Specific examples of the group represented by die formula (a1-r2-1b) are shown below. * indicates a bond (hereinafter the same in this specification).

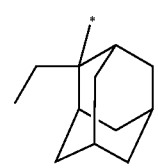

(r-pr-m2)

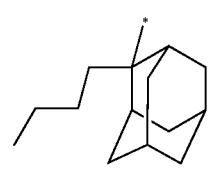

(r-pr-m3)

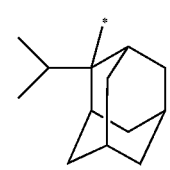

(r-pr-m4)

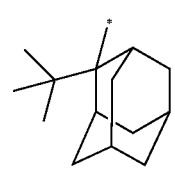

(r-pr-m5)

(r-pr-m6)

(r-pr-m7)

(r-pr-m8)

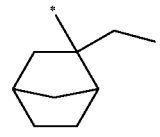

(r-pr-m9)

-continued

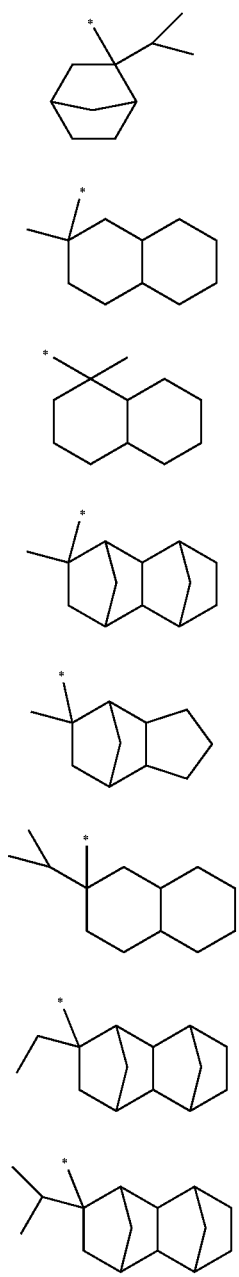

(r-pr-m10)
(r-pr-m11)
(r-pr-m12)
(r-pr-m13)
(r-pr-m14)
(r-pr-m15)
(r-pr-m16)
(r-pr-m17)

Specific examples of the group represented by die formula (a1-r2-2b) are shown below.

[Chem. 79]

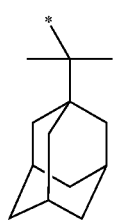

(r-pr-cm1)

-continued

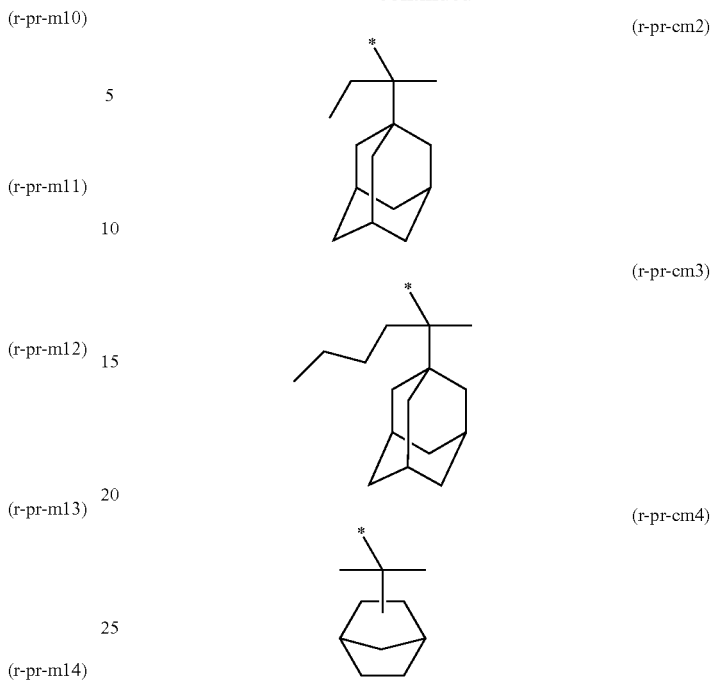

(r-pr-cm2)
(r-pr-cm3)
(r-pr-cm4)

Examples of die structural unit (a1-1b) include a structural unit derived from an acrylic ester in which a hydrogen atom bonded to a carbon atom at the α-position may be substituted with a substituent, a structural unit derived from acrylamide, a structural unit in which at least some of hydrogen atoms in hydroxyl groups of a structural unit derived from hydroxystyrene or a hydroxystyrene derivative are protected by a substituent having an acid decomposable group, and a structural unit in which at least some of hydrogen atoms in —C(═O)—OH's of a structural unit derived from vinylbenzoic acid or a vinylbenzoic acid derivative are protected by a substituent having an acid decomposable group.

Among the above examples, the structural unit (a1-1b) is preferably a structural unit derived from an acrylic ester in which a hydrogen atom bonded to a carbon atom at the α-position may be substituted with a substituent.

Preferable specific examples of the structural unit (a1-1b) include a structural unit represented by the following general formula (a1-1b-1) or (a1-1b-2).

[Chem. 80]

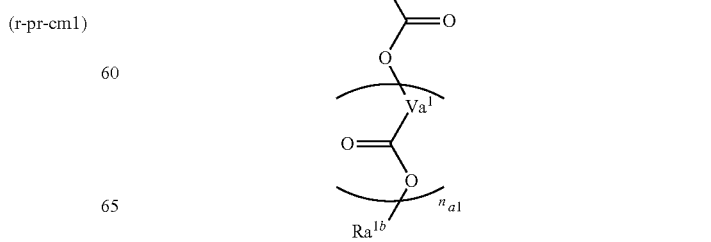

(a1-1b-1)

-continued (a1-1b-2)

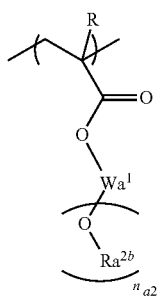

[In the formula, R represents a hydrogen atom, an alkyl group having 1 to 5 carbon atoms, or a halogenated alkyl group having 1 to 5 carbon atoms. $Va^1$ represents a bivalent hydrocarbon group which may have an ether bond, n*i is 0 to 2, and $Ra^{1b}$ represents an acid dissociable group represented by the formula (a1-r-1b) or (a1-r-2). $Wa^1$ represents a hydrocarbon group having a valency of $n_{a2}+1$, $n_{a2}$ is 1 to 3, and $Ra^{2b}$ represents an acid dissociable group represented by the formula (a1-r-1b) or (a1-r-3).]

In the formula (a1-1b-1), R, $Va^1$, and $n_{a1}$ are the same as R, $Va^1$, and $n_{a1}$ in the general formula (a1-1a-1), and preferable examples thereof are the same as those above.

In the formula (a1-1b-1), $Ra^{1b}$ is an acid dissociable group represented by the formula (a1-r-1b) or (a1-r-2).

In the formula (a1-1b-2), R, $Wa^1$, and $n_{2a}$ are the same as R, $Wa^1$, and $n_{2a}$ in the general formula (a1-1b-1), and preferable examples thereof are the same as diose above.

In the formula (a1-1b-2), $Ra^{2b}$ is an acid dissociable group represented by the formula (a1-r-1b) or (a1-r-3).

Specific examples of the structural unit represented by the formula (a1-1b-1) are shown below.

In the following formula, $R^a$ represents a hydrogen atom, a methyl group or a trifluoromethyl group.

[Chem. 81]

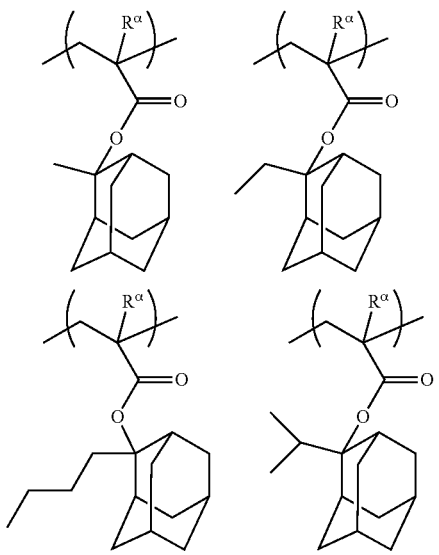

-continued

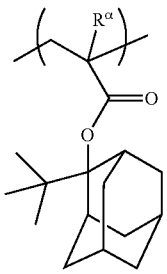 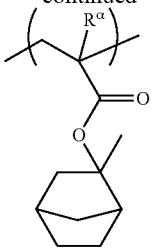 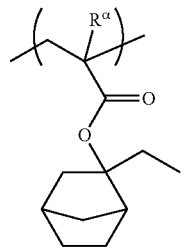

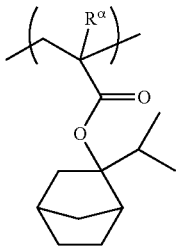 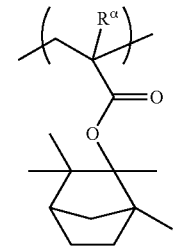 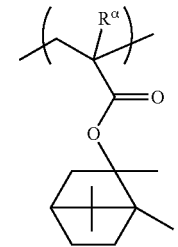

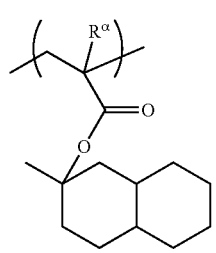 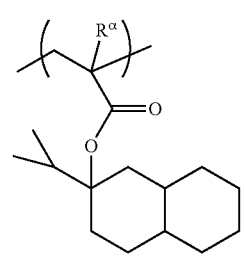

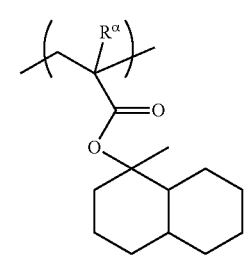 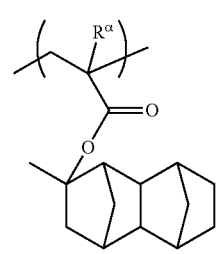

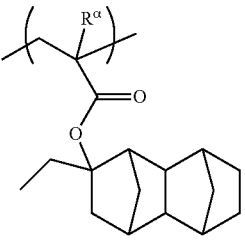 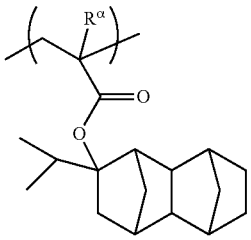

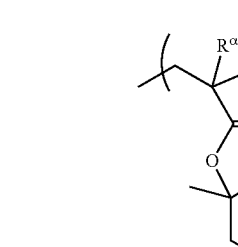 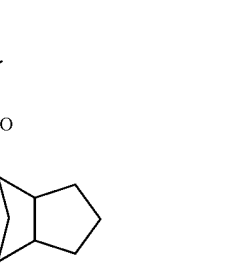

137
-continued
[Chem. 82]
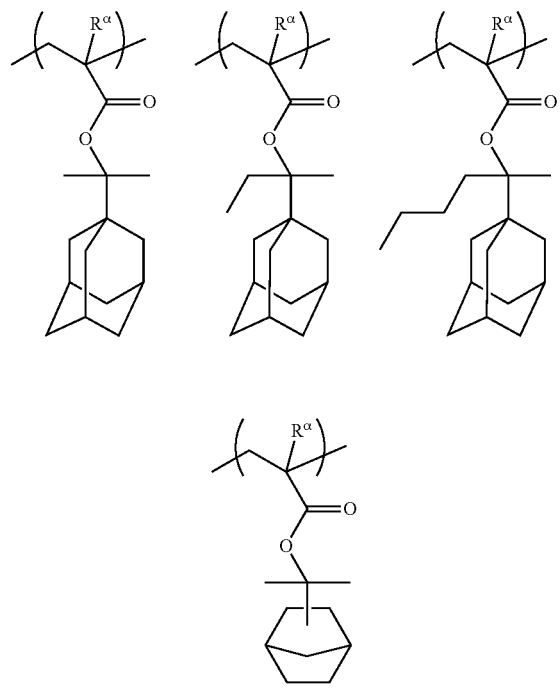
[Chem. 83]
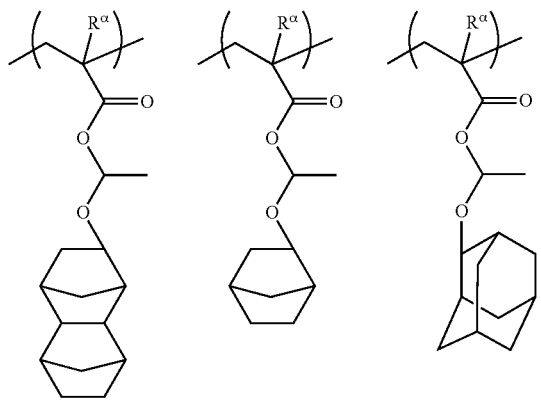
138
-continued
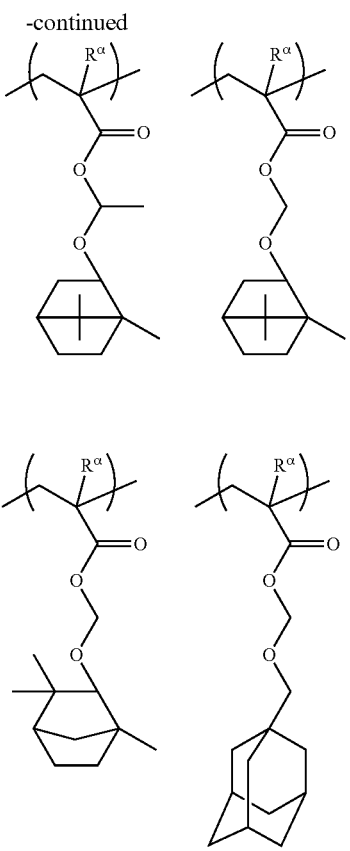
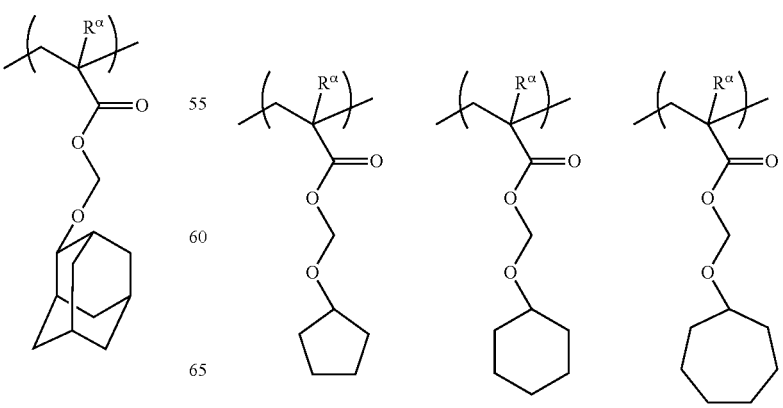
[Chem. 84]

139
-continued
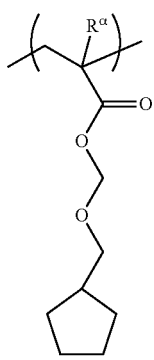
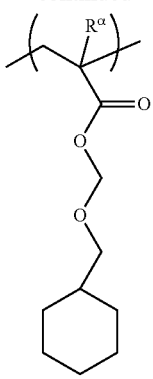
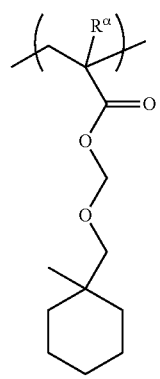
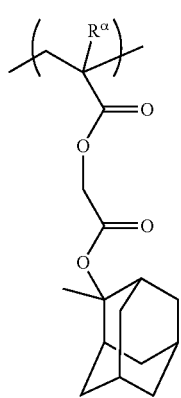
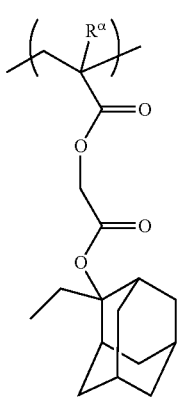
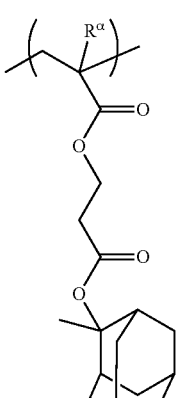
[Chem. 85]
140
-continued
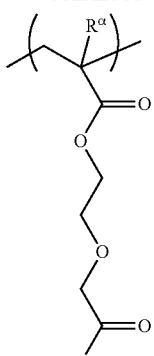
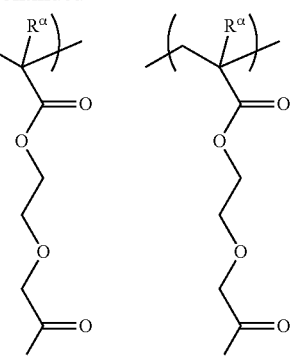
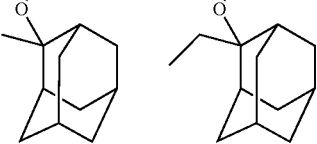
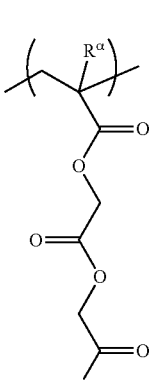
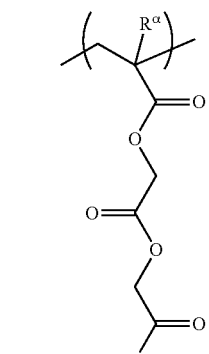
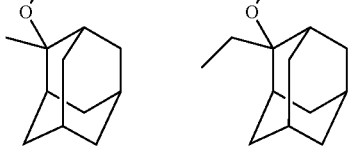
Specific examples of the structural unit represented by the formula (a 1-2b-1) are shown below.
[Chem. 86]
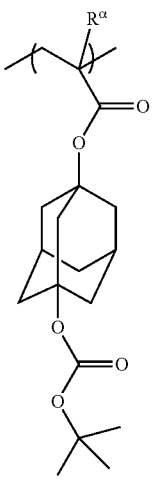
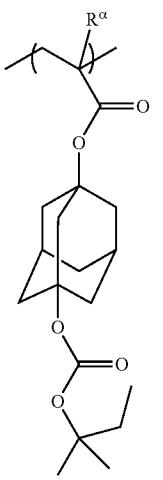
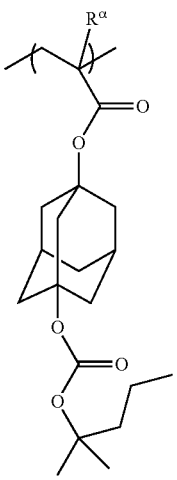

-continued

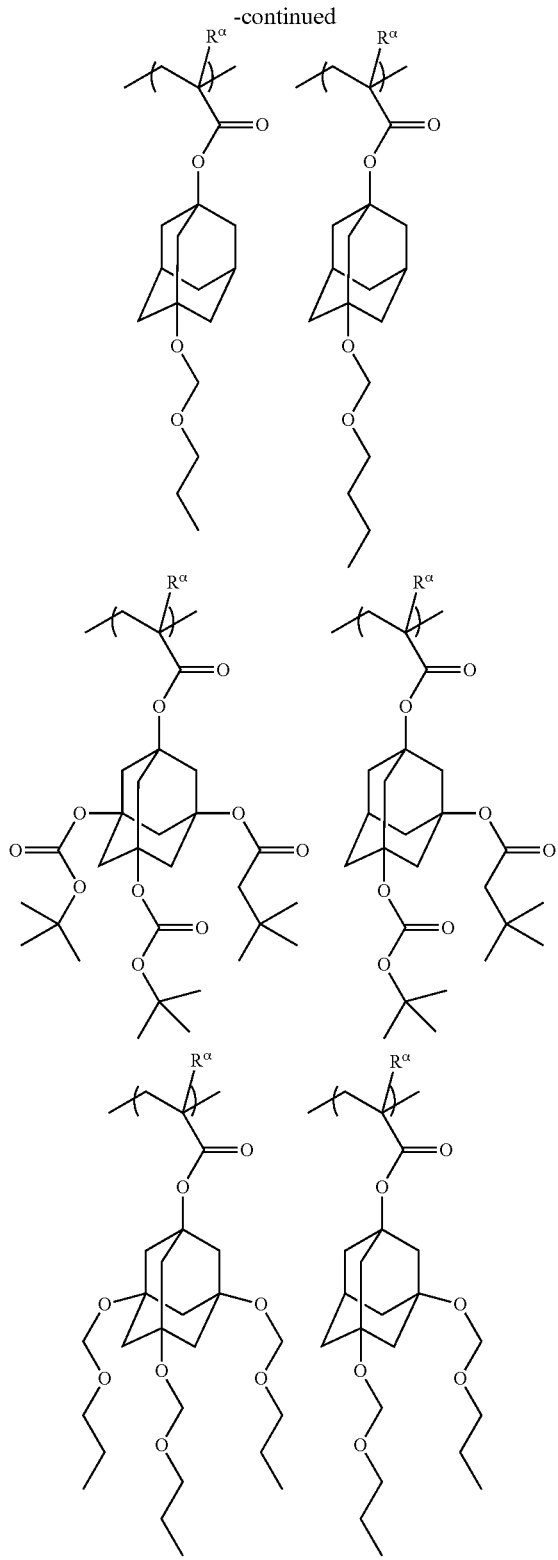

The structural unit (a1-1b) of the component (A1b) may be of one type or two or more types.

When the component (A1b) has the structural unit (a1-1b), a proportion of the structural unit (a1-1b) in the component (A1b) is preferably 1 to 50 mol %, more preferably 5 to 45 mol %, and most preferably 5 to 30 mol % with respect to the total (100 mol %) of all structural units constituting the component (A1b).

When the proportion of the structural unit (a1-1b) is equal to or more than a lower limit, lithography properties such as sensitivity, resolution, and roughness are improved. In addition, when the proportion thereof is equal to or less than an upper limit, a balance with other structural units can be achieved and various lithography properties become favorable.

Structural Unit (a2):

The component (A1b) may further have a structural unit (a2) (provided that those corresponding to the structural unit (a1) are excluded) in addition to the structural unit (a0-1) and the structural unit (a0-2). The structural unit (a2) is the same as the structural unit (a2) described in the above [Component (A1a)], and preferable examples thereof are the same as those above.

When the component (A1b) is used to form a resist film, the lactone-containing cyclic group, the —SO$_2$— containing cyclic group or the carbonate-containing cyclic group of the structural unit (a2) is effective in improving the adhesion of the resist film to the substrate. In addition, when the structural unit (a2) is provided, for example, lithography properties and the like become favorable according to effects of appropriately adjusting an acid diffusion length, improving the adhesion of the resist film to the substrate, and appropriately adjusting the solubility during development.

The structural unit (a2) of the component (A1b) may be of one type or two or more types.

When the component (A1b) has the structural unit (a2), a proportion of the structural unit (a2) is preferably 1 to 50 mol %, more preferably 5 to 45 mol %, still more preferably 10 to 40 mol %, and particularly preferably 10 to 30 mol % with respect to the total (100 mol %) of all structural units constituting the component (A1b).

When the proportion of the structural unit (a2) is equal to or more than a preferable lower limit, according to the above effects, an effect obtained by the inclusion of the structural unit (a2) is sufficiently obtained, and when the proportion thereof is equal to or less than an upper limit, a balance with other structural units can be achieved, and various lithography properties become favorable.

Structural Unit (a3):

The component (A1b) may further have a structural unit (a3) (provided that those corresponding to the structural unit (a1) or die structural unit (a2) are excluded) in addition to the structural unit (a0-1) and the structural unit (a0-2). The structural unit (a3) is the same as the structural unit (a3) described in the above [Component (A1a)], and preferable examples thereof are the same as those above. When the component (A1b) has the structural unit (a3), the hydrophilicity of the component (A1b) is improved, which contributes to improvement of the resolution. In addition, the acid diffusion length can be appropriately adjusted.

The structural unit (a3) of the component (A1b) may be of one type or two or more types.

When the component (A1b) has the structural unit (a3), a proportion thereof is preferably 1 to 40 mol %, more preferably 2 to 30 mol %, still more preferably 5 to 25 mol %, and particularly preferably 5 to 20 mol % with respect to the total of all structural units constituting the component (A1b).

When a proportion of the structural unit (a3) is equal to or more than a preferable lower limit, an effect obtained by the inclusion of the structural unit (a3) is sufficiently obtained, and on the other hand, when the proportion thereof is equal to or less than a preferable upper limit, a balance with other structural units can be easily achieved, and various lithography properties become favorable.

Structural Unit (a9):

The component (A1b) may further have a structural unit (a9) in addition to the structural unit (a0-1) and the structural unit (a0-2). The structural unit (a9) is the same as the structural unit (a9) described in the above [Component (A1a)], and preferable examples thereof are the same as those above.

The structural unit (a9) of the component (A1b) may be of one type or two or more types.

When the component (A1b) has the structural unit (a9), a proportion of the structural unit (a9) is preferably 1 to 40 mol %, more preferably 3 to 30 mol %, still more preferably 5 to 25 mol %, and particularly preferably 10 to 20 mol % with respect to the total (100 mol %) of all structural units constituting the component (A1).

When the proportion of the structural unit (a9) is equal to or more than a lower limit for example, effects of appropriately adjusting an acid diffusion length, improving the adhesion of the resist film to the substrate, appropriately adjusting the solubility during development, and improving etching resistance are obtained, and when the proportion thereof is equal to or less than an upper limit, a balance with other structural units can be achieved, and various lithography properties become favorable.

In the resist composition, one type of the component (A1b) may be used alone or two or more thereof may be used in combination.

In the resist composition of the present embodiment, the resin component as the component (A1b) has the structural unit (a0-1) and the structural unit (a0-2), and one type of polymer may be used alone or two or more types thereof may be used in combination.

For example, preferable examples of the component (A1b) include those containing a copolymer (hereinafter this copolymer will be referred to as a "component (A1b-1)") having the structural unit (a0-1) and the structural unit (a0-2), and as necessary, other structural units.

In addition, examples of the component (A1b) include those (mixed resin) containing a polymer having the structural unit (a0-1), and as necessary, other structural units (hereinafter this polymer will be referred to as a "component (A1b-21)"), and a polymer having the structural unit (a0-2), and as necessary, other structural units (hereinafter this polymer will be referred to as a "component (A1b-22)").

Among these, die component (A1b) of the resist composition more preferably contains the component (A1b-1).

Preferable examples of the component (A1b-1) include a high-molecular-weight compound having a repeating structure of the structural unit (a0-1) and the structural unit (a0-2), and a high-molecular-weight compound having a repeating structure of the structural unit (a0-1), the structural unit (a0-2), and other structural units.

The other structural unit is preferably at least one of the structural unit (a2) and the structural unit (a3).

The component (A1b) can be produced by dissolving monomers deriving structural units in a polymerization solvent, and adding a radical polymerization initiator, for example, azobisisobutyronitrile (AIBN), or dimethyl azobisisobutyrate (for example, V-601) thereto for polymerization. Alternatively, the component (A1) can be produced by dissolving a precursor monomer that derives a structural unit (a0-1), a monomer that derives a structural unit (a0-2), and as necessary, a monomer that derives other structural units in a polymerization solvent, and adding the above radical polymerization initiator thereto for polymerization, and then causing a deprotection reaction. Here, in the polymerization, for example, a chain transfer agent such as $HS-CH_2-CH_2-CH_2-C(CF_3)_2-OH$ may be used in combination to introduce a $-C(CF_3)_2-OH$ group at the terminal. In this manner, a copolymer in which a hydroxyalkyl group in which some of hydrogen atoms of the alkyl group are substituted with a fluorine atom is introduced is effective in reducing developing defects and LER (line edge roughness: un-uniform unevennesses of line side walls).

The mass average molecular weight (Mw) (in terms of polystyrene standards according to gel permeation chromatography (GPC)) of the component (A1b) is not particularly limited, and is preferably 1,000 to 50,000, more preferably 2,000 to 30,000, and most preferably 3,000 to 20,000.

When Mw of the component (A1b) is equal to or less than an upper limit of this preferable range, the solubility in a resist solvent is sufficient for use as a resist, and when Mw of the component (A1b) is equal to or more than a lower limit of this preferable range, the dry etching resistance and the resist pattern cross-sectional shape become favorable.

The dispersity (Mw/Mn) of the component (A1b) not particularly limited, and is preferably 1.0 to 4.0, more preferably 1.0 to 3.0, and particularly preferably 1.1 to 2.0. Here, Mn indicates a number average molecular weight.

Component (A2b)

In the resist composition of the present embodiment, as the component (A), a base component that exhibits a changed solubility in a developing solution under the action of an acid (hereinafter referred to as a "component (A2b)") which does not correspond to the component (A1b) may be used in combination.

The component (A2b) is not particularly limited, and any one selected from among many components conventionally known as a base component for a chemically amplified resist composition may be used Regarding the component (A2b), a high-molecular-weight compound or a low-molecular-weight compound may be used alone or two or more thereof may be used in combination.

A proportion of the component (A1b) in the component (A) is preferably 25 mass % or more, more preferably 50 mass % or more, and still more preferably 75 mass % or more, and may be 100 mass % with respect to the total mass of the component (A). When the proportion is 25 mass % or more, a resist pattern having excellent various lithography properties such as high sensitivity and resolution, and improved roughness is easily formed. Particularly, such effects are significant in lithography using an electron beam or EUV.

In the resist composition of the present embodiment, the amount of the component (A) may be adjusted according to the thickness of the resist film to be formed and die like.

[Component (A1c)]

The component (A1c) is a resin component having the structural unit (a1) and the structural unit (a0-3) having a partial structure represented by the following general formula (a0-3).

[Chem. 87]

(a0-3)

[In the formula, $R^1$ represents a fluorinated alkyl group having 1 to 12 carbon atoms. $R^2$ represents an organic group having 1 to 12 carbon atoms which may have a fluorine atom, or a hydrogen atom * indicates a bond.]

In the formula (a0-3), $R^1$ represents a fluorinated alkyl group having 1 to 12 carbon atoms.

The fluorinated alkyl group having 1 to 12 carbon atoms is a group in which some or all of the hydrogen atoms of the alkyl group having 1 to 12 carbon atoms are substituted with a fluorine atom. The alkyl group may be linear or branched.

Specific examples of the linear fluorinated alkyl group having 1 to 12 carbon atoms include groups in which some or all of the hydrogen atoms of a methyl group, an ethyl group, a propyl group, a butyl group, a pentyl group, a hexyl group, a heptyl group, an octyl group, a nonyl group, a decyl group, an undecyl group, or a dodecyl group are substituted with a fluorine atom specific examples of the branched fluorinated alkyl group having 1 to 12 carbon atoms include groups in which some or all of the hydrogen atoms of a 1-methylethyl group, a 1,1-dimethylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group are substituted with a fluorine atom.

Regarding the fluorinated alkyl group having 1 to 12 carbon atoms for $R^1$, among the above examples, a fluorinated alkyl group having 1 to 5 carbon atoms is more preferable, and specifically, a trifluoromethyl group is particularly preferable.

In the formula (a0-3), $R^2$ represents an organic group having 1 to 12 carbon atoms which may have a fluorine atom, or a hydrogen atom.

Examples of the organic group having 1 to 12 carbon atoms which may have a fluorine atom for $R^2$ include a monovalent hydrocarbon group which may have a substituent.

Examples of the hydrocarbon group include a linear or branched alkyl group and a cyclic hydrocarbon group. Examples of the linear or branched alkyl group include the same as those provided for the fluorinated alkyl group having 1 to 12 carbon atoms for $R^1$.

When $R^2$ is a cyclic hydrocarbon group, the hydrocarbon group may be an aliphatic hydrocarbon group or an aromatic hydrocarbon group, or may be a polycyclic group or a monocyclic group.

As the monocyclic aliphatic hydrocarbon group, a group in which one hydrogen atom has been removed from a monocycloalkane is preferable. The monocycloalkane preferably has 3 to 6 carbon atoms, and specific examples thereof include cyclopentane and cyclohexane.

As the polycyclic aliphatic hydrocarbon group, a group in which one hydrogen atom has been removed from a polycycloalkane is preferable, and the polycyclic group preferably has 7 to 12 carbon atoms. Examples of the poly cycloalkane include adamantane, norbornane, isobornane, tricyclodecane and tetracyclododecene.

When the cyclic hydrocarbon group for $R^2$ is an aromatic hydrocarbon group, the aromatic hydrocarbon group is a hydrocarbon group having at least one aromatic ring. Specific examples of the aromatic hydrocarbon group include a group in which one hydrogen atom has been removed from the aromatic hydrocarbon ring such as benzene, naphthalene, anthracene, phenanthrene, biphenyl, and fluorene.

The organic group having 1 to 12 carbon atoms for $R^2$ may have a substituent other than a fluorine atom. Examples of the substituent include a hydroxy group, a carboxy group, a halogen atom (such as, a fluorine atom, a chlorine atom, a bromine atom, and so on), an alkoxy group (such as, a methoxy group, an ethoxy group, a propoxy group, a butoxy group, and so on), and an alkyloxycarbonyl group.

$R^2$ is preferably a fluorinated alkyl group having 1 to 12 carbon atoms, more preferably a fluorinated alkyl group having 1 to 5 carbon atoms, and most preferably a trifluoromethyl group.

The structural unit (a0-3) having a partial structure represented by the general formula (a0-3) is preferably a structural unit (a0-3-1) in which a polymerizable group at the $W^3$ site in die compound represented by the following general formula (a0-3-1) is converted into a main chain or a structural unit (a0-3-2) in which a polymerizable group at the $W^4$ site in the compound represented by the following general formula (a0-3-2) is converted into a main chain.

[Chem. 88]

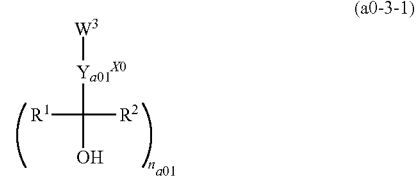

(a0-3-1)

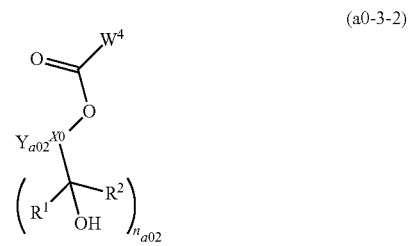

(a0-3-2)

[In the formula, $R^1$ represents a fluorinated alkyl group having 1 to 12 carbon atoms. $R^2$ represents an organic group having 1 to 12 carbon atoms which may have a fluorine atom, or a hydrogen atom. $W^3$ and $W^4$ represent a polymerizable group-containing group. $Y_{a01}^{x0}$ represents a single bond or an ($n_{a01}$+1)-valent linking group. $Y_{a01}^{x0}$ and $W^3$ may form a condensed ring. $Y_{a02}^{x0}$ represents a single bond or an ($n_{a02}$+1)-valent linking group, $n_{a01}$ and $n_{a02}$ are an integer of 1 to 3.]

In the formulae (a0-3-1) and (a0-3-2), $R^1$ and $R^2$ are the same as those described in the above (a0-3).

In the formulae (a0-3-1) and (a0-3-2), $W^3$ and $W^4$ represent a polymerizable group-containing group. The polymerizable group-containing group for $W^3$ and $W^4$ is the same as the polymerizable group-containing group for $W^1$ in the formula (a0-1a-1).

Examples of the polymerizable group at the $W^3$ and $W^4$ sites include a vinyl group, an allyl group, an acryloyl group, a methacryloyl group, a fluorovinyl group, a difluorovinyl group, a trifluorovinyl group, a difluorotrifluoromethylvinyl group, a trifluoroaryl group, a perfluoroallyl group, a trifluoromethylacryloyl group, a nonylfluorobutylacryloyl group, a vinyl ether group, a fluorine-containing vinyl ether group, an allyl ether group, a fluorine-containing allyl ether group, a styryl group, a vinylnaphthyl group, a fluorine-containing styryl group, a fluorine-containing vinylnaphthyl group, a norbornenyl group, a fluorine-containing norbornenyl group, and a silyl group. The polymerizable group-containing group may be a group constituted of only a polymerizable group or a group constituted of a polymerizable group and a group other than a polymerizable group. Examples of the group other than a polymerizable group include a bivalent hydrocarbon group which may have a substituent and a bivalent linking group containing a hetero atom.

Preferable examples of $W^3$ and $W^4$ include a group represented by the chemical formula: $CH_2=C(R)-Ya^{x0}-$. In the chemical formula, R represents a hydrogen atom, an alkyl group having 1 to 5 carbon atoms or a halogenated alkyl group having 1 to 5 carbon atoms, and $Ya^{x0}$ represents a single bond or a bivalent linking group.

In the chemical formula, the alkyl group having 1 to 5 carbon atoms for R is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which some or all of the hydrogen atoms of the alkyl group having 1 to 5 carbon atoms are substituted with a halogen atom. Examples of the halogen atom include a fluorine atom, a chlorine atom, a bromine atom, and an iodine atom, and a fluorine atom is particularly preferable. R is preferably a hydrogen atom, an alkyl group having 1 to 5 carbon atoms or a fluorinated alkyl group having 1 to 5 carbon atoms, and in terms of industrial availability, a hydrogen atom or a methyl group is more preferable, and a methyl group is particularly preferable.

In the chemical formula, examples of the bivalent linking group for $Ya^{x0}$ include the same as those provided for for $Ya^{x0}$ described for $W^1$ in the general formula (a0-1a-1). Among these, $Ya^{x0}$ for $W^3$ and $W^4$ is preferably an ester bond [—C(=O)—O—, —O—C(=O)—], an ether bond (—O—), a linear or branched alkylene group, or a combination thereof, or a single bond. Among these, an ester bond [—C(=O)—O—, —O—C(=O)—], a linear or branched alkylene group, or a combination thereof, or a single bond is more preferable, and an ester bond [—C(=O)—O—, —O—C(=O)—] or a single bond is particularly preferable.

In the formula (a0-3-1), $Y_{a01}^{x0}$ is a single bond or a $(n_{a01}+1)$-valent linking group, that is, a bivalent, trivalent or tetravalent linking group.

The bivalent linking group for $Y_{a01}^{x0}$ is the same as those described for the above $Ya^{x0}$.

Examples of the trivalent linking group for $Y_{a01}^{x0}$ include a group in which one hydrogen atom is removed from the bivalent linking group for $Y_{a01}^{x0}$, and a group in which the bivalent linking group is additionally bonded to the bivalent linking group.

Examples of the tetravalent linking group for $Y_{a01}^{x0}$ include a group in which two hydrogen atoms are removed from the bivalent linking group for $Y_{a01}^{x0}$.

$Y_{a01}^{x0}$ and $W^3$ may form a condensed ring.

When $Y_{a01}^{x0}$ and $W^3$ form a condensed ring, examples of a ring structure thereof include a condensed ring of an alicyclic hydrocarbon and an aromatic hydrocarbon. The condensed ring formed by $Y_{a01}^{x0}$ and $W^3$ may have a hetero atom.

The part of the alicyclic hydrocarbon in the condensed ring formed by $Y_{a01}^{x0}$ and $W^3$ may be monocyclic or polycyclic.

Examples of the condensed ring formed by $Y_{a01}^{x0}$ and $W^3$ include a condensed ring formed by a polymerizable group at the $W^3$ site and $Y_{a01}^{x0}$ and a condensed ring formed by a group other than the polymerizable group at the $W^3$ site and $Y_{a01}^{x0}$. Specific examples thereof include a 2-ring condensed ring of a cycloalkene and an aromatic ring, a 3-ring condensed ring of a cycloalkene and two aromatic rings, a 2-ring condensed ring of a cycloalkane having a polymerizable group as a substituent and an aromatic ring, and a 3-ring condensed ring of a cycloalkane having a polymerizable group as a substituent and an aromatic ring.

The condensed ring formed by $Y_{a01}^{x0}$ and $W^3$ may have a substituent. Examples of the substituent include a methyl group, an ethyl group, a propyl group, a hydroxy group, a hydroxyalkyl group, a carboxy group, a halogen atom (such as, a fluorine atom, a chlorine atom, a bromine atom, and so on), an alkoxy group such as, (a methoxy group, an ethoxy group, a propoxy group, a butoxy group, and so on), an acyl group, an alkyloxycarbonyl group, and an alkylcarbonyloxy group.

Specific examples of the condensed ring formed by $Y_{a01}^{x0}$ and $W^3$ are shown below. $W^\alpha$ represents a polymerizable group. ** indicates a bond with the group represented by the formula (a0-3).

[Chem. 89]

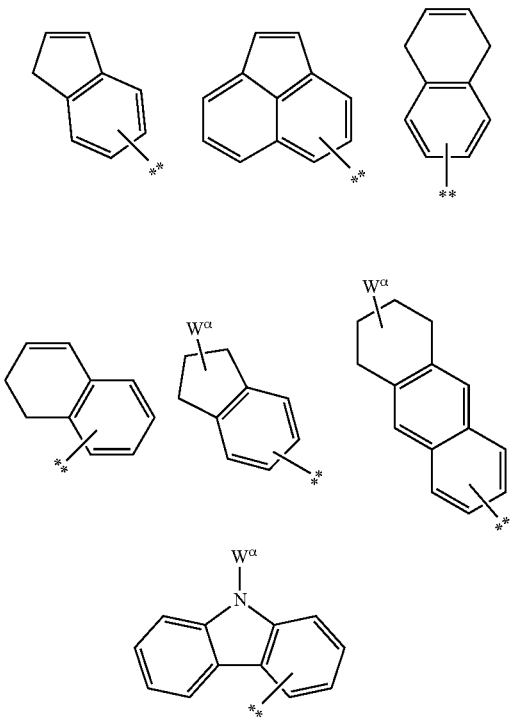

In the formula (a0-3-2), $Y_{a02}^{x0}$ represents a single bond or an $(n_{a02}+1)$-valent linking group. $Y_{a02}^{x0}$ is the same as diose described for die above $Ya^{x0}$ and $Y_{a01}^{x0}$.

In the formulae (a0-3-1) and (a0-3-2), $n_{a01}$ and $n_{a02}$ are an integer of 1 to 3, and preferably 1 or 2, and more preferably 1.

The structural unit (a0-3) having a partial structure represented by the general formula (a0-3) is more preferably a structural unit (a0-3-1-1) in which a polymerizable group at the $W^3$ site is converted into a main chain in the compound represented by the following general formula (a0-3-1-1).

[Chem. 90]

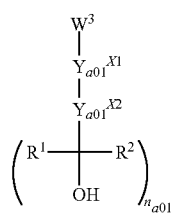

(a0-3-1-1)

[In the formula, $R^1$ represents a fluorinated alkyl group having 1 to 12 carbon atoms. $R^2$ represents an organic group having 1 to 12 carbon atoms which may have a fluorine atom, or a hydrogen atom $W^3$ represents a polymerizable group-containing group. $Y_{a01}{}^{x1}$ represents a single bond or a bivalent linking group. $Y_{a01}{}^{x2}$ represents an $(n_{a01}+1)$-valent aromatic hydrocarbon group which may have a substituent. $W^3$ and $Y_{a01}{}^{x1}$ may form a condensed ring. $W^3$, $Y_{a01}{}^{x1}$ and $Y_{a01}{}^{x2}$ may form a condensed ring, $n_{a01}$ represents an integer of 1 to 3.]

In the formula (a0-3-1-1), $R^1$ and $R^2$ are the same as those described in the above (a0-3).

In the formula (a0-3-1-1), $W^3$ is the same as those described in the above (a0-3-1) and (a0-3-2).

In the formula (a0-3-1-1), $Y_{a01}{}^{x1}$ represents a single bond or a bivalent linking group, and is the same as those described for the above $Ya^{x0}$ and $Y_{a01}{}^{x0}$.

In the formula (a0-3-1-1), $Y_{a01}{}^{x2}$ represents an $(n_{a01}+1)$-valent aromatic hydrocarbon group which may have a substituent.

Examples of the aromatic hydrocarbon group for $Y_{a01}{}^{x2}$ include a group in which $(n_{a01}+1)$ hydrogen atoms have been removed from an aromatic ring. The aromatic ring here is not particularly limited as long as it is a cyclic conjugated compound having $(4n+2)$ π-electrons, and it may be monocyclic or polycyclic. The aromatic ring preferably has 5 to 30 carbon atoms, more preferably 5 to 20 carbon atoms, still more preferably 6 to 15 carbon atoms, and particularly preferably 6 to 12 carbon atoms. Examples of the aromatic ring include aromatic hydrocarbon rings, such as benzene, naphthalene, anthracene and phenanthrene; and aromatic hetero rings in which some of the carbon atoms constituting the aforementioned aromatic hydrocarbon rings have been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Examples of the substituent that $Y_{a01}{}^{x2}$ may have include a carboxy group, a halogen atom (such as, a fluorine atom, a chlorine atom, a bromine atom, and so on), an alkoxy group (such as, a methoxy group, an ethoxy group, a propoxy group, a butoxy group, and so on), and an alkyloxycarbonyl group.

In the formula (a0-3-1-1), $W^3$ and $Y_{a01}{}^{x1}$ may form a condensed ring, and $W^3$, $Y_{a01}{}^{x1}$, and $Y_{a01}{}^{x2}$ may form a condensed ring. The condensed ring formed of $W^3$ and $Y_{a01}{}^{x1}$ and the condensed ring formed of $W^3$, $Y_{a01}{}^{x1}$, and $Y_{a01}{}^{x2}$ are the same as those described in the condensed ring formed of $Y_{a01}{}^{x0}$ and $W^3$ in the formula (a0-1).

In the formula (a0-3-1-1), $n_{a01}$ is an integer of 1 to 3, and is preferably 1 or 2, and more preferably 1.

Specific examples of the structural unit (a0-3) are shown below.

In the following formula, $R^\alpha$ represents a hydrogen atom, a methyl group or a trifluoromethyl group.

[Chem. 91]

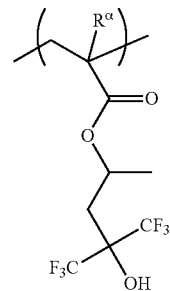

(a0-3-11)

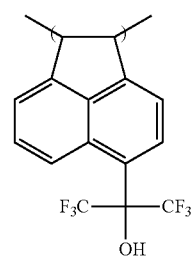

(a0-3-12)

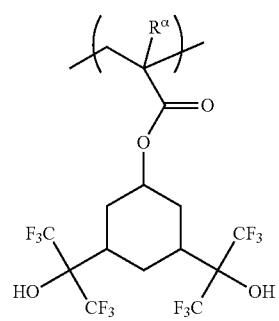

(a0-3-13)

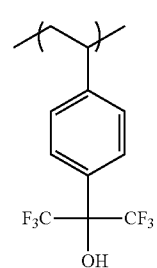

(a0-3-14)

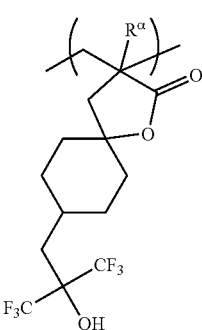

(a0-3-15)

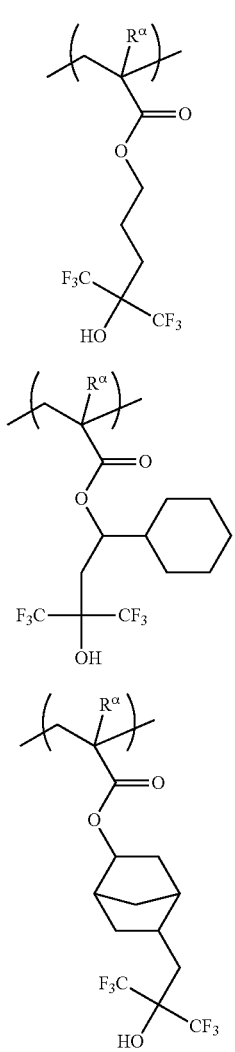

(a0-3-16)

(a0-3-17)

(a0-3-18)

Among the above examples, the structural unit (a0-3) is preferably at least one selected from among the group consisting of structural units represented by the chemical formulae (a0-3-11) to (a0-3-18). Among these, the structural unit (a0-3) is more preferably at least one selected from among the group consisting of structural units represented by the chemical formulae (a0-3-12) and (a0-3-14) having an aromatic hydrocarbon group.

The structural unit (a0-3) of the component ($R^1$) may be of one type or two or more types.

In the component (A1c), a proportion of the structural unit (a0-3) is preferably 10 to 80 mol %, more preferably 10 to 65 mol %, and particularly preferably 10 to 50 mol % with respect to the total (100 mol %) of all structural units constituting the component (A1c).

When a proportion of the structural unit (a0-3) is equal to or more than a lower limit of the preferable range, the solubility in the developing solution and the adhesion to the substrate are improved, and when the proportion thereof is equal to or less than an upper limit of the preferable range, a balance with other structural units can be easily achieved.

<<Structural Unit (a1)>>

The component (A1c) has the structural unit (a1) in addition to the structural unit (a0-3).

The acid dissociable group in the structural unit (a1) of the component (A1c) is not particularly limited, and examples thereof include diose hitherto proposed as an acid dissociable group for a base resin for a chemically amplified resist.

Specific examples of those proposed as an acid dissociable group for a base resin for a chemically amplified resist include the above "acetal-type acid dissociable group," "tertiary alkyloxycarbonyl acid dissociable group," and "tertiary alkyl ester type acid dissociable group."

Among the above examples, the structural unit (a1) is preferably a structural unit derived from an acrylic ester in which a hydrogen atom bonded to a carbon atom at the α-position may be substituted with a substituent.

Preferable specific examples of the structural unit (a1) include a structural unit represented by the following general formula (a1-1) or (a1-2).

[Chem. 92]

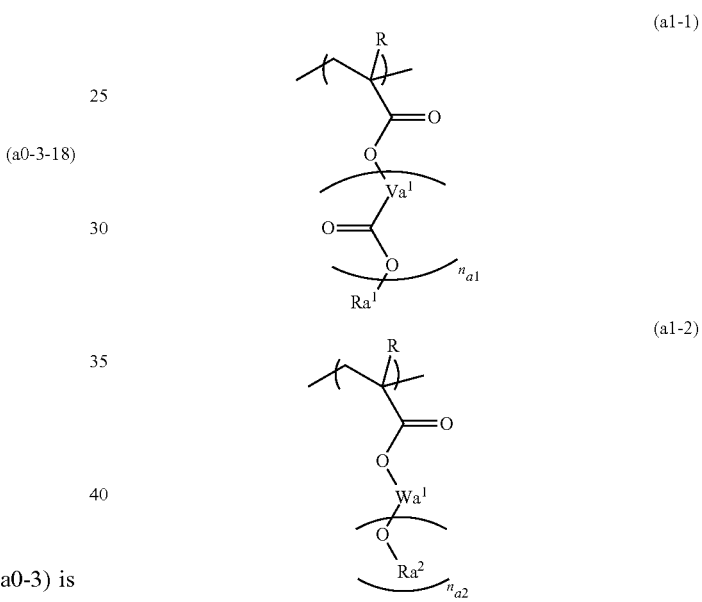

[In the formula, R represents a hydrogen atom, an alkyl group having 1 to 5 carbon atoms or a halogenated alkyl group having 1 to 5 carbon atoms. $Va^1$ represents a bivalent hydrocarbon group which may have an ether bond. $n_{a1}$ is an integer of 0 to 2. $Ra^1$ represents an acid dissociable group represented by the general formula (a1-r-1) or (a1-r-2). $Wa^1$ represents a hydrocarbon group having a valency of $n_{a2}+1$, $n_{a2}$ is an integer of 1 to 3, and $Ra^2$ represents an acid dissociable group represented by the general formula (a1-r-1) or (a1-r-3).]

In the formula (a1-1), R, $Va^{a1}$, and $n_{a1}$ are the same as R, $Va^1$, and $n_{a1}$ in the general formula (a1-1a-1), and preferable examples thereof are the same as those above.

In the formula (a1-1), $Ra^1$ represents an acid dissociable group represented by the formula (a1-r-1) or (a1-r-2).

In the formula (a1-2), R, $Wa^1$, and $n_{a2}$ are the same as R, $Wa^1$, and $n_{a1}$ in the general formula (a1-1a-2), and preferable examples thereof are the same as those above.

In the formula (a1-2), $Ra^2$ represents an acid dissociable group represented by the general formula (a1-r-1) or (a1-r-3).

Specific examples of the structural unit represented by the formula (a1-1) are shown below. In the following formula, $R^\alpha$ represents a hydrogen atom, a methyl group or a trifluoromethyl group.
[Chem. 93]
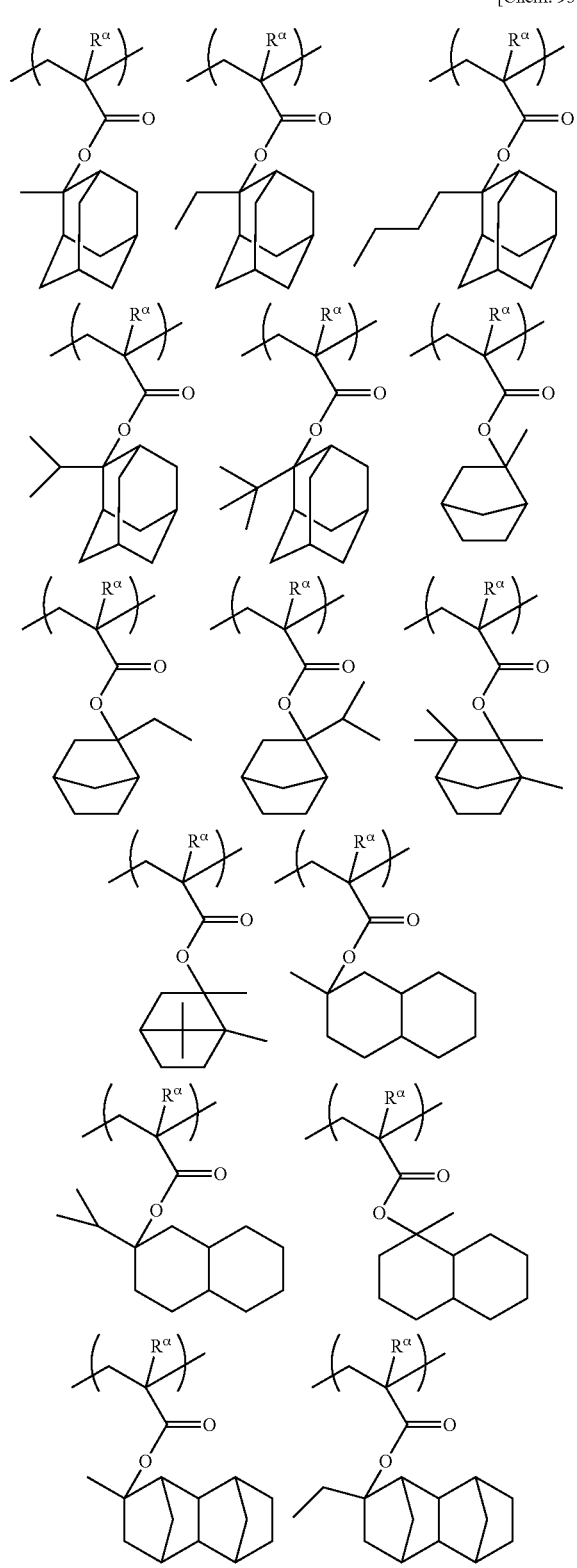
-continued
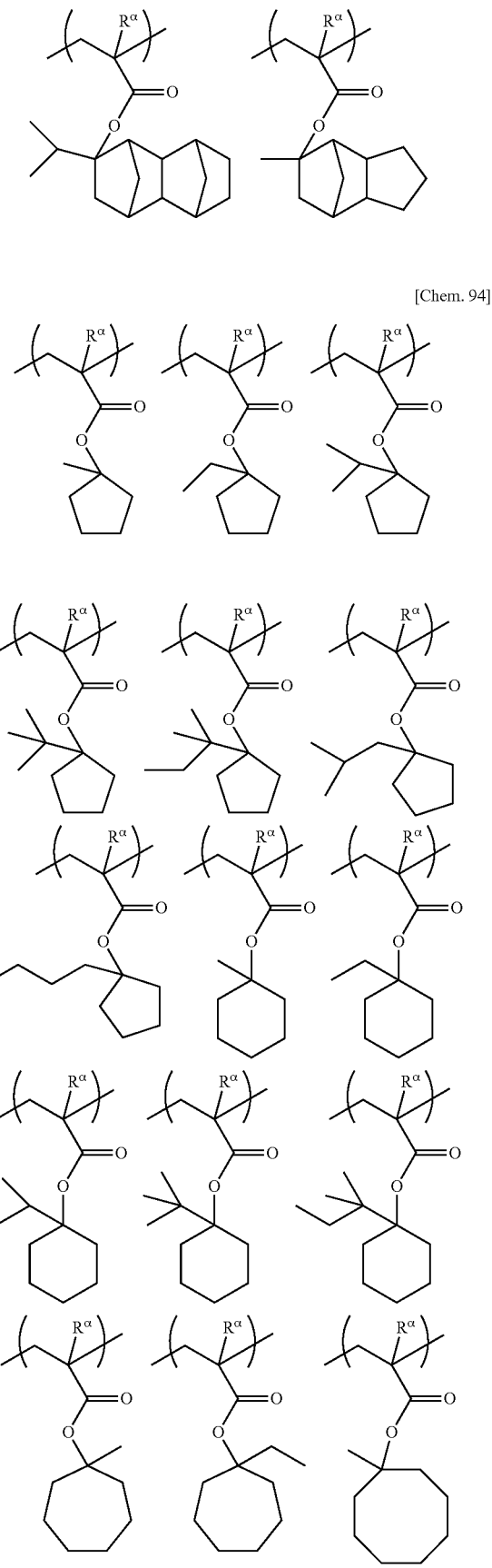
[Chem. 94]

155
-continued
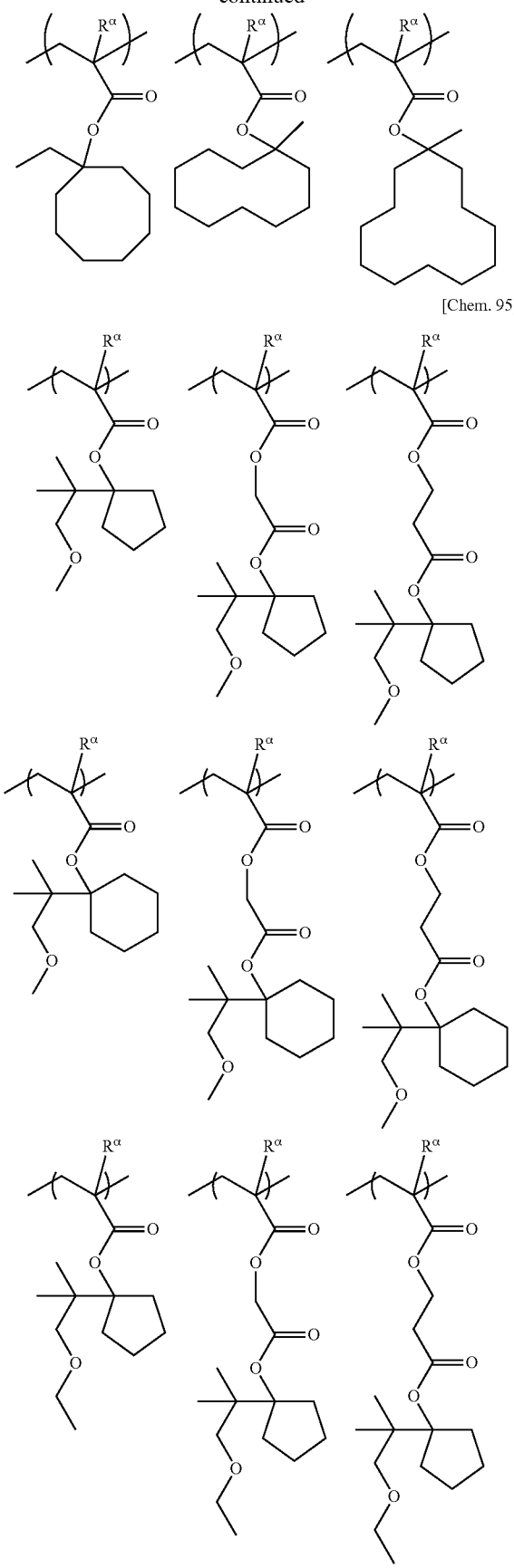
[Chem. 95]
156
-continued
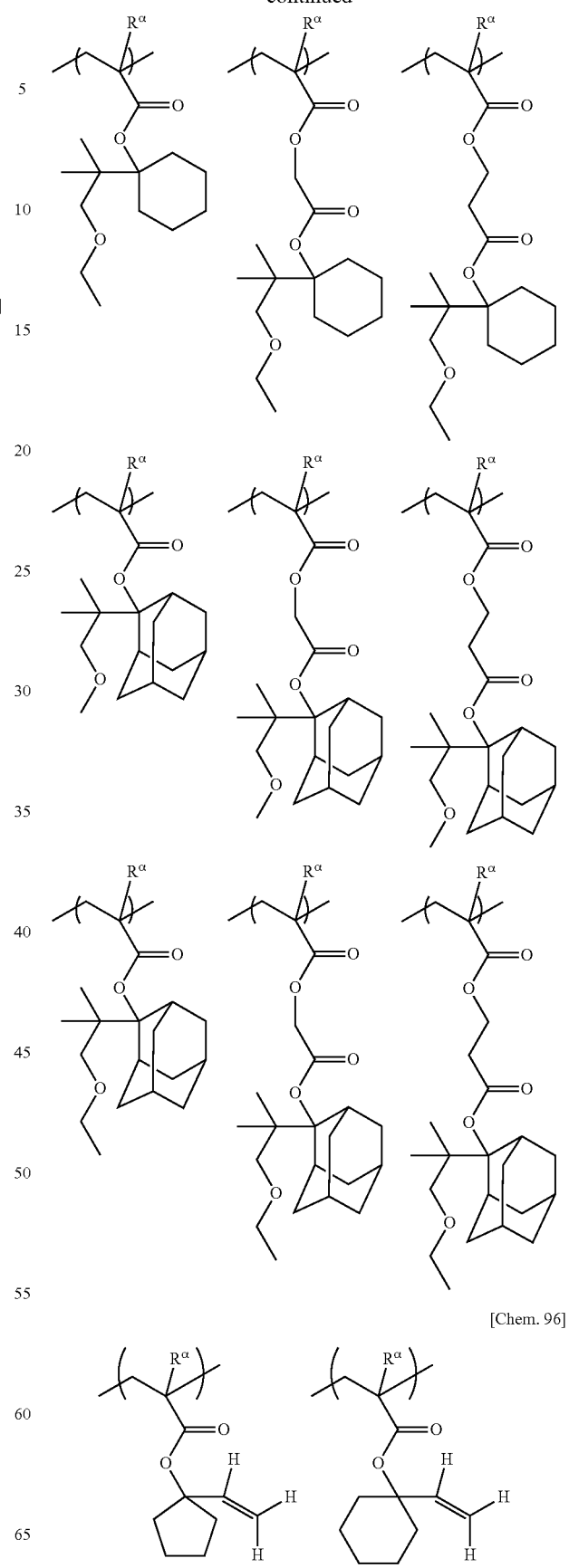
[Chem. 96]

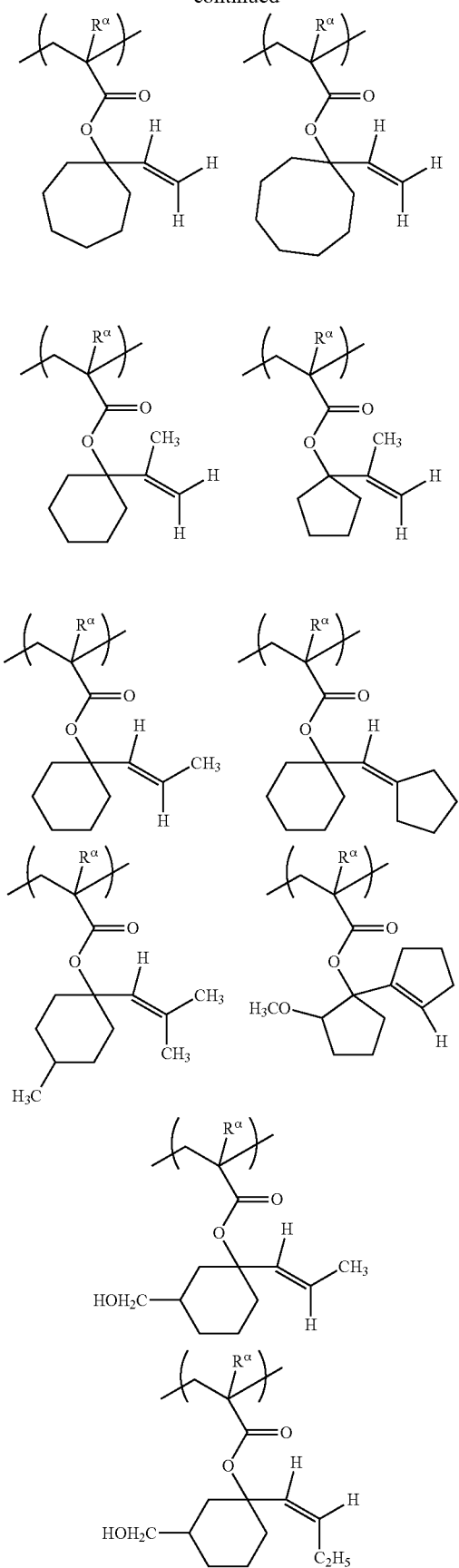
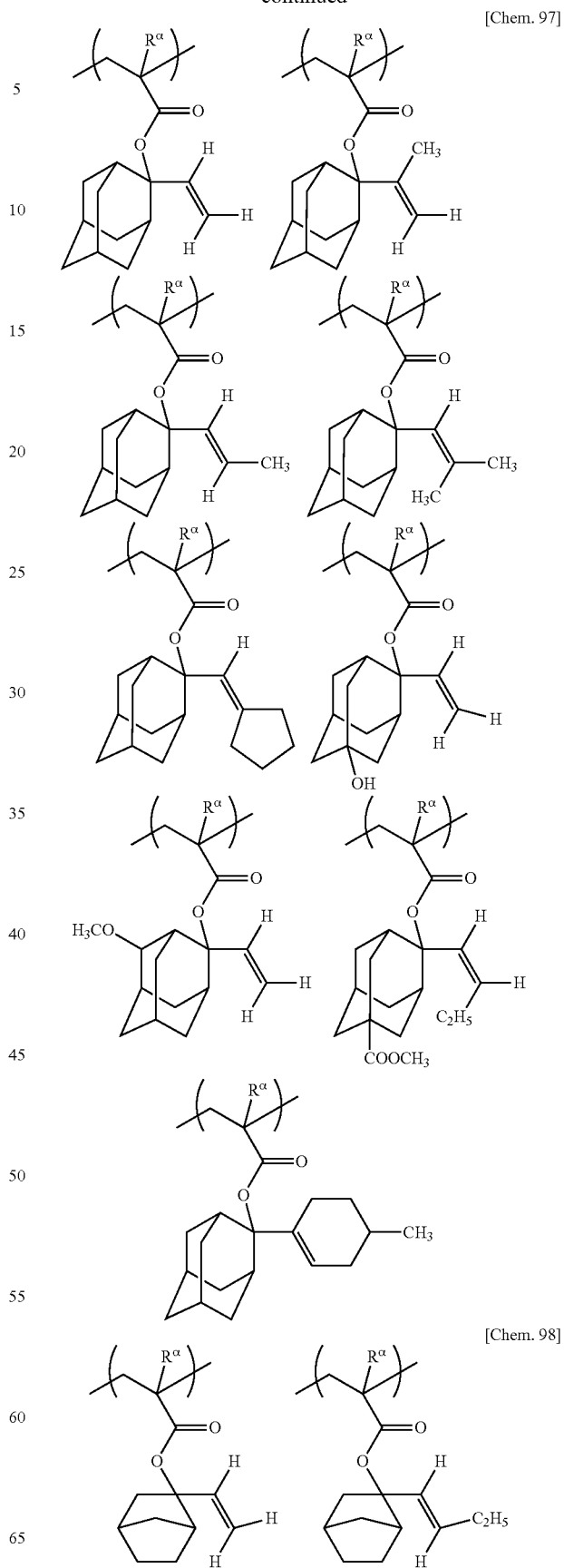

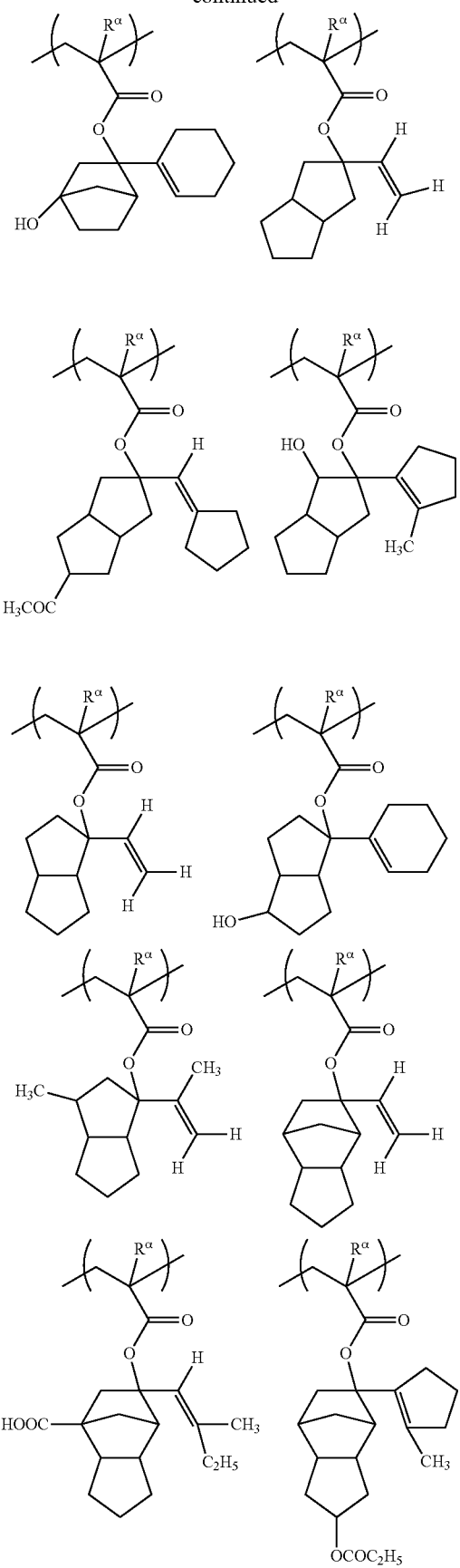
[Chem. 99]

[Chem. 100]
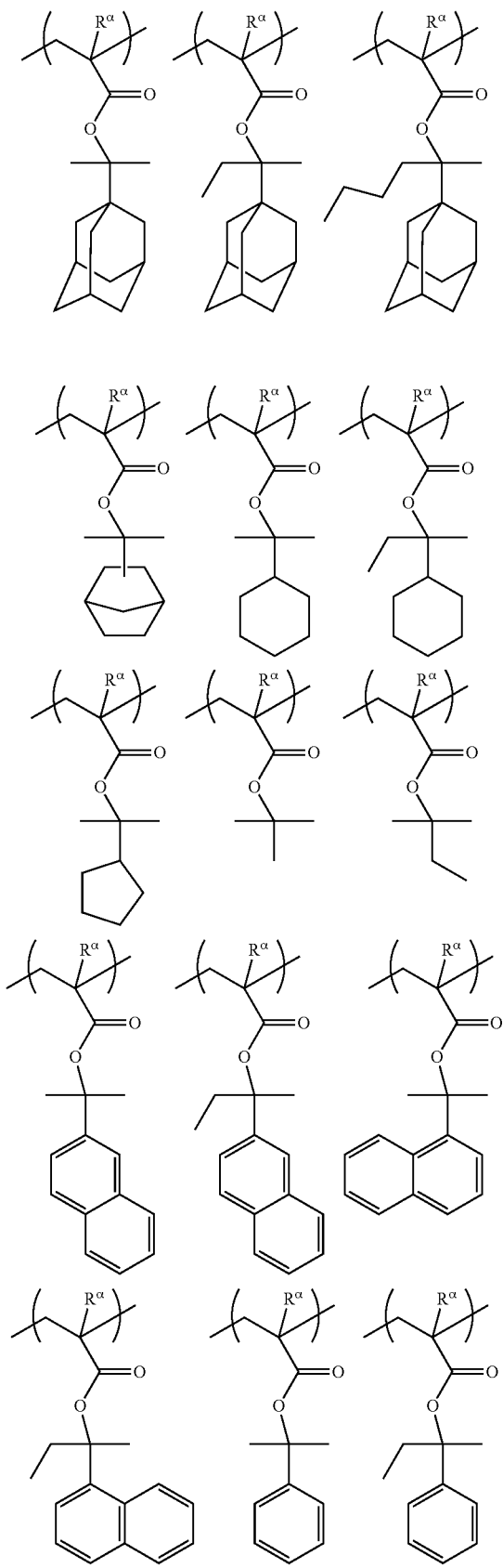
[Chem. 101]
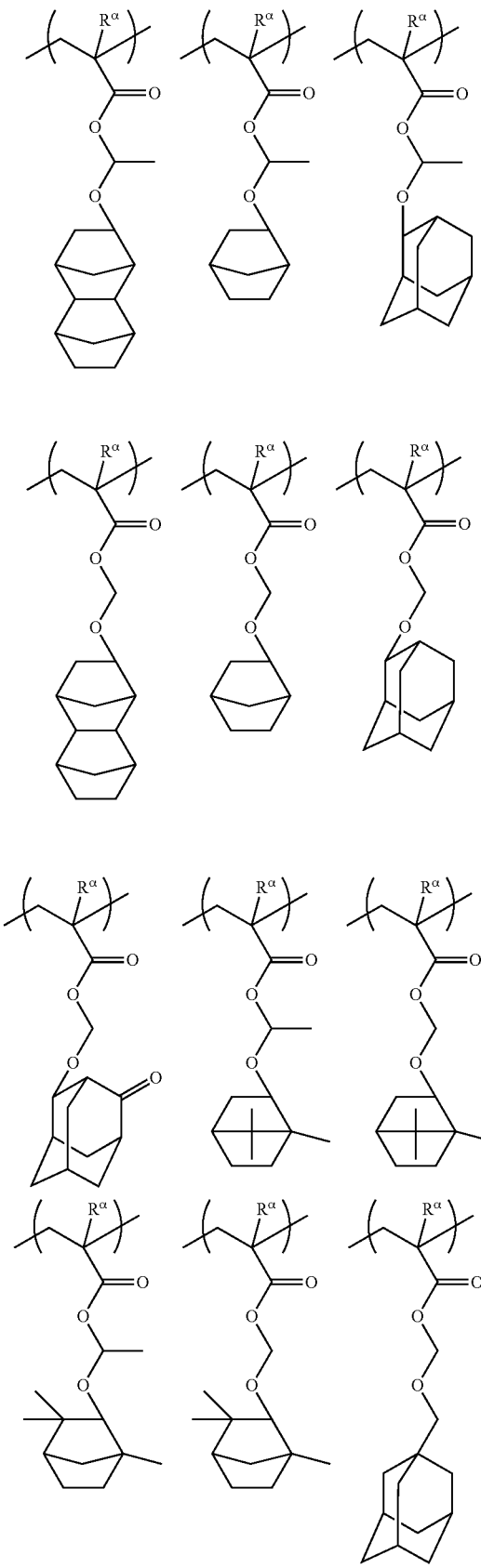

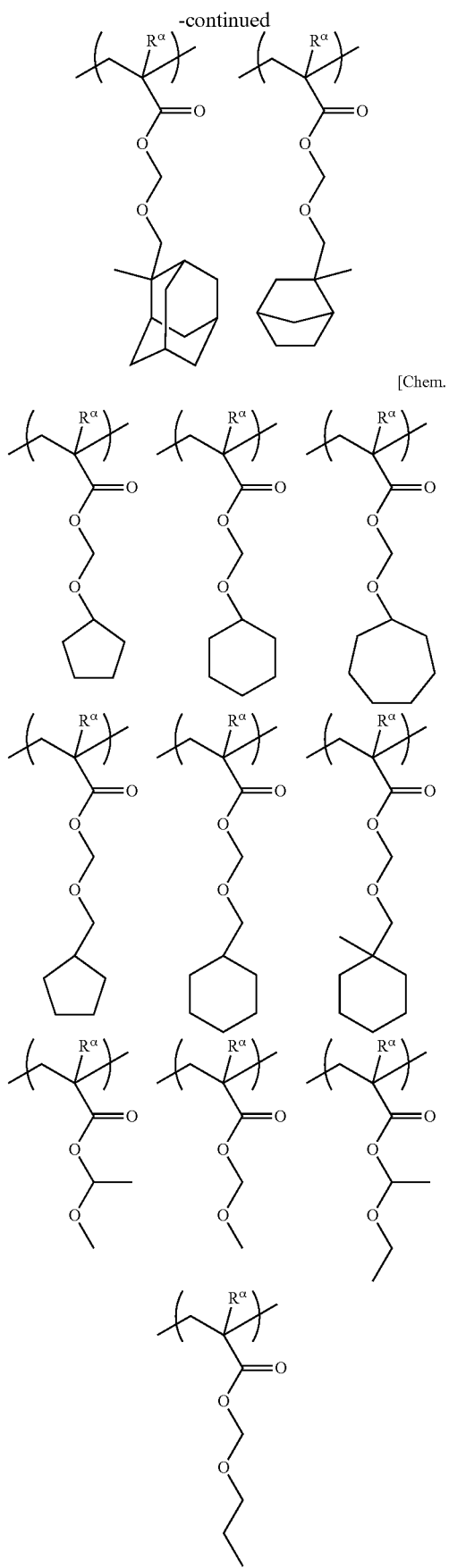
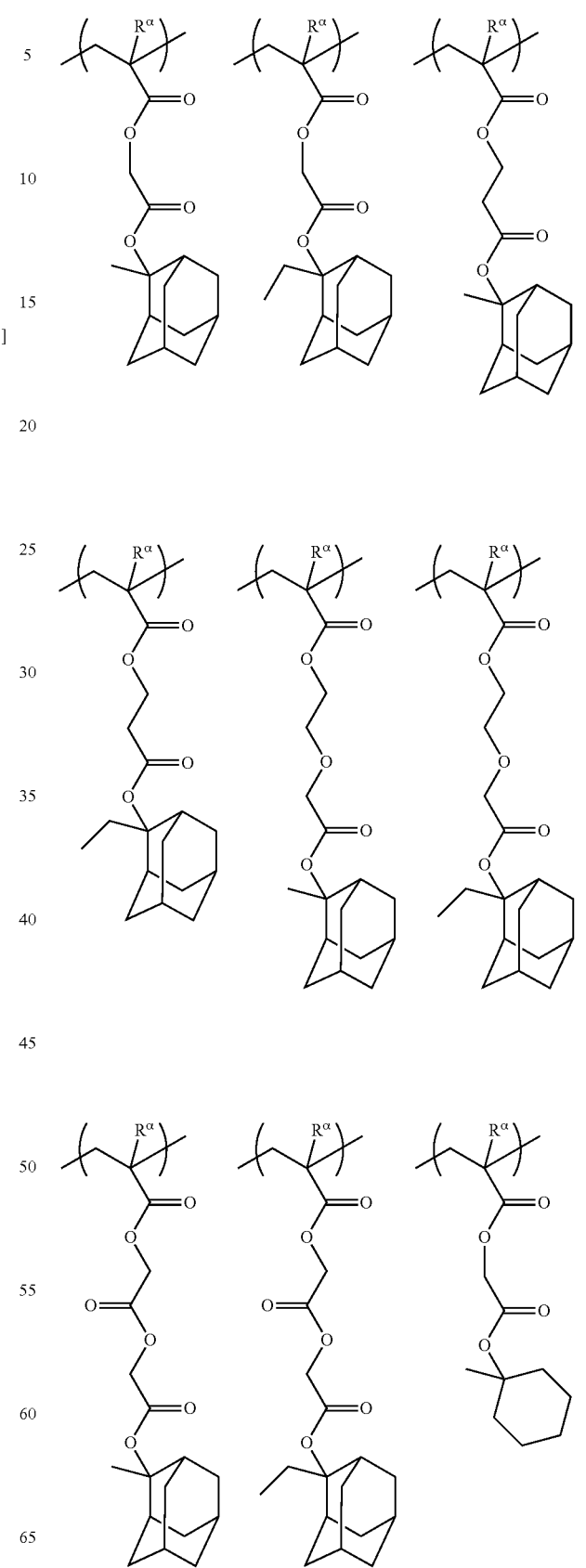

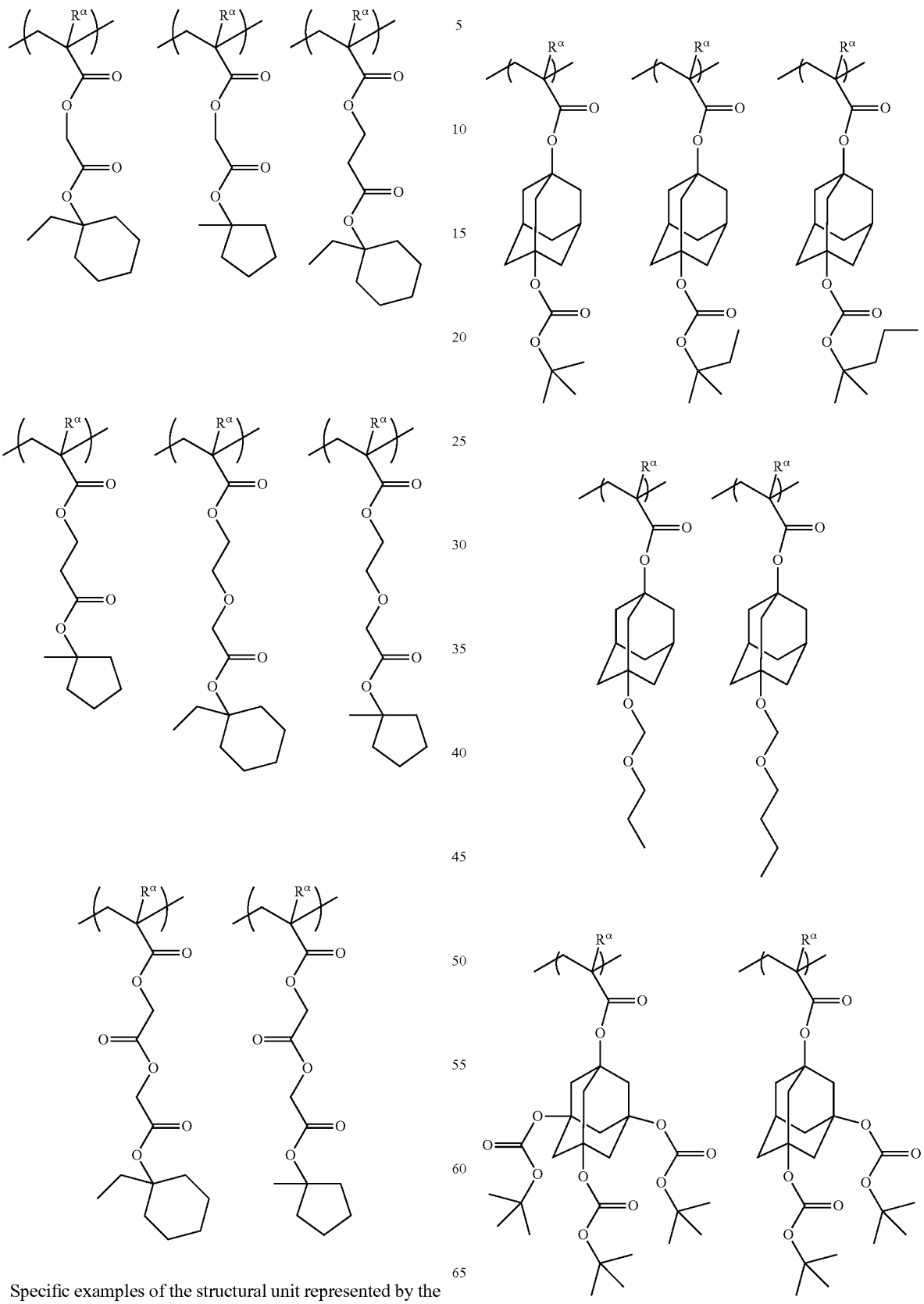
Specific examples of the structural unit represented by the formula (a 1-2) are shown below.

-continued

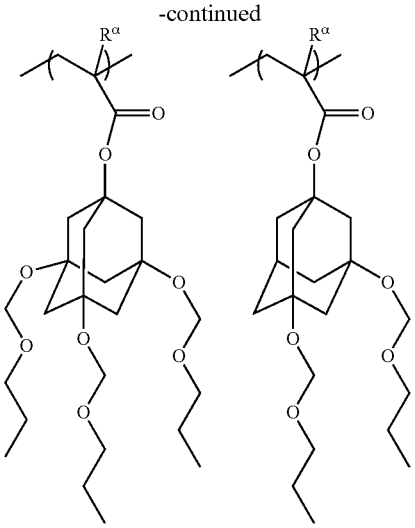

The structural unit (a1) of the component (A1c) may be of one type or two or more types.

Regarding the structural unit (a1), a structural unit represented by the formula (a1-1) is more preferable because properties (such as, sensitivity, a shape, etc.) in lithography with an electron beam or EUV are more improved.

Among these, regarding the structural unit (a1), those having a structural unit represented by the following general formula (a1-1-1) are particularly preferable.

[Chem. 105]

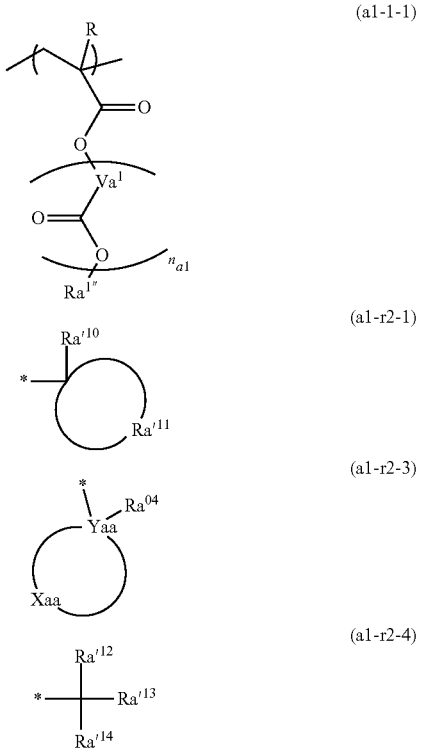

[In the formula, $Ra^{1\prime\prime}$ represents an acid dissociable group represented by the general formula (a1-r2-1), (a1-r2-3) or (a1-r2-4).]

In the formula (a1-1-1), R, $Va^1$ and $n_{a1}$ are the same as R, $Va^1$ and $n_{a1}$ in the formula (a1-1).

Description of the acid dissociable group represented by the general formula (a1-r2-1), (a1-r2-3) or (a1-r2-4) is the same as above.

Among examples, the structural unit (a1) is preferably the above structural unit (a0-1a) or structural unit (a0-1b).

The structural unit (a1) of the component (A1c) may be of one type or two or more types.

A proportion of the structural unit (a1) in the component (A1c) is preferably 5 to 80 mol %, more preferably 10 to 75 mol %, and most preferably 30 to 70 mol % with respect to the total (100 mol %) of all structural units constituting the component (A1c).

When a proportion of the structural unit (a1) is equal to or more than a lower limit, lithography properties such as sensitivity, resolution, and roughness are improved. In addition, when the proportion thereof is equal to or less than an upper limit, a balance with other structural units can be achieved and various lithography properties become favorable.

<<Other Structural Units>>

The component (A1c) may have another structural unit other than the above structural unit (a0-3) and structural unit (a1).

Examples of the other structural unit include the above structural unit (a0-2), the structural unit (a2) (provided that those corresponding to the structural unit (a1) are excluded), the structural unit (a3) (provided that those corresponding to the structural unit (a0-2), the structural unit (a1) or the structural unit (a2) are excluded), the structural unit (a9), a structural unit derived from styrene, a structural unit derived from a styrene derivative (provided that diose corresponding to the structural unit (a0-2) are excluded), and a structural unit having a non-acid dissociable aliphatic cyclic group.

Structural Unit (a0-2):

Preferably, the component (A1c) may further have a structural unit (a0-2) in addition to the structural unit (a0-3) and the structural unit (a1). The structural unit (a0-2) is the same as the structural unit (a0-2) described in die above [Component (A1a)], and preferable examples thereof are the same as those above.

The structural unit (a0-2) of the component (A1c) may be of one type or two or more types.

In the component (A1c), a proportion of the structural unit (a0-2) is, for example, 0 to 80 mol %, preferably 10 to 80 mol %, more preferably 20 to 70 mol %, and particularly preferably 30 to 60 mol % with respect to the total (100 mol %) of all structural units constituting the component (A1c).

When the proportion of the structural unit (a0-2) is equal to or more than a lower limit of the preferable range, lithography properties such as sensitivity, resolution, and roughness are improved. In addition, when the proportion thereof is equal to or less than an upper limit, a balance with other structural units can be achieved and various lithography properties become favorable.

Structural Unit (a2):

The component (A1c) may further have a structural unit (a2) (provided that those corresponding to the structural unit (a1) are excluded) in addition to the structural unit (a0-3) and the structural unit (a1). The structural unit (a2) is the same as the structural unit (a2) in the above [Component (A1a)], and preferable examples thereof are the same as those above.

When the component (A1c) is used to form a resist film, the lactone-containing cyclic group, the —$SO_2$— containing cyclic group or the carbonate-containing cyclic group of the structural unit (a2) is useful to improve the adhesion of the resist film to the substrate. In addition, when the structural unit (a2) is provided, for example, lithography properties and the like become favorable, according to effects of appropriately adjusting an acid diffusion length, improving adhesion of the resist film to the substrate, and appropriately adjusting the solubility during development.

The structural unit (a2) of the component (A1c) may be of one type or two or more types.

When the component (A1c) has the structural unit (a2), a proportion of the structural unit (a2) is preferably 1 to 50 mol %, more preferably 5 to 45 mol %, still more preferably 10 to 40 mol %, and particularly preferably 10 to 30 mol % with respect to the total (100 mol %) of all structural units constituting the component (A1).

When the proportion of the structural unit (a2) is equal to or more than a preferable lower limit, according to the above effects, an effect obtained by die inclusion of the structural unit (a2) is sufficiently obtained, and when the proportion thereof is equal to or less than an upper limit, a balance with other structural units can be achieved, and various lithography properties become favorable.

Structural Unit (a3):

The component (A1c) may further have a structural unit (a3) (provided that those corresponding to the structural unit (a1) or structural unit (a2) are excluded) in addition to the structural unit (a0-3) and the structural unit (a1). The structural unit (a3) is the same as the structural unit (a3) described in the above [Component (A1a)], and preferable examples thereof are the same as those above.

When the component (A1c) has the structural unit (a3), the hydrophilicity of the component (A) is improved, which contributes to improvement of the resolution. In addition, the acid diffusion length can be appropriately adjusted.

The structural unit (a3) of the component (A1c) may be of one type or two or more types.

When the component (A1c) has the structural unit (a3), a proportion thereof is preferably 1 to 40 mol %, more preferably 2 to 30 mol %, still more preferably 5 to 25 mol %, and particularly preferably 5 to 20 mol % with respect to the total of all structural units constituting the component (A1).

When a proportion of the structural unit (a3) is equal to or more than a preferable lower limit, an effect obtained by the inclusion of the structural unit (a3) is sufficiently obtained. On the other hand, when the proportion thereof is equal to or less than a preferable upper limit, a balance with other structural units can be easily achieved and various lithography properties become favorable.

Structural unit (a9):

The component (A1c) may have the structural unit (a9). The structural unit (a9) is the same as the structural unit (a9) described in the above [Component (A1a)], and preferable examples thereof are the same as those above.

The structural unit (a9) of the component (A1c) may be of one type or two or more types.

When the component (A1c) has the structural unit (a9), a proportion of the structural unit (a9) is preferably 1 to 40 mol %, more preferably 3 to 30 mol %, still more preferably 5 to 25 mol %, and particularly preferably 10 to 20 mol % with respect to the total (100 mol %) of all structural units constituting the component (A1).

When the proportion of the structural unit (a9) is equal to or more than a lower limit for example, effects of appropriately adjusting an acid diffusion length, improving the adhesion of the resist film to the substrate, appropriately adjusting the solubility during development, and improving etching resistance are obtained, and when the proportion thereof is equal to or less than an upper limit, a balance with other structural units can be achieved, and various lithography properties become favorable.

In the resist composition, one type of the component (A1c) may be used alone or two or more thereof may be used in combination.

In the resist composition of the present embodiment, the resin component as the component (A1) has the structural unit (a0-3), and one type of polymer may be used alone or two or more types thereof may be used in combination.

For example, preferable examples of the component (A1c) include those containing a copolymer having the structural unit (a0-3), and as necessary, other structural units (hereinafter this copolymer will be referred to as a "component (A1c-1)").

Preferable examples of the component (A1c-1) include a high-molecular-weight compound having a repeating structure of the structural unit (a0-3) and the structural unit (a1), a high-molecular-weight compound having a repeating structure of the structural unit (a0-3) and the structural unit (a2), a high-molecular-weight compound having a repeating structure of the structural unit (a0-3), the structural unit (a0-2), and other structural units, a high-molecular-weight compound having a repeating structure of the structural unit (a0-3), the structural unit (a1), and the structural unit (a2), and a high-molecular-weight compound having a repeating structure of the structural unit (a0-3), the structural unit (a1), and the structural unit (a0-2).

The other structural unit is preferably the structural unit (a1), and more preferably a combination of structural units (a1) and (a10), structural units (a1) and (a2), or structural units (a1) and (a0-2). The structural unit (a1) is preferably the structural unit (a0-1a) or the structural unit (a0-1b).

The component (A1c) can be produced by dissolving monomers deriving structural units in a polymerization solvent, and adding a radical polymerization initiator, for example, azobisisobutyronitrile (AIBN), or dimethyl azobisisobutyrate (for example, V-601) thereto for polymerization. Alternatively, the component (A1c) can be produced by dissolving a precursor monomer that derives the structural unit (a0-3) and as necessary, a monomer that derives other structural units in a polymerization solvent, and adding the above radical polymerization initiator thereto for polymerization, and then causing a deprotection reaction.

The mass average molecular weight (Mw) (in terms of polystyrene standards according to gel permeation chromatography (GPC)) of the component (A1c) is not particularly limited, and is preferably 1,000 to 50,000, more preferably 2,000 to 30,000, and most preferably 3,000 to 20,000.

When Mw of the component (A1c) is equal to or less than an upper limit of this preferable range, the solubility in a resist solvent is sufficient for use as a resist, and when Mw of the component (A1c) is equal to or more than a lower limit of this preferable range, the dry etching resistance and the resist pattern cross-sectional shape become favorable.

The dispersity (Mw/Mn) of the component (A1c) is not particularly limited, and is preferably 1.0 to 4.0, more preferably 1.0 to 3.0, and particularly preferably 1.1 to 2.0. Here, Mn indicates a number average molecular weight.

Component (A2c)

In the resist composition of the present embodiment, as the component (A), a base component that exhibits a changed solubility in a developing solution under the action of an acid (hereinafter referred to as a "component (A2c)") that does not correspond to the component (A1c) may be used in combination.

The component (A2c) is not particularly limited, and any one selected from among many components conventionally known as a base component for a chemically amplified resist composition may be used Regarding the component (A2c), a high-molecular-weight compound or a low-molecular-weight compound may be used alone or two or more thereof may be used in combination.

A proportion of the component (A1c) in the component (A) is preferably 25 mass % or more, more preferably 50 mass % or more, and still more preferably 75 mass % or more, and may be 100 mass % with respect to the total mass of the component (A). When the proportion is 25 mass % or more, a resist pattern having excellent various lithography properties such as high sensitivity and resolution, and improved roughness is easily formed. Particularly, such effects are significant in lithography using an electron beam or EUV.

In the resist composition of the present embodiment, the amount of the component (A) may be adjusted according to the thickness of the resist film to be formed and die like.

The resist composition of the present embodiment contains die component (A1) as the component (A). The component (A1) may be the above component (A1a), component (A1b), or component (A1c), or two or more thereof may be used in combination.

In the resist composition of the present embodiment, as the component (A), a base component that exhibits a changed solubility in a developing solution under the action of an acid (hereinafter referred to as a "component (A2)") that does not correspond to the component (A1) may be used in combination. The component (A2) is a base component that does not correspond to all of the component (A1a), the component (A1b), and die component (A1c).

The component (A2) is not particularly limited, and any one selected from among many components conventionally known as a base component for a chemically amplified resist composition may be used Regarding the component (A2), a high-molecular-weight compound or a low-molecular-weight compound may be used alone or two or more thereof may be used in combination.

A proportion of the component (A1) in the component (A) is preferably 25 mass % or more, more preferably 50 mass % or more, and still more preferably 75 mass % or more, and may be 100 mass % with respect to the total mass of the component (A). When the proportion is 25 mass % or more, a resist pattern having excellent various lithography properties such as high sensitivity and resolution, and improved roughness is easily formed. Particularly, such effects are significant in lithography using an electron beam or EUV.

<Compound (BD1)>

In the resist composition of the present embodiment, the component (BD1) is a compound having an anion moiety and a cation moiety represented by the following general formula (bd1).

[Chem. 106]

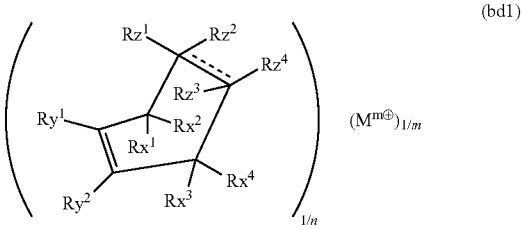

(bd1)

[In the formula, $Rx^1$ to $Rx^4$ each independently represent a hydrocarbon group which may have a substituent or a hydrogen atom, or two or more of $Rx^1$ to $Rx^4$ may be mutually bonded to form a ring structure. $Ry^1$ to $Ry^2$ each independently represent a hydrocarbon group which may have a substituent or a hydrogen atom, or may be mutually bonded to form a ring structure.

[Chem. 107]

----- represents a double bond or a single bond. $Rz^1$ to $Rz^4$ each independently represent, where valence allows, a hydrocarbon group which may have a substituent or a hydrogen atom, or two or more of $Rz^1$ to $Rz^4$ may be mutually bonded to form a ring structure; provided that at least one of $Rx^1$ to $Rx^4$, $Ry^1$ to $Ry^2$ and $Rz^1$ to $Rz^4$ has an anion group, and the entire anion moiety may be an n-valent anion, n is an integer of 1 or more, m is an integer of 1 or more, and $M^{m+}$ represents an m-valent organic cation.]

Anion Moiety

In the formula (bd1), $Rx^1$ to $Rx^4$ each independently represent a hydrocarbon group which may have a substituent or a hydrogen atom, or two or more of $Rx^1$ to $Rx^4$ may be mutually bonded to form a ring structure.

$Ry^1$ to $Ry^2$ each independently represent a hydrocarbon group which may have a substituent or a hydrogen atom, or may be mutually bonded to form a ring structure.

$Rz^1$ to $Rz^4$ each independently represent, where valence allows, a hydrocarbon group which may have a substituent or a hydrogen atom, or two or more of $Rz^1$ to $Rz^4$ may be mutually bonded to form a ring structure.

The hydrocarbon groups for $Rx^1$ to $Rx^4$, $Ry^1$ to $Ry^2$, and $Rz^1$ to $Rz^4$ each may be an aliphatic hydrocarbon group, an aromatic hydrocarbon group, a cyclic hydrocarbon group or a chain-like hydrocarbon group.

Examples of the hydrocarbon group which may have a substituent for $Rx^1$ to $Rx^4$, $Ry^1$ to $Ry^2$, and $Rz^1$ to $Rz^4$ include a cyclic group which may have a substituent, a chain-like alkyl group which may have a substituent and a linear alkenyl group which may have a substituent.

Cyclic Group which May have a Substituent:

The cyclic group is preferably a cyclic hydrocarbon group, and the cyclic hydrocarbon group may be an aromatic hydrocarbon group or an aliphatic hydrocarbon group. The aliphatic hydrocarbon group refers to a hydrocarbon group having no aromaticity. In addition, the aliphatic hydrocarbon group may be saturated or unsaturated, and generally preferably saturated. In addition, the cyclic hydrocarbon group for $Rx^1$ to $Rx^4$, $Ry^1$ to $Ry^2$, and $Rz^1$ to $Rz^4$ may contain a hetero atom such as in a heterocycle.

The aromatic hydrocarbon group for $Rx^1$ to $Rx^4$, $Ry^1$ to $Ry^2$, and $Rz^1$ to $Rz^4$ is a hydrocarbon group having an aromatic ring. The aromatic hydrocarbon group preferably has 3 to 30 carbon atoms, more preferably 5 to 30 carbon atoms, still more preferably 5 to 20 carbon atoms, particularly preferably 6 to 15 carbon atoms, and most preferably 6 to 12 carbon atoms. Here, carbon atoms in the substituent are not included in the number of carbon atoms.

Examples of the aromatic ring of the aromatic hydrocarbon group for $Rx^1$ to $Rx^4$, $Ry^1$ to $Ry^2$, and $Rz^1$ to $Rz^4$ include, specifically, benzene, fluorene, naphthalene, anthracene, phenanthrene, biphenyl, or aromatic hetero rings in which some of carbon atoms constituting such an aromatic ring are substituted with hetero atoms. Examples of the hetero atom within the aromatic hetero rings include an oxygen atom, a sulfur atom and a nitrogen atom. The aromatic ring of the aromatic hydrocarbon group for $Rx^1$ to $Rx^4$, $Ry^1$ to $Ry^2$, and $Rz^1$ to $Rz^4$ preferably does not contain a hetero atom in consideration of compatibility with the component (A), and aromatic rings such as benzene, fluorene, naphthalene, anthracene, phenanthrene, and biphenyl are more preferable.

Specific examples of the aromatic hydrocarbon group for $Rx^1$ to $Rx^4$, $Ry^1$ to $Ry^2$, and $Rz^1$ to $Rz^4$ include a group in which one hydrogen atom is removed from the aromatic ring (an aryl group: for example, a phenyl group and a naphthyl group), and a group in which one hydrogen atom of the aromatic ring is substituted with an alkylene group (for example, an arylalkyl group such as a benzyl group, a phenethyl group, a 1-naphthylmethyl, group, a 2-naphthylmethyl group, a 1-naphthylethyl group, and a 2-naphthylethyl group). The alkylene group (alkyl chain within the arylalkyl group) preferably has 1 to 4 carbon atoms, more preferably 1 or 2, and most preferably 1.

Examples of the cyclic aliphatic hydrocarbon group for $Rx^1$ to $Rx^4$, $Ry^1$ to $Ry^2$, and $Rz^1$ to $Rz^4$ include an aliphatic hydrocarbon group having a ring in the structure.

As examples of the hydrocarbon group containing a ring in the structure thereof, an alicyclic hydrocarbon group (a group in which one hydrogen atom has been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the polycyclic group preferably has 7 to 30 carbon atoms. Among polycycloalkanes, a polycycloalkane having a bridged ring polycyclic framework, such as adamantane, norbornane, isobornane, tricyclodecane or tetracyclodpdecane, and a polycycloalkane having a condensed ring polycyclic framework, such as a cyclic group having a steroid framework are preferable.

Among these, regarding the cyclic aliphatic hydrocarbon group for $Rx^1$ to $Rx^4$, $Ry^1$ to $Ry^2$, and $Rz^1$ to $Rz^4$, a group in which one or more hydrogen atoms are removed from a monocycloalkane or polycycloalkane is preferable, a group in which one hydrogen atom is removed from a monocycloalkane is more preferable, and a group in which one hydrogen atom is removed from cyclopentane or cyclohexane is particularly preferable.

The linear aliphatic hydrocarbon group that may be bonded to an alicyclic hydrocarbon group preferably has 1 to 10 carbon atoms, more preferably 1 to 6 carbon atoms, still more preferably 1 to 4 carbon atoms, and most preferably 1 to 3 carbon atoms. As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)_5$—].

The branched aliphatic hydrocarbon group that may be bounded to an alicyclic hydrocarbon group preferably has 2 to 10 carbon atoms, more preferably 3 to 6 carbon atoms, still more preferably 3 or 4 carbon atoms, and most preferably 3 carbon atoms. As the branched aliphatic hydrocarbon group, branched alkylene groups are preferred, and specific examples include various alkylalkylene groups, including azimethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

In addition, examples of the cyclic group for $Rx^1$ to $Rx^4$, $Ry^1$ to $Ry^2$, and $Rz^1$ to $Rz^4$ include —$COOR^{XYZ}$ and —$OC(=O)R^{XYZ}$ in which $R^{XYZ}$ is a lactone-containing cyclic group, a carbonate-containing cyclic group, or a cyclic group containing —$SO_2$—.

Examples of the substituent in the cyclic group for $Rx^1$ to $Rx^4$, $Ry^1$ to $Ry^2$, and $Rz^1$ to $Rz^4$ include an alkyl group, an alkoxy group, a halogen atom, a halogenated alkyl group, a hydroxyl group, a nitro group, and a carbonyl group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group s the substituent includes a group in which some or all of the hydrogen atoms within an alkyl group of 1 to 5 carbon atoms (e.g., a methyl group, an ethyl group, a propyl group, an n-butyl group or a tert-buty 1 group) have been substituted with the aforementioned halogen atoms.

The carbonyl group as the substituent is a group that substitutes a methylene group (—$CH_2$—) constituting the cyclic hydrocarbon group.

Among these, regarding the substituent in the cyclic group for $Rx^1$ to $Rx^4$, $Ry^1$ to $Ry^2$, and $Rz^1$ to $Rz^4$, in consideration of compatibility with the component (A), an alkyl group, a halogen atom, a halogenated alkyl group, and the like are preferable, and an alkyl group is more preferable.
Chain-like alkyl group which may have a substituent:

The chain-like alkyl group for $Rx^1$ to $Rx^4$, $Ry^1$ to $Ry^2$, and $Rz^1$ to $Rz^4$ may be linear or branched.

The linear alkyl group preferably has 1 to 20 carbon atoms, more preferably 1 to carbon atoms, and still more preferably 1 to 10 carbon atoms. Spic examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15 carbon atoms, and still more preferably 3 to 10 carbon atoms. Specific examples thereof include a 1-methylethyl group, a 1,1-dimethylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have a Substituent:

The chain-like alkenyl group for $Rx^1$ to $Rx^4$, $Ry^1$ to $Ry^2$, $Rz^1$ to $Rz^4$ may be linear or branched, and preferably has 2 to 10 carbon atoms, more preferably has 2 to 5 carbon atoms, still more preferably has 2 to 4 carbon atoms, and particularly preferably has 3 carbon atoms. Examples of linear alkenyl groups include a vinyl group, a propenyl group (an allyl group) and a butynyl group. Examples of branched alkenyl groups include a 1-methylvinyl group, a 2-methylvinyl group, a 1-methylpropenyl group and a 2-methylpropenyl group.

Among these, as the chain-like alkenyl group, a linear alkenyl group is preferable, a vinyl group or a propenyl group is more preferable, and a vinyl group is most preferable.

Examples of the substituent in a linear alkyl group or alkenyl group for $Rx^1$ to $Rx^4$, $Ry^1$ to $Ry^2$, and $Rz^1$ to $Rz^4$ include an alkoxy group, a halogen atom (such as, a fluorine atom, a chlorine atom, a bromine atom, an iodine atom, and so on), a halogenated alkyl group, a hydroxyl group, a carbonyl group, a nitro group, an amino group, and the cyclic groups for $Rx^1$ to $Rx^4$, $Ry^1$ to $Ry^2$, and $Rz^1$ to $Rz^4$. Among these, regarding the linear alkyl group or alkenyl group for $Rx^1$ to $Rx^4$, $Ry^1$ to $Ry^2$, and $Rz^1$ to $Rz^4$, in consideration of compatibility with the component (A), a halogen atom, a halogenated alkyl group, groups exemplified as the cyclic groups for $Rx^1$ to $Rx^4$, $Ry^1$ to $Ry^2$, and $Rz^1$ to $Rz^4$, and the like are preferable, and groups exemplified as the cyclic groups for $Rx^1$ to $Rx^4$, $Ry^1$ to $Ry^2$, and $Rz^1$ to $Rz^4$ are more preferable.

Regarding the hydrocarbon group for $Rx^1$ to $Rx^4$, $Ry^1$ to $Ry^2$, and $Rz^1$ to $Rz^4$, a cyclic group which may have a substituent and a linear alkyl group which may have a substituent are preferable among the above hydrocarbon groups.

In the formula (bd1), $Ry^1$ to $Ry^2$ may be mutually bonded to form a ring structure.

Such a ring structure formed of $Ry^1$ to $Ry^2$ shares one side (a bond between carbon atoms to which $Ry^1$ and $Ry^2$ are bonded) of a six-membered ring in the formula (bd1), and the ring structure may be an alicyclic hydrocarbon or an aromatic hydrocarbon. In addition, the ring structure may be a polycyclic structure composed of other ring structures.

An alicyclic hydrocarbon formed of $Ry^1$ to $Ry^2$ may be polycyclic or monocyclic. As a monocyclic alicyclic hydrocarbon, a monocycloalkane is preferable. The monocycloalkane preferably has 3 to 6 carbon atoms, and specific examples thereof include cyclopentane and cyclohexane. As a polycyclic alicyclic hydrocarbon, a polycycloalkane is preferable. The polycycloalkane preferably has 7 to 30 carbon atoms. Specific examples of the poly cycloalkane include a poly cycloalkane having a polycyclic framework with a bridged ring, such as adamantane, norbornane, isobornane, tricyclodecane or tetracyclododecene; and a polycycloalkane having a polycyclic framework with a condensed ring, such as a cyclic ring having a steroid framework.

Examples of an aromatic hydrocarbon ring formed of $Ry^1$ to $Ry^2$ include benzene, fluorene, naphthalene, anthracene, phenanthrene, biphenyl, and an aromatic hetero ring in which some of carbon atoms constituting such an aromatic ring are substituted with a hetero atom.

An aromatic hydrocarbon ring formed of $Ry^1$ to $Ry^2$ preferably does not contain a hetero atom in consideration of compatibility with the component (A), and an aromatic ring such as benzene, fluorene, naphthalene, anthracene, phenanthrene, and biphenyl is more preferable.

A ring structure (alicyclic hydrocarbon, aromatic hydrocarbon) formed of $Ry^1$ to $Ry^2$ may have a substituent. Examples of the substituent here include the same as those provided for for the above substituent (for example, an alkyl group, an alkoxy group, a halogen atom, a halogenated alkyl group, a hydroxyl group, a nitro group, and a carbonyl group) for the cyclic group for $Rx^1$ to $Rx^4$, $Ry^1$ to $Ry^2$, and $Rz^1$ to $Rz^4$. Among these, regarding the substituent for the ring structure formed of $Ry^1$ to $Ry^2$, in consideration of compatibility with the component (A), an alkyl group, a halogen atom, a halogenated alkyl group, and the like are preferable, and an alkyl group is more preferable.

Regarding the ring structure formed of $Ry^1$ to $Ry^2$, among these, in consideration of short diffusion of an acid generated upon exposure and an ability to control acid diffusion, an aromatic hydrocarbon which may have a substituent is more preferable.

In the formula (bd1), two or more of $Rz^1$ to $Rz^4$ may be mutually bonded to form a ring structure. For example, $Rz^1$ may form a ring structure with any of $Rz^2$ to $Rz^4$. Specifically, a ring structure sharing one side (a bond between a carbon atom to which $Rz^1$ and $Rz^2$ are bonded and a carbon atom to which $Rz^3$ and $Rz^4$ are bonded) of a 6-membered ring in the formula (bd1), a ring structure formed by bonding $Rz^1$ and $Rz^2$, a ring structure formed by bonding $Rz^3$ and $Rz^4$, and the like may be exemplified.

Such a ring structure formed of two or more of $Rz^1$ to $Rz^4$ may be an alicyclic hydrocarbon or an aromatic hydrocarbon, and an aromatic hydrocarbon is particularly preferable. In addition, the ring structure may be a polycyclic structure composed of other ring structures.

An alicyclic hydrocarbon ring formed of two or more of $Rz^1$ to $Rz^4$ may be polycyclic or monocyclic. As a monocyclic alicyclic hydrocarbon, a monocycloalkane is preferable. The monocycloalkane preferably has 3 to 6 carbon atoms, and specific examples thereof include cyclopentane and cyclohexane. As a polycyclic alicyclic hydrocarbon, a polycycloalkane is preferable. The polycycloalkane preferably has 7 to 30 carbon atoms. Specific examples of the polycycloalkane include a polycycloalkane having a polycyclic framework with a bridged ring, such as adamantane, norbornane, isobornane, tricyclodecane or tetracyclododecene; and a polycycloalkane having a polycyclic framework with a condensed ring, such as a cyclic ring having a steroid framework.

A heterocyclic structure in which some of carbon atoms are substituted with a hetero atom may be exemplified, and a nitrogen-containing heterocycle is particularly preferable, and specifically a cyclic imide and the like may be exemplified.

Examples of an aromatic hydrocarbon ring formed of two or more of $Rz^1$ to $Rz^4$ include benzene, fluorene, naphthalene, anthracene, phenanthrene, biphenyl, and an aromatic hetero ring in which some of carbon atoms constituting such an aromatic ring are substituted with a hetero atom. An aromatic hydrocarbon ring formed of two or more of $Rz^1$ to $Rz^4$ preferably does not contain a hetero atom in consideration of compatibility with the component (A), and an aromatic ring such as benzene, fluorene, naphthalene, anthracene, phenanthrene, and biphenyl is more preferable.

A ring structure (alicyclic hydrocarbon, aromatic hydrocarbon) formed of $Rz^1$ to $Rz^4$ may have a substituent. Examples of the substituent here include the same as those provided for the above substituent (for example, an alkyl group, an alkoxy group, a halogen atom, a halogenated alkyl group, a hydroxyl group, a nitro group, and a carbonyl group) for the cyclic group for $Rx^1$ to $Rx^4$, $Ry^1$ to $Ry^2$, and $Rz^1$ to $Rz^4$. Among these, regarding the substituent for the ring structure formed of $Rz^1$ to $Rz^4$, in consideration of compatibility with the component (A), an alkyl group, a halogen atom, a halogenated alkyl group, and the like are preferable, and an alkyl group is more preferable.

Regarding the ring structure formed of two or more of $Rz^1$ to $Rz^4$, among these, in consideration of an ability to control diffusion of an acid generated upon exposure, a ring structure sharing one side (a bond between a carbon atom to which $Rz^1$ and $Rz^2$ are bonded and a carbon atom to which $Rz^3$ and $Rz^4$ are bonded) of a six-membered ring in the formula (bd1) is preferable, and an aromatic ring structure is more preferable.

Here, in the formula (bd1), the meaning of "where valence allows" is as follows.

Specifically, when a bond between a carbon atom to which $Rz^1$ and $Rz^2$ are bonded and a carbon atom to which $Rz^3$ and $Rz^4$ are bonded is a single bond, all of $Rz^1$, $Rz^2$, $Rz^3$ and $Rz^4$ are present. When a bond between a carbon atom to which $Rz^1$ and $Rz^2$ are bonded and a carbon atom to which $Rz^3$ and $Rz^4$ are bonded is a double bond, only either $Rz^1$ or $Rz^2$ is present and only either $Rz^3$ or $Rz^4$ is present. In addition, for example, when $Rz^1$ and $Rz^3$ are bonded to form an aromatic ring structure, $Rz^2$ and $Rz^4$ are not present.

In the formula (bd1), two or more of $Rx^1$ to $Rx^4$ may be mutually bonded to form a ring structure. For example, $Rx^1$ may form a ring structure with any of $Rx^2$ to $Rx^4$.

Such a ring structure formed of two or more of $Rx^1$ to $Rx^4$ may be an alicyclic hydrocarbon or aromatic hydrocarbon ring. In addition, the ring structure may be a polycyclic structure composed of other ring structures.

An alicyclic hydrocarbon ring formed of two or more of $Rx^1$ to $Rx^4$ may be polycyclic or monocyclic. The monocycloalkane preferably has 3 to 6 carbon atoms, and specific examples thereof include cyclopentane and cyclohexane. As a polycyclic alicyclic hydrocarbon, a polycycloalkane is preferable. The polycycloalkane preferably has 7 to 30 carbon atoms. Specific examples of die polycycloalkane include a polycycloalkane having a polycyclic framework with a bridged ring, such as adamantane, norbornane, isobornane, tricyclodecane or tetracyclododecene; and a polycycloalkane having a polycyclic framework with a condensed ring, such as a cyclic ring having a steroid framework.

Examples of an aromatic hydrocarbon ring formed of two or more of $Rx^1$ to $Rx^4$ include benzene, fluorene, naphthalene, anthracene, phenanthrene, biphenyl, and an aromatic hetero ring in which some of carbon atoms constituting such an aromatic ring are substituted with a hetero atom. An aromatic hydrocarbon ring formed of two or more of $Rx^1$ to $Rx^4$ preferably does not contain a hetero atom in consideration of compatibility with the component (A), and an aromatic ring such as benzene, fluorene, naphthalene, anthracene, phenanthrene, and biphenyl is more preferable.

A ring structure (alicyclic hydrocarbon, aromatic hydrocarbon) formed of $Rx^1$ to $Rx^4$ may have a substituent. Examples of the substituent here include the same as those provided for the above substituent (for example, an alkyl group, an alkoxy group, a halogen atom, a halogenated alkyl group, a hydroxyl group, a nitro group, and a carbonyl group) for the cyclic group for $Rx^1$ to $Rx^4$, $Ry^1$ to $Ry^2$, and $Rz^1$ to $Rz^4$. Among these, regarding the substituent for the ring structure formed of $Rx^1$ to $Rx^4$, in consideration of compatibility with the component (A), an alkyl group, a halogen atom, a halogenated alkyl group, and the like are preferable, and an alkyl group is more preferable.

Regarding a ring structure formed of two or more of $Rx^1$ to $Rx^4$, among these, in consideration of an ability to control acid diffusion, an alicyclic hydrocarbon ring is preferable.

In addition, regarding a ring structure formed of two or more of $Rx^1$ to $Rx^4$, among these, in consideration of an ability to control acid diffusion, preferably, at least one of $Rx^1$ to $Rx^2$ and at least one of $Rx^3$ to $Rx^4$ are mutually bonded to form a crosslinked ring structure, and the ring structure is more preferably an alicyclic hydrocarbon ring.

When at least one of $Rx^1$ to $Rx^2$ and at least one of $Rx^3$ to $Rx^4$ are mutually bonded to form a ring structure, the number of carbon atoms constituting a bicyclic structure (a ring structure containing carbon atoms to which $Ry^1$, $Ry^2$, $Rz^1$ and $Rz^2$, and $Rz^3$ and $Rz^4$ are bonded) is preferably 7 to 16.

In the formula (bd1), at least one of $Rx^1$ to $Rx^4$, $Ry^1$ to $Ry^2$ and $Rz^1$ to $Rz^4$ has an anion group, and the entire anion moiety may be an n-valent anion, n is an integer of 1 or more.

By selecting an anion group in the molecule, in the resist composition, the component (BD1) functions as an acid-generator component (B) that generates an acid that acts on the base component (A) or a base component (D) that traps (controls acid diffusion) an acid that is generated from the component (B) upon exposure.

In the component (BD), $Rx^1$ to $Rx^4$, $Ry^1$ to $Ry^2$, and $Rz^1$ to $Rz^4$ may be the anion group or in the component (BD1), when two or more of $Rx^1$ to $Rx^4$ are mutually bonded to form a ring structure, a carbon atom forming the ring structure or a hydrogen atom bonded to the carbon atom may be substituted with die anion group. When two or more of $Ry^1$ to $Ry^2$ are mutually bonded to form a ring structure, a carbon atom forming the ring structure or a hydrogen atom bonded to the carbon atom may be substituted with the anion group. When two or more of $Rz^1$ to $Rz^4$ are mutually bonded to form a ring structure, a carbon atom forming the ring structure or a hydrogen atom bonded to the carbon atom may be substituted with the anion group.

Examples of the anion group for $Rx^1$ to $Rx^4$, $Ry^1$ to $Ry^2$, and $Rz^1$ to $Rz^4$ include those having a sulfonic acid anion structure, a carboxylic acid anion structure, an imide anion structure, a methide anion structure, a carbanion structure, a borate anion structure, a halogen anion structure, a phosphoric acid anion structure, an antimony acid anion structure, an arsenic acid anion structure, or the like. Among these, those having a sulfonic acid anion structure and those having a carboxylic acid anion structure are preferable.

Preferable examples of the anion group having a carboxylic acid anion structure include *—$V'^{10}$—COO ($V'^{10}$ is a single bond or an alkylene group having 1 to 20 carbon atoms).

Preferable examples of the anion group having a sulfonic acid anion structure include anion groups represented by *—$V'^{11}$—$SO_3$ ($V'^{11}$ is a single bond or an alkylene group having 1 to 20 carbon atoms) and the following general formula (bd1-r-an1).

In the formula (bd1-r-an1), the symbol * represents a bond. The symbol * means a bond with a carbon atom to which $Rx^1$ to $Rx^4$, $Ry^1$ to $Ry^2$, and $Rz^1$ to $Rz^4$ are bonded.

[Chem. 108]

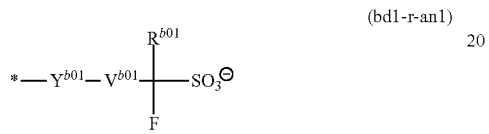

(bd1-r-an1)

[In the formula, $R^{b01}$ represents a fluorinated alkyl group of 1 to 5 carbon atoms or a fluorine atom; $V^{b01}$ represents an alkylene group, a fluorinated alkylene group or a single bond; and $Y^{b01}$ represents a divalent linking group or a single bond.]

In the formula (bd1-r-an1), $R^{b01}$ represents a fluorinated alkyl group having 1 to 5 carbon atoms or a fluorine atom. $R^{b01}$ is preferably a perfluoroalkyl group of 1 to 5 carbon atoms or a fluorine atom, and is more preferably a fluorine atom.

In the formula (bd1-r-an1), $V^{b01}$ represents an alkylene group, a fluorinated alkylene group or a single bond.

The alkylene group or the fluorinated alkylene group for $V^{b01}$ preferably has 1 to 4 carbon atoms, and more preferably 1 to 3 carbon atoms. Examples of the fluorinated alkyl group for $V^{b01}$ include a group in which some or all of the hydrogen atoms within an alkylene group have been substituted with a fluorine atom. Among these examples, as $V^{b01}$, an alkylene group having 1 to 4 carbon atoms, a fluorinated alkylene group having 1 to 4 carbon atoms or a single bond is preferable.

In the formula (bd1-r-an1), $Y^{b01}$ represents a bivalent linking group or a single bond.

As the divalent linking group for $Y^{b01}$, a divalent linking group containing an oxygen atom may be given as a preferable example.

In the case where $Y^{b01}$ is a divalent linking group containing an oxygen atom, $Y^{b01}$ may contain an atom other than an oxygen atom Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—$SO_2$—) bonded thereto.

Examples of the divalent linking group containing an oxygen atom include divalent linking groups represented by general formulae (y-a1-1) to (y-a1-8) shown below.

[Chem. 109]

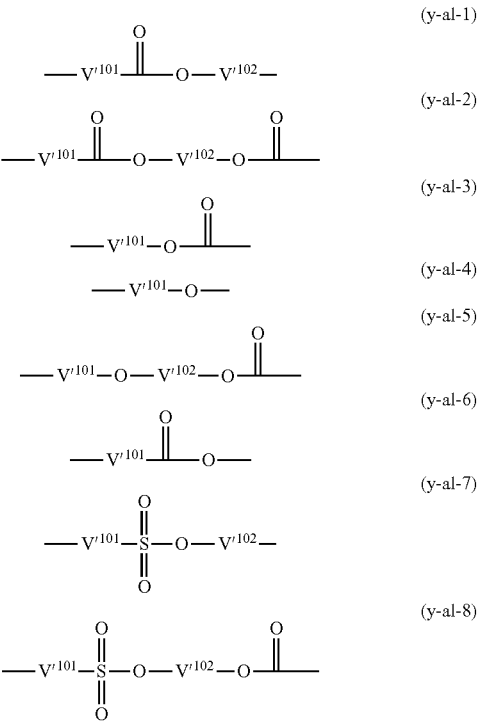

[In the formulae, $V'^{101}$ represents a single bond or an alkylene group of 1 to 5 carbon atoms; $V'^{102}$ represents a divalent saturated hydrocarbon group of 1 to 30 carbon atoms.]

The divalent saturated hydrocarbon group for $V'^{102}$ is preferably an alkylene group of 1 to 30 carbon atoms, more preferably an alkylene group of 1 to 10 carbon atoms, and still more preferably an alkylene group of 1 to 5 carbon atoms.

The alkylene group for $V'^{101}$ and $V'^{102}$ may be a linear alkylene group or a branched alkylene group, and a linear alkylene group is preferable.

Specific examples of the alkylene group for $V'^{101}$ and $V'^{102}$ include a methylene group [—$CH_2$—]; an alkylmethylene group, such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; an alkylethylene group, such as —CH($CH_3$)$CH_2$—, —CH($CH_3$)CH($CH_3$)—, —C($CH_3$)$_2CH_2$— and —CH($CH_2CH_3$)$CH_2$—; a trimethylene group (n-propylene group) [—$CH_2CH_2CH_2$—]; an alkyltrimethylene group, such as —CH($CH_3$)$CH_2CH_2$— and —$CH_2$CH($CH_3$)$CH_2$—; a tetramethylene group [—$CH_2CH_2CH_2CH_2$—]; an alkyltetramethylene group, such as —CH($CH_3$)$CH_2CH_2CH_2$—, —$CH_2$CH($CH_3$)$CH_2CH_2$—; and a pentamethylene group [—$CH_2CH_2CH_2CH_2CH_2$—].

Further, part of the methylene groups within the alkylene groups for $V'^{101}$ and $V'^{102}$ may be substituted with a divalent aliphatic cyclic group of 5 to 10 carbon atoms. The aliphatic cyclic group is preferably a cyclohexylene group, a 1,5-adamantylene group or a 2,6-adamantylene group.

$Y^{b01}$ is preferably a divalent linking group containing an ether bond or a divalent linking group containing an ester bond, and groups represented by the aforementioned formulas (y-a1-1) to (y-a1-6) are preferable.

Specific examples of the anion group represented by the formula (bd1-r-an1) include, when $Y^{b01}$ is a single bond, $-CH_2CF_2SO_3^-$, $-CF_2CF_2SO_3^-$, and a fluorinated alkylsulfonate anion such as a trifluoromethanesulfonate anion and a perfluorobutanesulfonate anion.

When $Y^{b01}$ is a bivalent linking group containing an oxygen atom, anion groups represented by any of the following formulae (bd1-r-an11) to (bd1-r-an13) may be exemplified.

[Chem. 110]

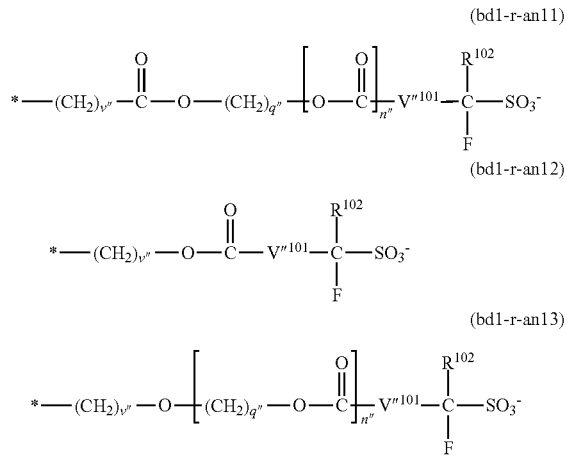

[In the formula, $V'''^{101}$ is a single bond, an alkylene group having 1 to 4 carbon atoms, or a fluorinated alkylene group having 1 to 4 carbon atoms. $R^{102}$ is a fluorine atom or a fluorinated alkyl group having 1 to 5 carbon atoms. Each $v'''$ independently represents an integer of 0 to 3. Each $q''$ independently is an integer of 1 to 20; $n''$ is 0 or 1.]

In the formulae (bd1-r-an11) to (bd1-r-an13), $V'''^{101}$ is a single bond, an alkylene group having 1 to 4 carbon atoms, or a fluorinated alkylene group having 1 to 4 carbon atoms. $V'''^{101}$ is preferably a single bond, an alkylene group having 1 carbon atom (a methylene group), or a fluorinated alkylene group having 1 to 3 carbon atoms.

In the formulae (bd1-r-an11) to (bd1-r-an13), $R^{102}$ is a fluorine atom or a fluorinated alkyl group having 1 to 5 carbon atoms. $R^{102}$ is preferably a perfluoro alkyl group having 1 to 5 carbon atoms or a fluorine atom and more preferably a fluorine atom.

In the formulae (bd1-r-an11) to (bd1-r-an13), $v'''$ is an integer of 0 to 3 and is preferably 0 or 1.

$q''$ is an integer of 1 to 20, preferably an integer of 1 to 10, more preferably an integer of 1 to 5, still more preferably 1, 2 or 3, and most preferably 1 or 2.

$n''$ is 0 or 1, and preferably 0.

The number of anion groups in the component (BD1) may be 1 or 2 or more, and 1 is preferable.

In the component (BD1), the entire anion moiety may be an n-valent anion, n is an integer of 1 or more, preferably 1 or 2, and more preferably 1.

In consideration of an ability to control acid diffusion, regarding the anion moiety in the component (BD1), anions represented by the following general formula (bd1-an1) are preferable.

[Chem. 111]

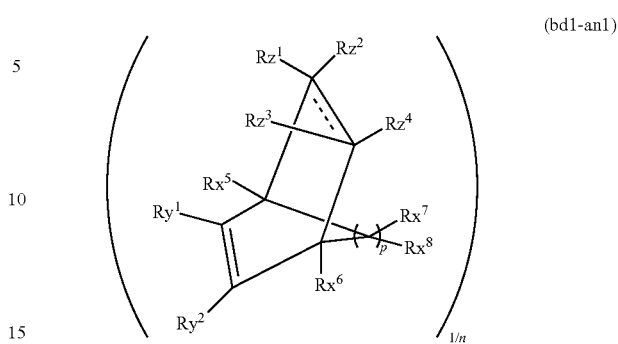

[In the formula, $Rx^5$ to $Rx^6$ each independently represent a hydrocarbon group which may have a substituent or a hydrogen atom $Rx^7$ to $Rx^8$ each independently represent a hydrocarbon group which may have a substituent or a hydrogen atom, or may be mutually bonded to form a ring structure, p is 1 or 2, and when p=2, a plurality of $Rx^7$ to $Rx^8$ may be different from each other. $Ry^1$ to $Ry^2$ each independently represent a hydrocarbon group which may have a substituent or a hydrogen atom, or may be mutually bonded to form a ring structure.

----- [Chem. 112]

represents a double bond or a single bond. Rz1 to Rz4 each independently represent, where valence allows, a hydrocarbon group which may have a substituent or a hydrogen atom, or two or more of Rz1 to Rz4 may be mutually bonded to form a ring structure; provided that at least one of $Rx^5$ to $Rx^8$, $Ry^1$ to $Ry^2$ and $Rz^1$ to $Rz^4$ has an anion group, and the entire anion moiety may be an n-valent anion, n is an integer of 1 or more.]

In the formula (bd1-an1), $Rx^5$ to $Rx^6$ each independently represent a hydrocarbon group which may have a substituent, or a hydrogen atom. Description of the hydrocarbon group which may have a substituent for $Rx^5$ to $Rx^6$ is the same as that of the hydrocarbon group which may have a substituent for $Rx^1$ to $Rx^4$ in the above formula (bd1).

In the formula (bd1-an1), $Rx^7$ to $Rx^8$ each independently represent a hydrocarbon group or a hydrogen atom which may have a substituent or may be mutually bonded to form a ring structure. Description of $Rx^7$ to $Rx^8$ is the same as that of $Rx^1$ to $Rx^4$ in die above formula (bd1).

In the formula (bd1-an1), when p is 1 or 2, and p=2, a plurality of $Rx^7$ to $Rx^8$ may be different from each other. The anion represented by the general formula (bd1-an1) has a bicycloheptane ring structure when p=1, and a bicyclooctane ring structure when p=2.

In the formula (bd1-an1), $Ry^1$ to $Ry^2$ each independently represent a hydrocarbon group which may have a substituent or a hydrogen atom or may be mutually bonded to form a ring structure. The description of $Ry^1$ to $Ry^2$ is the same as that of $Ry^1$ to $Ry^2$ in the above formula (bd1).

$Rz^1$ to $Rz^4$ each independently represent, where valence allows, a hydrocarbon group which may have a substituent or a hydrogen atom, or two or more of $Rz^1$ to $Rz^4$ may be mutually bonded to form a ring structure. $Rz^1$ to $Rz^4$ are the same as $Rz^1$ to $Rz^4$ in the above formula (bd1).

However, in the formula (bd1-an1), at least one of $Rx^5$ to $Rx^8$, $Ry^1$ to $Ry^2$, and $Rz^1$ to $Rz^4$ has an anion group, and the entire anion moiety may be an n-valent anion, n is an integer of 1 or more;

Among the above examples, in consideration of an ability to control acid diffusion, the anion moiety in the component (BD1) is an anion represented by p=2 in the formula (bd1-an1), that is, an anion represented by the following general formula (bd1-an2) is more preferable.

[Chem. 113]

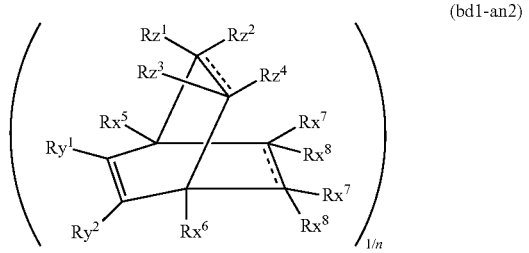

(bd1-an2)

[In the formula, $Rx^5$ to $Rx^6$ each independently represent a hydrocarbon group which may have a substituent or a hydrogen atom. A plurality of $Rx^7$ to $Rx^8$ each independently represent a hydrocarbon group which may have a substituent or a hydrogen atom, or two or more of $Rx^7$ to $Rx^8$ may be mutually bonded to form a ring structure. $Ry^1$ to $Ry^2$ each independently represent a hydrocarbon group which may have a substituent or a hydrogen atom or may be mutually bonded to form a ring structure.

----- [Chem. 114]

represents a double bond or a single bond. Rz1 to Rz4 each independently represent, where valence allows, a hydrocarbon group which may have a substituent or a hydrogen atom, or two or more of Rz1 to Rz4 may be mutually bonded to form a ring structure; provided that at least one of $Rx^5$ to $Rx^8$, $Ry^1$ to $Ry^2$ and $Rz^1$ to $Rz^4$ has an anion group, and the entire anion moiety may be an n-valent anion, n is an integer of 1 or more.]

In the formula (bd1-an2), $Rx^5$ to $Rx^6$, $Rx^7$ to $Rx^8$, $Ry^1$ to $Ry^2$, and $Rz^1$ to $Rz^4$ are the same as $Rx^5$ to $Rx^6$, $Rx^7$ to $Rx^8$, $Ry^1$ to $Ry^2$, and $Rz^1$ to $Rz^4$ in the above formula (bd1-an1).

Here, in the formula (bd1-an2), at least one of $Rx^5$ to $Rx^8$, $Ry^1$ to $Ry^2$ and $Rz^1$ to $Rz^4$ has an anion group, and the entire anion moiety may be an n-valent anion, n is an integer of 1 or more;

In the formula (bd1), formula (bd1-an1), and formula (bd1-an2), in consideration of short diffusion of an acid generated upon exposure and an ability to control acid diffusion, preferably, $Ry^1$ to $Ry^2$ are mutually bonded to form a ring structure, and a ring structure to be formed is more preferably an aromatic hydrocarbon which may have a substituent (an aromatic ring and an aromatic hetero ring).

In the formula (bd1), formula (bd1-an1), and formula (bd1-an2), $Rz^1$ to $Rz^4$ are preferably mutually bonded to form a ring structure in consideration of an ability to control diffusion of an acid generated upon exposure, and regarding the ring structure to be formed, a ring structure sharing one side (a bond between a carbon atom to which $Rz^1$ and $Rz^2$ are bonded and a carbon atom to which $Rz^3$ and $Rz^4$ are bonded) of a 6-membered ring in the formula is preferable, and an aromatic hydrocarbon ring which may have a substituent (an aromatic ring and an aromatic hetero ring) is more preferable.

In the formula (bd1-an1) and formula (bd1-an2), in consideration of short diffusion of an acid generated upon exposure and an ability to control acid diffusion, preferably, $Rx^7$ to $Rx^8$ are mutually bonded to form a ring structure, and a ring structure to be formed is more preferably an aromatic hydrocarbon ring which may have a substituent (an aromatic ring and an aromatic hetero ring).

In the formula (bd1-an2), regarding a ring structure formed in $Rx^7$ to $Rx^8$, a ring structure sharing one side (a bond between the same carbon atoms to which $Rx^7$ and $Rx^8$ are bonded) of a 6-membered ring in the formula is preferable, and an aromatic hydrocarbon ring which may have a substituent (an aromatic ring and an aromatic hetero ring) is more preferable.

In all anions represented by the above formula (bd1-an2), the number of ring structures formed by mutually holding $Rx^7$ to $Rx^8$, $Ry^1$ to $Ry^2$, and $Rz^1$ to $Rz^4$ may be one, two or more, and preferably two or three.

In particular, preferable examples of the anion moiety in the component (BD1) include anions represented by the following general formula (bd1-an3).

[Chem. 115]

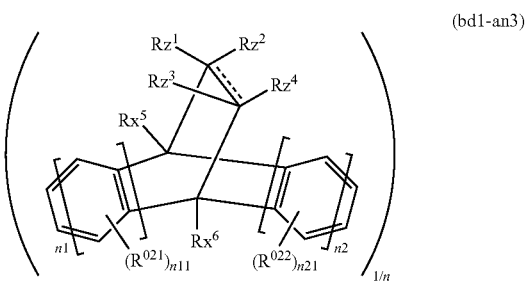

(bd1-an3)

[In the formula, $Rx^5$ to $Rx^6$ each independently represent a hydrocarbon group which may have a substituent or a hydrogen atom.

----- [Chem. 116]

represents a double bond or a single bond; $Rz^1$ to $Rz^4$ each independently represent, where valence allows, a hydrogen atom or a hydrocarbon group which may have a substituent, or two or more of $Rz^1$ to $Rz^4$ may be mutually bonded to form a ring structure; provided that at least one of $Rx^5$ to $Rx^6$ and $Rz^1$ to $Rz^4$ has an anion group, and the entire anion moiety may be an n-valent anion, n is an integer of 1 or more; $R^{021}$ is an alkyl group, an alkoxy group, halogen atom, a halogenated alkyl group, a hydroxyl group, a carbonyl group or a nitro group, n is an integer of 1 to 3; n11 is an integer of 0 to 8; $R^{022}$ is an alkyl group, an alkoxy group, a halogen atom, a halogenated alkyl group, a hydroxyl group, a carbonyl group or a nitro group. n2 is an integer of 1 to 3; and n21 is an integer of 0 to 8.]

In the formula (b1-an3), $Rx^5$ to $Rx^6$, and $Rz^1$ to $Rz^4$ are the same as $Rx^5$ to $Rx^6$, and $Rz^1$ to $Rz^4$ in the formula (b1-an1).

In the formula (b1-an3), $R^{021}$ is an alkyl group, an alkoxy group, a halogen atom, a halogenated alkyl group, a hydroxy group, a carbonyl group or a nitro group.

The alkyl group for $R^{021}$ is preferably an alkyl group having 1 to 5 carbon atoms, and most preferably a methyl group, an ethyl group, a propyl group, an n-butyl group, or a tert-butyl group.

The alkoxy group for $R^{021}$ is preferably an alkoxy group having 1 to 5 carbon atoms; more preferably a methoxy group, an ethoxy group, an n-propoxy group, an iso-propoxy group, an n-butoxy group, or a tert-butoxy group; and most preferably a methoxy group or an ethoxy group.

Examples of the halogen atom for $R^{o21}$ include a fluorine atom, a chlorine atom, a bromine atom, and an iodine atom; and a fluorine atom is preferable.

Examples of the halogenated alkyl group for $R^{o21}$ include an alkyl group having 1 to 5 carbon atoms, for example, a group in which some or all of hydrogen atoms are substituted with a halogen atom such as a methyl group, an ethyl group, a propyl group, an n-butyl group, and a tert-butyl group.

Among these, in consideration of compatibility with the component (A), $R^{o21}$ is preferably an alkyl group, a halogen atom, a halogenated alkyl group or the like; and more preferably an alkyl group.

In the formula (b1-an3), n1 is an integer of 1 to 3, preferably 1 or 2, and particularly preferably 1.

In the formula (b1-an3), n11 is an integer of 0 to 8, preferably an integer of 0 to 4, more preferably 0, 1 or 2, and particularly preferably 0 or 1.

In the formula (b1-an3), $R^{o22}$ represents an alkyl group, an alkoxy group, a halogen atom, a halogenated alkyl group, a hydroxy group, a carbonyl group or a nitro group, and the same as those provided for $R^{o21}$ may be exemplified. Among these, in consideration of compatibility with the component (A), $R^{o22}$ is preferably an alkyl group, a halogen atom, a halogenated alkyl group or the like; and more preferably an alkyl group.

In the formula (b1-an3), n2 is an integer of 1 to 3, preferably 1 or 2, and particularly preferably 1.

In the formula (b1-an3), n21 is an integer of 0 to 8, preferably an integer of 0 to 4, more preferably 0, 1 or 2, and particularly preferably 0 or 1.

Here, in the formula (b1-an3), at least one of $Rx^5$ to $Rx^6$ and $Rz^1$ to $Rz^4$ has an anion group, and the entire anion moiety may be an n-valent anion, n is an integer of 1 or more.

Regarding the anion group, the above anion group represented by *—$V'^{10}$—COO ($V'^{10}$ is a single bond or an alkylene group having 1 to 5 carbon atoms), and anions represented by general formula (bd1-r-an1) are preferable examples thereof.

In the formula (bd1), formula (bd1-an1), formula (bd1-an2), and formula (b1-an3), in consideration of excellent effects of the present invention, at least one of $Rz^1$ to $Rz^4$ preferably has an anion group. When two or more of $Rz^1$ to $Rz^4$ are mutually bonded to form a ring structure, a carbon atom forming the ring structure or a hydrogen atom bonded to the carbon atom may be substituted with the anion group.

Alternatively, in the formula (bd1-an1), formula (bd1-an2), and formula (b1-an3), in consideration of excellent effects of the present invention, at least one of $Rx^5$ to $Rx^6$ preferably has an anion group.

Alternatively, in the formula (bd1-an1), formula (bd1-an2), and formula (b1-an3), in consideration of excellent effects of the present invention, at least one of $Rx^5$ to $Rx^6$ and $Rz^1$ to $Rz^4$ preferably has an anion group.

Specific examples of the anion moiety in the compound (BD1) will be described below.

[Chem. 117]

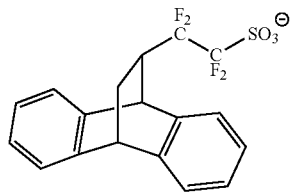
(bd1-an3-1)

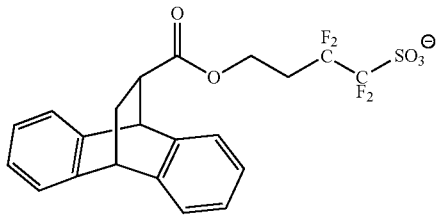
(bd1-an3-2)

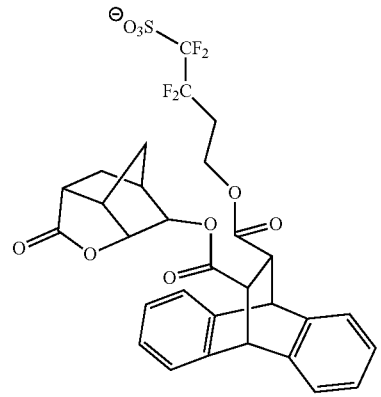
(bd1-an3-3)

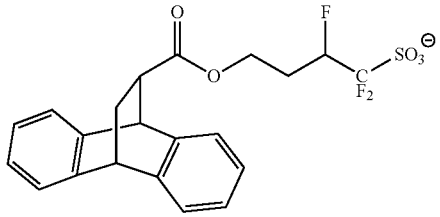
(bd1-an3-4)

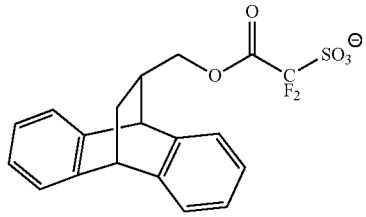
(bd1-an3-5)

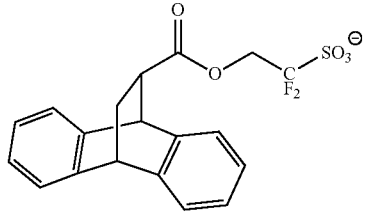
(bd1-an3-6)

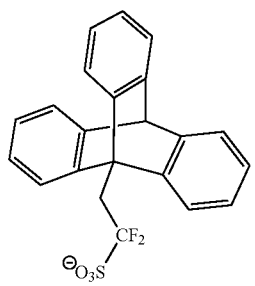
(bd1-an3-7)

(bd1-an3-8)
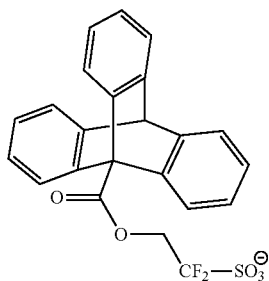
[Chem. 118]
(bd1-an3-9)
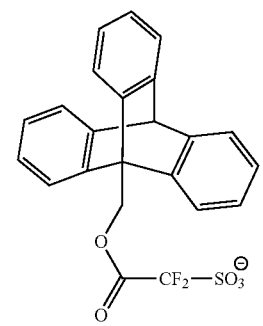
(bd1-an3-10)
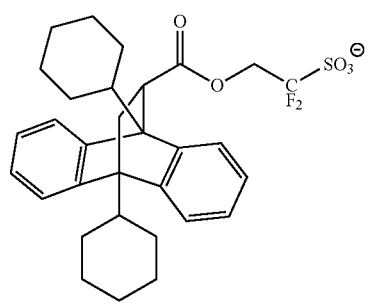
(bd1-an3-11)
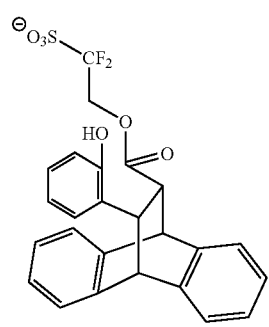
(bd1-an3-12)
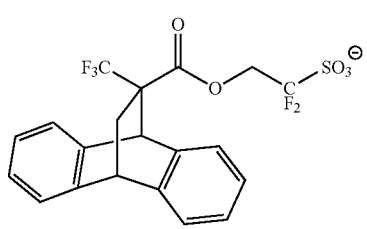
(bd1-an3-13)
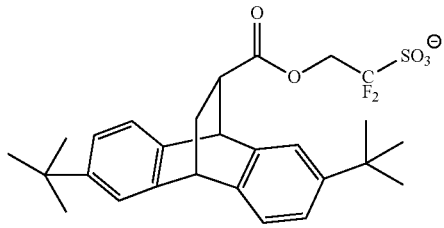
(bd1-an3-14)
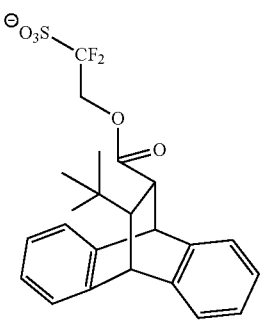
(bd1-an3-15)
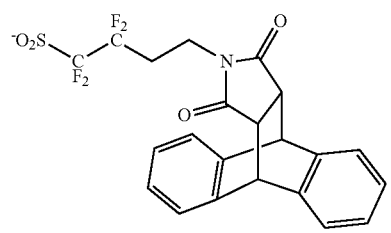
[Chem. 119]
(bd1-an3-21)
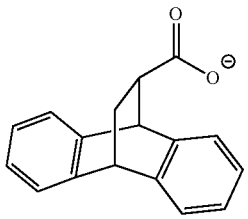
(bd1-an3-22)
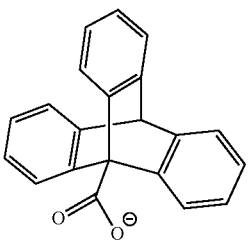
(bd1-an3-23a)
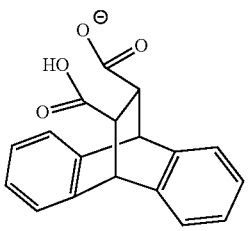

(bd1-an3-23b)

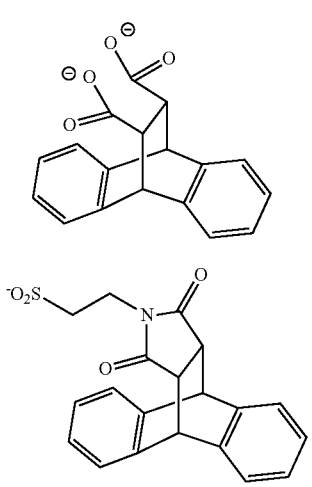

(bd1-an3-24)

Cation Moiety$((M^{m+})_{1/m})$

In the formula (bd1), $M^{m+}$ represents an m-valent organic cation, m is an integer of 1 or more.

The organic cation for $M^{m+}$ is preferably a sulfonium cation or an iodonium cation. In addition, when the component (BD1) is used as the base component (D), an ammonium cation may also be exemplified.

Preferable examples of the cation moiety $((M^{m+})_{1/m})$ include organic cations represented by the following general formulae (ca-1) to (ca-4).

[Chem. 120]

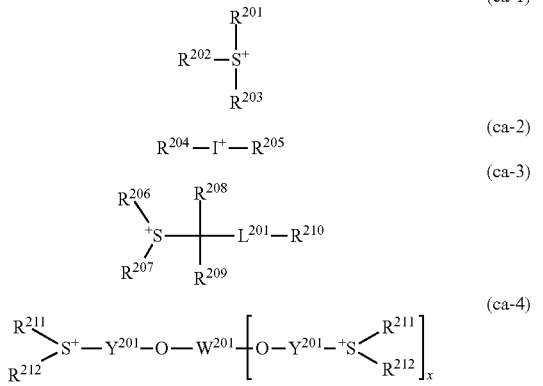

(ca-1)

(ca-2)

(ca-3)

(ca-4)

[In the formula, $R^{201}$ to $R^{207}$ and $R^{211}$ to $R^{212}$ each independently represent an aryl group which may have a substituent, an alkyl group which may have a substituent, or an alkenyl group which may have a substituent. $R^{201}$ to $R^{203}$, $R^{206}$ to $R^{207}$, and $R^{211}$ to $R^{212}$ may be mutually bonded to form a ring together with a sulfur atom in die formula $R^{208}$ to $R^{209}$ each independently represent a hydrogen atom or an alkyl group having 1 to 5 carbon atoms or may be mutually bonded to form a ring together with a sulfur atom in the formula $R^{210}$ represents an aryl group which may have a substituent, an alkyl group which may have a substituent, an alkenyl group which may have a substituent, or an —$SO_2$— containing cyclic group which may have a substituent. $L^{201}$ represents —C(=O)— or —C(=O)—O—. A plurality of $Y^{201}$ each independently represent an arylene group, an alkylene group or an alkenylene group, x is 1 or 2. $W^{201}$ represents an (x+1)-valent linking group.]

Regarding the aryl group for $R^{201}$ to $R^{207}$ and $R^{211}$ to $R^{212}$, an aryl group having 6 to 20 carbon atoms may be exemplified, and a phenyl group or a naphthyl group is preferable.

The alkyl group for $R^{201}$ to $R^{207}$, $R^{211}$ and $R^{212}$ is preferably a chain-like or cyclic alkyl group having 1 to 30 carbon atoms.

The alkenyl group for $R^{201}$ to $R^{207}$ and $R^{211}$ to $R^{212}$ preferably has 2 to 10 carbon atoms.

Examples of the substituent that $R^{201}$ to $R^{207}$ and $R^{211}$ to $R^{212}$ may have include an alkyl group, a halogen atom, a halogenated alkyl group, a carbonyl group, a cyano group, an amino group, an aryl group, and groups represented by the following general formulae (ca-r-1) to (ca-r-7).

[Chem. 121]

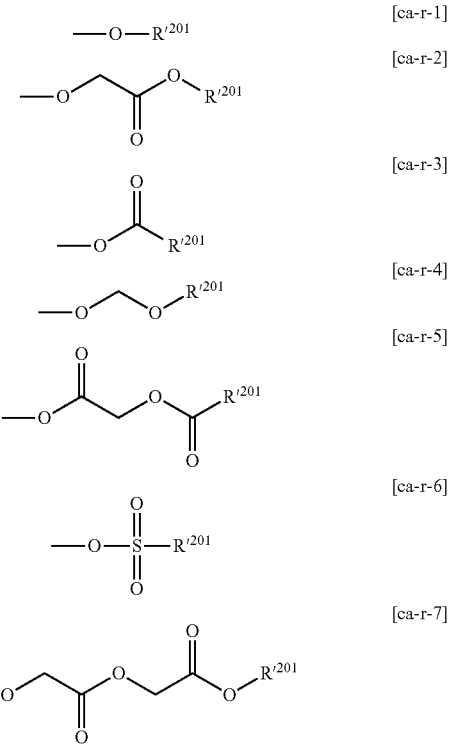

[ca-r-1]

[ca-r-2]

[ca-r-3]

[ca-r-4]

[ca-r-5]

[ca-r-6]

[ca-r-7]

[In the formulae, each $R'^{201}$ independently represents a hydrogen atom, a cyclic group which may have a substituent, a chain-like alkyl group which may have a substituent, or a chain-like alkenyl group which may have a substituent.]

Regarding a cyclic group which may have a substituent, a linear alkyl group which may have a substituent, or a chain-like alkenyl group which may have a substituent for $R'^{201}$, the same as those described for $Rx^1$ to $Rx^4$, $Ry^1$ to $Ry^2$, and $Rz^1$ to $Rz^4$ in the above formula (bd1) may be exemplified, and regarding a cyclic group which may have a substituent or a linear alkyl group which may have a substituent, the same as those provided for the acid dissociable group represented by the above formula (a1-r-2) may be exemplified.

$R^{201}$ to $R^{203}$, $R^{206}$ to $R^{207}$, and $R^{211}$ to $R^{212}$ may be mutually bonded to form a ring together with a sulfur atom in the formula.

When $R^{201}$ to $R^{203}$, $R^{206}$, $R^{207}$, $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —SO$_2$—, —SO$_3$—, —COO—, —CONH— or —N(RN)— (wherein RN represents an alkyl group of 1 to 5 carbon atoms). The ring containing the sulfur atom in the framework thereof is preferably a 3- to 10-membered ring, and most preferably a 5- to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

$R^{208}$ to $R^{209}$ each independently represent a hydrogen atom or an alkyl group having 1 to 5 carbon atoms, and are preferably a hydrogen atom or an alkyl group having 1 to 3 carbon atoms, and when $R^{208}$ to $R^{209}$ are an alkyl group, they are mutually bonded to form a ring together with a sulfur atom in the formula.

$R^{210}$ is an aryl group which may have a substituent, an alkyl group which may have a substituent, an alkenyl group which may have a substituent, or a —SO$_2$— containing cyclic group which may have a substituent.

Examples of the aryl group for $R^{210}$ include an unsubstituted aryl group of 6 to carbon atoms, and a phenyl group or a naphthyl group is preferable.

As the alkyl group for $R^{210}$, a chain-like or cyclic alkyl group having 1 to 30 carbon atoms is preferable.

The alkenyl group for $R^{210}$ preferably has 2 to 10 carbon atoms.

As the —SO$_2$— containing cyclic group for $R^{210}$ which may have a substituent, an "—SO$_2$— containing polycyclic group" is preferable, and a group represented by the aforementioned general formula (a5-r-1) is more preferable.

Each $Y^{201}$ independently represents an arylene group, an alkylene group or an alkenylene group.

Regarding an arylene group for $Y^{201}$, groups in which one hydrogen atom is additionally removed from an aryl group exemplified as an aromatic hydrocarbon group for $Rx^1$ to $Rx^4$, $Ry^1$ to $Ry^2$, and $Rz^1$ to $Rz^4$ in the above formula (bd1) may be exemplified.

Regarding an alkylene group and an alkenylene group for $Y^{201}$, groups in which one hydrogen atom is additionally removed from groups exemplified as a linear alkyl group or a chain-like alkenyl group for $Rx^1$ to $Rx^4$, $Ry^1$ to $Ry^2$, and $Rz^1$ to $Rz^4$ in the above formula (bd1) may be exemplified.

In the formula (ca-4), x is 1 or 2.

$W^{201}$ represents a linking group having a valency of (x+1), and specifically, a bivalent or trivalent linking group.

The bivalent linking group for $W^{201}$ is preferably a bivalent hydrocarbon group which may have a substituent, and the same as those provided for the bivalent hydrocarbon group which may have a substituent for $Ya^{x0}$ may be exemplified. The bivalent linking group for $W^{201}$ may be linear, branched, or cyclic, and cyclic is preferable. Among these, a group in which two carbonyl groups are bonded at both ends of an arylene group is preferable. Examples of the arylene group include a phenylene group and a naphthylene group, and a phenylene group is particularly preferable.

As the trivalent linking group for $W^{201}$, a group in which one hydrogen atom has been removed from the aforementioned divalent linking group for $W^{201}$ and a group in which the divalent linking group has been bonded to another divalent linking group can be mentioned. The trivalent linking group for $W^{201}$ is preferably a group in which 2 carbonyl groups are bonded to an arylene group.

Specific examples of a suitable cation represented by the formula (ca-1) include cations represented by the following chemical formulae (ca-1-1) to (ca-1-78), and (ca-1-101) to (ca-1-169).

In the following chemical formula, g1 represents a number of repetitions, and g1 is an integer of 1 to 5. g2 represents a number of repetitions, and g2 is an integer of 0 to 20. g3 represents a number of repetitions, and g3 is an integer of 0 to 20.

[Chem. 122]

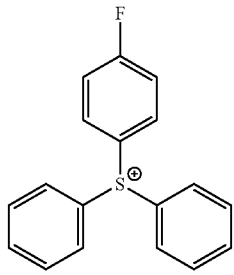

(ca-1-1)

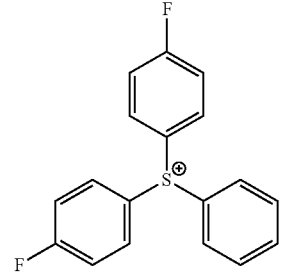

(ca-1-2)

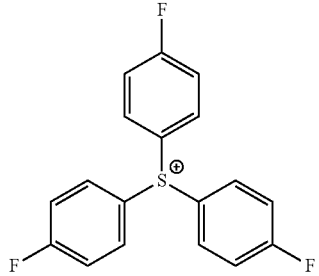

(ca-1-3)

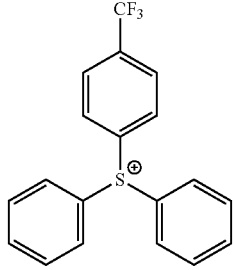

(ca-1-4)

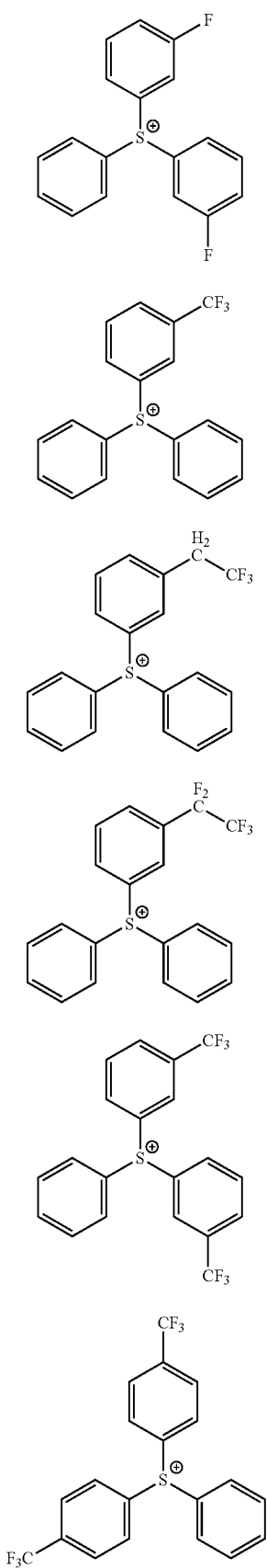
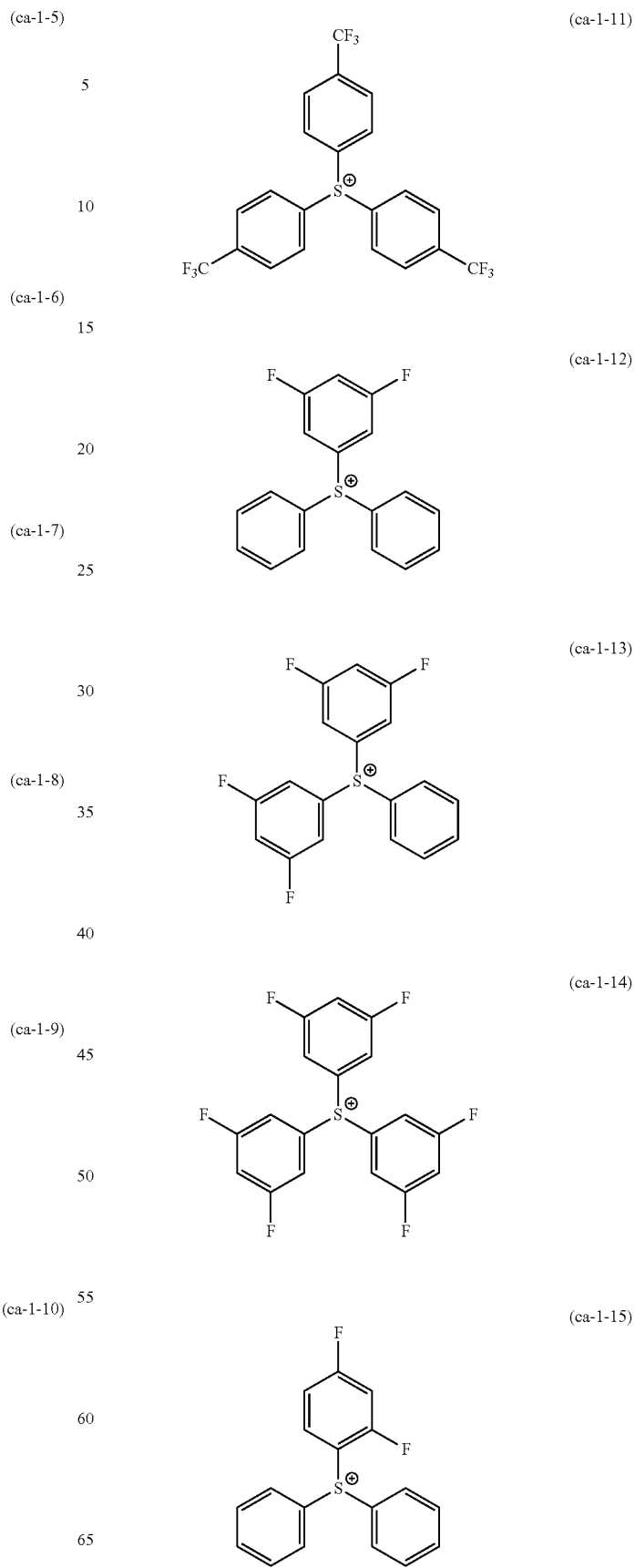

(ca-1-16)
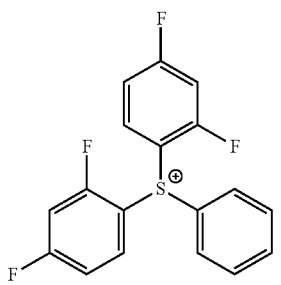
(ca-1-17)
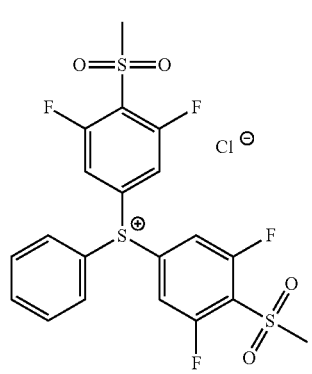
[Chem. 123]
(ca-1-18)
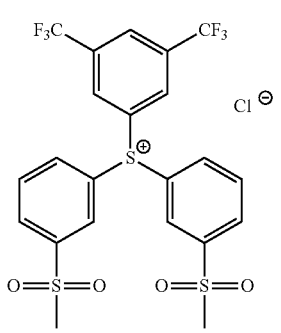
(ca-1-19)
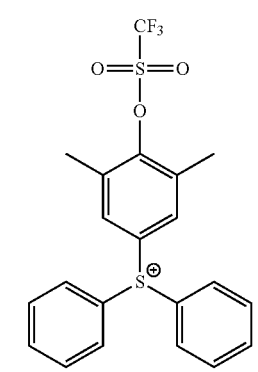
(ca-1-20)
(ca-1-21)
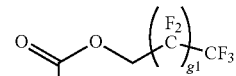
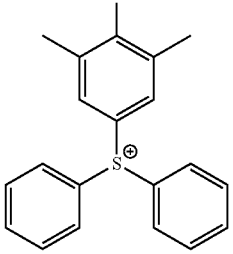
(ca-1-22)
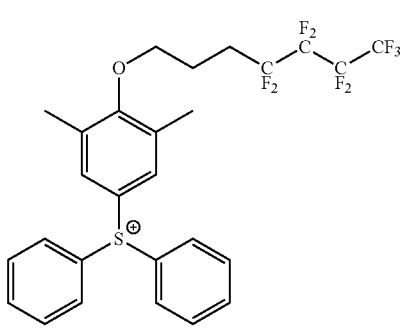
(ca-1-23)
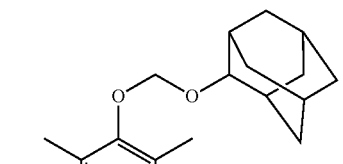
(ca-1-24)
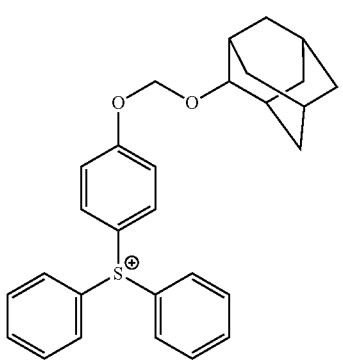

(ca-1-25)
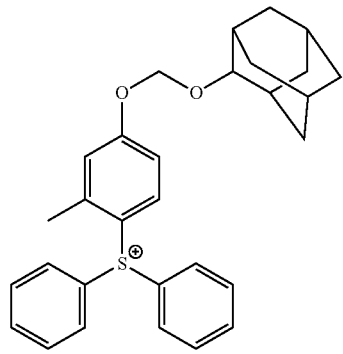
(ca-1-26)
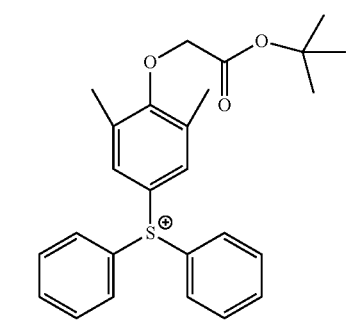
(ca-1-27)
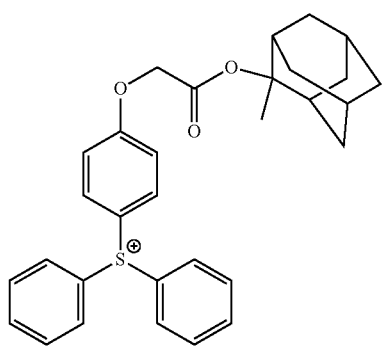
(ca-1-28)
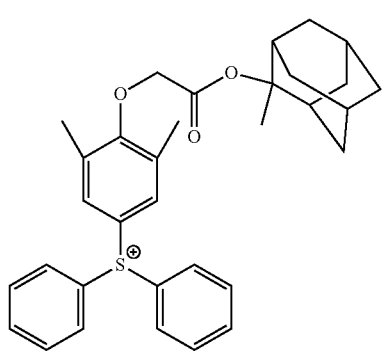
(ca-1-29)
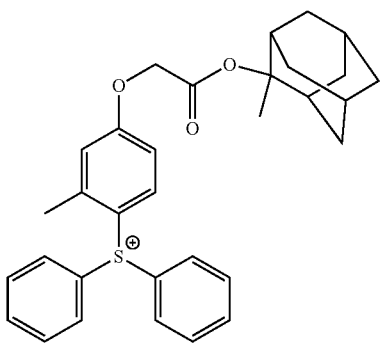
[Chem. 124]
(ca-1-30)
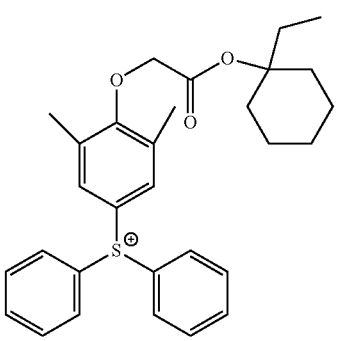
(ca-1-31)
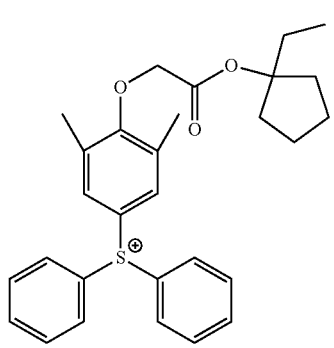
(ca-1-32)
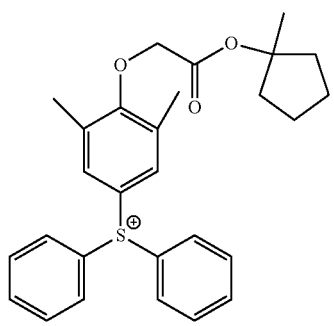

(ca-1-33)
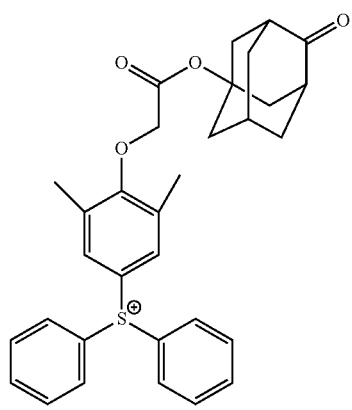
(ca-1-34)
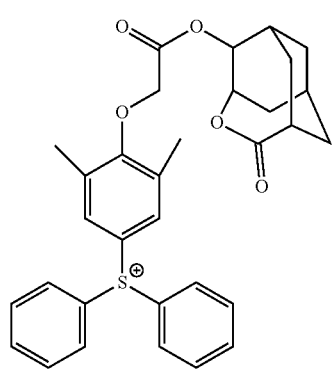
(ca-1-35)
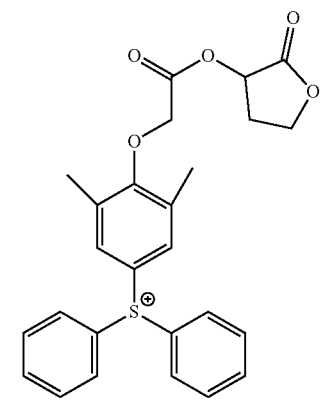
(ca-1-36)
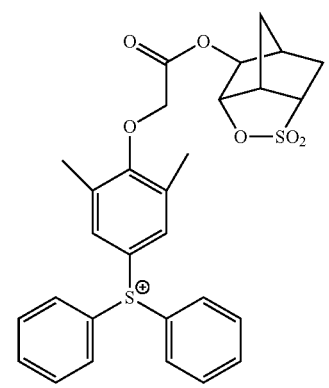
(ca-1-37)
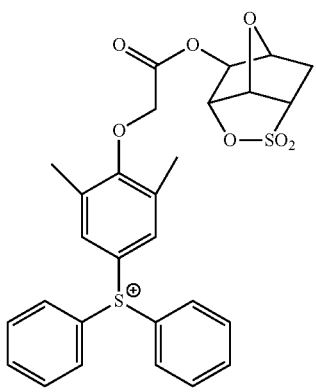
(ca-1-38)
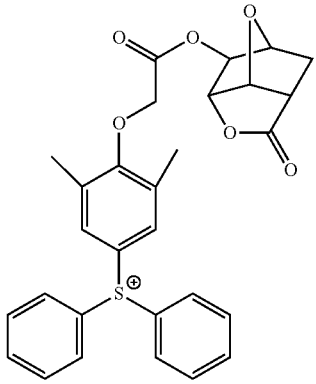
(ca-1-39)
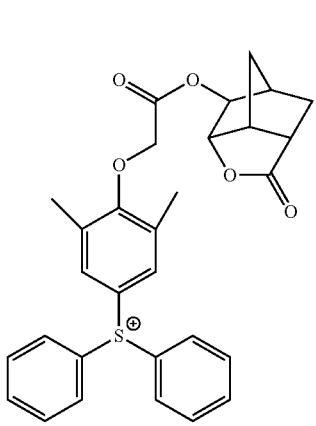
(ca-1-40)
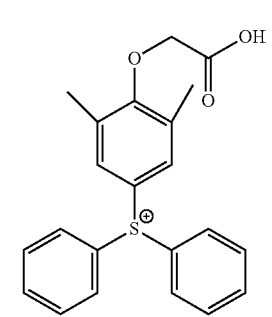

(ca-1-41)
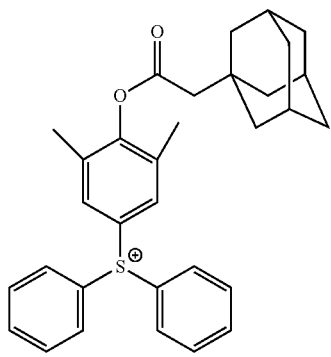
(ca-1-42)
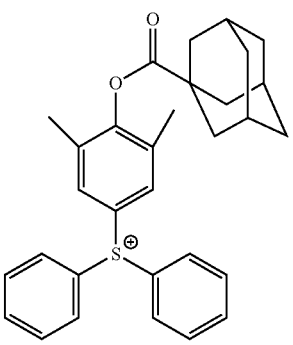
[Chem. 125]
(ca-1-43)
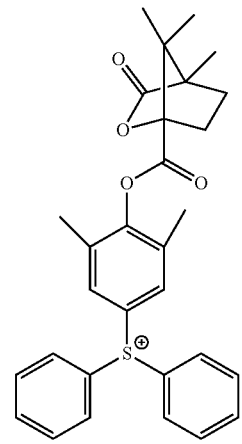
(ca-1-44)
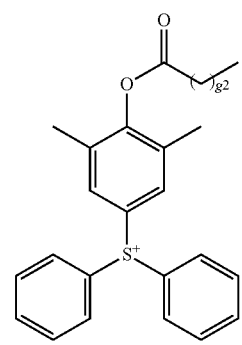
(ca-1-45)
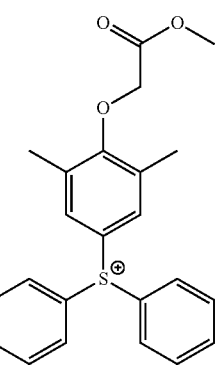
(ca-1-46)
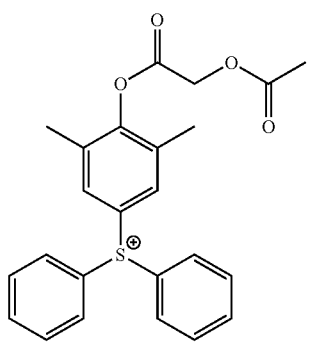
(ca-1-47)
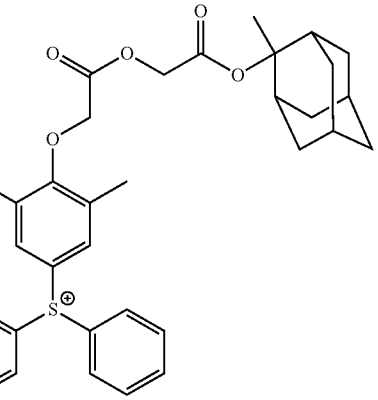
(ca-1-48)
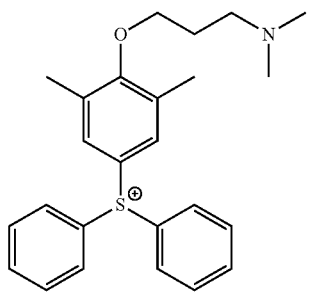

-continued
(ca-1-49)
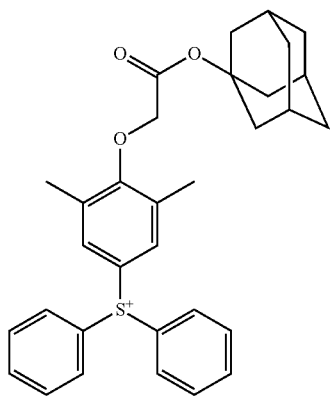
(ca-1-50)
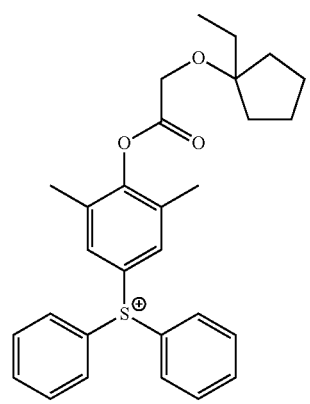
(ca-1-51)
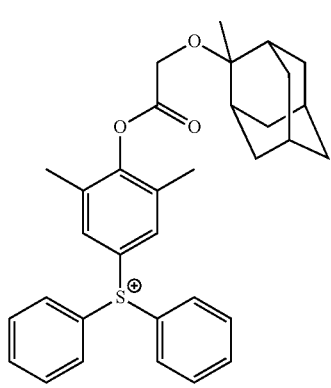
(ca-1-52)
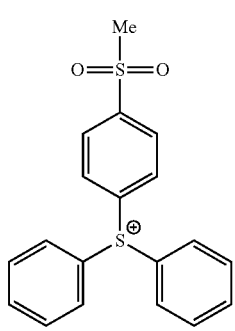
-continued
(ca-1-53)
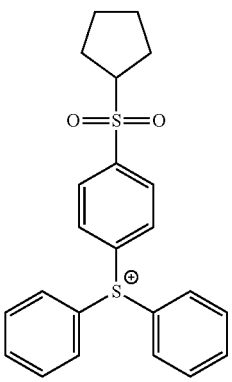
(ca-1-54)
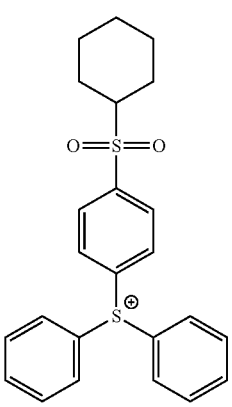
[Chem. 126]
(ca-1-55)
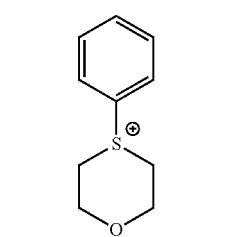
(ca-1-56)
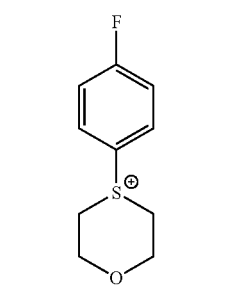

(ca-1-57)
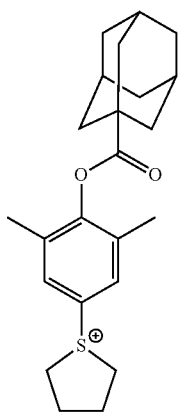
(ca-1-58)
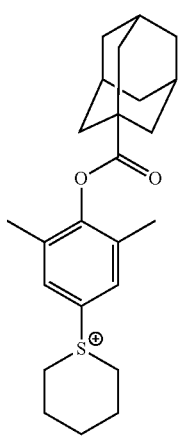
(ca-1-59)
(ca-1-60)
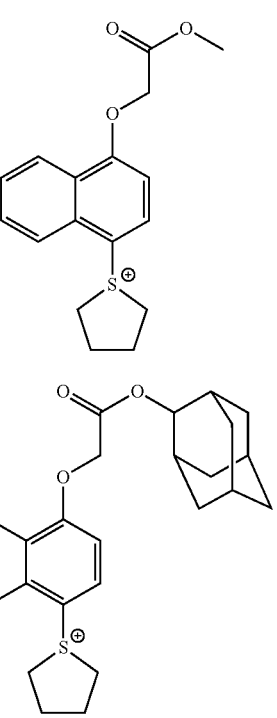
(ca-1-61)
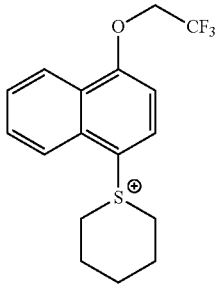
(ca-1-62)
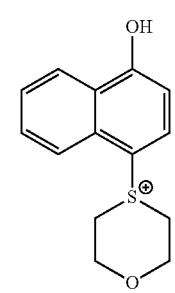
(ca-1-63)
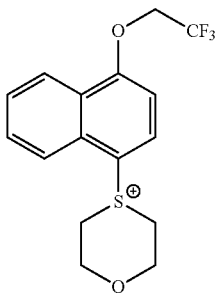
(ca-1-64)
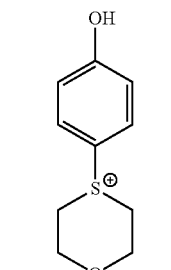
[Chem. 127]
(ca-1-65)
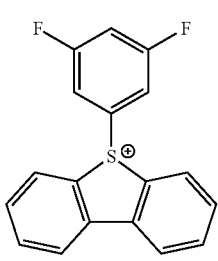

(ca-1-66)
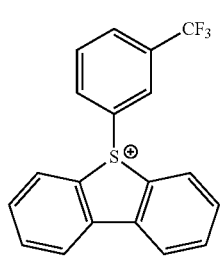
(ca-1-67)
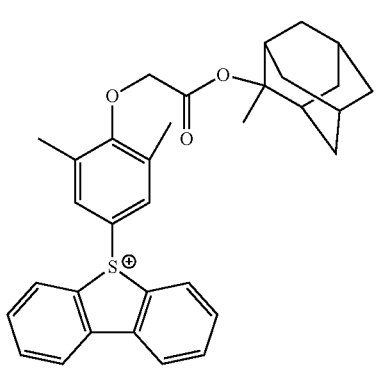
(ca-1-68)
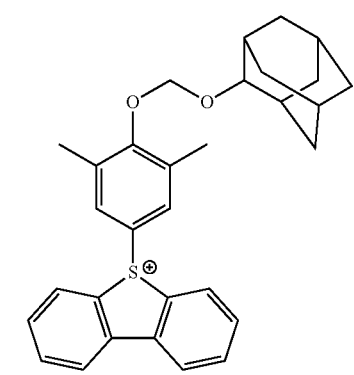
(ca-1-69)
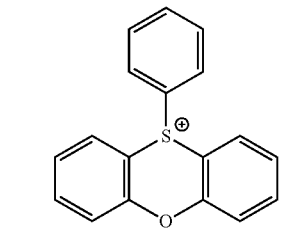
(ca-1-70)
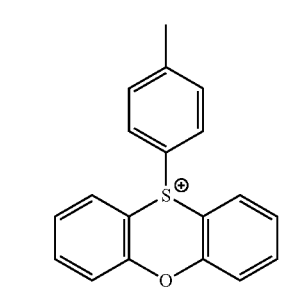
(ca-1-71)
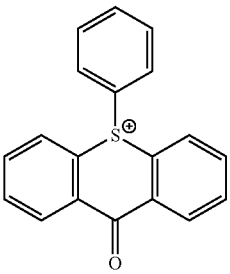
(ca-1-72)
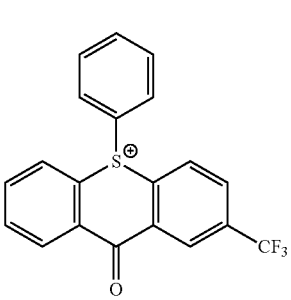
(ca-1-73)
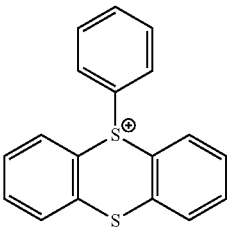
(ca-1-74)
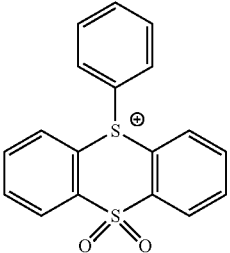
(ca-1-75)
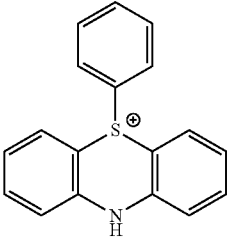
(ca-1-76)
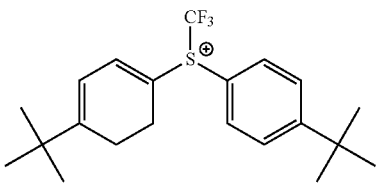

-continued
(ca-1-77)
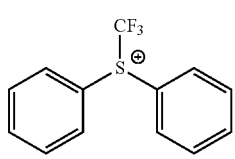
(ca-1-78)
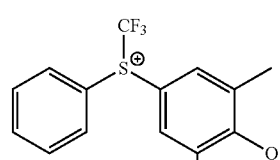
[Chem. 128]
(ca-1-101)
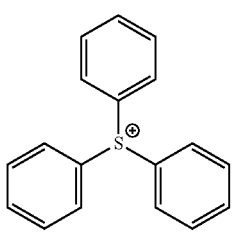
(ca-1-102)
(ca-1-103)
(ca-1-104)
-continued
(ca-1-105)
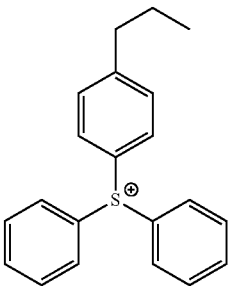
(ca-1-106)
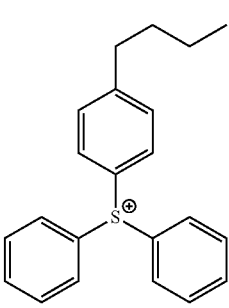
(ca-1-107)
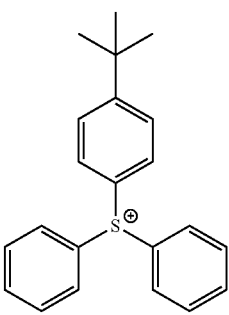
(ca-1-108)
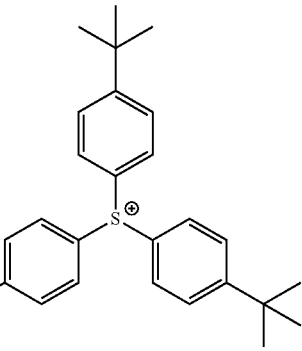
(ca-1-109)
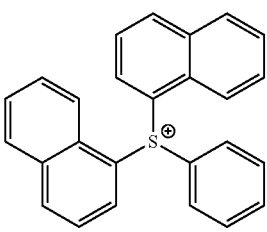

-continued
(ca-1-110)
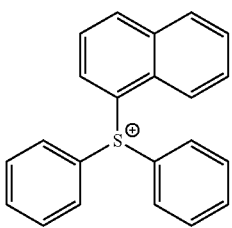
(ca-1-111)
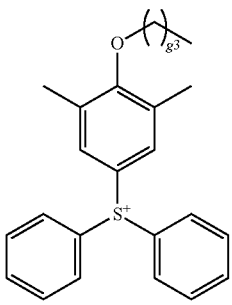
[Chem. 129]
(ca-1-112)
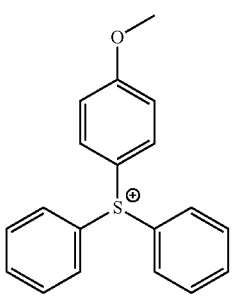
(ca-1-113)
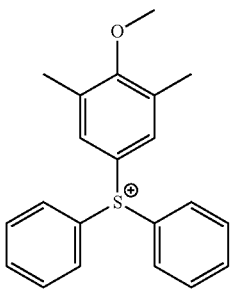
(ca-1-114)
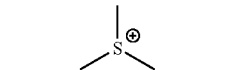
(ca-1-115)
(ca-1-116)
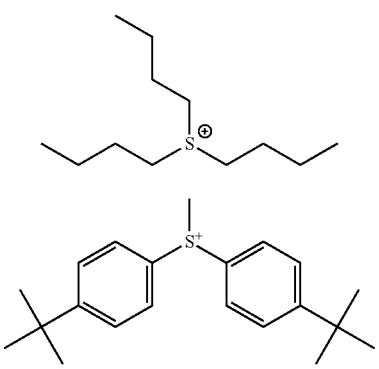
-continued
(ca-1-117)
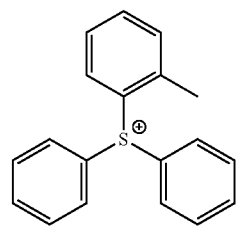
(ca-1-118)
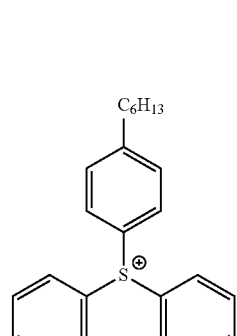
(ca-1-119)
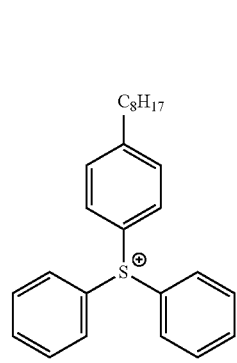
(ca-1-120)
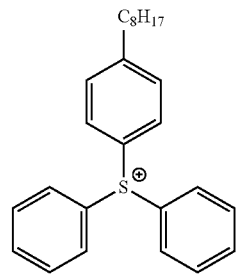
(ca-1-121)

[Chem. 130]
(ca-1-122)
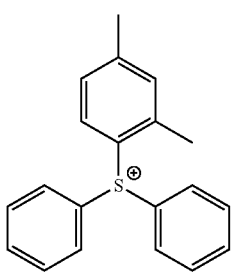
(ca-1-123)
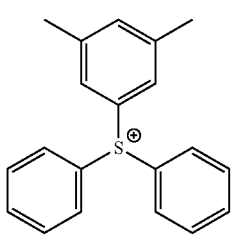
(ca-1-124)
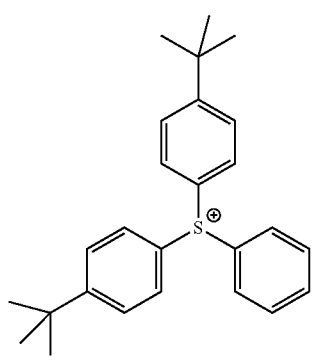
(ca-1-125)
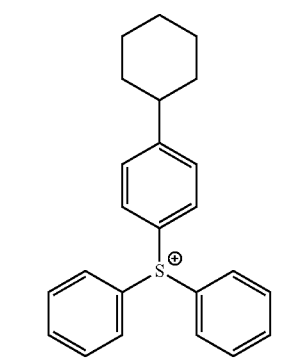
(ca-1-126)
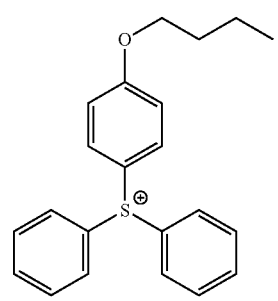
(ca-1-127)
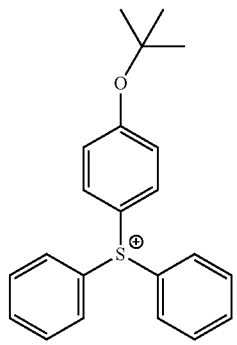
(ca-1-128)
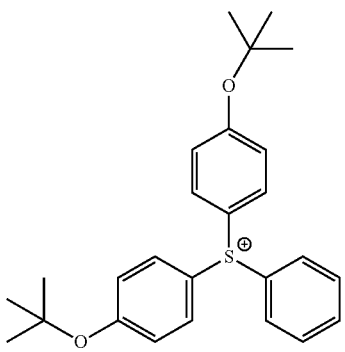
(ca-1-129)
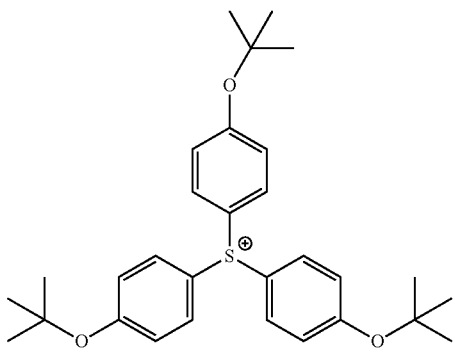
(ca-1-130)
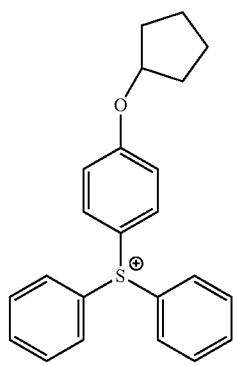

(ca-1-131)
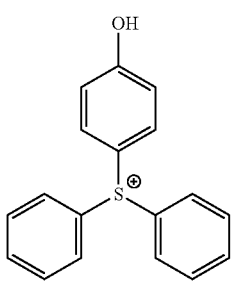
(ca-1-132)
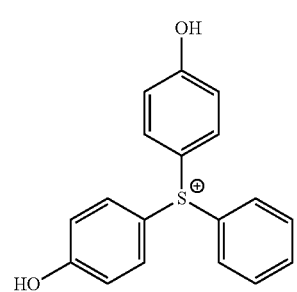
(ca-1-133)
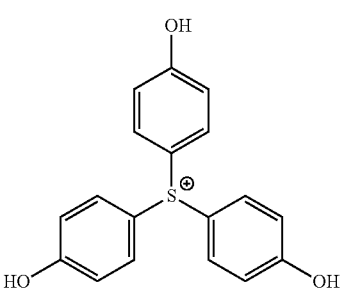
(ca-1-134)
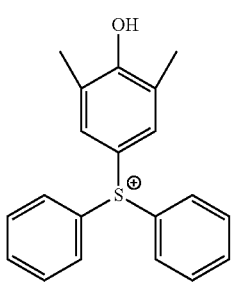
(ca-1-135)
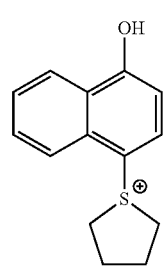
(ca-1-136)
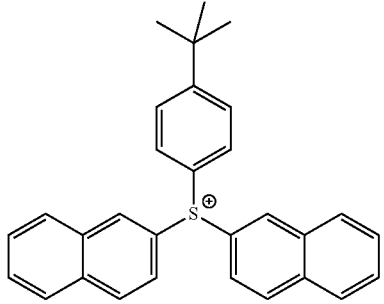
(ca-1-137)
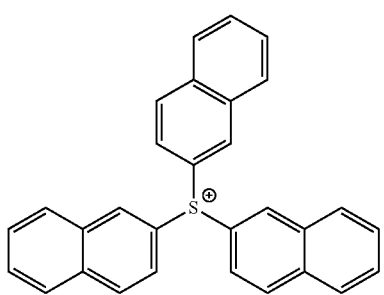
[Chem. 131]
(ca-1-138)
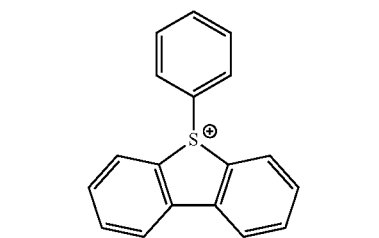
(ca-1-139)
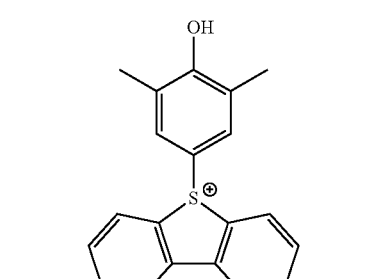
(ca-1-140)
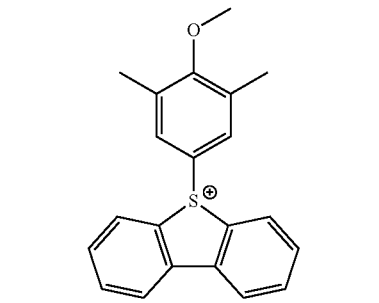

(ca-1-141)
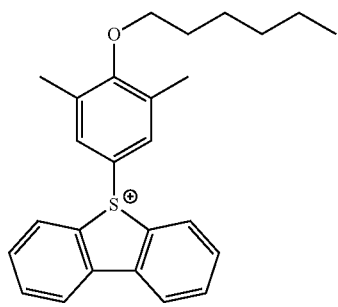
(ca-1-146)
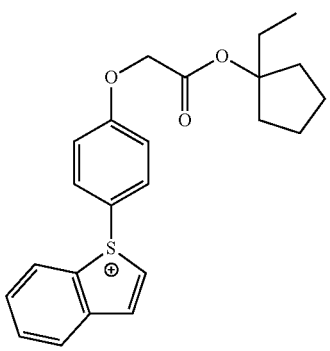
(ca-1-142)
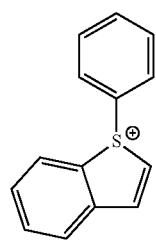
(ca-1-143)
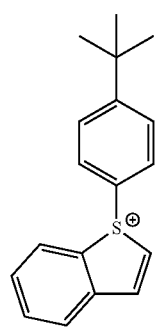
(ca-1-147)
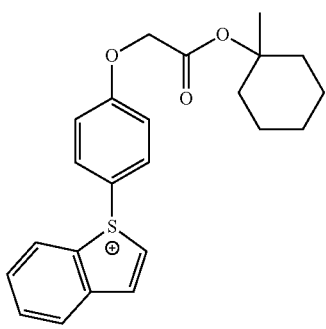
[Chem. 132]
(ca-1-144)
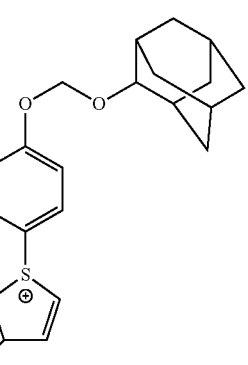
(ca-1-148)
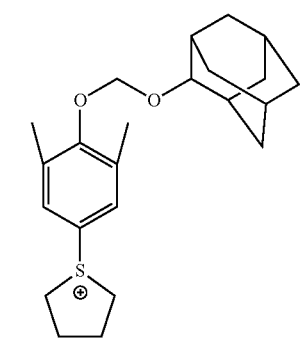
(ca-1-145)
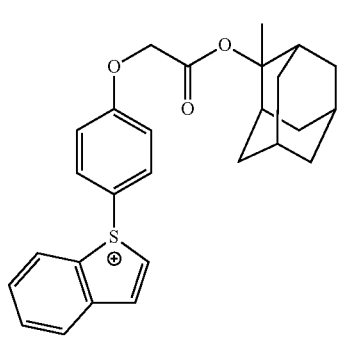
(ca-1-149)
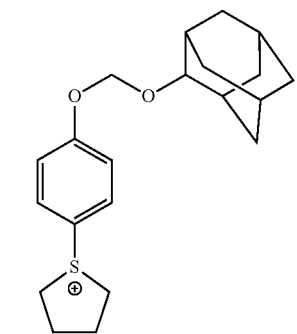

(ca-1-150)
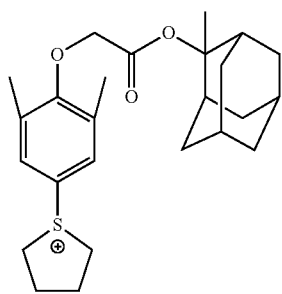
(ca-1-151)
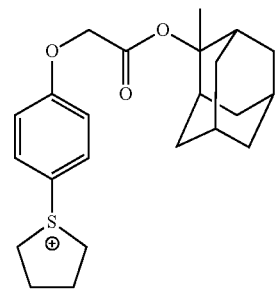
(ca-1-152)
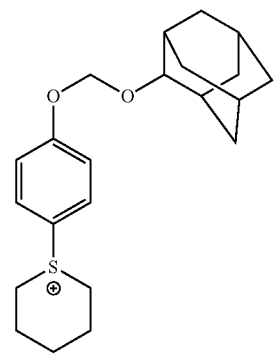
(ca-1-153)
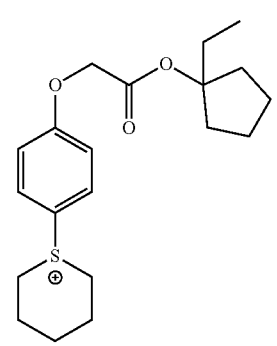
(ca-1-154)
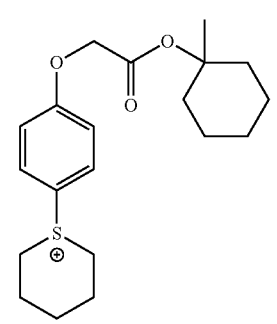
(ca-1-155)
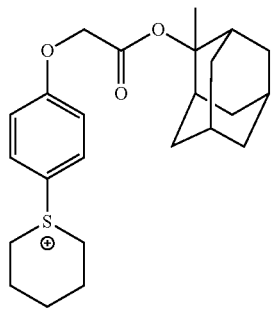
[Chem. 133]
(ca-1-156)
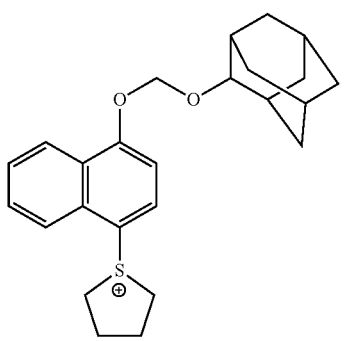
(ca-1-157)
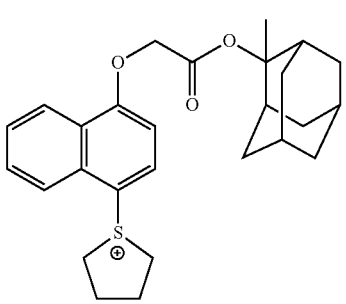
(ca-1-158)
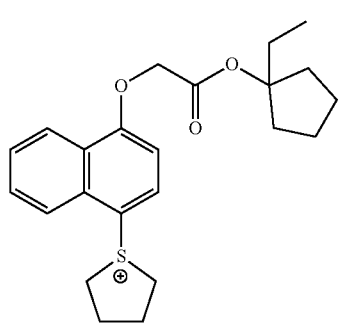
(ca-1-159)
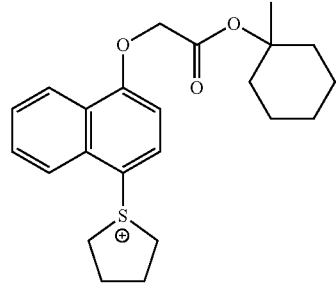

221
-continued (ca-1-160)
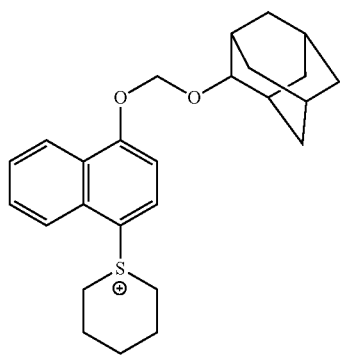

(ca-1-161)
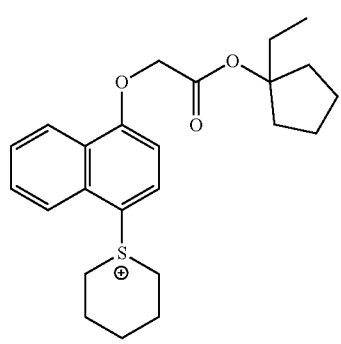

(ca-1-162)
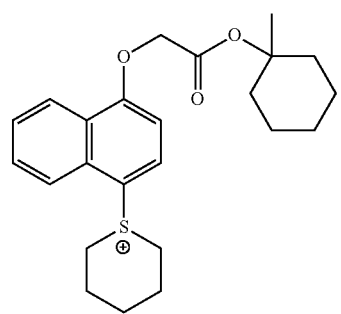

(ca-1-163)
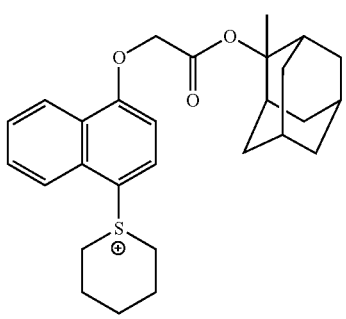

(ca-1-164)
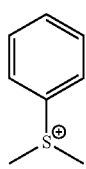

222
-continued (ca-1-165)
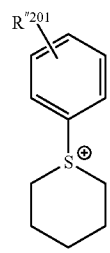

(ca-1-166)
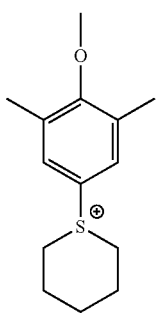

(ca-1-167)
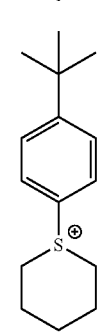

(ca-1-168)
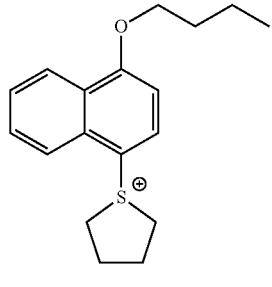

(ca-1-169)
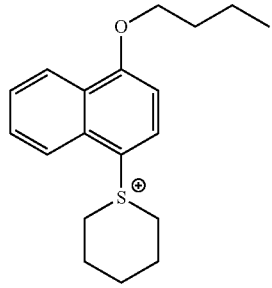

[In the formula, $R'^{201}$ represents a hydrogen atom or a substituent. Examples of the substituent include an alkyl group, a halogen atom, a halogenated alkyl group, a carbonyl group, a cyano group, an amino group, an aryl group which are exemplified as substituents that $R^{201}$ to $R^{207}$ and $R^{211}$ to $R^{212}$ may have, and groups represented by the general formulae (ca-r-1) to (ca-r-7).]

Specific examples of a suitable cation represented by the formula (ca-2) include cations represented by the following formulae (ca-2-1) to (ca-2-2), a diphenyliodonium cation, and a bis(4-tert-butylphenyl)iodonium cation.

[Chem. 134]

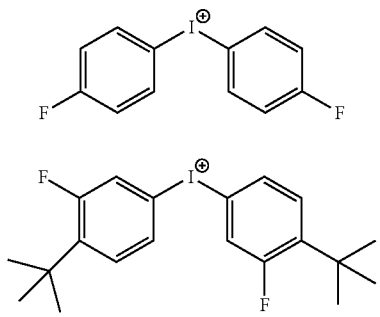

(ca-2-1)

(ca-2-2)

Specific examples of a suitable cation represented by the formula (ca-3) include cations represented by the following formulae (ca-3-1) to (ca-3-7).

[Chem. 135]

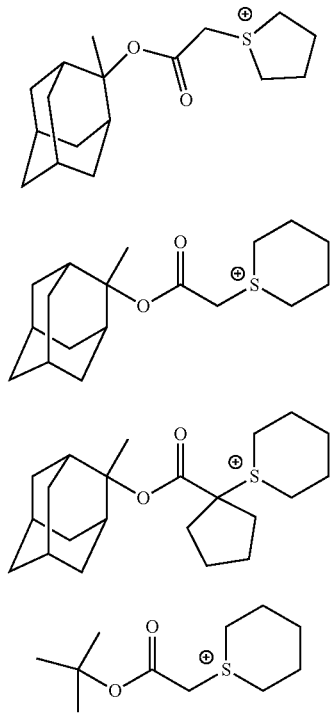

(ca-3-1)

(ca-3-2)

(ca-3-3)

(ca-3-4)

(ca-3-5)

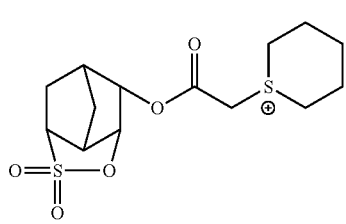

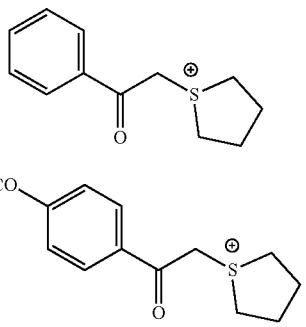

(ca-3-6)

(ca-3-7)

Specific examples of a suitable cation represented by the formula (ca-4) include cations represented by the following formulae (ca-4-1) to (ca-4-2).

[Chem. 136]

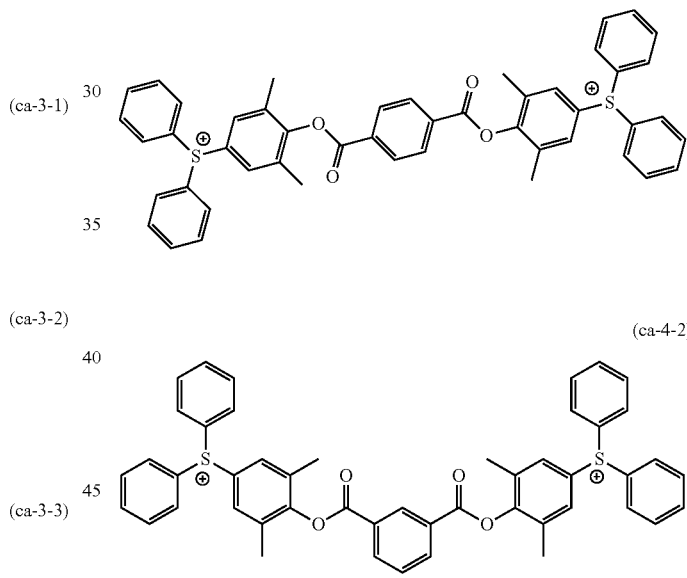

(ca-4-1)

(ca-4-2)

In addition, regarding an ammonium cation when the component (BD1) is used as the base component (D), cations (primary to quaternary ammonium cations) in which $NH_4^+$ or H bonded to a nitrogen atom thereof is substituted with a hydrocarbon group which may have a hetero atom and cyclic cations forming a ring together with a nitrogen atom thereof may be exemplified.

Among the above examples, regarding the cation moiety $((M^{m+})_{1/m})$, a cation represented by the general formula (ca-1) is preferable, and cations represented by the chemical formulae (ca-1-1) to (ca-1-78), and (ca-1-101) to (ca-1-169) are more preferable.

Among the above components (BD1), specific examples of a compound suitable as an acid-generator component (B) (hereinafter referred to as a "component (B1)") that generates an acid acting on the component (A) are shown below.

[Chem. 137]

(B1-1)
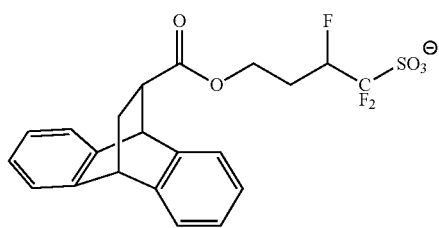

(B1-2)
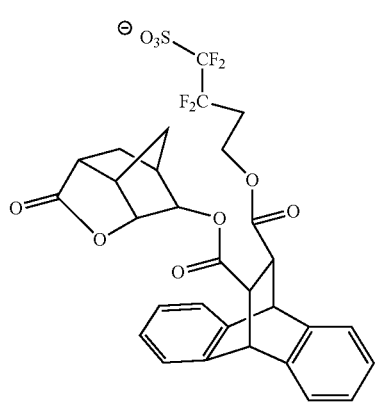

(B1-3)
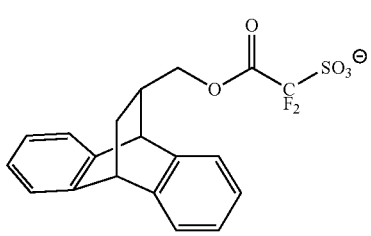

(B1-4)
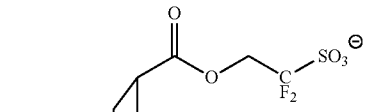

(B1-5)
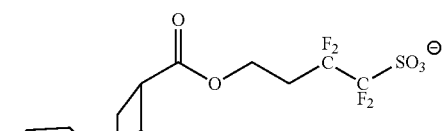

(B1-6)
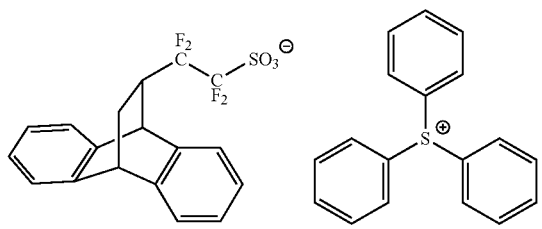

In the resist composition of the present embodiment, one type of the component (B1) may be used alone or two or more thereof may be used in combination.

In the resist composition of the present embodiment, the amount of the component (B1) is preferably 5 to 65 parts by mass, more preferably 5 to 55 parts by mass, still more preferably 10 to 45 parts by mass, and particularly preferably 10 to 40 parts by mass with respect to 100 parts by mass of the component (A).

In the resist composition, within the entire acid-generator component (B) that generates an acid acting on the component (A), a proportion of the component (B1) is, for example, 50 mass % or more, preferably 70 mass % or more, and most preferably 95 mass % or more. Here, the proportion may be 100 mass %.

If the amount of the component (B1) is equal to or more than a lower limit of the preferable range, in the resist pattern formation, lithography properties such as sensitivity, resolution performance, line width roughnesss (LWR) reduction, and the shape are further improved. On the other hand, if the amount thereof is equal to or less than an upper limit of the preferable range, when components in the resist composition are dissolved in an organic solvent, a homogeneous solution is easily obtained, and storage stability for the resist composition is further improved.

In addition, when the resist composition contains the component (B1) and the component (D) (at least one of die components (D1) to (D3)), a ratio thereof (molar ratio) is, for example, (B1):(D)=100:0 to 50:50, more preferably (B1):(D)=99:1 to 51:49, and most preferably (B1):(D)=90:10 to 60:40 because then favorable lithography properties and resist pattern shape are easily obtained.

In addition, among die components (BD1) described above, specific examples of a compound suitable as a base component (D) (hereinafter referred to as a "component (D1)") that traps (controls acid diffusion) an acid generated from the component (B) upon exposure are shown below.

[Chem. 138]

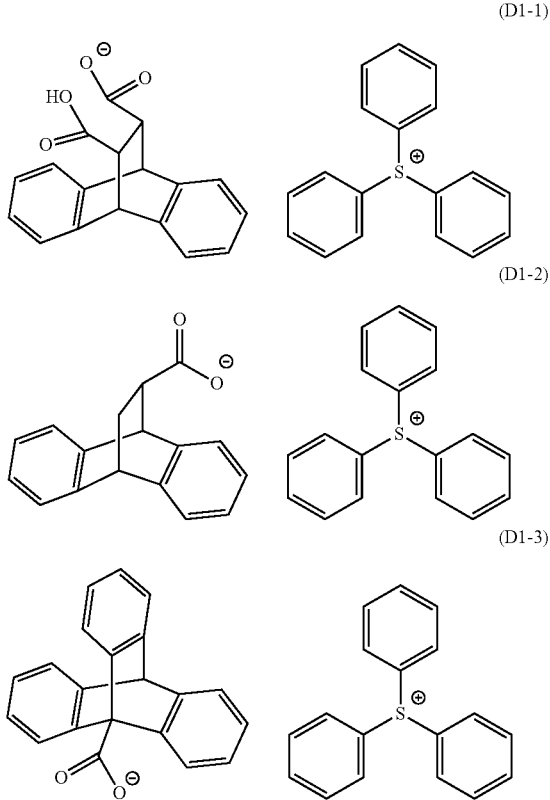

(D1-1)

(D1-2)

(D1-3)

In the resist composition of the present embodiment, one type of the component (D1) may be used alone or two or more thereof may be used in combination.

In the resist composition of the present embodiment, the amount of the component (D1) is preferably 1 to 35 parts by mass, more preferably 2 to 25 parts by mass, still more preferably 3 to 20 parts by mass, and particularly preferably 3.5 to 15 parts by mass with respect to 100 parts by mass of the component (A).

In the resist composition, within the entire base component (D) that traps (controls acid diffusion) an acid generated from the component (B) upon exposure, a proportion of the component (D1) is, for example, 50 mass % or more, preferably 70 mass % or more, and most preferably 95 mass % or more. Here, the proportion may be 100 mass %.

If the amount of the component (D1) is equal to or more than a lower limit of the preferable range, favorable lithography properties and resist pattern shape are easily obtained. On the other hand, if the amount thereof is equal to less than an upper limit of the preferable range, a balance with other components can be achieved and various lithography properties become favorable.

In addition, when the resist composition contains the component (D1) and the component (B) (at least one of components (B1) to (B2)), a ratio thereof (molar ratio) is, for example, (B):(D1)=100:0 to 50:50, more preferably (B):(D1)=99:1 to 51:49, and most preferably (B):(D1)=90:10 to 60:40 because then favorable lithography properties and resist pattern shape are easily obtained.

<<Component (B1d)>>

Preferable examples of the component (B1) include a compound (B1d) represented by the following general formula (b1) (hereinafter referred to as a "component (B1d)").

[Chem. 139]

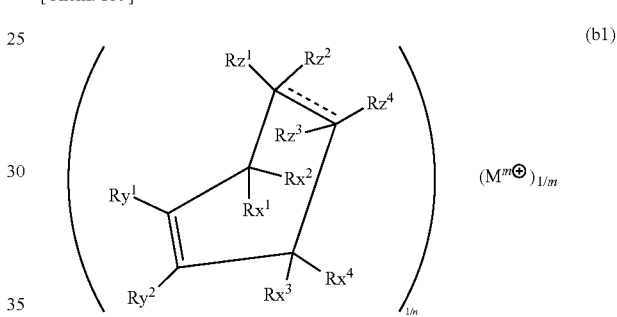

(b1)

[In the formula, $Rx^1$ to $Rx^4$ each independently represent a hydrocarbon group which may have a substituent or a hydrogen atom or two or more of $Rx^1$ to $Rx^4$ may be mutually bonded to form a ring structure. $Ry^1$ to $Ry^2$ each independently represent a hydrocarbon group which may have a substituent, or a hydrogen atom or may be mutually bonded to form a ring structure.

· · · · ·   [Chem. 140]

represents a double bond or a single bond. Rz1 to Rz4 each independently represent, where valence allows, a hydrocarbon group which may have a substituent or a hydrogen atom, or two or more of Rz1 to Rz4 may be mutually bonded to form a ring structure; provided that at least one of $Rx^1$ to $Rx^4$, $Ry^1$ to $Ry^2$ and $Rz^1$ to $Rz^4$ has an anion group represented by the following general formula (an-1), the entire anion moiety may be an n-valent anion, and the number of carbonyl groups of the entire anion moiety is 1 or 0. n is an integer of 1 or more, m is an integer of 1 or more, and $M^{m+}$ represents an m-val ent organic cation.]

[Chem. 141]

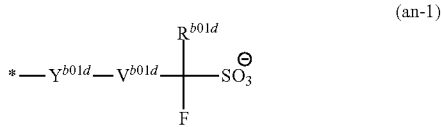

(an-1)

[In the formula, $R^{b01d}$ represents a fluorine atom or a fluorinated alkyl group having 1 to carbon atoms. $Y^{b01d}$ represents a single bond or a bivalent linking group. Here, when $Y^{b01d}$ is a bivalent linking group, the number of carbonyl groups contained in $Y^{b01d}$ is 1 or 0. $V^{b01}$ represents a single bond, an alkylene group or a fluorinated alkylene group. * indicates a bond.]

Anion Moiety

In the general formula (b1), $Rx^1$ to $Rx^4$, $Ry^1$ to $Ry^2$, and $Rz^1$ to $Rz^4$ are the same as $Rx^1$ to $Rx^4$, $Ry^1$ to $Ry^2$, and $Rz^1$ to $Rz^4$ in the general formula (bd1), and preferable examples thereof are the same as those above.

In the general formula (b1), at least one of $Rx^1$ to $Rx^4$, $Ry^1$ to $Ry^2$ and $Rz^1$ to $Rz^4$ has an anion group represented by the following general formula (an-1), the entire anion moiety may be an n-valent anion, and the number of carbonyl groups of the entire anion moiety is 1 or 0.

[Chem. 142]

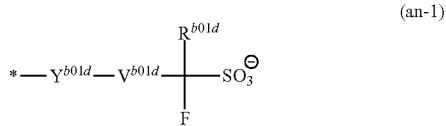

(an-1)

[In the formula, $R^{b01d}$ represents a fluorine atom or a fluorinated alkyl group having 1 to carbon atoms. $Y^{b01d}$ represents a single bond or a bivalent linking group. However, when $Y^{b01d}$ is a bivalent linking group, the number of carbonyl groups contained in $Y^{b01d}$ is 1 or 0. $V^{b01d}$ represents a single bond, an alkylene group or a fluorinated alkylene group. * indicates a bond.]

In the component (B1d), $Rx^1$ to $Rx^4$, $Ry^1$ to $Ry^2$, and $Rz^1$ to $Rz^4$ each may be the anion group. Alternatively, when two or more of $Rx^1$ to $Rx^4$ are mutually bonded to form a ring structure, a carbon atom forming the ring structure or a hydrogen atom bonded to the carbon atom may be substituted with die anion group. When two or more of $Ry^1$ to $Ry^2$ are mutually bonded to form a ring structure, a carbon atom forming the ring structure or a hydrogen atom bonded to the carbon atom may be substituted with the anion group. When two or more of $Rz^1$ to $Rz^4$ are mutually bonded to form a ring structure, a carbon atom forming the ring structure or a hydrogen atom bonded to the carbon atom may be substituted with the anion group.

In the formula (an-1), $R^{b01d}$ represents a fluorinated alkyl group having 1 to 5 carbon atoms or a fluorine atom. $R^{b01d}$ is preferably a perfluoro alkyl group having 1 to carbon atoms or a fluorine atom, and more preferably a fluorine atom.

In the formula (an-1), $V^{b01*1}$ represents an alkylene group, a fluorinated alkylene group or a single bond.

The alkylene group or fluorinated alkylene group for $V^{b01d}$ preferably has 1 to 4 carbon atoms, and more preferably 1 to 3 carbon atoms. Examples of the fluorinated alkylene group for $V^{b01d}$ include a group in which some or all of the hydrogen atoms of the alkylene group are substituted with a fluorine atom. Among these, $V^{b01d}$ is preferably an alkylene group having 1 to 4 carbon atoms, a fluorinated alkylene group having 1 to 4 carbon atoms or a single bond.

In the formula (an-1), $Y^{b01d}$ represents a bivalent linking group or a single bond. Here, when $Y^{b01d}$ is a bivalent linking group, the number of carbonyl groups contained in $Y^{b01d}$ is 1 or 0.

Preferable examples of the bivalent linking group for $Y^{b01d}$ include a bivalent linking group containing an oxygen atom.

When $Y^{b01d}$ is a bivalent linking group containing an oxygen atom, $Y^{b01d}$ may contain an atom other than an oxygen atom. Examples of atoms other than an oxygen atom include a carbon atom, a hydrogen atom, a sulfur atom, and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—SO$_2$—) bonded thereto.

Examples of the bivalent linking group containing an oxygen atom include linking groups represented by the general formulae (y-a1-1), and (y-a1-3) to (y-a1-8).

The bivalent linking group for $Y^{b01d}$ is preferably a bivalent linking group having one ester bond or a bivalent linking group having an ether bond, and more preferably linking groups represented by the formulae (y-a1-1) to (y-a1-5).

For example, when $Y^{b01d}$ is a single bond, specific examples of the anion group represented by the formula (an-1) include —CH$_2$CF$_2$SO$_3^-$, —CF$_2$CF$_2$SO$_3^-$, and a fluorinated alkylsulfonate anion such as a trifluoromethanesulfonate anion and a perfluorobutanesulfonate anion.

Specific examples of the anion group represented by the formula (an-1) when $Y^{b01d}$ is a bivalent linking group containing an oxygen atom include anion groups represented by any of the following formulae (an-11) to (an-13).

[Chem. 143]

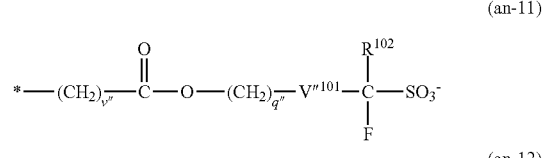

(an-11)

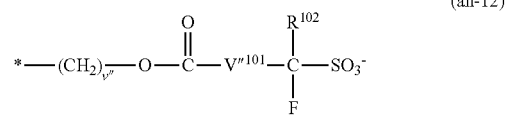

(an-12)

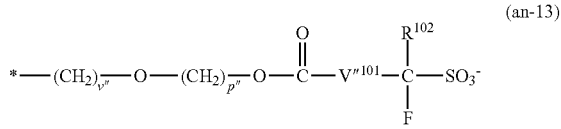

(an-13)

[In the formula, $V'''^{101}$ represents a single bond, an alkylene group having 1 to 4 carbon atoms, or a fluorinated alkylene group having 1 to 4 carbon atoms. $R^{102}$ represents a fluorine atom or a fluorinated alkyl group having 1 to 5 carbon atoms. Each v" independently is an integer of 0 to 3. q" is an integer of 0 to 20, and p" is an integer of 1 to 20.]

In the formulae (an-11) to (an-13), $V'''^{101}$, $R^{102}$, v", q", and p" are the same as $V'''^{101}$, $R^{102}$, v", q", and p" in the general formulae (bd1-r-an11) to (bd1-r-an13), and preferable examples thereof are the same as those above.

Among the above examples, the anion group represented by the formula (an-1) is preferably the group represented by the formula (an-11) or (an-12).

Preferable specific examples of the anion group represented by the general formula (an-1) are shown below. In the following formula, k is an integer of 0 to 3, and k' is an integer of 0 to 20. * indicates a bond.

[Chem. 144]

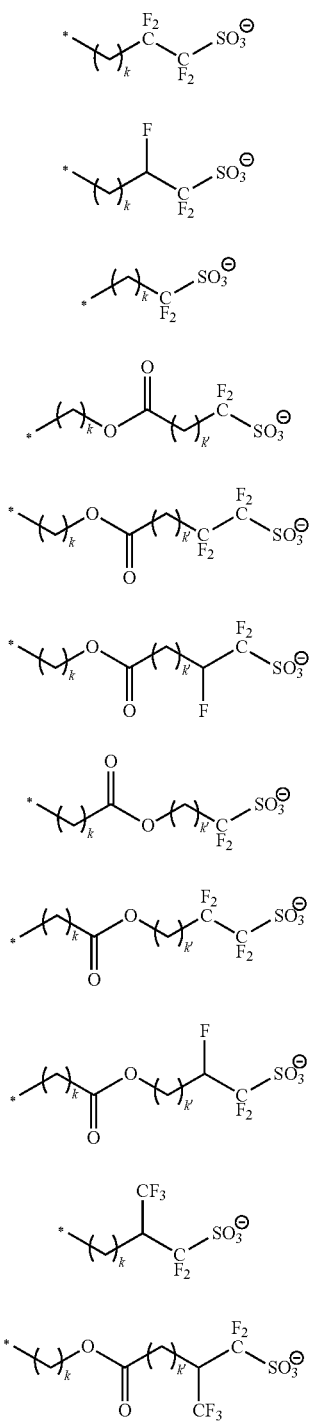

(an-1-1)
(an-1-2)
(an-1-3)
(an-1-4)
(an-1-5)
(an-1-6)
(an-1-7)
(an-1-8)
(an-1-9)
(an-1-10)
(an-1-11)

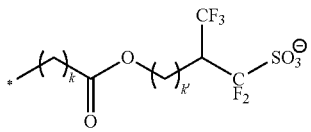

(an-1-12)

The number of anion groups in the component (B1d) may be 1 or 2 or more, and 1 is preferable. When the number of anion groups in the component (B1 d) is 2 or more, the total number of carbonyl groups contained in the two or more anion groups is 1 or 0. In the general formula (b1), preferably, any of $Rx^1$ to $Rx^4$ and $Rz^1$ to $Rz^4$ has the anion group, and $Ry^1$ to $Ry^4$ preferably have no anion group. In addition, the component (B1d) preferably has no anion group other than the anion group represented by the general formula (an-1).

In the component (B1d), the entire anion moiety may be an n-val ent anion, n is an integer of 1 or more; m is an integer of 1 or more, preferably 1 or 2, and more preferably 1.

In the component (B1d), the number of carbonyl groups in the entire anion moiety is 1 or 0. When the anion moiety has one carbonyl group, any of $Rx^1$ to $Rx^4$ and $Rz^1$ to $Rz^4$ preferably has the carbonyl group, and $Ry^1$ to $Ry^4$ preferably has no carbonyl group. In addition, when the component (B1d) has one carbonyl group, the carbonyl group is preferably contained in the anion group represented by the general formula (an-1).

Regarding the anion moiety in the component (B1d), in consideration of an ability to control acid diffusion, an anion represented by the following general formula (b1-an1) is preferable.

[Chem. 145]

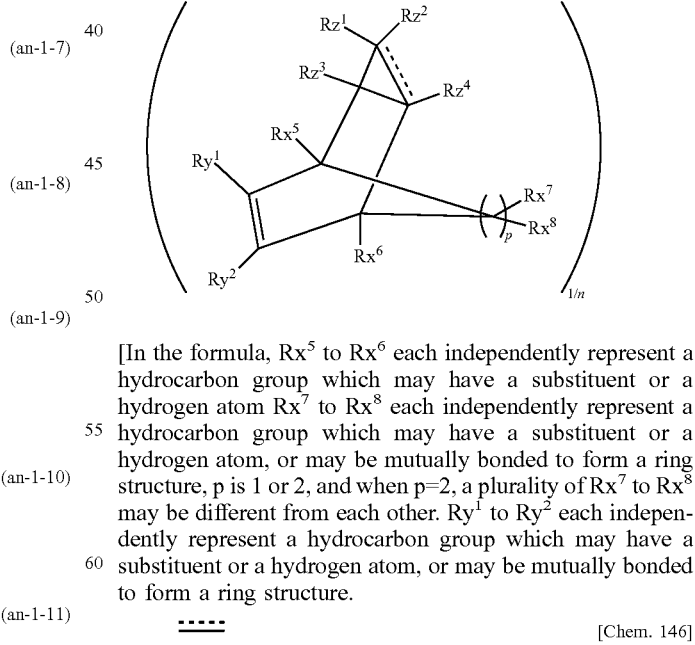

(b1-an1)

[In the formula, $Rx^5$ to $Rx^6$ each independently represent a hydrocarbon group which may have a substituent or a hydrogen atom $Rx^7$ to $Rx^8$ each independently represent a hydrocarbon group which may have a substituent or a hydrogen atom, or may be mutually bonded to form a ring structure, p is 1 or 2, and when p=2, a plurality of $Rx^7$ to $Rx^8$ may be different from each other. $Ry^1$ to $Ry^2$ each independently represent a hydrocarbon group which may have a substituent or a hydrogen atom, or may be mutually bonded to form a ring structure.

----- [Chem. 146]

represents a double bond or a single bond. $Rz^1$ to $Rz^4$ each independently represent, where valence allows, a hydrocarbon group which may have a substituent or a hydrogen atom, or two or more of $Rz^1$ to $Rz^4$ may be mutually bonded to form a ring structure; provided that at least one of $Rx^5$ to $Rx^8$, $Ry^1$ to $Ry^2$ and $Rz^1$ to $Rz^4$ has an anion group represented by the general formula (an-1), the entire anion moiety may be an n-valent anion, and the number of carbonyl groups in the entire anion moiety is 1 or 0. n is an integer of 1 or more.]

In the formula (b1-an1), $Rx^5$ to $Rx^6$, $Rx^7$ to $Rx^8$, $Ry^1$ to $Ry^2$, $Rz^1$ to $Rz^4$, and p are the same as $Rx^5$ to $Rx^6$, $Rx^7$ to $Rx^8$, $Ry^1$ to $Ry^2$, $Rz^1$ to $Rz^4$, and p in the general formula (bd1-an1), and preferable examples thereof are the same as those above.

Here, in the formula (b1-an1), at least one of $Rx^5$ to $Rx^8$, $Ry^1$ to $Ry^2$ and $Rz^1$ to $Rz^4$ has an anion group represented by the general formula (an-1), the entire anion moiety may be an n-valent anion, and the number of carbonyl groups in the entire anion moiety is 1 or 0. n is an integer of 1 or more.

Among the above examples, in consideration of an ability to control acid diffusion, the anion moiety in the component (B1d) is an anion represented by p=2 in the formula (b1-an1), that is, an anion represented by the following general formula (b1-an2) is more preferable.

[Chem. 147]

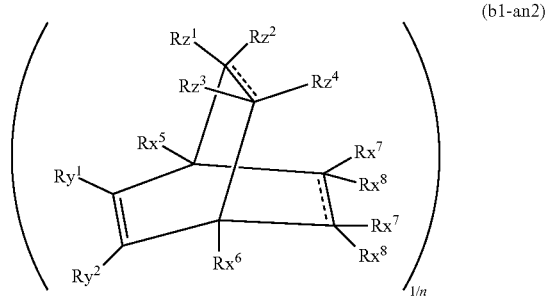

(b1-an2)

[In the formula, $Rx^5$ to $Rx^6$ each independently represent a hydrocarbon group which may have a substituent or a hydrogen atom. A plurality of $Rx^7$ to $Rx^8$ each independently represent a hydrocarbon group which may have a substituent or a hydrogen atom, or two or more of $Rx^7$ to $Rx^8$ may be mutually bonded to form a ring structure. $Ry^1$ to $Ry^2$ each independently represent a hydrocarbon group which may have a substituent or a hydrogen atom, or may be mutually bonded to form a ring structure:

----- [Chem. 148]

represents a double bond or a single bond. $Rz^1$ to $Rz^4$ each independently represent, where valence allows, a hydrocarbon group which may have a substituent or a hydrogen atom, or two or more of $Rz^1$ to $Rz^4$ may be mutually bonded to form a ring structure; provided that at least one of $Rx^5$ to $Rx^8$, $Ry^1$ to $Ry^2$ and $Rz^1$ to $Rz^4$ has an anion group represented by the general formula (an-1), the entire anion moiety may be an n-valent anion, and the number of carbonyl groups in the entire anion moiety is 1 or 0. n is an integer of 1 or more.]

In the formula (b1-an2), $Rx^5$ to $Rx^6$, $Rx^7$ to $Rx^8$, $Ry^1$ to $Ry^2$, and $Rz^1$ to $Rz^4$ are the same as $Rx^5$ to $Rx^6$, $Rx^7$ to $Rx^8$, $Ry^1$ to $Ry^2$, and $Rz^1$ to $Rz^4$ in the above formula (bd1-an1).

Here, in the formula (b1-an2), at least one of $Rx^5$ to $Rx^8$, $Ry^1$ to $Ry^2$ and $Rz^1$ to $Rz^4$ has an anion group represented by the general formula (an-1), the entire anion moiety may be an n-valent anion, and the number of carbonyl groups in the entire anion moiety is 1 or 0. n is an integer of 1 or more.

In the formula (b1), formula (b1-an1), and formula (b1-an2), in consideration of short diffusion of an acid generated upon exposure and an ability to control acid diffusion, preferably, $Ry^1$ to $Ry^2$ are mutually bonded to form a ring structure, and a ring structure to be formed is more preferably an aromatic hydrocarbon which may have a substituent (an aromatic ring, an aromatic hetero ring, and more preferably an aromatic ring).

In the formula (b1), formula (b1-an1), and formula (b1-an2), $Rz^1$ to $Rz^4$ are preferably mutually bonded to form a ring structure in consideration of an ability to control diffusion of an acid generated upon exposure, and regarding the ring structure to be formed, a ring structure sharing one side (a bond between a carbon atom to which $Rz^1$ and $Rz^2$ are bonded and a carbon atom to which $Rz^3$ and $Rz^4$ are bonded) of a 6-membered ring in the formula is preferable, and an aromatic hydrocarbon which may have a substituent (an aromatic ring, an aromatic hetero ring, and more preferably an aromatic ring) is more preferable.

In the formula (b1-an1) and formula (b1-an2), in consideration of short diffusion of an acid generated upon exposure and an ability to control acid diffusion, preferably, $Rx^7$ to $Rx^8$ are mutually bonded to form a ring structure, and a ring structure to be formed is more preferably an aromatic hydrocarbon ring which may have a substituent (an aromatic ring and an aromatic hetero ring).

In the formula (b1-an2), regarding a ring structure formed in $Rx^7$ to $Rx^8$, a ring structure sharing one side (a bond between the same carbon atoms to which $Rx^7$ and $Rx^8$ are bonded) of a 6-membered ring in the formula is preferable, and an aromatic hydrocarbon which may have a substituent (an aromatic ring, an aromatic hetero ring, and more preferably an aromatic ring) is more preferable.

In all anions represented by the formula (b1-an2), the number of ring structures formed by mutually bonding $Rx^7$ to $Rx^8$, $Ry^1$ to $Ry^2$, and $Rz^1$ to $Rz^4$ may be one, two or more, and two or three is preferable.

In the formula (b1-an1) and formula (b1-an2), in consideration of excellent effects of the present invention, any of $Rx^5$ to $Rx^6$ and $Rz^1$ to $Rz^4$ preferably has an anion group, and $Rx^7$ to $Rx^8$ and $Ry^1$ to $Ry^2$ preferably have no anion group.

In particular, preferable examples of the anion moiety in the component (B1d) include anions represented by the following general formula (b1-an3).

[Chem. 149]

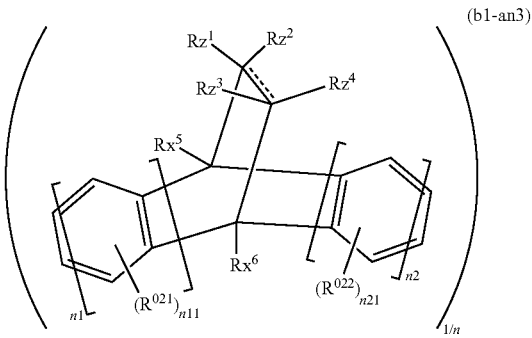

(b1-an3)

[In the formula, $Rx^5$ to $Rx^6$ each independently represent a hydrocarbon group which may have a substituent or a hydrogen atom.

----- [Chem. 150]

represents a double bond or a single bond. $Rz^1$ to $Rz^4$ each independently represent, where valence allows, a hydrocarbon group which may have a substituent or a hydrogen atom, or two or more of $Rz^1$ to $Rz^4$ may be mutually bonded to form a ring structure; provided that at least one of $Rx^5$ to $Rx^6$ and $Rz^1$ to $Rz^4$ has an anion group represented by the general formula (an-1), the entire anion moiety may be an n-valent anion, and the number of carbonyl groups in the entire anion moiety is 1 or 0. n is an integer of 1 or more. $R^{021}$ is an alkyl group, an alkoxy group, a halogen atom, a halogenated alkyl group, a hydroxyl group, or an nitro group, n1 is an integer of 1 to 3. n11 is an integer of 0 to 8. $R^{022}$ is an alkyl group, an alkoxy group, a halogen atom, a halogenated alkyl group, a hydroxyl group, or a nitro group. n2 is an integer of 1 to 3. n21 is an integer of 0 to 8.]

In the formula (b1-an3), $Rx^5$ to $Rx^6$, and $Rz^1$ to $Rz^4$ are the same as $Rx^5$ to $Rx^6$, and $Rz^1$ to $Rz^4$ in the above formula (bd1-an1).

In the formula (b1-an3), $R^{021}$, $R^{022}$, n1, n11, n2, and n21 are the same as $R^{021}$, $R^{022}$, n1, n11, n2, and n21 in the above formula (bd1-an3).

Here, in the formula (b1-an3), at least one of $Rx^5$ to $Rx^6$ and $Rz^1$ to $Rz^4$ has an anion group represented by the general formula (an-1), the entire anion moiety may be an n-valent anion, and the number of carbonyl groups in the entire anion moiety is 1 or 0. n is an integer of 1 or more.

In the formulae (b1-an1), (b1-an2), and (b1-an3), n is preferably 1 or 2, and more preferably 1.

In the formulae (b1-an1), (b1-an2), and (b1-an3), any one of $Rx^5$ to $Rx^6$ and $Rz^1$ to $Rz^4$ preferably has an anion group represented by the general formula (an-1).

Specific examples of the anion moiety in the compound (B1d) are shown below.

[Chem. 151]

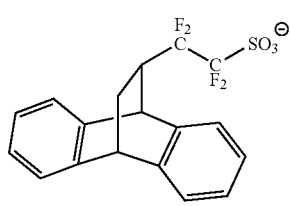
(b1-an3-1)

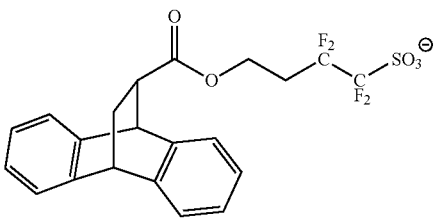
(b1-an3-2)

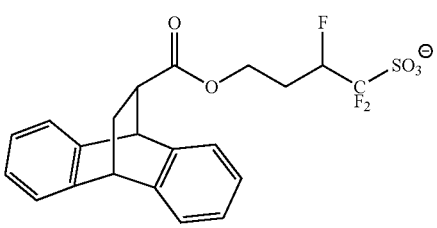
(b1-an3-3)

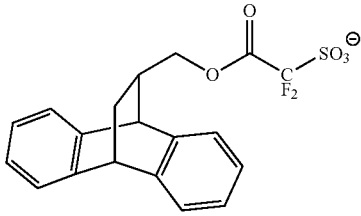
(b1-an3-4)

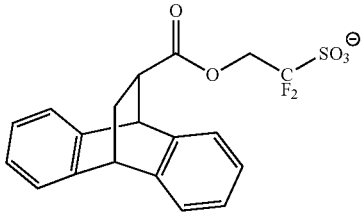
(b1-an3-5)

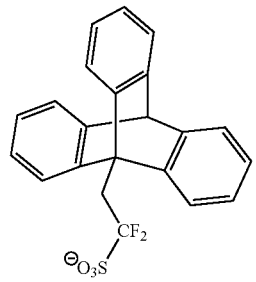
(b1-an3-6)

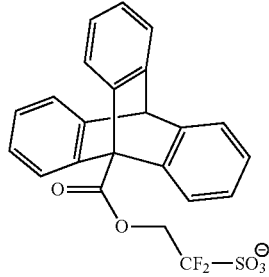
(b1-an3-7)

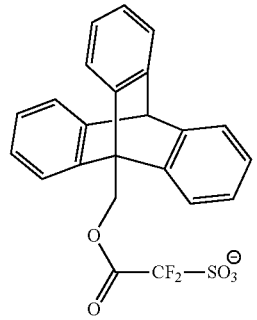
(b1-an3-8)

(b1-an3-9)
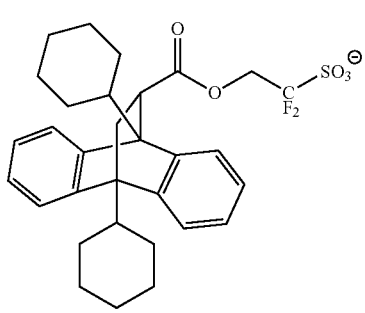

[Chem. 152]

(b1-an3-10)
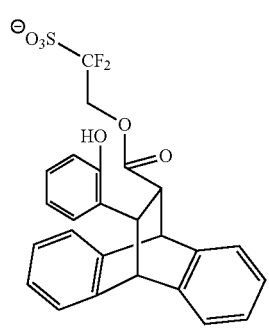

(b1-an3-11)
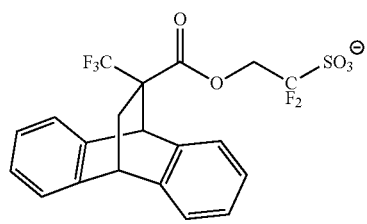

(b1-an3-12)
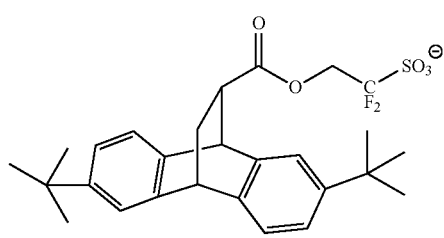

(b1-an3-13)
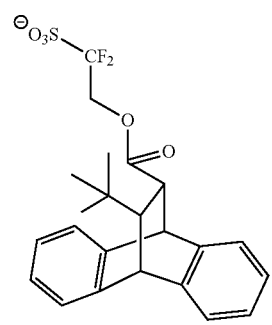

(b1-an3-14)
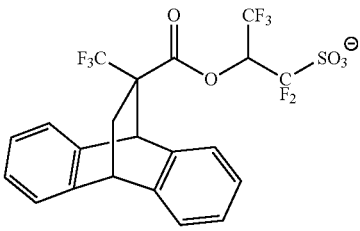

(b1-an3-15)
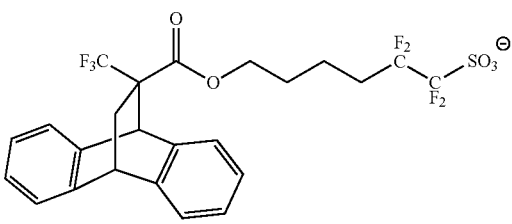

(b1-an3-16)
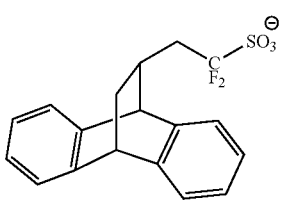

(b1-an3-17)
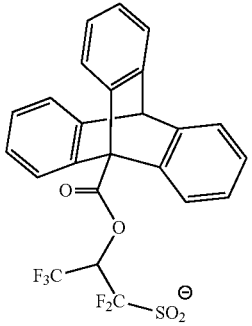

(b1-an3-18)
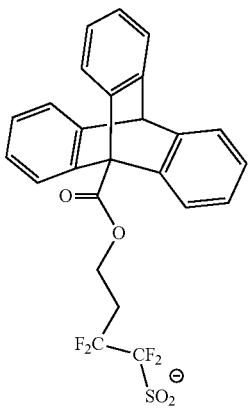

Cation Moiety $((M^{m+})_{1/m})$

In the formula (b1), $M^{m+}$ represents an m-valent organic cation, m is an integer of 1 or more. $M^{m+}$ in the formula (b1) is the same as $M^{m+}$ in the above formula (bd1), and preferable examples thereof are the same as those above.

The cation moiety $((M^{m+})_{1/m})$ is preferably a cation represented by the general formula (ca-1) and more preferably cations represented by the formulae (ca-1-1) to (ca-1-78), and (ca-1-101) to (ca-1-169).

Among the above components (B1d), suitable examples include various combinations of the anions represented by any of the formulae (b1-an3-1) to (b1-an3-18) and die cations represented by any of the formulae (ca-1-1) to (ca-1-78), and (ca-1-101) to (ca-1-169) described above, and specific examples of the combinations are shown below, but the present invention is not limited thereto.

[Chem. 153]

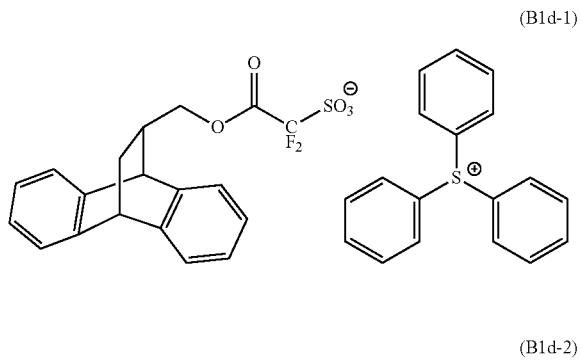

(B1d-1)

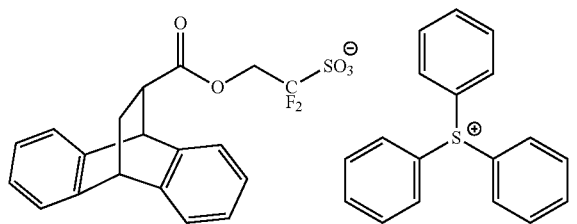

(B1d-2)

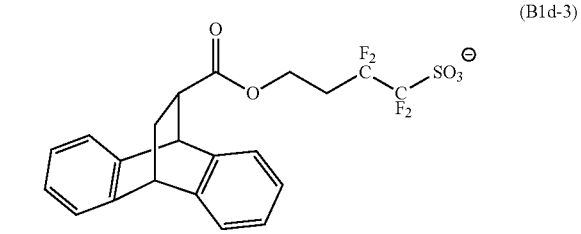

(B1d-3)

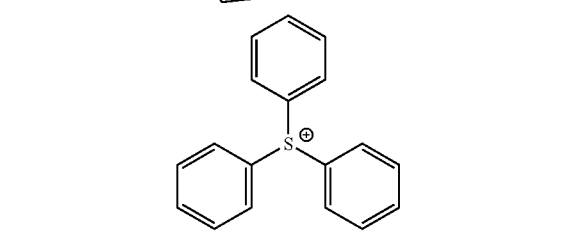

(B1d-4)

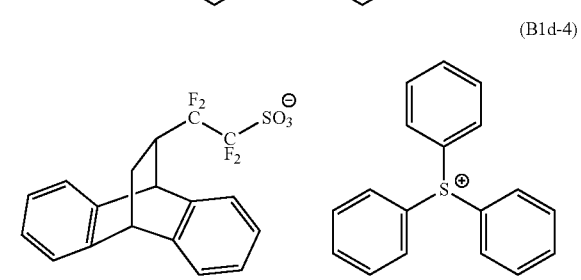

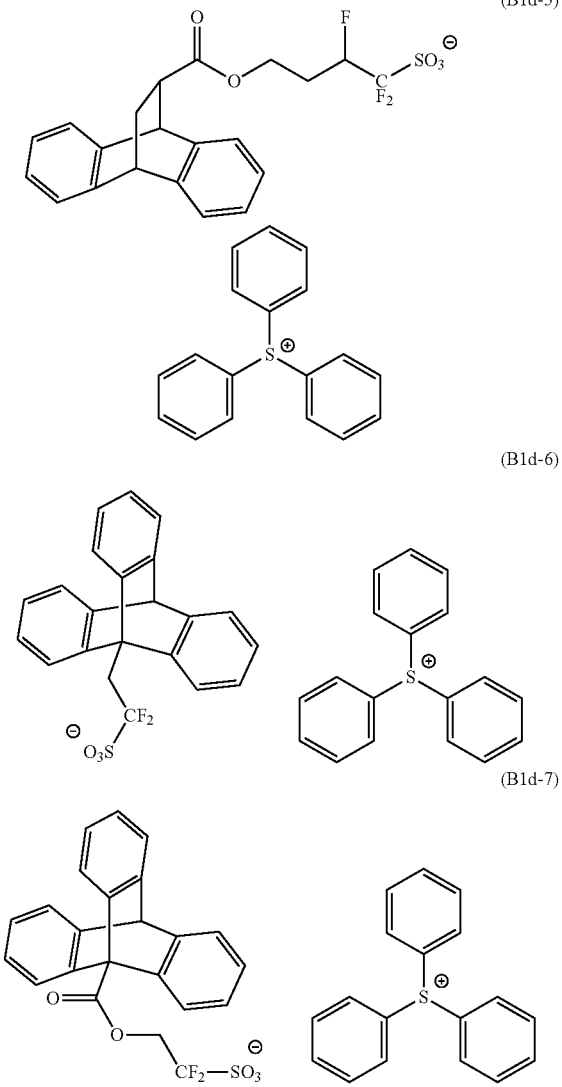

In the resist composition of the present embodiment, one type of the component (B1d) may be used alone or two or more thereof may be used in combination.

In the resist composition of the present embodiment, the amount of the component (B1d) is preferably 5 to 65 parts by mass, more preferably 5 to 55 parts by mass, still more preferably 10 to 45 parts by mass, and particularly preferably 10 to 40 parts by mass with respect to 100 parts by mass of the component (A).

In the resist composition, within the entire acid-generator component (B) that generates an acid acting on the component (A), a proportion of the component (B1d) is, for example, 50 mass % or more, preferably 70 mass % or more, and most preferably 95 mass % or more. Here, the proportion may be 100 mass %.

If the amount of the component (B1d) is equal to or more than a lower limit of the preferable range, in the resist pattern formation, lithography properties such as sensitivity, resolution performance, line width roughnesss (LWR) reduction, and the shape are further improved. On the other hand, if the amount thereof is equal to or less than an upper limit of the preferable range, when components in the resist composition are dissolved in an organic solvent, a homogeneous solution is easily obtained, and storage stability for the resist composition is further improved.

In addition, when the resist composition contains the component (B1d) and the component (D) (at least one of the components (D1) to (D3)), a ratio thereof (molar ratio) is, for example, (B1d):(D)=100:0 to 50:50, and more preferably (B1d):(D)=99:1 to 51:49, and most preferably (B1d): (D)=90:10 to 60:40 because then favorable lithography properties and resist pattern shape are easily obtained.

[Method of Producing the Compound (BD1)]

The component (BD1) can be produced using a known method.

Examples of the method of producing the component (BD1) include a method using a Diels-Alder reaction in which an alkene or alkyne ((starting material 2) in the following reaction formula) is added to a conjugated diene ((starting material 1) in the following reaction formula) to form a ring structure ((intermediate) in the following reaction formula) as in the following reaction formula. Specifically, a desired anion group is introduced into a product (intermediate) according to a Diels-Alder reaction to obtain a precursor, and then a desired cation is introduced according to a salt exchange reaction to obtain a desired component (BD1). In addition, a Diels-Alder reaction using an alkene, alkyne or conjugated diene containing a substituent derived from a desired anion group (a substituent that can introduce a desired anion group) is performed to obtain an intermediate, a desired anion group is then introduced to obtain a precursor, and a desired cation is introduced according to a salt exchange reaction to obtain a desired component (BD1).

The conjugated diene is appropriately selected according to a desired compound (component (BD1)), and for example, anthracene or derivatives thereof, and triptycene or derivatives thereof may be used.

Examples of a method of introducing an anion group include a method using an esterification reaction; a method using a reaction between an ammonium salt having an anion group into which a tosyl group is introduced and a lithium compound having a ring structure with an anion moiety framework (derived due to a Diels-Alder reaction) and a method of sulfinating an intermediate containing a halogen atom to obtain a sulfonate, and dien performing oxidation to obtain a sulfonate.

When an esterification reaction is used for a method of introducing an anion group, examples of a method of producing a compound represented by the general formula (bd1) [a compound having an anion group represented by the general formula (bd1-r-an1), $Y^{b01}$=—C(=O)—O—] include a production method of an embodiment including the following Steps 1 and 2.

Here, an anion group represented by the general formula (bd1-r-an1), which is $Y^{b01}$=—C(=O)O—, is referred to as "an anion group represented by the general formula (b1-r-an10)." A desired compound produced according to the production method of the embodiment including such Steps 1 and 2 is set as a compound (B1-0).

As the compounds used in each step, commercially available compounds may be used, or the compounds may be synthesized.

As the organic solvent used in Steps 1 and 2, any solvent capable of dissolving compounds used in each step and which does not react with the compounds may be used. Examples of the solvent include dichloromethane, dichloroethane, chloroform, tetrahydrofuran, N,N-dimethylformamide, dimethylacetamide, dimethylsulfoxide, acetonitrile, and propionitrile.

Step 1

In Step 1, an intermediate and the compound (I) are dissolved in an organic solvent (dichloromethane and the like), and a reaction occurs in the presence of a base. Then, filtration, concentration or the like is conducted to obtain a precursor (Bpre).

[Chem. 154]

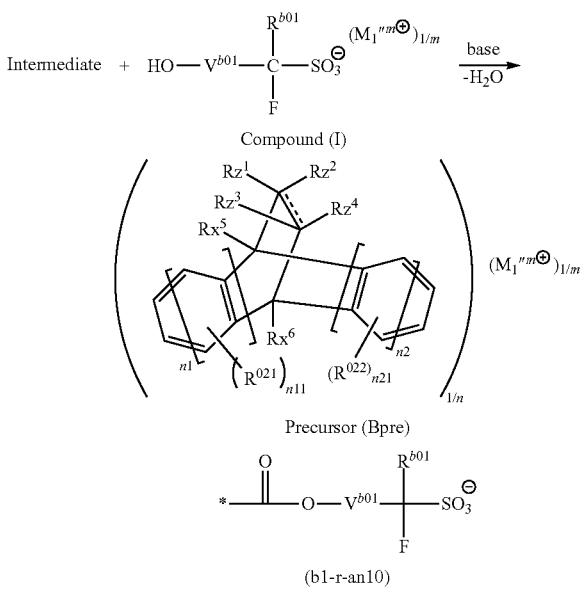

(b1-r-an10)

[In the formula, $R^{b01}$ and $V^{b01}$ are the same as $R^{b01}$ and $V^{b01}$ in the formula (bd1-r-an1). $(M_1{''}^{m+})_{l/m}$ represents an ammonium cation; and $Rx^5$, $Rx^6$, $Rz^1$ to $Rz^4$, $R^{021}$, n1, n11, $R^{022}$, n2 and n21 are the same as $Rx^5$, $Rx^6$, $Rz^1$ to $Rz^4$, $R^{021}$, n1, n11, $R^{022}$, n2 and n21 in the formula (bd1-an3). Here, at least one of $Rx^5$ to $Rx^6$ and $Rz^1$ to $Rz^4$ has an anion group represented by the general formula (b1-r-an10), and the entire anion moiety may be an n-valent anion, n is an integer of 1 or more.]

Examples of the base added in Step 1 include an organic base, such as triethylamine, 4-dimethylaminopyridine, pyridine, ethyldiisopropylaminocarbodiimide hydrochloride (EDCl), dicyclohexylcarboxyimide (DCC), diisopropylcarbodiimide and carbodiimidazole; and an organic base, such as sodium hydride, $K_2CO_3$, and $Cs_2CO_3$.

The cation moiety of the compound (I) may be an ammonium cation derived from an aliphatic amine, or an ammonium cation derived from an aromatic amine.

The amount of the compound (I) used, relative to the intermediate product is preferably within a range of 1 to 3 equivalents, and more preferably 1 to 2 equivalents.

The reaction temperature is preferably within the range of 0 to 50° C., and more preferably 5 to 40° C.

Step 2

In Step 2, a precursor (Bpre) and a compound (II) for salt exchange are reacted in a solvent such as water, dichloromethane, acetonitrile, or chloroform, and a desired compound (B1-0) is obtained according to salt exchange between the precursor (Bpre) and an organic cation in the compound (II).

[Chem. 155]

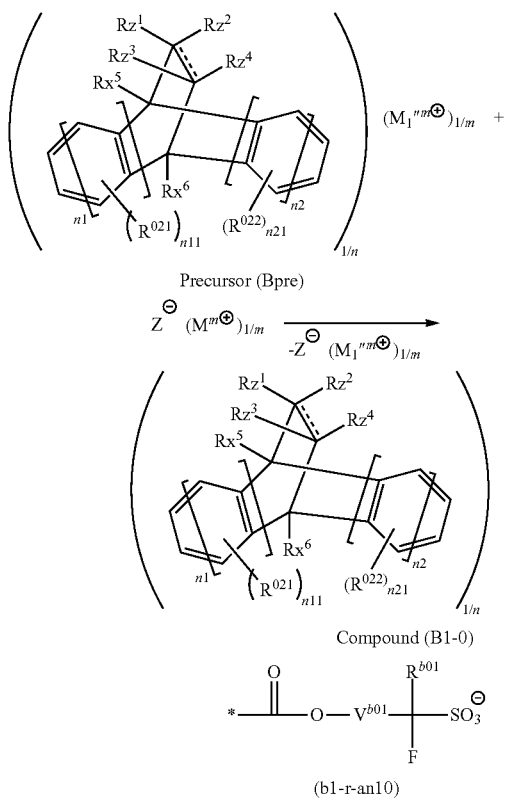

Precursor (Bpre)

Compound (B1-0)

(b1-r-an10)

[In the formula, $R^{b01}$ and $V^{b01}$ are the same as $R^{b01}$ and $V^{b01}$ in the formula (b1-r-an10). $(M_1''^{m+})_{l/m}$ represents an ammonium cation; and $Rx^5$, $Rx^6$, $Rz^1$ to $Rz^4$, $R^{021}$, n1, n11, $R^{022}$, n2 and n21 are the same as $Rx^5$, $Rx^6$, $Rz^1$ to $Rz^4$, $R^{021}$, n1, n11, $R^{022}$, n2 and n21 in the formula (bd1 an3). Here, at least one of $Rx^5$ to $Rx^6$ and $Rz^1$ to $Rz^4$ has an anion group represented by the general formula (b1-r-an10), and the entire anion moiety may be an n-valent anion, n is an integer of 1 or more. Z" represents a non-nucleophilic ion. $(M^{m+})_{l/m}$ is an m-valent organic cation, and it is the same as above.]

Examples of Z include a halogen ion such as a bromine ion and a chloride ion; an ion that can act as an acid with less acidity than the precursor (Bpre), $BF_4$, $AsF_6$, $SbF_6$, $PF_6$ or $ClO_4$.

The reaction temperature is preferably 0 to 100° C., and more preferably 0 to 50° C.

The reaction time varies, depending on die reactivity of the precursor (Bpre) and the compound (II) for salt exchange, the reaction temperature, and the like. However, in general, the reaction time is preferably 10 minutes to 24 hours, more preferably 10 minutes to 12 hours.

After the salt exchange reaction, the compound in the reaction liquid may be separated and purified. The separation and purification can be conducted by a conventional method. For example, any of concentration, solvent extraction, distillation, crystallization, re-crystallization and chromatography may be used.

The structure of the compound obtained in the manner described above can be identified by a general organic analysis method such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elementary analysis and X-ray diffraction analysis.

The intermediate is appropriately selected according to the desired compound (B1-0), and examples thereof include a product represented by the following reaction formula according to a Diels-Alder reaction. For a (starting material 1) in the following reaction formula, anthracene or derivatives thereof can be used. For a (starting material 2) in the following reaction formula, a compound having an ethylenic double bond such as an acrylic ester can be used.

In addition, examples of the intermediate include triptycene and derivatives thereof.

[Chem. 156]

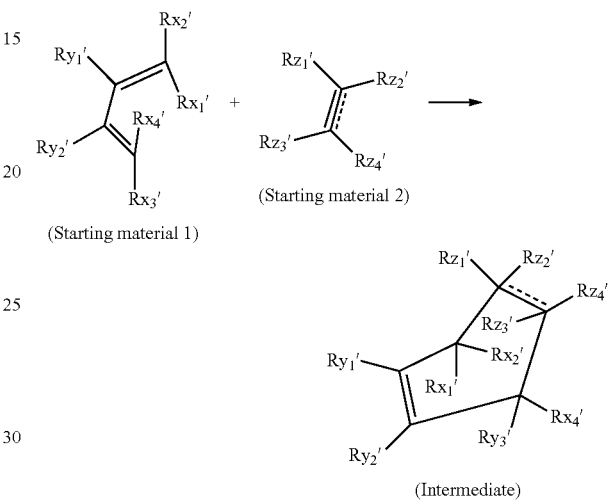

(Starting material 1)    (Starting material 2)

(Intermediate)

[In the formula, $Rx_1'$ to $Rx_4'$ are the same as $Rx^1$ to $Rx^4$. $Ry_1'$ to $Ry_2'$ are the same as $Ry^1$ to $Ry^2$.

----- [Chem. 157]

represents a triple bond or a double bond.

----- [Chem. 158]

represents is double bond or a single bond. $Rz_1'$ to $Rz_4'$ are the same as $Rz^1$ to $Rz^4$. Here, at least one of $Rx_1'$ to $Rx_4'$, $Ry_1'$ to $Ry_2'$ and $Rz_1'$ to $Rz_4'$ is a group attaining a leaving group that can introduce the anion group.]

Examples of the group containing a leaving group that can introduce an anion group include groups containing a halogen atom, a group containing a halogen atom, and a dehydration-condensable substituent (a hydroxyl group, a carboxy group, and the like).

Regarding a method of introducing an anion group, when an esterification reaction is used, examples of die group containing a leaving group include a dehydration-condensable substituent. For example, the intermediate in the reaction formula shown in Step 1 preferably has a dehydration-condensable substituent (such as a hydroxyl group or a carboxy group). An esterification reaction occurs in Step 1, and a sulfonic acid ammonium salt as a precursor (Bpre) is obtained.

Regarding a method of introducing an anion group, when a reaction between an ammonium salt having an anion group into which a tosyl group is introduced and a lithium compound having a ring structure of an anion moiety framework (derived from a Diels-Alder reaction) is used, examples of the group containing a leaving group include a halogen atom and a group containing a halogen atom, and a bromine atom is preferable. An intermediate containing a halogen atom (preferably, a bromine atom) is converted into Li to obtain a Li compound, and then reacted with an ammonium salt having an anion group into which a tosyl group is introduced, and thereby a sulfonic acid ammonium salt as a precursor is obtained.

Regarding a method of introducing an anion group, when a method of sulfinating an intermediate containing a halogen atom to obtain a sulfonate and then performing oxidation to obtain a sulfonate is used, examples of the group containing a leaving group include a halogen atom and a group containing a halogen atom, and a bromine atom is preferable. An intermediate containing a halogen atom (preferably, a bromine atom) is converted into a sulfinate ammonium salt using a sulfinating agent in the presence of an amine and additionally reacted with an oxidizing agent, and thereby a sulfonic acid ammonium salt as a precursor is obtained.

When the above salt exchange in Step 2 is performed on respective sulfonic acid ammonium salts as precursors, a desired compound (component (BD1)) can be obtained.

<Optional Components>

A resist composition of the present embodiment may further contain a component (optional component) other than the above component (A) and compound (BD1) (the component (B1) and the component (D1)).

Examples of the optional component include the following component (B2), component (D2), component (D3), component (E), component (F), and component (S).

<<Component (B2)>>

The resist composition of the present embodiment may contain an acid-generator component (hereinafter referred to as a "component (B2)") other than the above component (B1) as long as the effects of the present invention are not impaired.

The component (B2) is not particularly limited, and those proposed as an acid generator for a chemically amplified resist composition up to now can be used.

Examples of these acid generators are numerous, and include onium salt acid generators such as iodonium salts and sulfonium salts; oxime sulfonate acid generators; diazomethane acid generators such as bisalkyl or bisaiyl sulfonyl diazomethanes and poly(bis-sulfonyl)diazomethanes; nitrobenzylsulfonate acid generators; iminosulfonate acid generators; and disulfone acid generators.

Examples of the onium salt acid generator include a compound represented by the following general formula (b-1) (hereinafter referred to as "component (b-1)"), a compound represented by the general formula (b-2) (hereinafter referred to as a "component (b-2)") and a compound represented by the general formula (b-3) (hereinafter referred to as a "component (b-3)"). Here, the component (b-1) does not include a compound corresponding to the above component (B1).

[Chem. 159]

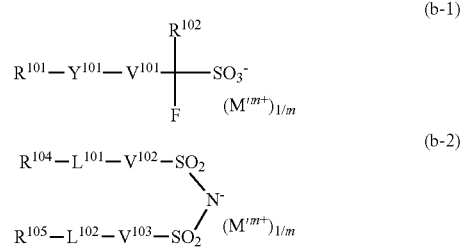

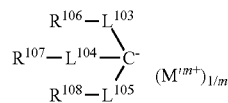

[In the formulae, $R^{101}$ and $R^{104}$ to $R^{108}$ each independently represent a cyclic group which may have a substituent, a chain-like alkyl group which may have a substituent or a chain-like alkenyl group which may have a substituent, provided that $R^{104}$ and $R^{105}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represent a single bond, an alkylene group or a fluorinated alkylene group; $L^{101}$ and $L^{102}$ each independently represent a single bond or an oxygen atom; $L^{103}$ to $L^{105}$ each independently represent a single bond, —CO— or —SO$_2$—; and m represents an integer of 1 or more; and $M'^{m+}$ represents an m-valent onium cation.]

{Anion Moiety}

Anion Moiety of the Component (b-1)

In the formula (b-1), $R^{101}$ is a cyclic group which may have a substituent, a chain-like alkyl group which may have a substituent, or a chain-like alkenyl group which may have a substituent. Description of $R^{101}$ is the same as that of the hydrocarbon group which may have a substituent (a cyclic group which may have a substituent, a chain-like alkyl group which may have a substituent, or a chain-like alkenyl group which may have a substituent) for Rx$^1$ to Rx$^4$, Ry$^1$ to Ry$^2$, Rz$^1$ to Rz$^4$ (hereinafter referred to as "Rx$^1$ to Rx$^4$ and the like") in the formula (bd1).

Among these examples, as $R^{101}$, a cyclic group which may have a substituent is preferable, and a cyclic hydrocarbon group which may have a substituent is more preferable. Specifically, a phenyl group, a naphthyl group, a group in which one or more hydrogen atoms have been removed from a polycycloalkane, a lactone-containing cyclic group represented by any one of the aforementioned formulae (a2-r-1) and (a2-r-3) to (a2-r-7), and an —SO$_2$— containing cyclic group represented by any one of the aforementioned formulae (a5-r-1) to (a5-r-4).

In formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom Examples of atoms other than an oxygen atom include a carbon atom, a hydrogen atom, a sulfur atom and a nitrogen atom.

Examples of the divalent linking group containing an oxygen atom include divalent linking groups represented by the aforementioned general formulae (y-a1-1) to (y-a1-8).

$Y^{101}$ is preferably a divalent linking group containing an ether bond or a divalent linking group containing an ester bond, and groups represented by the aforementioned formulas (y-a1-1) to (y-a1-5) are preferable.

In formula (b-1), $V^{101}$ represents a single bond, an alkylene group or a fluorinated alkylene group. The alkylene group and the fluorinated alkylene group for $V^{101}$ preferably have 1 to 4 carbon atoms. Examples of the fluorinated alkylene group for $V^{101}$ include a group in which some or all of the hydrogen atoms within the alkylene group for $V^{101}$ have been substituted with fluorine atoms. Among these examples, as $V^{101}$, a single bond or a fluorinated alkylene group of 1 to 4 carbon atoms is preferable.

In formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and more preferably a fluorine atom.

For example, when $Y^{101}$ is a single bond, specific examples of the anion moiety for the component (b-1) include a fluorinated alkylsulfonate anion such as a trifluoromethanesulfonate anion and a perfluorobutanesulfonate anion. When $Y^{101}$ is a bivalent linking group containing an oxygen atom, specific examples thereof include anions represented by any of the following formulae (an1) to (an3).

[Chem. 160]

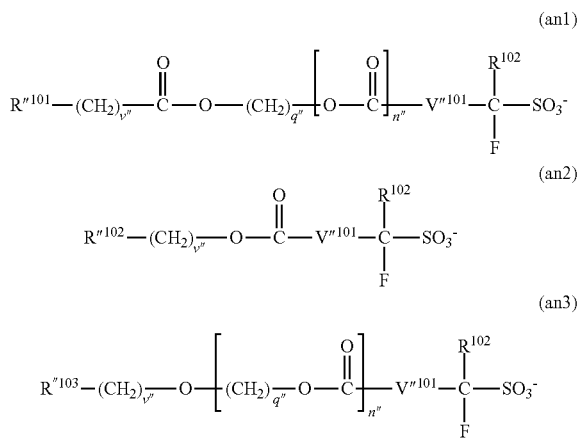

[In the formula, $R'^{101}$ is an aliphatic cyclic group which may have a substituent, a monovalent heterocyclic group represented by each of the chemical formulae (r-hr-1) to (r-hr-6), or a linear alkyl group which may have a substituent. $R'^{102}$ is an aliphatic cyclic group which may have a substituent, a lactone-containing cyclic group represented by each of the general formulae (a2-r-1), (a2-r-3) to (a2-r-7), or a —$SO_2$— containing cyclic group represented by each of the general formulae (a5-r-1) to (a5-r-4). $R'^{103}$ is an aromatic cyclic group which may have a substituent, an aliphatic cyclic group which may have a substituent, or a chain-like alkenyl group which may have a substituent. $V'^{101}$ is an alkylene group having 1 to 4 carbon atoms or a fluorinated alkylene group having 1 to 4 carbon atoms. $R^{102}$ is a fluorine atom or a fluorinated alkyl group having 1 to 5 carbon atoms. v'''s each independently represent an integer of 0 to 3, q'''s each independently represent an integer of 1 to 20, and n'' is 0 or 1.]

The aliphatic cyclic group which may have a substituent for $R''^{101}$, $R''^{102}$ and $R''^{103}$ is preferably a group exemplified as a cyclic aliphatic hydrocarbon group for $Rx^1$ to $Rx^4$ and the like in the formula (bd1). Examples of the substituent include the same substituent that may substitute a cyclic aliphatic hydrocarbon group for $Rx^1$ to $Rx^4$ and the like in the formula (bd1).

The aromatic cyclic group which may have a substituent for $R''^{103}$ is preferably a group exemplified as an aromatic hydrocarbon group in the cyclic hydrocarbon group for $Rx^1$ to $Rx^4$ and the like in die formula (bd1). Examples of the substituent include the same substituent that may substitute the aromatic hydrocarbon group for $Rx^1$ to $Rx^4$ and the like in the formula (bd1).

The chain-like alkyl group which may have a substituent for $R''^{101}$ is preferably a group exemplified as the chain-like alkyl group for $Rx^1$ to $Rx^4$, and the like in the formula (bd1). The chain-like alkenyl group which may have a substituent for $R''^{103}$ is preferably a group exemplified as the chain-like alkenyl group for $Rx^1$ to $Rx^4$ and the like in the formula (bd1).

Anion Moiety for the Component (b-2)

In the formula (b-2), $R^{104}$ and $R^{105}$ each independently represent a cyclic group which may have a substituent, a chain-like alkyl group which may have a substituent, or a chain-like alkenyl group which may have a substituent, and the same as those provided for the cyclic group which may have a substituent, the chain-like alkyl group which may have a substituent, or the chain-like alkenyl group which may have a substituent for $Rx^1$ to $Rx^4$ and the like in the formula (bd1) may be exemplified. In addition, $R^{104}$ and $R^{105}$ may be mutually bonded to form a ring.

$R^{104}$ and $R^{105}$ are preferably a chain-like alkyl group which may have a substituent and more preferably a linear or branched alkyl group, or a linear or branched fluorinated alkyl group.

The chain-like alkyl group preferably has 1 to 10 carbon atoms, more preferably 1 to 7 carbon atoms, and still more preferably 1 to 3 carbon atoms. The smaller the number of carbon atoms of the chain-like alkyl group for $R^{104}$ and $R^{105}$, the more the solubility in a resist solvent is improved. Further, in the chain-like alkyl group for $R^{104}$ and $R^{105}$, it is preferable that the number of hydrogen atoms substituted with fluorine atoms be as large as possible because the acid strength increases. The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represent a single bond, an alkylene group or a fluorinated alkylene group, and are the same as defined for $V^{101}$ in formula (b-1).

In formula (b-2), $L^{101}$ and $L^{102}$ each independently represent a single bond or an oxygen atom.

Anion Moiety for the Component (b-3)

In the formula (b-3), $R^{106}$ to $R^{108}$ each independently represent a cyclic group which may have a substituent, a chain-like alkyl group which may have a substituent, or a chain-like alkenyl group which may have a substituent, and the same as those provided for the cyclic group which may have a substituent, the chain-like alkyl group which may have a substituent, or the chain-like alkenyl group which may have a substituent for $Rx^1$ to $Rx^4$ and the like in the formula (bd1) may be exemplified.

$L^{103}$ to $L^{105}$ each independently represent a single bond, —CO— or —$SO_2$—.

{Cation Moiety}

In the formulae (b-1), (b-2) and (b-3), m is an integer of 1 or more and $M'^{m+}$ is an m-valent onium cation. $M'^{m+}$ is preferably a sulfonium cation or an iodonium cation, and examples thereof include cations represented by the chemical formulae (ca-1-1) to (ca-1-78), and (ca-1-101) to (ca-1-169).

In addition, in die formulae (b-1), (b-2) and (b-3), examples of $M'^{m+}$ include a diphenyliodonium cation, a bis(4-tert-butylphenyl)iodonium cation, cations represented by the chemical formulae (ca-2-1) to (ca-2-2), cations represented by the chemical formulae (ca-3-1) to (ca-3-7), and cations represented by the chemical formulae (ca-4-1) to (ca-4-2).

Among the above examples, the cation moiety [(M'$^{m+}$)$_{1/m}$] is more preferably organic cations represented by the chemical formulae (ca-1-1) to (ca-1-78), and (ca-1-101) to (ca-1-169).

In the resist composition of the present embodiment, one type of the component (B2) may be used alone or two or more thereof may be used in combination.

When the resist composition contains the component (B2), in the resist composition, the amount of the component (B2) is preferably 50 parts by mass or less, more preferably 1 to 40 parts by mass, and most preferably 5 to 30 parts by mass with respect to 100 parts by mass of the component (A).

In addition, when the resist composition contains the component (B2), in the resist composition, within the entire acid-generator component (B) that generates an acid acting on the component (A), the amount of the component (B2) is, for example, 50 mass % or less, more preferably 30 mass % or less, and most preferably 0 mass % or more 5 mass % or less.

When the amount of the component (B2) is set to be within the above range, pattern formation is sufficiently performed.

<<Component (D2)>>

The component (D2) is a base component and is a photodecomposable base (provided that those corresponding to the component (D1) are excluded) which is decomposed upon exposure and then loses an ability to control acid diffusion.

When a resist pattern is formed using a resist composition containing the component (D2), the contrast between exposed portions and unexposed portions of the resist film is further improved.

The component (D2) is not particularly limited as long as it is decomposed upon exposure and loses an ability to control acid diffusion, and one or more compounds selected from the group consisting of a compound represented by the following general formula (d2-1) (hereinafter referred to as a "component (d2-1)"), a compound represented by the following general formula (d2-2) (hereinafter referred to as a "component (d2-2)") and a compound represented by the following general formula (d2-3) (hereinafter referred to as a "component (d2-3)") are preferable.

The components (d2-1) to (d2-3) decompose in an exposed portion of the resist film and lose an ability to control acid diffusion (basic) and thus do not act as a quencher, but act as a quencher in an unexposed portion of the resist film.

[Chem. 161]

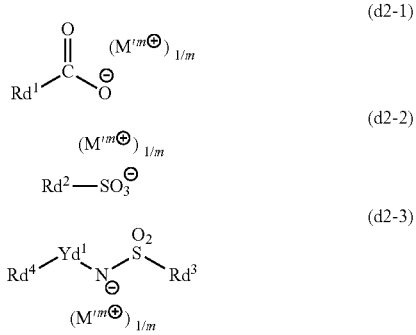

[In the formulae, Rd$^1$ to Rd$^4$ represent a cyclic group which may have a substituent, a chain-like alkyl group which may have a substituent or a chain-like alkenyl group which may have a substituent, provided that, the carbon atom adjacent to the sulfur atom within the Rd$^2$ in general formula (d2-2) has no fluorine atom bonded thereto; Yd$^1$ represents a single bond or a divalent linking group; m represents an integer of 1 or more, and each M'$^{m+}$ independently represents an onium cation having a valency of m.]

{Component (d2-1)}

Anion Moiety

In the formula (d2-1), Rd$^1$ represents a cyclic group which may have a substituent, a chain-like alkyl group which may have a substituent, or a chain-like alkenyl group which may have a substituent, and the same as those provided for Rx$^1$ to Rx$^4$ and the like in the formula (bd1) may be exemplified.

Among these, Rd$^1$ is preferably an aromatic hydrocarbon group which may have a substituent, an aliphatic cyclic group which may have a substituent, or a chain-like alkyl group which may have a substituent. Examples of the substituent that such a group may have include a hydroxyl group, an oxo group, an alkyl group, an aryl group, a fluorine atom, a fluorinated alkyl group, lactone-containing cyclic groups represented by the general formulae (a2-r-1) to (a2-r-7), an ether bond, an ester bond, or a combination thereof. When an ether bond or an ester bond is included as a substituent, the substituent may be bonded via an alkylene group, and linking groups represented by the formulae (y-a1-1) to (y-a1-5) are preferable as the substituent in this case.

Regarding the aromatic hydrocarbon group, a polycyclic structure having a phenyl group, a naphthyl group, and a bicyclooctane framework (for example, a polycyclic structure composed of a bicyclooctane framework ring structure and other ring structures) are preferably exemplified.

Examples of the aliphatic cyclic group include groups in which one or more hydrogen atoms have been removed from a polycycloalkane such as adamantane, norbornane, isobornane, tricyclodecane or tetracyclododecene.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In the case where the chain-like alkyl group is a fluorinated alkyl group having fluorine atoms or a fluorinated alkyl group, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine. Examples of the atom other than fluorine include an oxygen atom, a sulfur atom and a nitrogen atom.

As Rd$^1$, a fluorinated alkyl group in which some or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is particularly desirable.

Preferable specific examples of the anion moiety for the component (d2-1) are shown below.

[Chem. 162]

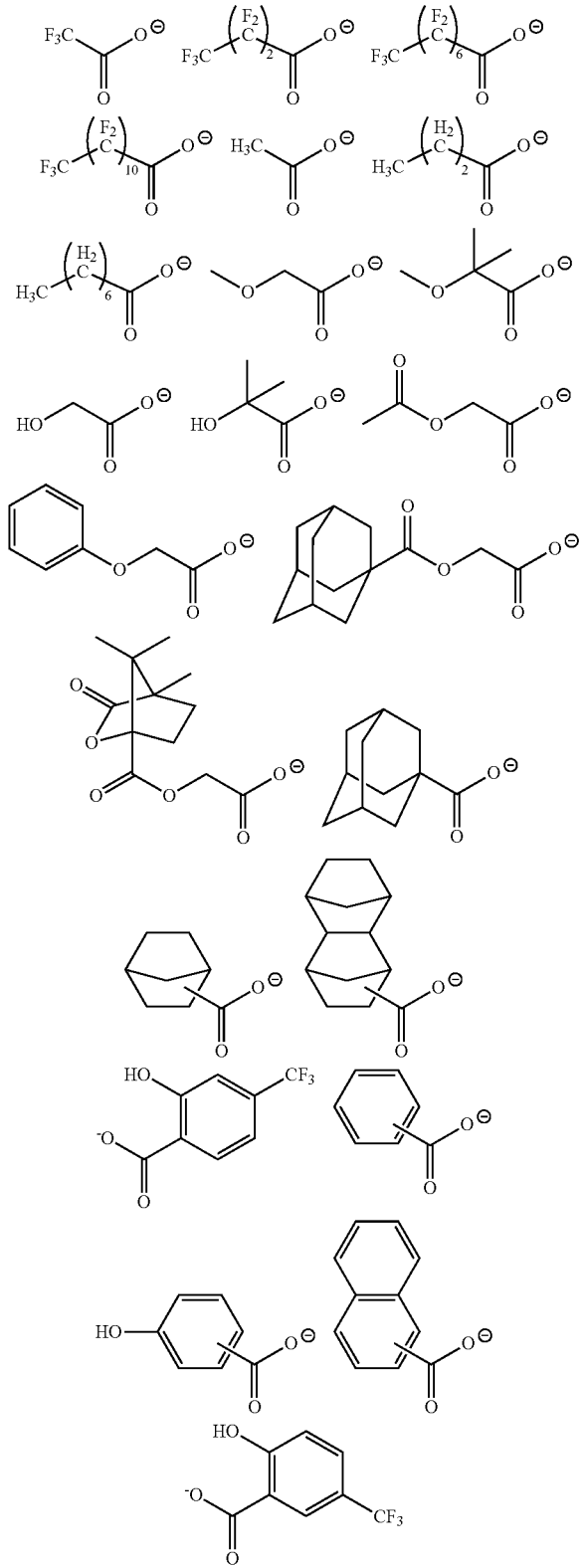

Cation Moiety

In the formula (d2-1), $M'^{m+}$ is an m-valent onium cation.

Onium cations for $M'^{m+}$ can be appropriately selected from among the same as those provided for $M'^{m+}$ in the formulae (b-1) to (b-3) so that they are different from the component (D1).

One type of the component (d2-1) may be used alone or two or more thereof may be used in combination.

{Component (d2-2)}

Anion Moiety

In the formula (d2-2), $Rd^2$ is a cyclic group which may have a substituent, a chain-like alkyl group which may have a substituent, or a chain-like alkenyl group which may have a substituent, and the same as those provided for $Rx^1$ to $Rx^4$ and the like in the formula (bd1) may be exemplified.

Here, for $Rd^2$, no fluorine atom is bonded to a carbon atom adjacent to a S atom (not substituted with a fluorine atom). Accordingly, the anion of the component (d2-2) becomes an appropriate weak acid anion, and a quenching ability for the component (D2) is improved.

As $Rd^2$, a chain-like alkyl group which may have a substituent or an aliphatic cyclic group which may have a substituent is preferable. The chain-like alkyl group preferably has 1 to 10 carbon atoms, and more preferably 3 to 10 carbon atoms. As the aliphatic cyclic group, a group in which one or more hydrogen atoms have been removed from adamantane, norbornane, isobornane, tricyclodecane, tetracyclododecene or camphor (which may have a substituent) is more preferable.

The hydrocarbon group for $Rd^2$ may have a substituent. As the substituent, the same groups as those described above for substituting the hydrocarbon group (e.g., aromatic hydrocarbon group, aliphatic cyclic group, chain-like alkyl group) for $Rd^1$ in the formula (d2-1) can be mentioned.

Preferable specific examples of the anion moiety for the component (d2-2) are shown below.

[Chem. 163]

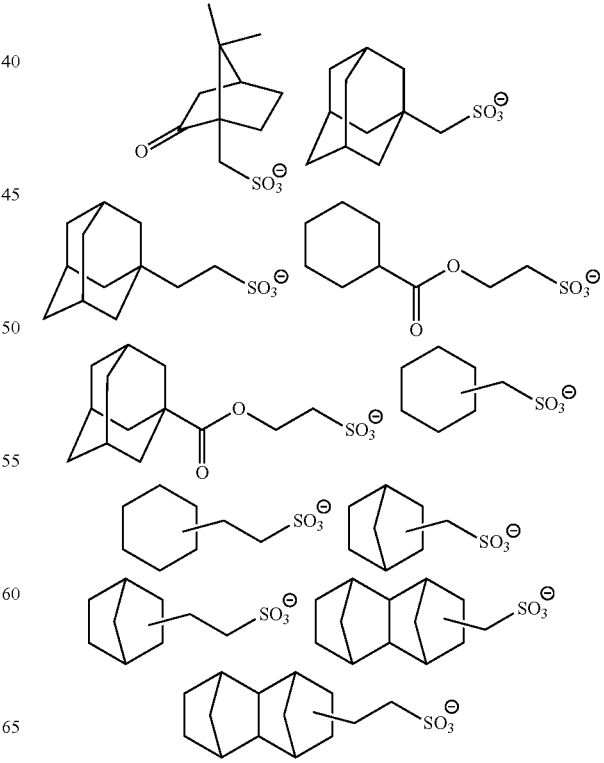

-continued

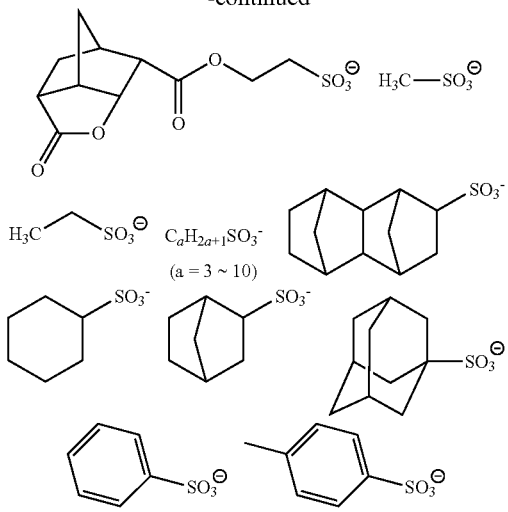

Cation Moiety

In formula (d2-2), $M^{m+}$ is an m-valent onium cation, and is the same as defined for $M^{m+}$ in the aforementioned formula (d2-1).

As the component (d2-2), one kind of compound may be used alone, or two or more thereof may be used in combination.

{Component (d2-3)}
Anion Moiety

In the formula (d2-3), $Rd^3$ is a cyclic group which may have a substituent, a chain-like alkyl group which may have a substituent, or a chain-like alkenyl group which may have a substituent, and the same as those provided for $Rx^1$ to $Rx^4$ and the like in the formula (bd1) may be exemplified, and a cyclic group containing a fluorine atom, a chain-like alkyl group, or a linear alkenyl group is preferable. Among these, a fluorinated alkyl group is preferable, and the same fluorinated alkyl group for $Rd^1$ is more preferable.

In the formula (d2-3), $Rd^4$ is a cyclic group which may have a substituent, a chain-like alkyl group which may have a substituent, or a chain-like alkenyl group which may have a substituent, and the same as those provided for $Rx^1$ to $Rx^4$ and the like in the formula (bd1) may be exemplified.

Among these, an alkyl group which may have a substituent, an alkoxy group, an alkenyl group, or a cyclic group is preferable.

The alkyl group for $Rd^4$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxy group, a cyano group or the like.

The alkoxy group for $Rd^4$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are preferable.

Regarding the alkenyl group for $Rd^4$, the same as those provided for for $Rx^1$ to $Rx^4$ and the like in the formula (bd1) may be exemplified, and a vinyl group, a propenyl group (allyl group), a 1-methylpropenyl group, or a 2-methylpropenyl group is preferable. These groups may further have an alkyl group having 1 to 5 carbon atoms or a halogenated alkyl group having 1 to 5 carbon atoms as a substituent.

Regarding the cyclic group for $Rd^4$, the same as those provided for for $Rx^1$ to $Rx^4$ and the like in the formula (bd1) may be exemplified, and an alicyclic group in which one or more hydrogen atoms are removed from a cycloalkane such as cyclopentane, cyclohexane, adamantane, norbornane, isobornane, tricyclodecane, and tetracyclododecane or an aromatic group such as a phenyl group and a naphthyl group is preferable. When $Rd^4$ is an alicyclic group, the resist composition is favorably dissolved in an organic solvent and thus lithography properties become favorable.

In the formula (d2-3), $Yd^1$ is a single bond or a bivalent linking group.

The bivalent linking group for $Yd^1$ is not particularly limited, and examples thereof include a bivalent hydrocarbon group which may have a substituent (an aliphatic hydrocarbon group and an aromatic hydrocarbon group) and a bivalent linking group containing a hetero atom. These are the same as the bivalent hydrocarbon group which may have a substituent and the bivalent linking group containing a hetero atom which are described for the bivalent linking group for $Ya^{x0}$ described above.

$Yd^1$ is preferably a carbonyl group, an ester bond, an amide bond, an alkylene group or a combination thereof. The alkylene group is more preferably a linear or branched alkylene group, and most preferably a methylene group or an ethylene group.

Preferable specific examples of the anion moiety for the component (d2-3) are shown below.

[Chem. 164]

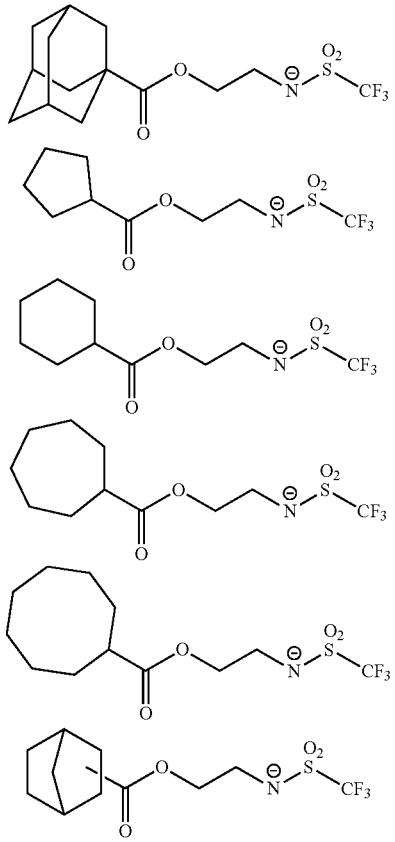

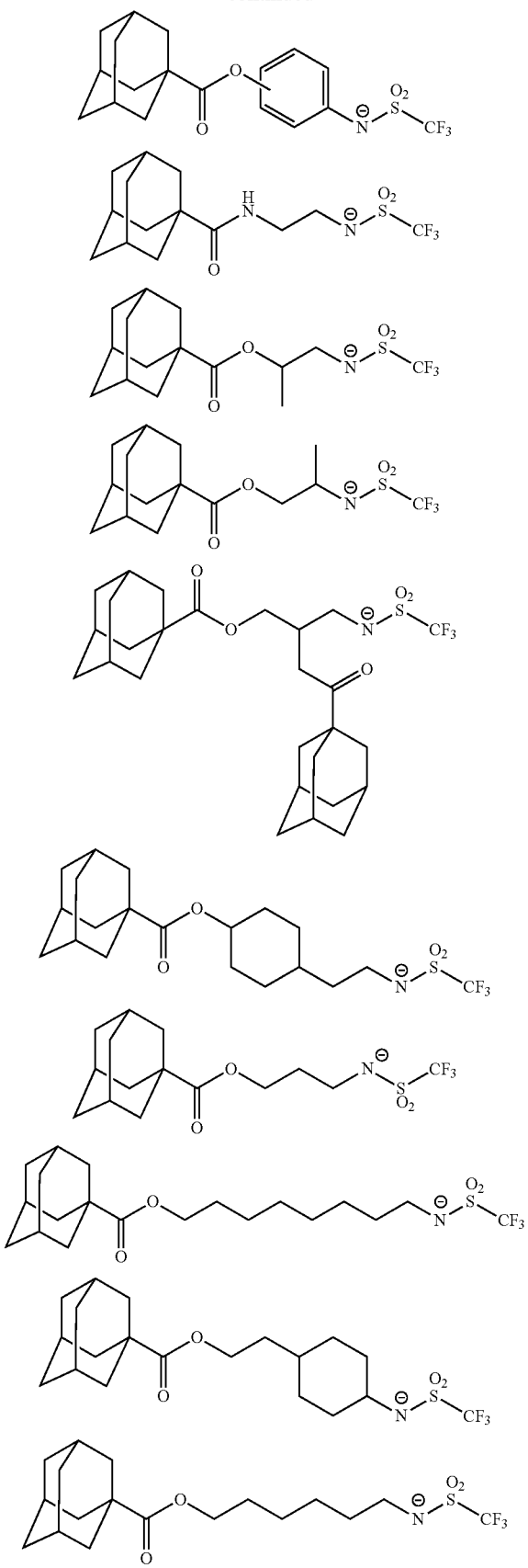

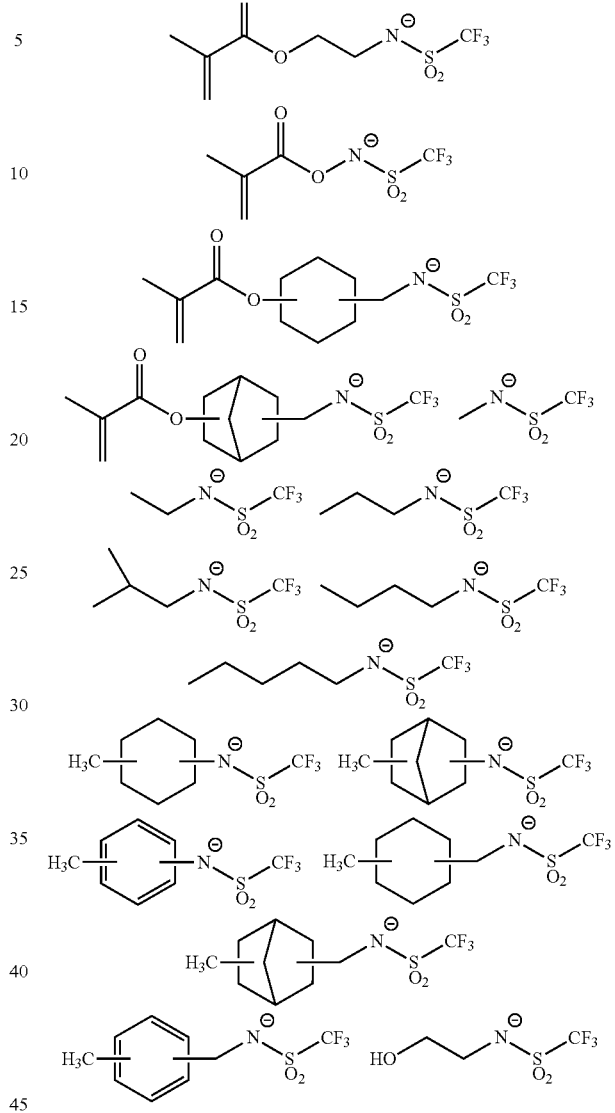

Cation Moiety

In formula (d2-3), $M'^{m+}$ is an m-valent onium cation, and is the same as defined for $M'^{m+}$ in the aforementioned formula (d2-1).

As the component (d2-3), one kind of compound may be used alone, or two or more thereof may be used in combination.

For the component (D2), one type of the components (d2-1) to (d2-3) may be used alone and two or more thereof may be used in combination.

When the resist composition contains the component (D2), in the resist composition, the amount of the component (D2) is preferably 0.5 to 10 parts by mass, more preferably 0.5 to 8 parts by mass, and most preferably 1 to 6 parts by mass with respect to 100 parts by mass of the component (A).

In addition, when the resist composition contains the component (D2), in the resist composition, within the entire base component (D) that traps (controls acid diffusion) an acid generated from the component (B) upon exposure, the amount of the component (D2) is, for example, 50 mass % or less, more preferably 30 mass % or less, and most preferably 0 mass % or more 5 mass % or less.

When the amount of the component (D2) is equal to or more than a preferable lower limit, particularly favorable lithography properties and resist pattern shape are easily obtained. On the other hand, when the amount thereof is equal to or less than the upper limit, a balance with other components can be achieved, various lithography properties become favorable.

Method of Producing the Component (D2):

A method of producing the component (d2-1) and component (d2-2) is not particularly limited, and a known method can be used for production.

In addition, the method of producing the component (d2-3) is not particularly limited, and the component (d2-3) can be produced by the same method as in, for example, US2012-0149916.

<<Component (D3)>>

The component (D3) is a base component and is a nitrogen-containing organic compound component that acts as an acid diffusion control agent (provided that those corresponding to the component (D1) and component (D2) are excluded) in the resist composition.

The component (D3) is not particularly limited as long as it acts as an acid diffusion control agent and does not correspond to the component (D1) and the component (D2), and examples thereof include a compound having an anion moiety and a cation moiety and an aliphatic amine.

In the component (D3), regarding a compound having an anion moiety and a cation moiety, those in which a cation moiety in the components (d2-1) to (d2-3) is an ammonium cation may be exemplified. Examples of the ammonium cation here include cations (primary to quaternary ammonium cations) in which $NH_4^+$, or H bonded to a nitrogen atom thereof is substituted with a hydrocarbon group which may have a hetero atom or cyclic cations forming a ring together with a nitrogen atom thereof.

Among these aliphatic amines, a secondary aliphatic amine and a tertiary aliphatic amine are preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkylalcoholamines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris {2-(2-methoxy ethoxy) ethyl}amine, tris {2-(2-methoxy ethoxy methoxy) ethyl}amine, tris {2-(1-methoxyethoxyethyl}amine, tris {2-(1-ethoxy ethoxy)ethyl}amine, tris {2-(1-ethoxy propoxy) ethyl}amine, tris[2-{2-(2-hydroxyethoxy)ethoxy}ethyl] amine and triethanolamine triacetate, and triethanolamine triacetate is preferable.

Further, as the component (D3), an aromatic amine may be used.

Examples of aromatic amines include 4-dimethylaminopyridine, pyrrole, indole, pyrazole, imidazole and derivatives thereof, as well as tribenzylamine, 2,6-diisopropylaniline and N-tert-butoxycarbonylpyrrolidine.

As the component (D3), one kind of compound may be used alone, or two or more thereof may be used in combination.

When the resist composition contains the component (D3), the amount of the component (D3) is typically used in an amount within a range of 0.01 to 5 parts by mass, relative to 100 parts by mass of the component (A). Within the above range, a balance with other components can be achieved, and various lithography properties become favorable.

<<Component (E): At Least One Compound Selected from the Group Consisting of Organic Carboxylic Acids, and Phosphorus Oxo Acids and Derivatives Thereof>>

In the resist composition of the present embodiment, for preventing any deterioration in sensitivity, and improving the resist pattern shape and the post exposure stability of the latent image formed by the pattern-wise exposure of the resist layer, at least one compound (E) (hereafter referred to as the component (E)) selected from die group consisting of an organic carboxylic acid, or a phosphorus oxo acid or derivative thereof may be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

In the resist composition of the present embodiment, as the component (E), one kind of compound may be used alone, or two or more thereof may be used in combination.

When the resist composition contains the component (E), the amount of the component (E) is typically used in an amount within a range of 0.01 to 5 parts by mass, relative to 100 parts by mass of the component (A).

<<Component (F): Fluorine Additive Component>>

The resist composition of the present embodiment may further include a fluorine additive component (hereinafter referred to as a "component (F)") in order to impart water repellency to the resist film or improve lithography properties.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. As the polymer, a polymer (homopolymer) consisting of a structural unit (f1) represented by formula (f1-1) shown below; a copolymer of the structural unit (f1) and the aforementioned structural unit (a1); and a copolymer of the structural unit (f1), a structural unit derived from acrylic acid or methacrylic acid and the aforementioned structural unit (a1) are preferable. As the structural unit (a1) to be copolymerized with the structural unit (f1), a structural unit derived from 1-ethyl-1-cyclooctyl (meth) acrylate or a structural unit derived from 1-methyl-1-adamantyl (meth)acrylate is preferable.

[Chem. 166]

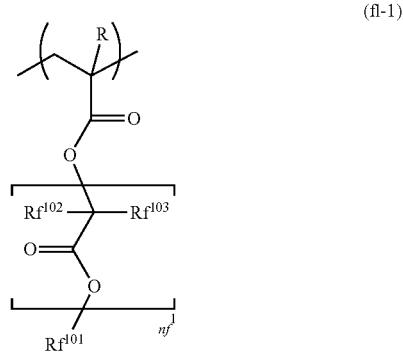

(f1-1)

[In the formula, R is the same as defined above; $Rf^{102}$ and $Rf^{103}$ each independently represent a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different; $nf^1$ represents an integer of 1 to 5; and $Rf^{101}$ represents an organic group containing a fluorine atom.]

In formula (f1-1), R bonded to a carbon atom at the α-position is the same as defined above. As R, a hydrogen atom or a methyl group is preferable.

In formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl groups of 1 to 5 carbon atoms as those described above for R, and a methyl group or an ethyl group is preferable. Specific examples of the halogenated alkyl group of 1 to 5 carbon atoms represented by $Rf^{102}$ or $Rf^{103}$ include groups in which some or all of the hydrogen atoms of the aforementioned alkyl groups of 1 to 5 carbon atoms have been substituted with halogen atoms.

Examples of the halogen atom include a fluorine atom, a chlorine atom, a bromine atom and an iodine atom, and a fluorine atom is particularly desirable. Among these examples, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In the formula (f1-1), $nf^1$ is an integer of 1 to 5, and is preferably an integer of 1 to 3 and more preferably 1 or 2.

In the formula (f1-1), $Rf^{101}$ represents an organic group containing a fluorine atom and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having fluorine atoms have 25% or more of the hydrogen atoms within the hydrocarbon group fluorinated, more preferably 50% or more, and most preferably 60% or more, as the hydrophobicity of the resist film during immersion exposure is then enhanced.

Among these, as $Rf^{101}$, a fluorinated hydrocarbon group of 1 to 6 carbon atoms is preferable, and a trifluoromethyl group, —$CH_2$—$CF_3$, —$CH_2$—$CF_2$—$CF_3$, —$CH(CF_3)_2$, —$CH_2$—$CH_2$—$CF_3$, and —$CH_2$—$CH_2$—$CF_2$—$CF_2$—$CF_2$—$CF_3$ are most preferable.

The weight average molecular weight (Mw) (die polystyrene equivalent value determined by gel permeation chromatography) of the component (F) is preferably 1,000 to 50,000, more preferably 5,000 to 40,000, and most preferably 10,000 to 30,000. When the weight is equal to or less than the upper limit of this range, solubility in the resist solvent used for the resist becomes sufficient, and when the weight is equal to or more than the lower limit of this range, water repellency of the resist film becomes favorable.

Further, the dispersity (Mw/Mn) of the component (F) is preferably 1.0 to 5.0, more preferably 1.0 to 3.0, and most preferably 1.2 to 2.5.

In the resist composition of the present embodiment, one type of the component (F) may be used alone or two or more thereof may be used in combination.

When the resist composition contains the component (F), the component (F) is used in an amount within a range of 0.5 to 10 parts by mass, relative to 100 parts by mass of the component (A).

<<Component (S): Organic Solvent Component>>

The resist composition of the present embodiment may be prepared by dissolving the resist materials for the resist composition in an organic solvent (hereafter, referred to as a "component (S)").

The component (S) may be any organic solvent which can dissolve the respective components to give a homogeneous solution, and any organic solvent can be appropriately selected from those which are conventionally known as solvents for a chemically amplified resist composition.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

In the resist composition of the present embodiment, as the component (S), one kind of solvent may be used, or two or more thereof may be used in combination as a mixed solvent.

Among these, PGMEA, PGME, γ-butyrolactone, EL and cyclohexanone are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably 2:8 to 8:2.

Specifically, when EL or cyclohexanone is mixed in as the polar solvent, the PGMEA:EL or cyclohexanone weight ratio is preferably from 1:9 to 9:1, and more preferably from 2:8 to 8:2. Alternatively, when PGME is mixed in as the polar solvent, the PGME A:PGME weight ratio is preferably from 1:9 to 9:1, more preferably from 2:8 to 8:2, and still more preferably 3:7 to 7:3. Furthermore, a mixed solvent of PGMEA, PGME and cyclohexanone is also preferable.

Further, as the component (S), a mixed solvent of at least one of PGMEA and EL with γ-butyrolactone is also preferable. In this case, regarding a mixing ratio, a mass ratio between the former and the latter is preferably 70:30 to 95:5.

The amount of the component (S) is not particularly limited, and is appropriately adjusted to a concentration which enables coating of a coating solution to a substrate. In general, the component (S) is used so that a solid content concentration of the resist composition is in a range of 0.1 to 20 mass %, and preferably in a range of 0.2 to 15 mass %.

If desired, other miscible additives can also be added to the resist composition of the present invention. Examples of such miscible additives include additive resins for improving the performance of the resist film, dissolution inhibitors, plasticizers, stabilizers, colorants, halation prevention agents, and dyes.

Regarding the resist composition of the present embodiment, the resist material is dissolved in the component (S) and then impurities and the like may be removed using a polyimide porous membrane, a polyamide imide porous membrane, or the like. For example, the resist composition may be filtered using a filter made of a polyimide porous membrane, a filter made of a polyamide imide porous membrane, a filter made of a polyimide porous membrane and a polyamide imide porous membrane. Examples of the polyimide porous membrane and the polyamide imide porous membrane include those described in Japanese Unexamined Patent Application, First Publication No. 2016-155121.

The resist composition of the present embodiment contains die above component (A1) and component (BD1), and as necessary, the above optional components.

For example, when the component (BD1) is used as the component (B1), a preferable example is a resist composition containing the component (A1), the component (B1), the component (D2) or the component (D3). For example, when the component (BD1) is used as the component (D1), a preferable example is a resist composition containing the component (A1), the component (B2), and the component (D1).

In addition, for example, when the component (BD1) is used as the component (B1) and the component (D1), a preferable example is a resist composition containing the component (A1), the component (B1), and the component (D1).

The resist composition of the present embodiment described above contains the above component (A1a), component (A1b), or component (A1c) as the component (A).

The resist composition of the present embodiment containing the component (A1a) contains the resin component (A1a) having the structural unit (a0-1a) and the compound (BD1) represented by the general formula (bd1). The component (BD1) has a relatively high hydrophobicity because it has a specific structure (bulky structure) in which the anion moiety is mainly composed of hydrocarbon. Therefore, the compatibility between the compound (BD1) and the resin component (A1) is improved, and an acid diffusion ability in the resist film is appropriately controlled. In addition, since the resin component (A1a) has a specific structural unit (a0-1a) (a structural unit having a carbon-carbon unsaturated bond moiety in a group which is dissociated under the action of an acid), a synergistic effect of the compound (BD1) and the resin component (A1) is further enhanced. Therefore, it is speculated that, according to the resist composition of the embodiment, lithography properties (roughness reduction and the like) are further improved and the sensitivity is enhanced.

In addition, when the resist composition containing the component (A1a) is used, in the resist pattern formation, it is unlikely to be affected by the baking temperature during a heating treatment after exposure, change in the sensitivity is reduced, and a resist pattern with minute dimensions can be stably formed, that is, a PEB margin can be widened.

In addition, when the resist composition containing the component (A1a) is used, since the uniformity of the compound (BD1) in the resist film to be formed is improved, it is possible to easily form a resist pattern having a high resolution and a favorable shape with reduced roughness.

The resist composition containing the component (A1b) of the present embodiment contains the resin component (A1b) having the structural unit (a0-1b) and the structural unit (a0-2) and the compound (BD1) represented by the general formula (bd1). The component (BD1) has a relatively high hydrophobicity because it has a specific structure (bulky structure) in which the anion moiety is mainly composed of a hydrocarbon. Therefore, the compatibility between die compound (BD1) and the resin component (A1b) is improved, and an acid diffusion ability in the resist film is appropriately controlled. In addition, since a specific structural unit is combined into the resin component (A1b), a synergistic effect of the compound (BD1) and the resin component (A1b) is further improved. Therefore, it is speculated that, according to the resist composition of the embodiment, lithography properties (roughness reduction and the like) are further improved and the sensitivity is enhanced.

In addition, when the resist composition containing the component (A1b) is used, since the uniformity of the compound (BD1) in the resist film to be formed is improved, it is possible to easily form a resist pattern having a high resolution and a favorable shape with reduced roughness.

The resist composition containing the component (A1c) contains the resin component (A1c) having the structural unit (a0-3) and the compound (BD1) represented by the general formula (bd1). The component (BD1) has a relatively high hydrophobicity because it has a specific structure (bulky structure) in which the anion moiety is mainly composed of a hydrocarbon. Therefore, the compatibility between the compound (BD1) and the resin component (A1c) is improved, and an acid diffusion ability in the resist film is appropriately controlled. In addition, since the resin component (A1c) has a specific structural unit (a0-3), the solubility in the developing solution is appropriately adjusted and the adhesion with respect to the substrate is improved, and thus it is possible to improve the rectangularity of a cross-sectional shape of the resist pattern. In addition, According to a synergistic effect of the compound (BD1) and the resin component (A1c), the component (BD1) can be uniformly distributed in the resist film. Therefore, it is speculated that, according to die resist composition of the embodiment, lithography properties (roughness reduction and the like) are further improved and the rectangularity of a cross-sectional shape of the resist pattern is improved.

In addition, when the resist composition containing the component (A1c) is used, since the uniformity of the compound (BD1) in the resist film to be formed is improved, it is possible to easily form a resist pattern having a high resolution and a favorable shape with reduced roughness.

In addition, the resist composition of the present embodiment preferably contains the compound (B1d) represented by the general formula (b1) as the component (B1). The compound (B1 d) has a relatively high hydrophobicity because it has a specific structure (bulky structure) in which the anion moiety is mainly composed of a hydrocarbon. Therefore, the compatibility between the compound (B1 d) and the base component (A) is improved, and an acid diffusion ability in the resist film is appropriately controlled. It is speculated that, when the component (B1d) having an anion moiety and a cation moiety is contained, lithography properties (roughness reduction and the like) are further improved, and the sensitivity is enhanced.

In addition, when the resist composition containing the compound (B1d) is used, since the uniformity of the compound (B1d) in the resist film to be formed is improved, it is possible to easily form a resist pattern having a high resolution and a favorable shape with reduced roughness.

(Resist Composition: Other Embodiments)

The resist composition according to the embodiment of the present invention contains a base component (A) that exhibits a changed solubility in a developing solution under the action of an acid, and an acid-generator component (B) that generates an acid upon exposure, and the acid-generator component (B) may contain the compound (B1d) represented by the general formula (b1).

In the resist composition of the present embodiment, one type of the component (A) may be used alone or two or more thereof may be used in combination.

In the resist composition of the present embodiment, the component (A) is preferably the component (A-1). That is, the resist composition of the present embodiment is preferably a "positive type resist composition for an alkali developing process" that forms a positive type resist pattern in the alkali developing process or a "negative type resist composition for a solvent developing process" that forms a negative type resist pattern in the solvent developing process. In the component (A), at least one of a high-molecular-weight compound and a low-molecular-weight compound can be used.

When the component (A) is the component (A-1), the component (A1) is preferably contained as the component (A-1).

The component (A1) preferably contains a high-molecular-weight compound (A1d) having a structural unit (a1) (hereinafter referred to as a "component (A1d)").

Preferable examples of the component (A1d) include a high-molecular-weight compound having a repeating structure of the structural unit (a1) and structural unit (a0-2), a high-molecular-weight compound having a repeating structure of the structural unit (a1) and the structural unit (a3), and a high-molecular-weight compound having a repeating structure of the structural unit (a1) and the structural unit (a2).

In addition to the combination of the above two structural units, as additional third or three or more structural units, the structural units described above may be appropriately combined according to a desired effect. Examples of combinations of three or more structural units include a combination of the structural unit (a1), the structural unit (a0-2), and the structural unit (a3), a combination of the structural unit (a1), the structural unit (a0-2), and the structural unit (a2), and a combination of the structural unit (a1), the structural unit (a0-2), the structural unit (a2), and the structural unit (a3).

The component (A1d) can be produced by dissolving monomers deriving structural units in a polymerization solvent, and adding a radical polymerization initiator, for example, azobisisobutyronitrile (AIBN) or dimethyl azobisisobutyrate (for example, V-601) thereto for polymerization. Alternatively, the component (A1 d) can be produced by dissolving a monomer that derives a structural unit (a1) and as necessary, a precursor monomer (a monomer with a protected functional group for the monomer) that derives a structural unit other than the structural unit (a1) in a polymerization solvent, adding the above radical polymerization initiator thereto for polymerization, and then causing a deprotection reaction. Here, in the polymerization, for example, a chain transfer agent such as HS—$CH_2$—$CH_2$—$CH_2$—$C(CF_3)_2$—OH may be used in combination to introduce a —$C(CF_3)_2$—OH group at the terminal. In this manner, a copolymer in which a hydroxyalkyl group in which some of hydrogen atoms of the alkyl group are substituted with a fluorine atom is introduced is effective in reducing developing defects and LER (line edge roughness: un-uniform unevenness of line side walls).

The mass average molecular weight (Mw) (in terms of polystyrene standards according to gel permeation chromatography (GPC)) of the component (A1d) is not particularly limited, and is preferably 1,000 to 50,000, more preferably 2,000 to 30,000, and most preferably 3,000 to 20,000.

When Mw of the component (A1d) is equal to or less than an upper limit of this preferable range, the solubility in a resist solvent is sufficient for use as a resist, and when Mw of the component (A1d) is equal to or more than a lower limit of this preferable range, the dry etching resistance and the resist pattern cross-sectional shape become favorable.

The dispersity (Mw/Mn) of the component (A1d) is not particularly limited, and is preferably 1.0 to 4.0, more preferably 1.0 to 3.0, and particularly preferably 1.1 to 2.0. Here, Mn indicates a number average molecular weight.

In the resist composition of the present embodiment, as the component (A), a base component that exhibits a changed solubility in a developing solution under the action of an acid (hereinafter referred to as a "component (A2)") which does not correspond to the component (A1d) may be used in combination.

The component (A2) is not particularly limited, and any one selected from among many components conventionally known as a base component for a chemically amplified resist composition may be used Regarding the component (A2), a high-molecular-weight compound or a low-molecular-weight compound may be used alone or two or more thereof may be used in combination.

A proportion of the component (A1d) in the component (A) is preferably 25 mass % or more, more preferably 50 mass % or more, and still more preferably 75 mass % or more, and may be 100 mass % with respect to the total mass of the component (A). When the proportion is 25 mass % or more, a resist pattern having excellent various lithography properties such as high sensitivity and resolution, and improved roughness is easily formed. Particularly, such effects are significant in lithography using an electron beam or EUV.

In the resist composition of the present embodiment, the amount of the component (A) may be adjusted according to the thickness of the resist film to be formed and die like.

The resist composition of the present embodiment contains die above component (A) and component (B1d), and as necessary, the above optional components.

For example, a preferable example is a resist composition containing the component (A), die component (B1 d), and the component (D1). In addition, for example, a preferable example is a resist composition containing the component (A), the component (B1d), the component (D2) or the component (D3).

The resist composition of the present embodiment described above contains the compound (B1 d) represented by die general formula (b1). It is speculated that, when the component (B1d) having an anion moiety and a cation moiety is contained, for the same reasons described in the above embodiment, lithography properties (roughness reduction and the like) are further improved and the sensitivity is enhanced.

In addition, when the resist composition of the embodiment is used, since the uniformity of the compound (B1d) in the resist film to be formed is improved, it is possible to easily form a resist pattern having a high resolution and a favorable shape with reduced roughness.

(Method of Forming a Resist Pattern)

A method of forming a resist pattern according to a second aspect of the present invention is a method including a process of forming a resist film on a support using the resist composition of the above embodiment, a process of exposing the resist film, and a process of developing the resist film after exposure and forming a resist pattern.

As one embodiment of the method of forming a resist pattern, for example, a method of forming a resist pattern that can be performed as follows may be exemplified.

Firstly, a resist composition of the first aspect is applied to a substrate using a spinner or the like, and a baking treatment (post applied bake (FAB)) is conducted at a temperature of 80 to 150° C. for 40 to 120 seconds, preferably 60 to 90 seconds, to form a resist film.

Following selective exposure of the thus formed resist film, either by exposure through a mask having a predetermined pattern formed thereon (mask pattern) using an exposure apparatus such an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment. The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern can be removed by a treatment using a supercritical fluid.

After the developing treatment or the rinse treatment, drying is conducted. If desired, a baking treatment (post baking) can be conducted following the developing.

In this manner, a resist pattern can be formed.

The substrate is not specifically limited and a conventionally known substrate can be used. For example, substrates for electronic components, such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

Multilayer resist methods are broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film is formed (triple-layer resist method).

The wavelength used for exposure is not particularly limited, and radiation using an ArF excimer laser, a KrF excimer laser, an $F_2$ excimer laser, extreme ultraviolet (EUV), vacuum ultraviolet (VUV), an electron beam (EB), X-rays, soft X-rays, or the like can be performed. The resist composition of the present embodiment is effective with a KrF excimer laser, an ArF excimer laser, an EB and EUV, and more effective with an ArF excimer laser, an EB and EUV, and most effective with an EB and EUV. That is, the method of forming a resist pattern of the present embodiment is a particularly useful method when a step of exposing a resist film includes an operation of exposing the resist film with extreme ultraviolet (EUV) or an electron beam (EB).

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than die refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of die resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range of 70 to 180° C. and preferably 80 to 160° C. A fluorine-based inert liquid having a boiling point within die above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, the environment and versatility.

As an example of the alkali developing solution used in an alkali developing process, a 0.1 to 10% by mass aqueous solution of tetramethylammonium hydroxide (TMAH) can be given.

As the organic solvent contained in the organic developing solution used in a solvent developing process, any of conventional organic solvents which are capable of dissolving the component (A) (prior to exposure) can be used. Specific examples of the organic solvent include polar solvents such as ketone solvents, ester solvents, alcohol solvents, nitrile solvents, amide solvents and ether solvents, and hydrocarbon solvents.

A ketone solvent is an organic solvent containing C—C(=O)—C within the structure thereof. An ester solvent is an organic solvent containing C—C(=O)—O—C within the structure thereof. An alcohol solvent is an organic solvent containing an alcoholic hydroxy group in the structure thereof. An "alcoholic hydroxy group" refers to a hydroxy group bonded to a carbon atom of an aliphatic hydrocarbon group. A nitrile solvent is an organic solvent containing a nitrile group in the structure thereof. An amide solvent is an organic solvent containing an amide group within the structure thereof. An ether solvent is an organic solvent containing C—O—C within the structure thereof.

Some organic solvents have a plurality of the functional groups which characterize the aforementioned solvents within the structure thereof. In such a case, the organic solvent can be classified as any solvent type having the characteristic functional group. For example, diethylene glycol monomethylether can be classified as either an alcohol solvent or an ether solvent.

A hydrocarbon solvent consists of a hydrocarbon which may be halogenated, and does not have any substituent other than a halogen atom Examples of the halogen atom include a fluorine atom, a chlorine atom, a bromine atom and an iodine atom, and a fluorine atom is preferable.

As the organic solvent contained in the organic developing solution, among these, a polar solvent is preferable, and ketone solvents, ester solvents and nitrile solvents are preferable.

Examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone). Among these examples, as a ketone solvent, methyl amyl ketone (2-heptanone) is preferable.

Examples of die ester-based solvent include methyl acetate, butyl acetate, ethyl acetate, isopropyl acetate, amyl acetate, isoamyl acetate, methoxyethyl acetate, ethoxyethyl acetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propiolate, isopropyl propionate, methyl 2-hydroxypropionate, ethyl 2-hydroxypropionate, methyl-3-methoxypropionate, ethyl-3-methoxypropionate, ethyl 3-ethoxypropionate, and propyl-3-methoxypropionate. Among these examples, as an ester solvent, butyl acetate is preferable.

Examples of the nitrile-based solvent include acetonitrile, propionitrile, valeronitrile, and butyronitrile.

If desired, the organic developing solution may have a conventional additive blended in. Examples of the additive include surfactants. The surfactant is not particularly limited, and for example, an ionic or non-ionic fluorine and/or silicon surfactant can be used. As the surfactant, a non-ionic surfactant is preferable, and a non-ionic fluorine surfactant or a non-ionic silicon surfactant is more preferable.

When a surfactant is added, the amount thereof based on the total amount of the in organic developing solution is generally 0.001 to 5% by mass, preferably 0.005 to 2% by mass, and more preferably 0.01 to 0.5% by mass.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

As the organic solvent contained in the rinse liquid used in die rinse treatment after the developing treatment in the case of a solvent developing process, any of the aforementioned organic solvents contained in the organic developing solution which hardly dissolve the resist pattern can be used. In general, at least one solvent selected from the group consisting of hydrocarbon solvents, ketone solvents, ester solvents, alcohol solvents, amide solvents and ether solvents is used. Among these, at least one solvent selected from the group consisting of hydrocarbon solvents, ketone solvents, ester solvents, alcohol solvents and amide solvents is preferable, at least one solvent selected from the group consisting of alcohol solvents and ester solvents is more preferable, and an alcohol solvent is particularly desirable.

The alcohol solvent used for the rinse liquid is preferably a monohydric alcohol of 6 to 8 carbon atoms, and the monohydric alcohol may be linear, branched or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol and benzyl alcohol. Among these, 1-hexanol, 2-heptanol and 2-hexanol are preferable, and 1 hexanol and 2-hexanol are more preferable.

One type of such an organic solvent may be used alone or two or more thereof may be used in combination. In addition, an organic solvent other than the above organic solvents and water may be mixed together and used. However, in consideration of development characteristics, the amount of water added in a rinse liquid is preferably 30 mass % or less, more preferably 10 mass % or less, still more preferably 5 mass % or less, and particularly preferably 3 mass % or less with respect to the total amount of the rinse liquid.

If desired, the rinse solution may have a conventional additive blended in. Examples of the additive include surfactants. As the surfactant, the same surfactants as those described above can be mentioned, a non-ionic surfactant is preferable, and a non-ionic fluorine surfactant or a non-ionic silicon surfactant is more preferable.

When a surfactant is added, the amount thereof based on the total amount of the rinse liquid is generally 0.001 to 5% by mass, preferably 0.005 to 2% by mass, and more preferably 0.01 to 0.5% by mass.

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which die rinse liquid is sprayed onto the surface of the substrate (spray method).

In the method of forming a resist pattern of the present embodiment described above, since the resist composition according to the first aspect is used, when a resist pattern is formed, the sensitivity is enhanced, and it is possible to form a resist pattern having more favorable lithography properties (roughness reduction and the like).

In addition, in die method of forming a resist pattern of the present embodiment, it is unlikely to be affected by the baking temperature during a heating treatment after exposure. Therefore, change in the sensitivity is reduced, and a resist pattern with minute dimensions can be stably formed (a PEB margin is wide and favorable).

(Compound)

A compound according to a third aspect of the present invention is represented by the following general formula (b1) and has an anion moiety and a cation moiety.

[Chem. 167]

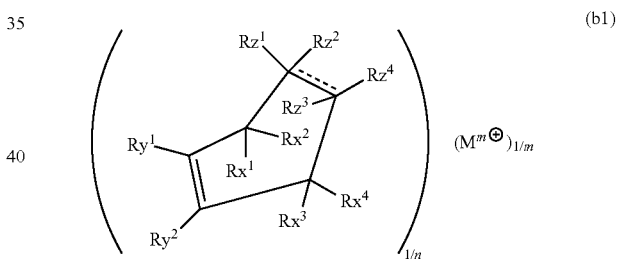

(b1)

[In the formula, $Rx^1$ to $Rx^4$ each independently represent a hydrocarbon group which may have a substituent or a hydrogen atom, or two or more of $Rx^1$ to $Rx^4$ may be mutually bonded to form a ring structure. $Ry^1$ to $Ry^2$ each independently represent a hydrocarbon group which may have a substituent or a hydrogen atom, or may be mutually bonded to form a ring structure.

- - - - - [Chem. 168]

represents a double bond or a single bond. $Rz^1$ to $Rz^4$ each independently represent, where valence allows, a hydrocarbon group which may have a substituent or a hydrogen atom, or two or more of $Rz^1$ to $Rz^4$ may be mutually bonded to form a ring structure; provided that at least one of $Rx^1$ to $Rx^4$, $Ry^1$ to $Ry^2$ and $Rz^1$ to $Rz^4$ has an anion group represented by the following general formula (an-1), the entire anion moiety may be an n-valent anion, and the number of carbonyl groups of the entire anion moiety is 1 or 0. n is an integer of 1 or more, m is an integer of 1 or more and $M^{m+}$ represents an m-valent organic cation having an electron-withdrawing group.]

[Chem. 169]

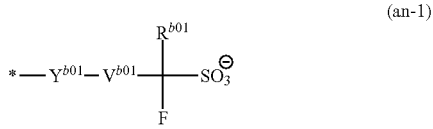

(an-1)

[In the formula, $R^{b01}$ represents a fluorine atom or a fluorinated alkyl group having 1 to 5 carbon atoms. $Y^{b01}$ represents a single bond or a bivalent linking group. Here, when $Y^{b01}$ is a bivalent linking group, the number of carbonyl groups contained in $Y^{b01}$ is 1 or 0. $V^{b01}$ represents a single bond, an alkylene group or a fluorinated alkylene group. * indicates a bond.]

The compound represented by the general formula (b1) is the same compound as the component (B1d) described in the resist composition of the above embodiment. The compound represented by the general formula (b1) can be produced by a method exemplified in the above [Method of producing the compound (BD1)].

(Acid Generator)

An acid generator according to a fourth aspect of the present invention includes the compound according to the above third aspect.

The acid generator is useful as an acid-generator component for a chemically amplified resist composition. When such an acid-generator component is used for a chemically amplified resist composition, in the resist pattern formation, lithography properties such as roughness reduction are improved, the pattern shape is favorably maintained and the sensitivity is enhanced. When such an acid-generator component is used, in particular, high sensitivity with respect an EB or EUV light source is easily obtained. In addition, according to a chemically amplified resist composition containing such an acid-generator component, resolution performance is further improved.

EXAMPLES

As follows is a description of examples of the present invention, although the scope of the present invention is by no way limited by these examples.

In the following examples, a compound represented by a chemical formula (1) is denoted as "compound (1)," and the same applies for compounds represented by other chemical formulae.

Embodiment a

Production Example of Copolymer (A1a-1-1)

The copolymer (A1a-1-1) was obtained using predetermined amounts of the following monomer (a21), the following monomer (a0-1a1), the following monomer (a31), and 2,2'-azobis(2-methylpropionic acid)dimethyl (V-601) as a polymerization initiator according to known radical polymerization.

Production Examples of Copolymer (A1a-1-2) to Copolymer (A1a-1-13), Copolymer (A2a-1), and Copolymer (A2a-2)

The copolymer (A1a-1-2) to copolymer (A1a-1-13), copolymer (A2a-1) and copolymer (A2a-2) were synthesized in the same method as in the above Production example of copolymer (A1a-1-1)> except that die following monomers that derive structural units constituting respective copolymers were used in a predetermined molar ratio.

[Chem. 170]

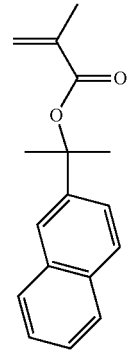

(a0-1a1)

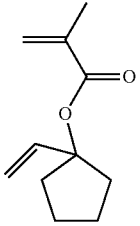

(a0-1a2)

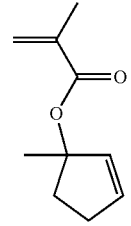

(a2-1a3)

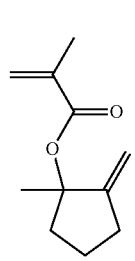

(a0-1a4)

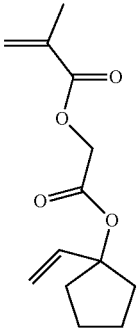

(a0-1a5)

(a0-1a6)
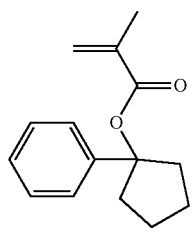
(a0-1a7)
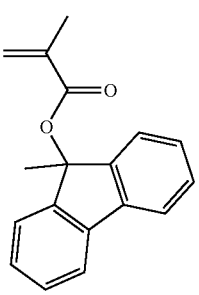
(a0-1a8)
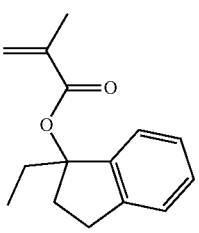
(a0-1a9)
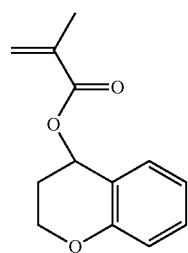
(a0-1a10)
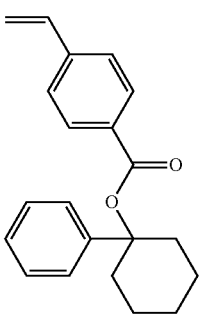
[Chem. 171]
(a21)
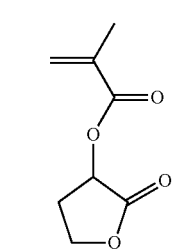
(a22)
(a31)
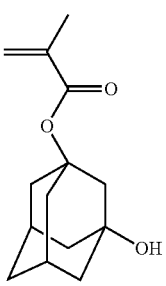
(a32)
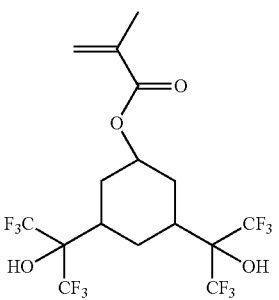
(a91)
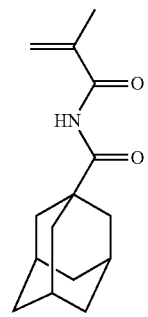
(a1-1a)
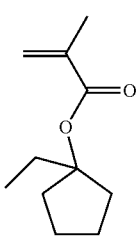

(a1-2a)

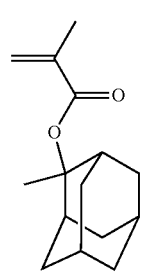

Production Example of Copolymer (A1a-1-14)

10.0 g of the monomer (a021-pre), 18.5 g of the monomer (a0-1a1), and 2.4 g of azobis(isobutyric acid)dimethyl (V-601) as a polymerization initiator were dissolved in 50.0 g of methyl ethyl ketone (MEK), and heated at 85° C. in a nitrogen atmosphere, and stirred for 5 hours. Then, 9.4 g of acetic acid and 160 g of methanol were added to the reaction solution, and a deprotection reaction was caused at 30° C. for 8 hours. After the reaction was completed, the obtained reaction solution was precipitated in 2,500 g of heptane and washed. The obtained white solid substance was filtered and dried under a reduced pressure overnight, and thereby 15.2 g of a desired copolymer (A1a-1-14) was obtained.

[Chem. 172]

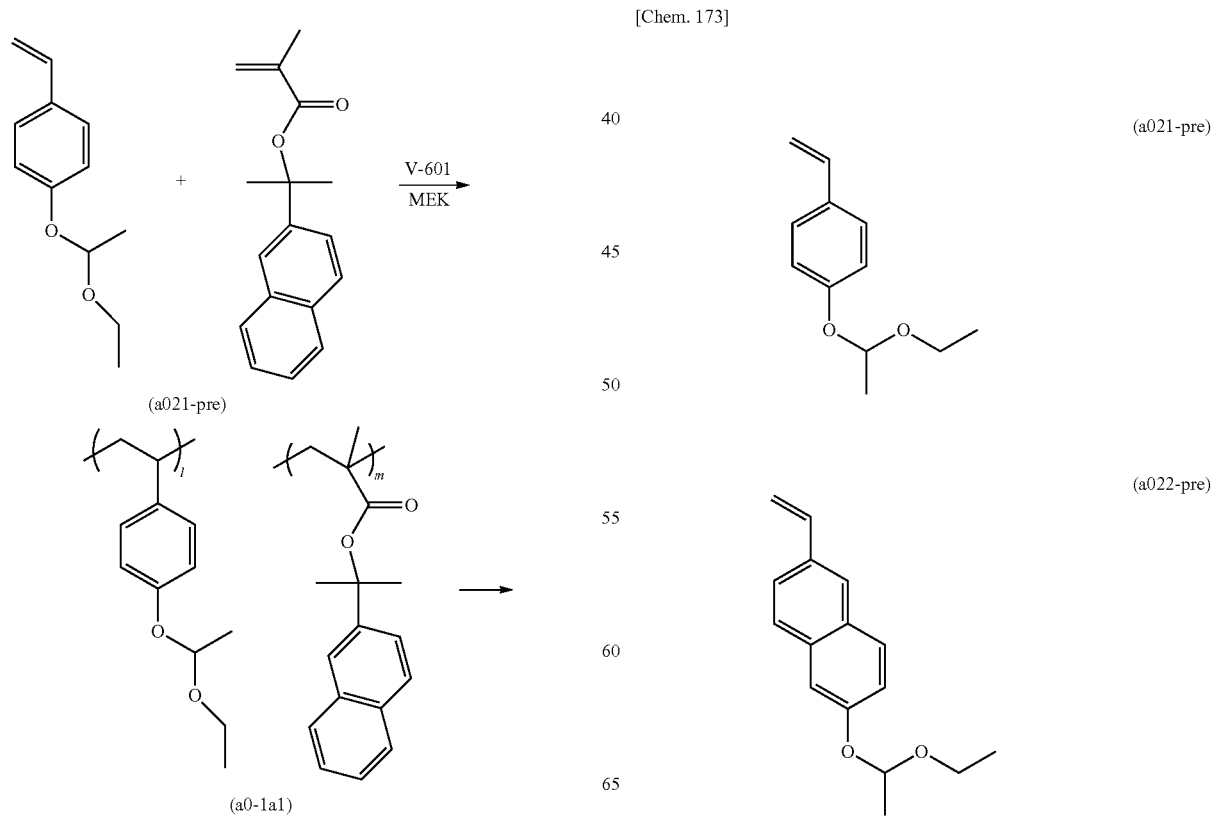

(A1-a-1-14)

Production Examples of Copolymer (A1a-1-15) to Copolymer (A1a-1-28), Copolymer (A2a-3), and Copolymer (A2a-4)

The copolymer (A1a-1-15) to copolymer (A1a-1-28), copolymer (A2a-3) and copolymer (A2a-4) were synthesized in the same method as in the above Production example of copolymer (A1a-1-14)> except that the following precursor monomers ((a021-pre), (a022-pre), and (a023-pre)) that derive structural units constituting respective copolymers and the above monomer were used in a predetermined molar ratio.

[Chem. 173]

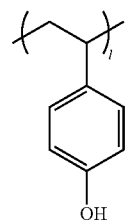

(a021-pre)

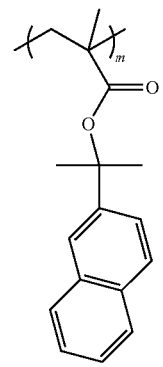

(a022-pre)

(a023-pre)
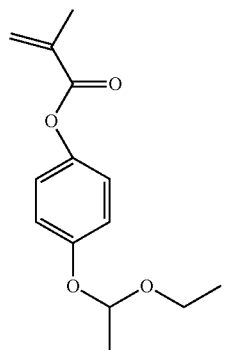
The copolymer (A1a-1-1) to copolymer (A1a-1-28), and copolymer (A2a-1) to copolymer (A2a-3) obtained according to the above production examples are shown below.
[Chem. 174]
(A1a-1-1)
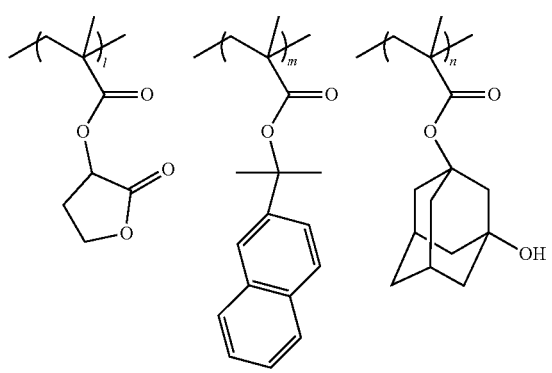
(A1a-1-2)
(A1a-1-3)
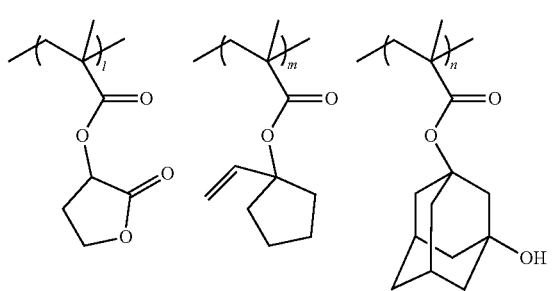
(A1a-1-4)
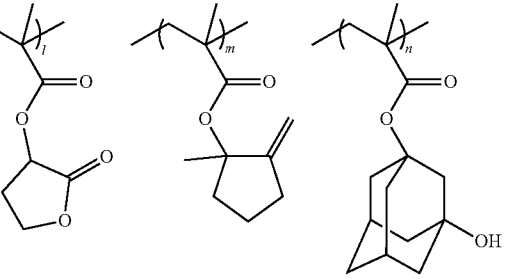
(A1a-1-5)
(A1a-1-6)
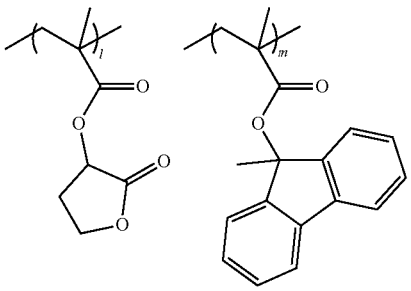
(A1a-1-7)
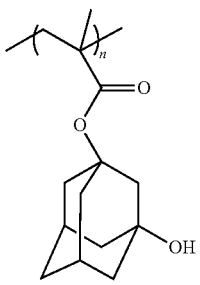

(A1a-1-8)
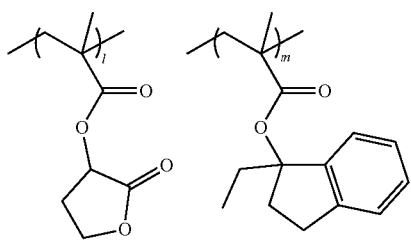
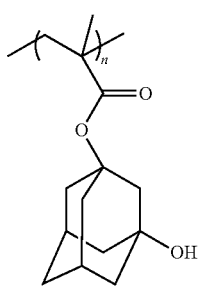
(A1a-1-9)
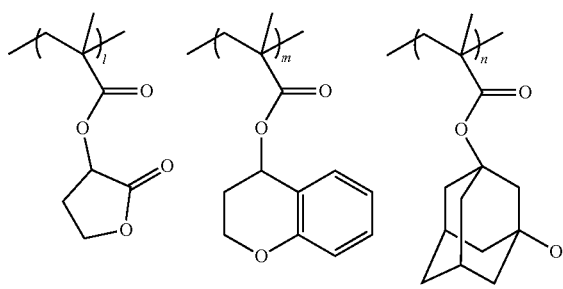
[Chem. 175]
(A1a-1-10)
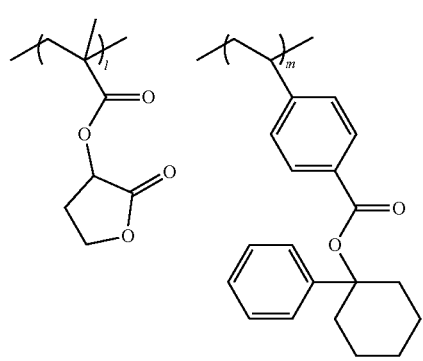
(A1a-1-11)
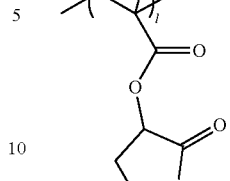 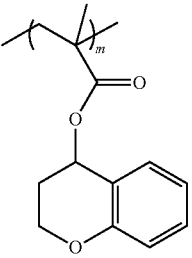 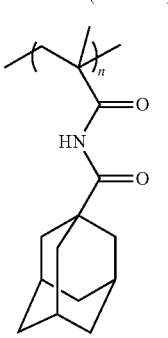
(A1a-1-12)
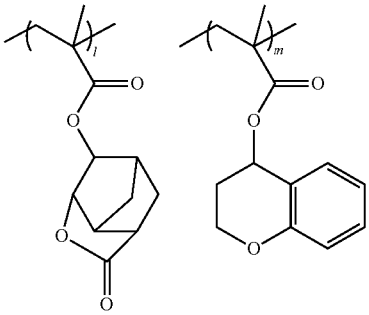 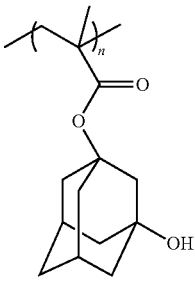
(A1a-1-13)
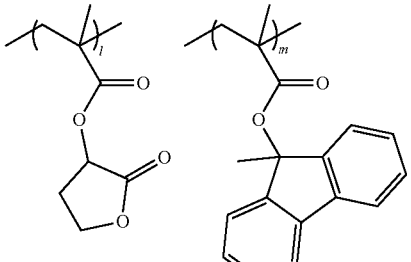
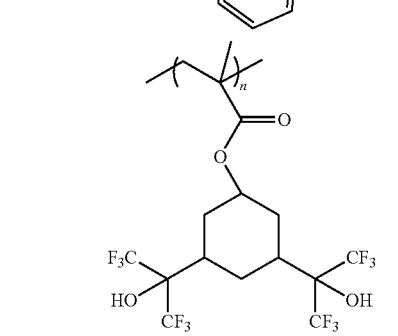
(A2a-1)
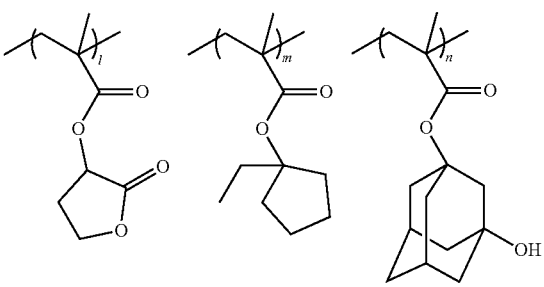

-continued
(A2a-2)
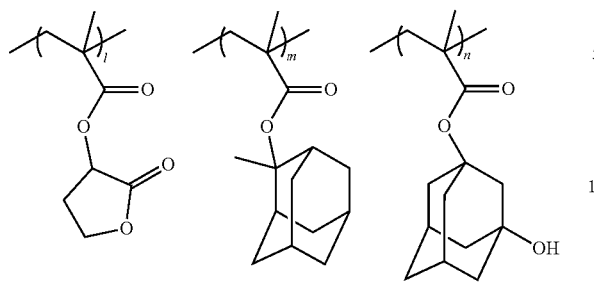
[Chem. 176]
(A1a-1-14)
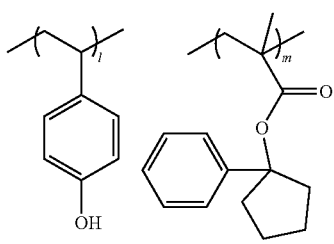
(A1a-1-15)
(A1a-1-16)
(A1a-1-17)
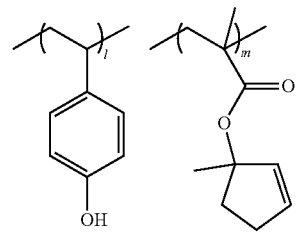
-continued
(A1a-1-18)
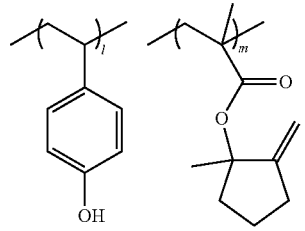
(A1a-1-19)
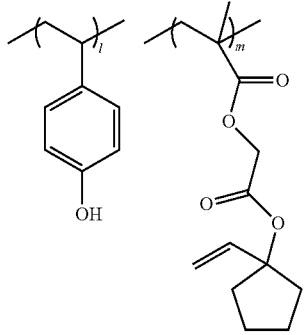
(A1a-1-20)
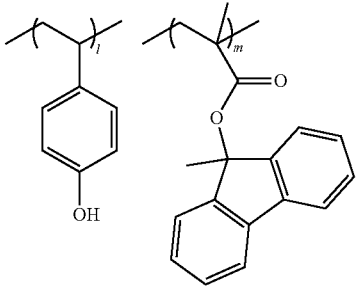
(A1a-1-21)
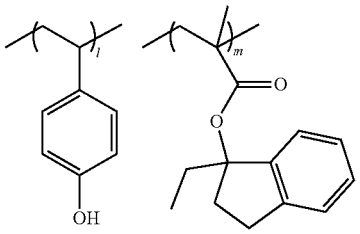
(A1a-1-22)
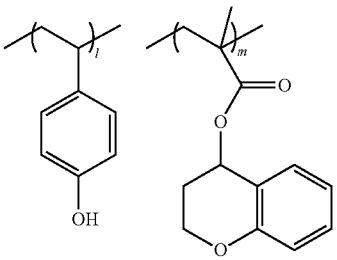

[Chem. 177]

(A1a-1-23)
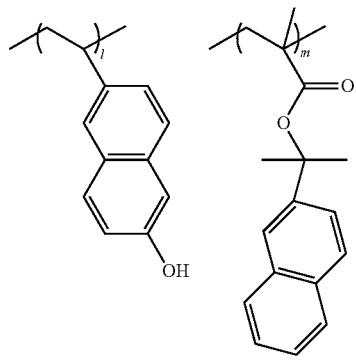

(A1a-1-24)
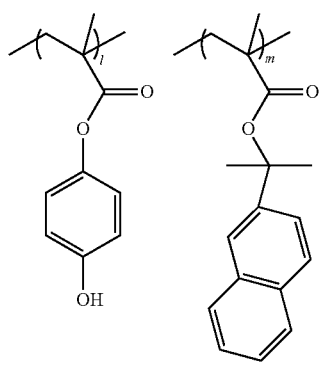

(A1a-1-25)
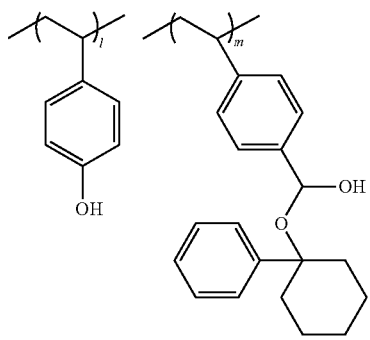

(A1a-1-26)
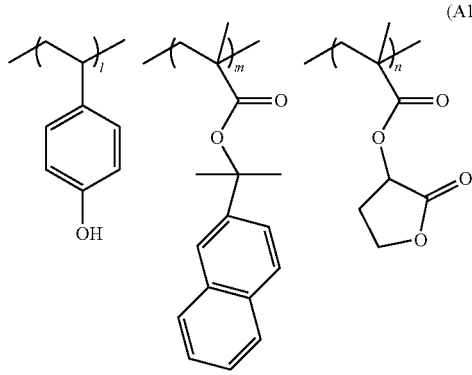

(A1a-1-27)
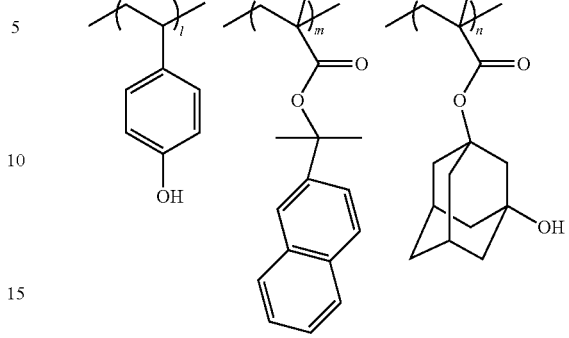

(A1a-1-28)

(A2a-3)
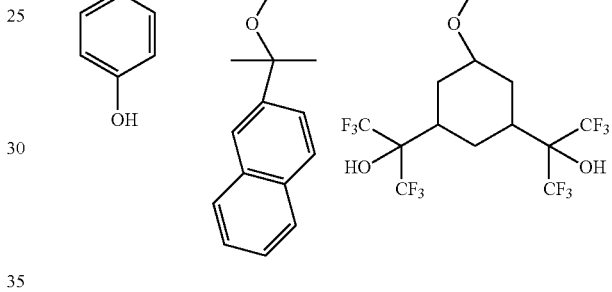

Regarding the obtained copolymers, a copolymer composition ratio (a ratio (molar ratio) of structural units derived from monomers) of the copolymer obtained through $^{13}$C-NMR, a weight average molecular weight (Mw) and a molecular weight dispersity (Mw/Mn) in terms of polystyrene standards obtained through GPC measurement are shown together in Table 1.

Here, the structural unit represented by the following chemical formula (a021) constituting the above copolymer is a structural unit that is derived from the monomer represented by the chemical formula (a021-pre). Similarly, the structural unit represented by the following chemical formula (a022) is a structural unit that is derived from the monomer represented by the chemical formula (a022-pre). The structural unit represented by the following chemical formula (a023) is a structural unit that is derived from the monomer represented by the chemical formula (a023-pre).

[Chem. 178]

(a021)
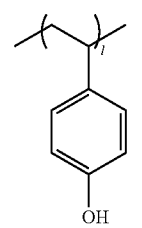

(a022)
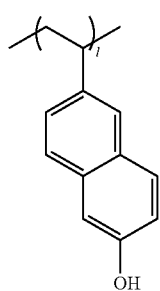

(a023)
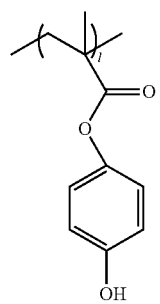

TABLE 1

| Copolymer | Copolymer composition ratio (molar ratio) of copolymer | Weight average molecular weight (Mw) | Molecular weight dispersity (Mw/Mn) |
|---|---|---|---|
| (A1a-1-1) | (a21)/(a0-1a1)/(a31) = 30/60/10 | 7000 | 1.68 |
| (A1a-1-2) | (a21)/(a0-1a2)/(a31) = 30/60/10 | 7000 | 1.64 |
| (A1a-1-3) | (a21)/(a0-1a3)/(a31) = 30/60/10 | 6900 | 1.64 |
| (A1a-1-4) | (a21)/(a0-1a4)/(a31) = 30/60/10 | 7000 | 1.71 |
| (A1a-1-5) | (a21)/(a0-1a5)/(a31) = 30/60/10 | 6800 | 1.67 |
| (A1a-1-6) | (a21)/(a0-1a6)/(a31) = 30/60/10 | 6800 | 1.62 |
| (A1a-1-7) | (a21)/(a0-1a7)/(a31) = 30/60/10 | 6600 | 1.69 |
| (A1a-1-8) | (a21)/(a0-1a8)/(a31) = 30/60/10 | 6800 | 1.65 |
| (A1a-1-9) | (a21)/(a0-1a9)/(a31) = 30/60/10 | 6800 | 1.67 |
| (A1a-1-10) | (a21)/(a0-1a10)/(a31) = 30/60/10 | 7000 | 1.68 |
| (A1a-1-11) | (a21)/(a0-1a9)/(a91) = 30/60/10 | 6900 | 1.68 |
| (A1a-1-12) | (a22)/(a0-1a9)/(a31) = 30/60/10 | 6900 | 1.65 |
| (A1a-1-13) | (a21)/(a0-1a7)/(a32) = 30/60/10 | 6700 | 1.70 |
| (A1a-1-14) | (a021)/(a0-1a1) = 50/50 | 6700 | 1.72 |
| (A1a-1-15) | (a021)/(a0-1a2) = 50/50 | 6800 | 1.67 |
| (A1a-1-16) | (a021)/(a0-1a6) = 50/50 | 7200 | 1.71 |
| (A1a-1-17) | (a021)/(a0-1a3) = 50/50 | 6700 | 1.71 |
| (A1a-1-18) | (a021)/(a0-1a4) = 50/50 | 6700 | 1.71 |
| (A1a-1-19) | (a021)/(a0-1a5) = 50/50 | 7000 | 1.72 |
| (A1a-1-20) | (a021)/(a0-1a7) = 50/50 | 6700 | 1.72 |
| (A1a-1-21) | (a021)/(a0-1a8) = 60/40 | 7000 | 1.71 |
| (A1a-1-22) | (a021)/(a0-1a9) = 50/50 | 6600 | 1.72 |
| (A1a-1-23) | (a022)/(a0-1a1) = 50/50 | 7100 | 1.71 |
| (A1a-1-24) | (a023)/(a0-1a1) = 50/50 | 7000 | 1.68 |
| (A1a-1-25) | (a021)/(a0-1a10) = 50/50 | 7100 | 1.72 |
| (A1a-1-26) | (a021)/(a0-1a1)/(a21) = 40/40/20 | 6700 | 1.69 |
| (A1a-1-27) | (a021)/(a0-1a1)/(a31) = 50/40/10 | 7100 | 1.73 |

TABLE 1-continued

| Copolymer | Copolymer composition ratio (molar ratio) of copolymer | Weight average molecular weight (Mw) | Molecular weight dispersity (Mw/Mn) |
|---|---|---|---|
| (A1a-1-28) | (a021)/(a0-1a1)/(a32) = 50/40/10 | 7000 | 1.74 |
| (A2a-1) | (a21)/(a1-1a)/(a31) = 30/60/10 | 6800 | 1.65 |
| (A2a-2) | (a21)/(a1-2a)/(a31) = 30/60/10 | 6800 | 1.64 |
| (A2a-3) | (a021)/(a1-2a) = 50/50 | 6800 | 1.73 |

Production of Compounds

Production Example 1a

Anthracene (5.0 g, 28 mmol), methyl acrylate (3.6 g, 42 mmol), aluminum chloride (0.37 g, 2.8 mmol), and toluene (50 g) were put into a 100 mL 3-neck flask, and the mixture was reacted at 80° C. for 4 hours while stirring. After cooling, ultra pure water (50 g) and methyl tert-butyl ether (MTBE) (74 g) were added thereto and the mixture was stirred for 30 minutes, and an aqueous layer was then removed. An organic layer was washed with ultra pure water (50 g) 3 times, and the organic layer was concentrated using a rotary evaporator. The concentrate was recrystallized with 2-isopropanol to obtain an intermediate 1 (5.9 g, yield=79.6%).

Sodium hydroxide (3.8 g, 95 mmol) and ultra pure water (38 g) were put into a 100 mL 3-neck flask and stirred and dissolved, and the intermediate 1 (5.0 g, 19 mmol) was then dispersed, and reacted at 90° C. for 4 hours. After cooling to room temperature, hydrochloric acid was added thereto until the solution became acidic for neutralization, and MTBE (50 g) was dien added thereto, and the mixture was stirred for 30 minutes, and an aqueous layer was then removed. An organic layer was washed with ultra pure water (50 g) 3 times and the organic layer was concentrated using a rotary evaporator to obtain an intermediate 2 (4.6 g, yield=97.2%).

[Chem. 179]

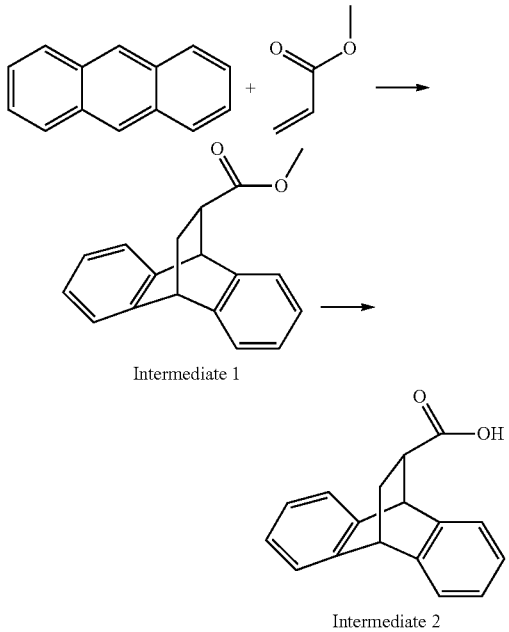

The intermediate 2 (4.0 g, 16 mmol), the compound (Ia-1) (5.0 g, 16 mmol), and dichloromethane (87 g) were put into a 100 mL 3-neck flask, and stirred and dissolved at room temperature. Next, diisopropylcarbodiimide (2.2 g, 18 mmol) and dimethylaminopyridine (0.098 g, 0.8 mmol) were put thereinto, and the mixture was reacted at room temperature for 5 hours. The reaction solution was filtered, and the filtrate was concentrated using a rotary evaporator. The concentrate was dissolved in acetonitrile (17 g) and then added dropwise to MTBE (170 g), and the precipitated solid was filtered off. The filtrate was dissolved again in acetonitrile (17 g), and added dropwise to MTBE (170 g), and the precipitated solid was filtered off. This operation was repeated twice, and the filtrate was then dried under a reduced pressure to obtain a precursor (Bpre-1) (5.8 g, yield=66.8%).

[Chem. 180]

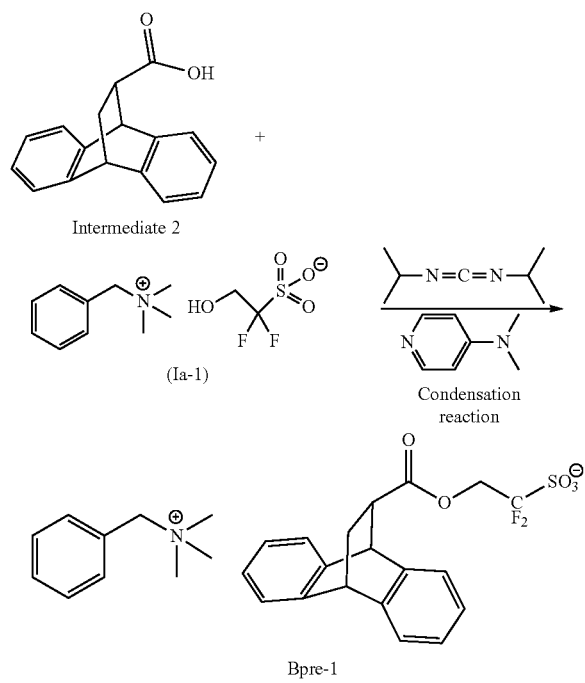

Production Example 2a

The intermediate 2 (4.0 g, 16 mmol), the compound (Ia-2) (5.7 g, 16 mmol), and dichloromethane (87 g) were put into a 100 mL 3-neck flask, and stirred and dissolved at room temperature.

Next, diisopropylcarbodiimide (2.2 g, 18 mmol) and dimethylaminopyridine (0.098 g, 0.8 mmol) were put thereinto, and the mixture was reacted at room temperature for 5 hours. The reaction solution was filtered, and the filtrate was concentrated using a rotary evaporator. The concentrate was dissolved in acetonitrile (17 g), and then added dropwise to MTBE (170 g), and the precipitated solid was filtered off. The filtrate was dissolved again in acetonitrile (17 g) and added dropwise to MTBE (170 g), and the precipitated solid was filtered off. This operation was repeated twice, and the filtrate was then dried under a reduced pressure to obtain a precursor (Bpre-2) (6.2 g, yield=65.4%).

[Chem. 181]

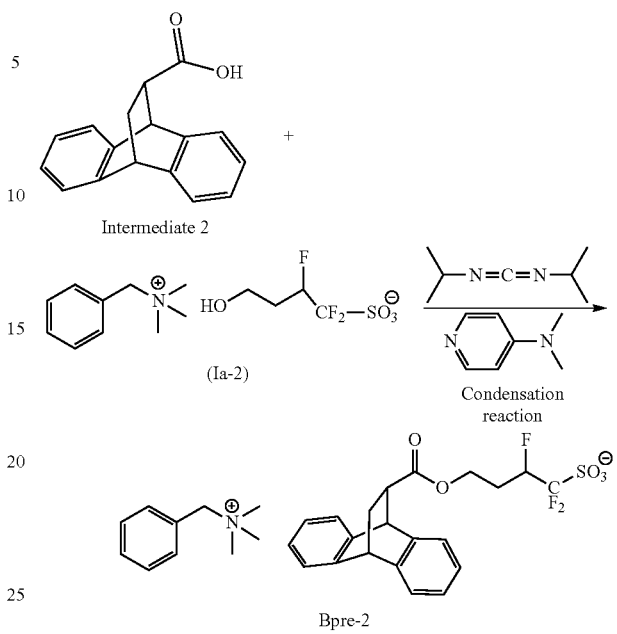

Production Example 3a

The intermediate 2 (4.0 g, 16 mmol), the compound (Ia-3) (6.0 g, 16 mmol), and dichloromethane (87 g) were put into a 100 mL 3-neck flask, and stirred and dissolved at room temperature.

Next, diisopropylcarbodiimide (2.2 g, 18 mmol) and dimethylaminopyridine (0.098 g, 0.8 mmol) were put thereinto, and the mixture was reacted at room temperature for 5 hours. The reaction solution was filtered, and the filtrate was concentrated using a rotary evaporator. The concentrate was dissolved in acetonitrile (17 g) and dien added dropwise to MTBE (170 g) and the precipitated solid was filtered off. The filtrate was dissolved again in acetonitrile (17 g) and added dropwise to MTBE (170 g) and the precipitated solid was filtered off. This operation was repeated twice and the filtrate was then dried under a reduced pressure to obtain a precursor (Bpre-3) (7.6 g, yield=78.2%).

[Chem. 182]

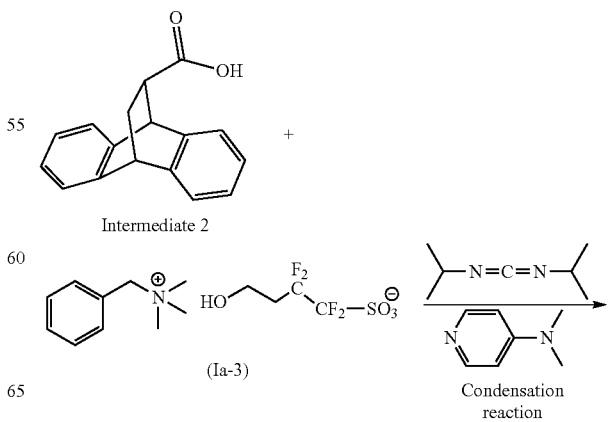

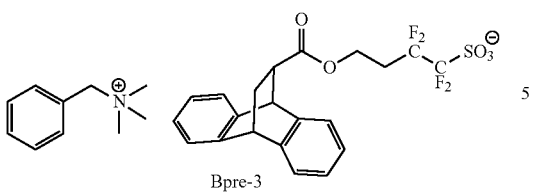

Bpre-3

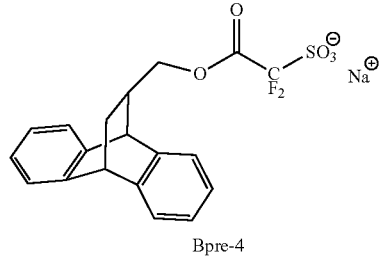

Bpre-4

Production Example 4a

The intermediate 2 (4.8 g, 19 mmol) and tetrahydrofuran (THF) (50 g) were put into a 100 mL 3-neck flask, and stirred and dissolved at room temperature. Next, LiAlH$_4$ (0.86 g, 23 mmol) was put thereinto, and the mixture was reacted at room temperature for 3 hours. Next, ultra pure water (50 g) and MTBE (50 g) were added thereto, and the mixture was stirred for 30 minutes, and an aqueous layer was then removed. Then, an organic layer was washed with ultra pure water (50 g) 3 times, and the organic layer was concentrated using a rotary evaporator to obtain an intermediate 3 (4.1 g, yield=91.0%).

The intermediate 3 (4.0 g, 19 mmol), the compound (Ia-4) (3.6 g, 18 mmol), p-toluenesulfonic acid monohydrate (0.18 g, 0.9 mmol), and toluene (40 g) were put into a 100 mL 3-neck flask, and the mixture was refluxed at 110° C. for 24 hours. After cooling, filtration was performed, acetonitrile (160 g) was added to the residue, and the mixture was stirred at room temperature for 30 minutes, and filtered off. The filtrate was concentrated, and methyl ethyl ketone (78 g) was added to the residue and stirred. Then, filtration was performed, and the filtrate was dried to obtain a precursor (Bpre-4) (4.9 g, yield=62.4%).

[Chem. 183]

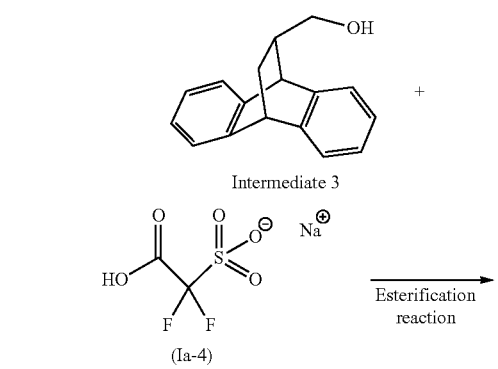

Production Example 5a

4-Bromo-3,3,4,4-tetrafluoro-1-butene (8.7 g, 42 mmol), anthracene (5.0 g, 28 mmol), and toluene (100 g) were put into a 300 mL pressure resistant reaction container, and die mixture was reacted at 150° C. for 24 hours. Next, after cooling to room temperature, concentration was performed using a rotary evaporator. Methanol (50 g) was added to the concentrate and stirred, and die precipitated solid was filtered off. Then, drying was performed under a reduced pressure to obtain an intermediate 4 (6.0 g, yield=55.6%).

[Chem. 184]

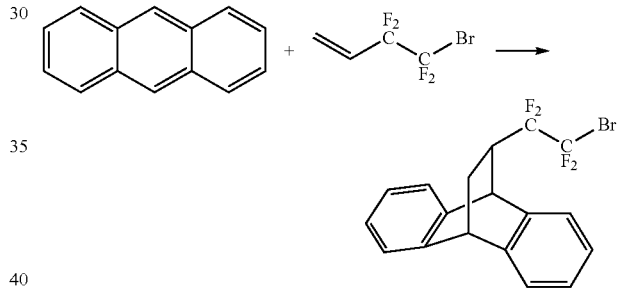

Intermediate 4

The intermediate 4 (5.8 g, 15 mmol), benzyltrimethylammonium chloride (2.9 g, 16 mmol), sodium dithionite (6.7.38 mmol), sodium bicarbonate (3.8 g, 45 mmol), acetonitrile (16 g), and H$_2$O (16 g) were put into a 200 mL 3-neck flask, and the mixture was reacted at 65° C. for 4 hours while stirring. Next, after cooling to room temperature, the reaction solution was filtered off, and H$_2$O (16 g) and dichloromethane (25 g) were added to the filtrate, and the mixture was stirred for 30 minutes, and an aqueous layer was then removed. Next, washing with ultra pure water (160 g) was performed twice, and an organic layer was concentrated using a rotary evaporator. Acetonitrile (77 g) was added to and dissolved in the concentrate, a 30% hydrogen peroxide solution (2.7 g, 24 mmol) was added thereto, and reacted at 45° C. for 7 hours. After cooling to room temperature, dichloromethane (78 g) and a saturated sodium sulfite aqueous solution (78 g) were added thereto, and stirred in ultra pure water for 30 minutes, and an aqueous layer was dien removed. Washing with ultra pure water (78 g) was performed twice, and MTBE (156 g) was then added thereto, and stirred for 30 minutes. The precipitate was filtered off and dried under a reduced pressure to obtain a precursor (Bpre-5) (5.8 g, yield=66.8%).

[Chem. 185]

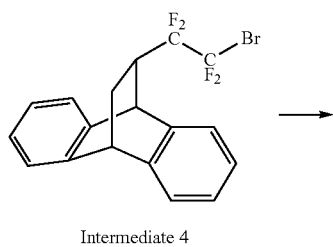

Intermediate 4

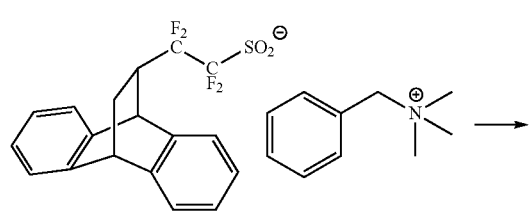

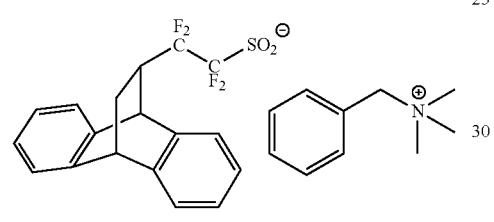

Bpre -5

Production Example 6a

A precursor (Bpre-6) (6.6 g, yield=53.1%) was obtained in the same manner as in the production example of the precursor (Bpre-2) except that the intermediate 5 (6.8 g, 16 mmol) was used in place of the intermediate 2 (4.0 g, 16 mmol).

[Chem. 186]

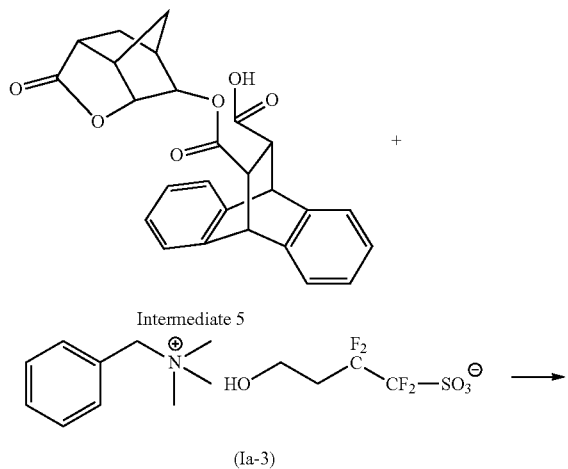

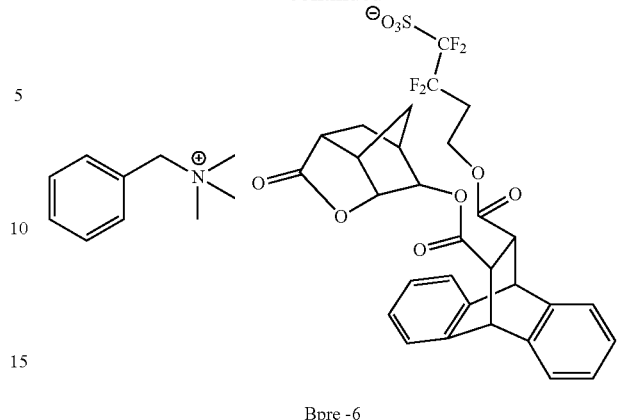

Bpre -6

Production Example 7a

An intermediate 6 (6.4 g, yield=82.3%) was obtained in the same manner as in the production example of the intermediate 2 except that anhydrous maleic acid (4.0 g, 42 mmol) was used in place of methyl acrylate (3.6 g, 42 mmol).

[Chem. 187]

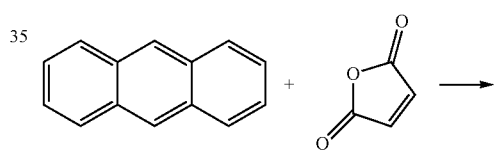

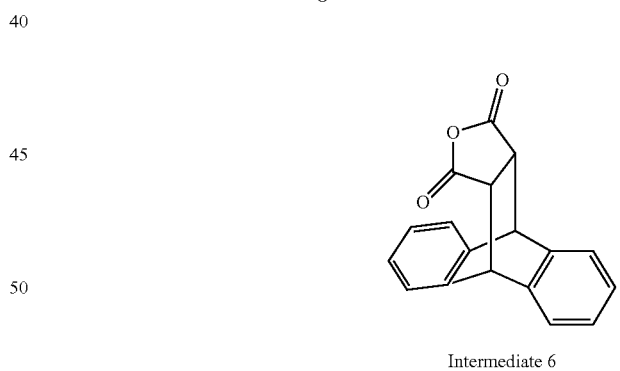

Intermediate 6

Sodium hydroxide (3.6 g, 90 mmol) and ultra pure water (36 g) were put into a 100 mL 3-neck flask, and stirred and dissolved, and the intermediate 6 (5.0 g, 18 mmol) was then dispersed and reacted at 90° C. for 4 hours. After cooling to room temperature, 20% hydrochloric acid (13.2 g, 72.4 mmol) and benzyltrimethylammonium chloride (5.0 g, 27 mmol) were added thereto, MTBE (50 g) was then added thereto, and the mixture was stirred for 30 minutes and an aqueous layer was then removed. An organic layer was washed with ultra pure water (50 g) 3 times and the organic layer was concentrated using a rotary evaporator to obtain precursor (Bpre-7) (5.7 g, yield=71.0%).

[Chem. 188]

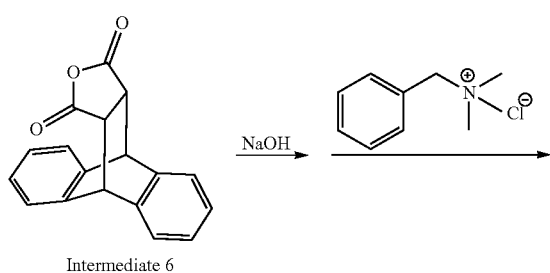

Intermediate 6

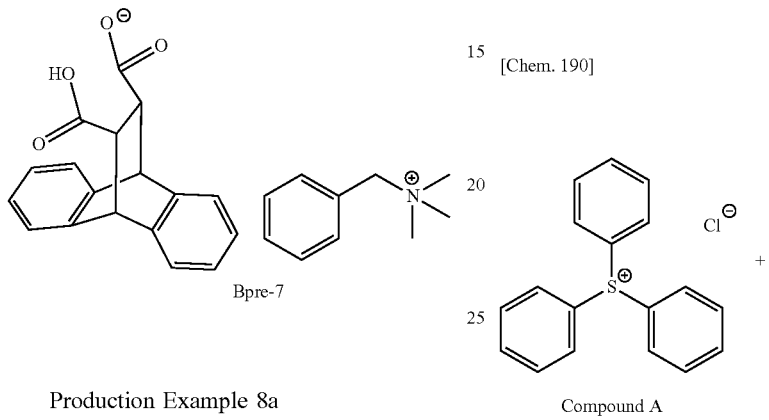

Bpre-7

Production Example 8a

Sodium hydroxide (3.6 g, 90 mmol) and ultra pure water (36 g) were put into a 100 mL 3-neck flask, and stirred and dissolved, and the intermediate 1 (4.8 g, 18 mmol) was then dispersed and reacted at 90° C. for 4 hours. After cooling to room temperature, 20% hydrochloric acid (13.2 g, 72.4 mmol) and benzyltrimethylammonium chloride (5.0 g, 27 mmol) were added thereto, MTBE (50 g) was then added thereto, and the mixture was stirred for 30 minutes, and an aqueous layer was then removed. The organic layer was washed with ultra pure water (50 g) 3 times, and the organic layer was concentrated using a rotary evaporator to obtain a precursor (Bpre-8) (5.7 g, yield=71.0%).

[Chem. 189]

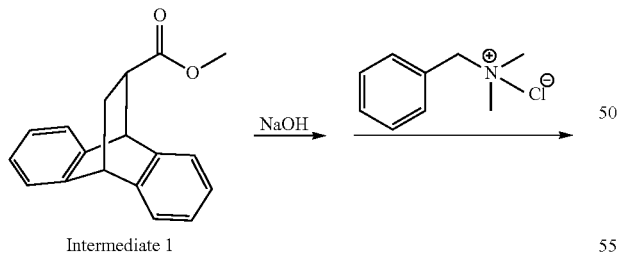

Intermediate 1

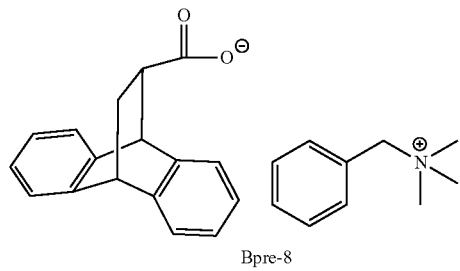

Bpre-8

Production Example of Compound (B1a-1)

The precursor (Bpre-1) (5.0 g, 9.2 mmol) and the compound A for salt exchange (2.8 g, 9.2 mmol) were dissolved in dichloromethane (60 g), and ultra pure water (60 g) was added thereto, and the mixture was reacted at room temperature for 30 minutes. After the reaction was completed, an aqueous phase was removed and an organic phase was then washed with ultra pure water (60 g) 4 times. The organic phase was concentrated and dried using a rotary evaporator to obtain a compound (B1a-1) (5.1 g, yield=85%).

[Chem. 190]

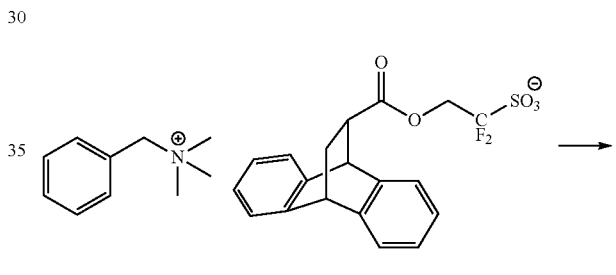

Compound A

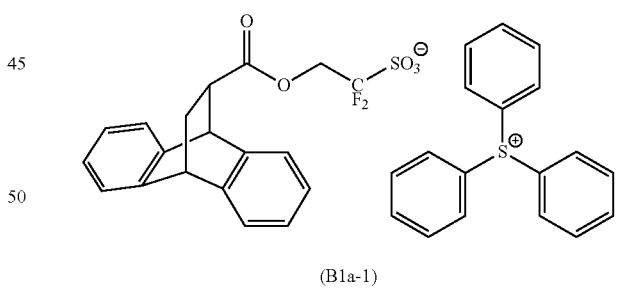

(B1a-1)

Production Examples of Other Compounds

The following compound (B1a-1) to compound (B1a-6), and compound (D1a-1) to compound (D1a-2) were obtained in the same manner as in the above "production example of compound (B1a-1)" except that combinations of the precursor (Bpre-1) to precursor (Bpre-8), and the compound A for salt exchange were changed.

NMR measurement was performed for the obtained compounds, and structures thereof were identified from the following analysis results.

[Chem. 191]
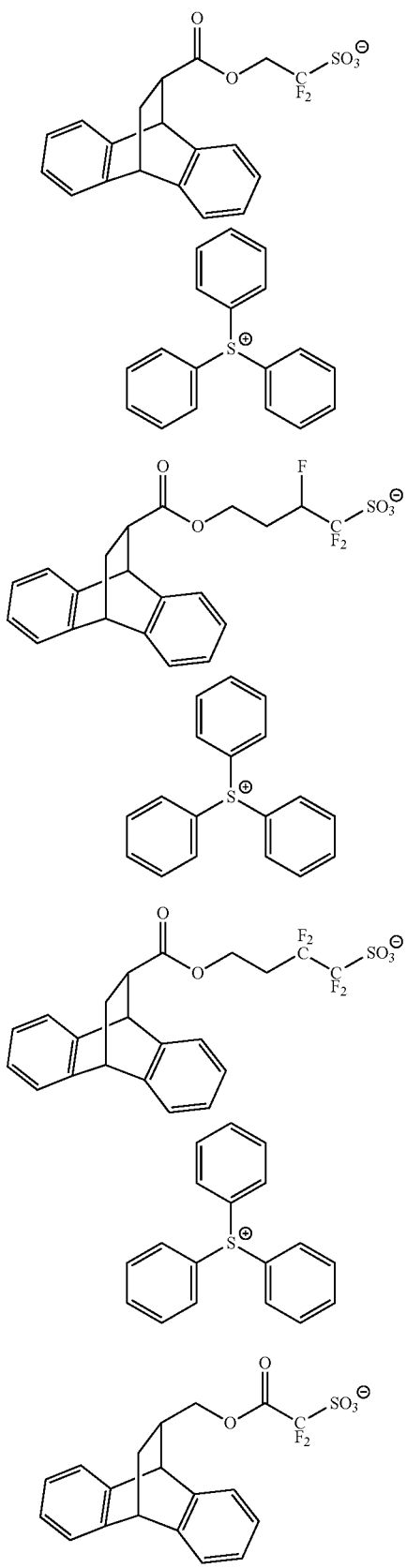
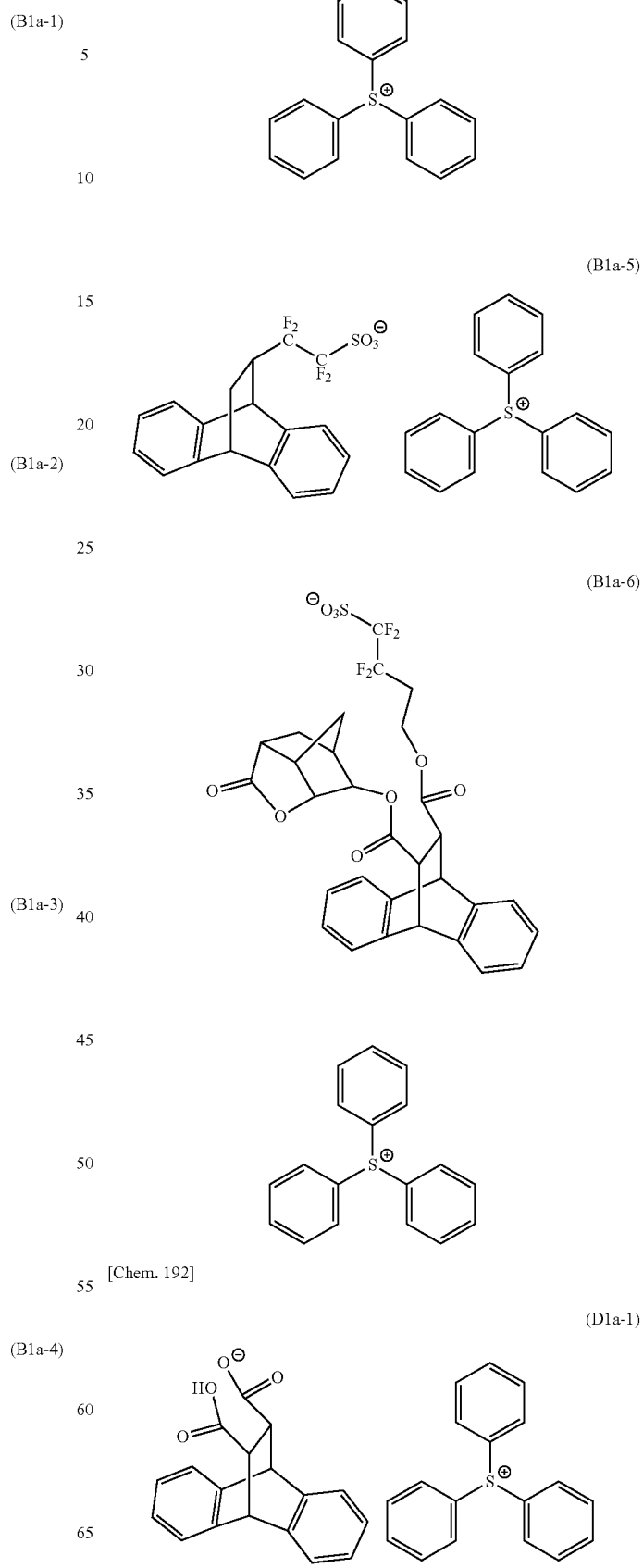
[Chem. 192]

-continued (D1a-2)

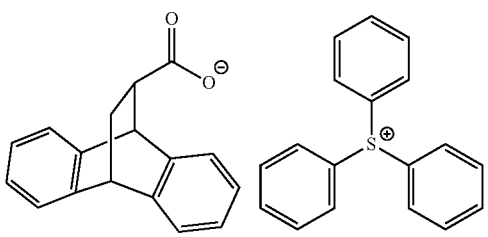

Compound (B1a-1): Combination of the Precursor (Bpre-1) and the Compound A for Salt Exchange $^{1}$H-NMR (DMSO, 400 MHz): δ(ppm)=7.74-7.90 (m, 15H, ArH), 7.00-7.48 (m, ArH, 8H), 4.70 (s, CH, 1H), 4.31-4.58 (m, CH, CF2CH2, 3H), 2.95-3.02 (m, CH, 1H), 1.85-2.05 (m, CH2, 2H)
$^{19}$F-NMR (DMSO, 376 MHz): δ(ppm)=−111.4

Compound (B1a-2): Combination of the Precursor (Bpre-2) and the Compound A for Salt Exchange $^{1}$H-NMR (DMSO, 400 MHz): δ(ppm)=7.74-7.90 (m, 15H, ArH), 7.01-7.47 (m, ArH, 8H), 5.08 (m, CFCH, 1H), 4.71 (s, CH, 1H), 4.42 (s, CH, 1H), 4.23 (m, CH2, 2H), 2.90 (m, CH, 1H), 2.45 (m, CFCH, 1H), 1.82-2.07 (m, CH2, CFCH, 3H)
$^{19}$F-NMR (DMSO, 376 MHz): δ(ppm)=−112.5, −121.2, −203.2

Compound (B1a-3): Combination of the Precursor (Bpre-3) and the Compound A for Salt Exchange $^{1}$H-NMR (DMSO, 400 MHz): δ(ppm)=7.74-7.90 (m, 15H, ArH), 7.01-7.47 (m, ArH, 8H), 4.72 (s, CH, 1H), 4.43 (S, CH, 1H), 4.23, (t, CH2, 2H), 2.95-3.02 (m, CH, 1H), 2.63-2.73, (m, CF2CH2, 2H), 1.86-2.07 (m, CH2, 2H)
$^{19}$F-NMR (DMSO, 376 MHz): δ(ppm)=−111.3, −117.4

Compound (B1a-4): Combination of the Precursor (Bpre-4) and the Compound A for Salt Exchange $^{1}$H-NMR (DMSO, 400 MHz): δ(ppm)=7.74-7.90 (m, 15H, ArH), 7.01-7.45 (m, ArH, 8H), 4.71 (s, CH, 1H), 4.44 (S, CH, 1H), 4.31 (S, CH2, 2H), 2.93-3.00 (m, CH, 1H), 1.87-2.07 (m, CH2, 1H), 0.98-1.03 (m, CH2, 1H)
$^{19}$F-NMR (DMSO, 376 MHz): δ(ppm)=−107.9

Compound (B1a-5): Combination of the Precursor (Bpre-5) and the Compound A for Salt Exchange $^{1}$H-NMR (DMSO, 400 MHz): δ(ppm)=7.74-7.90 (m, 15H, ArH), 7.00-7.48 (m, ArH, 8H), 4.70 (s, CH, 1H), 4.40 (s, CH, 1H), 3.15-3.22 (m, CF2CH, 1H), 1.95-2.15 (m, CH2, 2H)
$^{19}$F-NMR (DMSO, 376 MHz): δ(ppm)=−111.3, −117.4

Compound (B1a-6): Combination of the Precursor (Bpre-6) and the Compound A for Salt Exchange $^{1}$H-NMR (DMSO, 400 MHz): δ(ppm)=7.74-7.90 (m, 15H, ArH), 7.01-7.47 (m, ArH, 8H), 4.70 (d, OCH (lactone), 1H), 4.58 (t, COOCH (lactone), 1H), 4.50 (d, CH, 2H), 4.22, (t, COOCH2, 2H), 3.32 (m, CHO (lactone), 1H), 3.20 (t, COCH, 2H), 2.63-2.73, (m, CF2CH2, CH (lactone) 4H), 1.60-2.20 (m, CH2 (lactone), 4H)
$^{19}$F-NMR (DMSO, 376 MHz): δ(ppm)=−111.3, −117.4

Compound (D1a-1): Combination of the Precursor (Bpre-7) and the Compound A for Salt Exchange $^{1}$H-NMR (DMSO, 400 MHz): δ(ppm)=7.74-7.90 (m, 15H, ArH), 7.00-7.48 (m, ArH, 8H), 4.85 (s, ArCH, 2H), 3.16 (s, CH, 2H)

Compound (D1a-2): Combination of the Precursor (Bpre-8) and the Compound A for Salt Exchange $^{1}$H-NMR (DMSO, 400 MHz): δ(ppm)=7.74-7.90 (m, ArH, 15H), 7.00-7.48 (m, ArH, 8H), 4.68 (s, CH, 1H), 4.41 (s, CH, 1H), 2.95-3.02 (m, CH, 1H), 1.86-2.04 (m, CH2, 2H)

Preparation of Resist Compositions

Examples 1a to 36a and Comparative Examples 1a to 16a

Components shown in Tables 2 to 5 were mixed and dissolved to prepare resist compositions of respective examples.

TABLE 2

|  | Component (A) | | Component (B) | | Component (D) | | |
| --- | --- | --- | --- | --- | --- | --- | --- |
|  | Component (A1a) | Component (A2a) | Component (B1a) | Component (B2a) | Component (D1a) | Component (D2a) | Component (S) |
| Comparative Example 1a | — | (A2a)-1 [100] | (B1a)-3 [20.5] | — | — | (D2a)-3 [4.5] | (S)-1 [6400] |
| Comparative Example 2a | — | (A2a)-2 [100] | — | (B2a)-1 [17.4] | (D1a)-1 [5.3] | — | (S)-1 [6400] |
| Comparative Example 3a | (A1a)-1 [100] | — | — | (B2a)-1 [17.4] | — | (D2a)-3 [4.5] | (S)-1 [6400] |
| Example 1a | (A1a)-1 [100] | — | — | (B2a)-1 [17.4] | (D1a)-1 [5.3] | — | (S)-1 [6400] |
| Example 2a | (A1a)-1 [100] | — | (B1a)-3 [20.5] | — | — | (D2a)-3 [4.5] | (S)-1 [6400] |
| Example 3a | (A1a)-1 [100] | — | (B1a)-3 [20.5] | — | (D1a)-2 [4.8] | — | (S)-1 [6400] |
| Example 4a | (A1a)-1 [100] | — | (B1a)-6 [25.6] | — | — | (D2a)-3 [4.5] | (S)-1 [6400] |
| Comparative Example 4a | (A1a)-4 [100] | — | — | (B2a)-1 [17.4] | — | (D2a)-3 [4.5] | (S)-1 [6400] |

TABLE 2-continued

| | Component (A) | | Component (B) | | Component (D) | | |
| --- | --- | --- | --- | --- | --- | --- | --- |
| | Component (A1a) | Component (A2a) | Component (B1a) | Component (B2a) | Component (D1a) | Component (D2a) | Component (S) |
| Comparative Example 5a | — | (A2a)-1 [100] | (B1a)-3 [20.5] | — | — | (D2a)-3 [4.5] | (S)-1 [6400] |
| Example 5a | (A1a)-2 [100] | — | (B1a)-3 [20.5] | — | — | (D2a)-3 [4.5] | (S)-1 [6400] |
| Example 6a | (A1a)-4 [100] | — | (B1a)-3 [20.5] | — | — | (D2a)-3 [4.5] | (S)-1 [6400] |
| Example 7a | (A1a)-5 [100] | — | (B1a)-3 [20.5] | — | — | (D2a)-3 [4.5] | (S)-1 [6400] |
| Example 8a | (A1a)-9 [100] | — | (B1a)-3 [20.5] | — | — | (D2a)-3 [4.5] | (S)-1 [6400] |
| Comparative Example 6a | (A1a)-1 [100] | — | — | (B2a)-1 [17.4] | — | (D2a)-1 [3.8] | (S)-1 [6400] |
| Comparative Example 7a | — | (A2a)-1 [100] | (B1a)-4 [18.8] | — | — | (D2a)-1 [3.8] | (S)-1 [6400] |
| Example 9a | (A1a)-1 [100] | — | (B1a)-4 [18.8] | — | — | (D2a)-1 [3.8] | (S)-1 [6400] |
| Example 10a | (A1a)-3 [100] | — | (B1a)-4 [18.8] | — | — | (D2a)-1 [3.8] | (S)-1 [6400] |
| Example 11a | (A1a)-10 [100] | — | (B1a)-4 [18.8] | — | — | (D2a)-1 [3.8] | (S)-1 [6400] |

TABLE 3

| | Component (A) | | Component (B) | | Component (D) | | |
| --- | --- | --- | --- | --- | --- | --- | --- |
| | Component (A1a) | Component (A2a) | Component (B1a) | Component (B2a) | Component (D1a) | Component (D2a) | Component (S) |
| Comparative Example 8a | (A1a)-9 [100] | — | — | (B2a)-1 [17.4] | — | (D2a)-2 [4.1] | (S)-1 [6400] |
| Comparative Example 9a | — | (A2a)-1 [100] | (B1a)-2 [20.0] | — | — | (D2a)-2 [4.1] | (S)-1 [6400] |
| Example 12a | (A1a)-7 [100] | — | (B1a)-2 [20.0] | — | — | (D2a)-2 [4.1] | (S)-1 [6400] |
| Example 13a | (A1a)-8 [100] | — | (B1a)-2 [20.0] | — | — | (D2a)-2 [4.1] | (S)-1 [6400] |
| Example 14a | (A1a)-9 [100] | — | (B1a)-2 [20.0] | — | — | (D2a)-2 [4.1] | (S)-1 [6400] |
| Comparative Example 10a | — | (A2a)-1 [100] | — | (B2a)-1 [17.4] | (D1a)-1 [5.3] | — | (S)-1 [6400] |
| Example 15a | (A1a)-9 [100] | — | — | (B2a)-1 [17.4] | (D1a)-1 [5.3] | — | (S)-1 [6400] |
| Example 16a | (A1a)-13 [100] | — | — | (B2a)-1 [17.4] | (D1a)-1 [5.3] | — | (S)-1 [6400] |
| Example 17a | (A1a)-11 [100] | — | — | (B2a)-1 [17.4] | (D1a)-1 [5.3] | — | (S)-1 [6400] |
| Example 18a | (A1a)-12 [100] | — | — | (B2a)-1 [17.4] | (D1a)-1 [5.3] | — | (S)-1 [6400] |

TABLE 4

| | Component (A) | | Component (B) | | Component (D) | | |
| --- | --- | --- | --- | --- | --- | --- | --- |
| | Component (A1a) | Component (A2a) | Component (B1a) | Component (B2a) | Component (D1a) | Component (D2a) | Component (S) |
| Comparative Example 11a | — | (A2a)-4 [100] | — | (B2a)-1 [17.4] | (D1a)-1 [5.3] | — | (S)-1 [6400] |
| Example 19a | (A1a)-14 [100] | — | — | (B2a)-1 [17.4] | (D1a)-1 [5.3] | — | (S)-1 [6400] |
| Example 20a | (A1a)-14 [100] | — | (B1a)-3 [20.5] | — | — | (D2a)-1 [3.8] | (S)-1 [6400] |
| Example 21a | (A1a)-14 [100] | — | (B1a)-3 [20.5] | — | (D1a)-2 [4.8] | — | (S)-1 [6400] |
| Example 22a | (A1a)-14 [100] | — | (B1a)-6 [25.6] | — | — | (D2a)-1 [3.8] | (S)-1 [6400] |
| Comparative Example 12a | (A1a)-17 [100] | — | — | (B2a)-1 [17.4] | — | (D2a)-2 [4.1] | (S)-1 [6400] |
| Example 23a | (A1a)-15 [100] | — | — | (B2a)-1 [17.4] | (D1a)-2 [4.8] | — | (S)-1 [6400] |

TABLE 4-continued

| | Component (A) | | Component (B) | | Component (D) | | |
|---|---|---|---|---|---|---|---|
| | Component (A1a) | Component (A2a) | Component (B1a) | Component (B2a) | Component (D1a) | Component (D2a) | Component (S) |
| Example 24a | (A1a)-17 [100] | — | — | (B2a)-1 [17.4] | (D1a)-2 [4.8] | — | (S)-1 [6400] |
| Example 25a | (A1a)-18 [100] | — | — | (B2a)-1 [17.4] | (D1a)-2 [4.8] | — | (S)-1 [6400] |
| Example 26a | (A1a)-19 [100] | — | — | (B2a)-1 [17.4] | (D1a)-2 [4.8] | — | (S)-1 [6400] |
| Comparative Example 13a | (A1a)-14 [100] | — | — | (B2a)-1 [17.4] | — | (D2a)-3 [4.5] | (S)-1 [6400] |
| Comparative Example 14a | — | (A2a)-4 [100] | (B1a)-5 [18.5] | — | — | (D2a)-3 [4.5] | (S)-1 [6400] |
| Example 27a | (A1a)-16 [100] | — | (B1a)-5 [18.5] | — | — | (D2a)-3 [4.5] | (S)-1 [6400] |
| Example 28a | (A1a)-25 [100] | — | (B1a)-5 [18.5] | — | — | (D2a)-3 [4.5] | (S)-1 [6400] |

TABLE 5

| | Component (A) | | Component (B) | | Component (D) | | |
|---|---|---|---|---|---|---|---|
| | Component (A1a) | Component (A2a) | Component (B1a) | Component (B2a) | Component (D1a) | Component (D2a) | Component (S) |
| Comparative Example 15a | (A1a)-22 [100] | — | — | (B2a)-1 [17.4] | — | (D2a)-3 [4.5] | (S)-1 [6400] |
| Example 29a | (A1a)-20 [100] | — | (B1a)-3 [20.5] | — | (D1a)-2 [4.8] | — | (S)-1 [6400] |
| Example 30a | (A1a)-21 [100] | — | (B1a)-3 [20.5] | — | (D1a)-2 [4.8] | — | (S)-1 [6400] |
| Example 31a | (A1a)-22 [100] | — | (B1a)-3 [20.5] | — | (D1a)-2 [4.8] | — | (S)-1 [6400] |
| Comparative Example 16a | (A1a)-14 [100] | — | — | (B2a)-1 [17.4] | — | (D2a)-3 [4.5] | (S)-1 [6400] |
| Example 32a | (A1a)-24 [100] | — | (B1a)-1 [18.8] | — | (D1a)-1 [5.3] | — | (S)-1 [6400] |
| Example 33a | (A1a)-23 [100] | — | (B1a)-1 [18.8] | — | (D1a)-1 [5.3] | — | (S)-1 [6400] |
| Example 34a | (A1a)-26 [100] | — | (B1a)-4 [18.8] | — | — | (D2a)-3 [4.5] | (S)-1 [6400] |
| Example 35a | (A1a)-27 [100] | — | (B1a)-4 [18.8] | — | — | (D2a)-3 [4.5] | (S)-1 [6400] |
| Example 36a | (A1a)-28 [100] | — | (B1a)-4 [18.8] | — | — | (D2a)-3 [4.5] | (S)-1 [6400] |

In Tables 2 to 5, respective abbreviations have the following meanings. The values in brackets [ ] indicate the amount (in terms of parts by mass) of the component added.

(A1a)-1 to (A1a)-5: the copolymers (A1a-1-1) to (A1a-1-5)

(A1a)-7 to (A1a)-28: the copolymers (A1a-1-7) to (A1a-1-28)

(A2a)-1 to (A2a)-3: the copolymers (A2a-1) to (A2a-3)

(B1a)-1 to (B1a)-6: acid generators including compounds represented by the chemical formulae (B1a-1) to (B1a-6)

(D1a)-1 to (D1a)-2: acid diffusion control agents including compounds represented by the chemical formulae (D1a-1) to (D1a-2)

(B2a)-1: acid generator including a compound represented by the following chemical formula (B2a-1)

(D2a)-1 to (D2a)-3: acid diffusion control agents including compounds represented by the following chemical formulae (D2a-1) to (D2a-3)

(S)-1: mixed solvent containing propylene glycol monomethyl ether acetate/propylene glycol monomethyl ether=6/4 (mass ratio)

[Chem. 193]

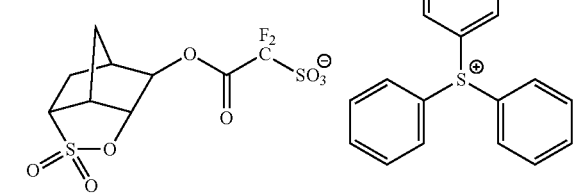

(B2a-1)

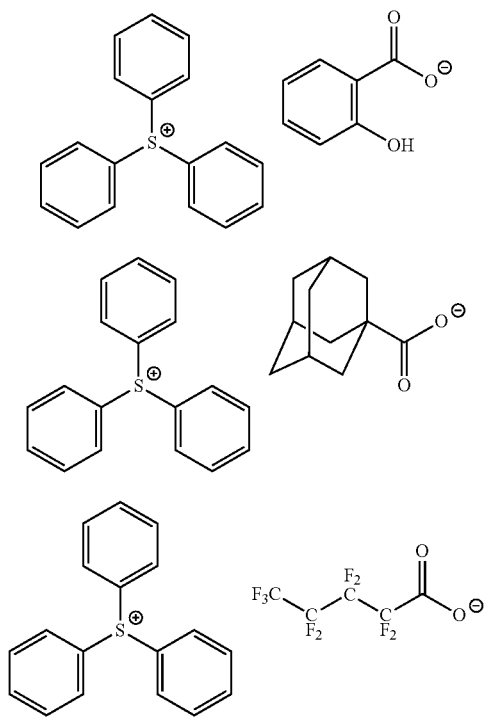

<Formation of Resist Pattern>

Process (i):

The resist compositions of respective examples were implied to 8-inch silicon substrates subjected to a hexamethyldisilazane (HMDS) treatment using a spinner, and a pre-baking (PAB) treatment was performed on a hot plate at a temperature of 110° C. for 60 seconds, and drying was performed, and thereby resist films with a film thickness of 50 nm were formed.

Process (ii):

Next, drawing (exposure) was performed on the resist film using an electron beam lithography system JEOL JBX-9300FS (commercially available from JEOL Ltd.) at an acceleration voltage of 100 kV to obtain a 1:1 line and space pattern (hereinafter referred to as an "LS pattern") with a target size of a line width of 50 nm. Then, a heating (PEB) treatment was performed after exposure at 100° C. for 60 seconds.

Process (iii):

Next, alkali developing was performed using in a 2.38 mass % tetramethylammonium hydroxide (TMAH) aqueous solution "NMD-3" (product name, commercially available from Tokyo Ohka Kogyo Co., Ltd.) at 23° C. for 60 seconds.

Then, water rinsing was conducted for 15 seconds using pure water.

As a result, a 1:1 LS pattern with a line width of 50 nm was formed.

[Evaluation of Optimum Exposure Dose (Eop)]

An optimum exposure dose Eop ($\mu C/cm^2$) at which an LS pattern with a target size was formed according to the method of forming a resist pattern was obtained. This is shown as "Eop($\mu C/cm^2$)" in Tables 6 to 9.

[Evaluation of Line Width Roughness (LWR)]

$3\sigma$ which is a scale showing LWR was obtained from the LS pattern formed in the above <Formation of resist pattern>. This is shown as "LWR (nm)" in Tables 6 to 9.

"$3\sigma$" (unit: nm) indicates a value of 3 times ($3\sigma$) the standard deviation ($\sigma$) obtained from measurement results when the line positions at 400 points in the longitudinal direction of the line were measured using a scanning electron microscope (an acceleration voltage of 800 V, product name: S-9380, commercially available from Hitachi High-Technologies Corporation).

The smaller this $3\sigma$ value, the lower the level of roughness on the side walls of the line, indicating that an LS pattern with a more uniform width was obtained.

[Evaluation of PEB Margin]

LS patterns were formed by changing heating (PEB) treatment conditions (a baking temperature and a heating time) after exposure in the process (ii) in the above <Formation of resist pattern> to 100° C. for 60 seconds and 110° C. for 60 second. An optimum exposure dose at 100° C. and an optimum exposure dose at 110° C. were determined, and according to the following evaluation criteria, and a PEB margin was evaluated using a difference of change in sensitivity between two as an index. This is shown as "PEB margin" in Tables 6 to 9.

Evaluation Criteria

A: change in sensitivity was less than 10%

B: change in sensitivity was 10% or more

TABLE 6

| | PAB (° C.) | PEB (° C.) | Eop ($\mu C/cm^2$) | LWR (nm) | PEB margin |
|---|---|---|---|---|---|
| Comparative Example 1a | 110 | 100 | 140 | 5.5 | B |
| Comparative Example 2a | 110 | 100 | 155 | 6.1 | B |
| Comparative Example 3a | 110 | 100 | 150 | 5.8 | B |
| Example 1a | 110 | 100 | 150 | 4.9 | A |
| Example 2a | 110 | 100 | 130 | 5.1 | A |
| Example 3a | 110 | 100 | 125 | 4.7 | A |
| Example 4a | 110 | 100 | 135 | 5.2 | A |
| Comparative Example 4a | 110 | 100 | 135 | 5.5 | B |
| Comparative Example 5a | 110 | 100 | 145 | 5.5 | B |
| Example 5a | 110 | 100 | 125 | 4.8 | A |
| Example 6a | 110 | 100 | 120 | 5.0 | A |
| Example 7a | 110 | 100 | 125 | 5.0 | A |
| Example 8a | 110 | 100 | 110 | 5.1 | A |
| Comparative Example 6a | 110 | 100 | 145 | 5.8 | B |
| Comparative Example 7a | 110 | 100 | 135 | 5.4 | B |
| Example 9a | 110 | 100 | 125 | 4.8 | A |
| Example 10a | 110 | 100 | 115 | 4.8 | A |
| Example 11a | 110 | 100 | 130 | 4.5 | A |

TABLE 7

| | PAB (° C.) | PEB (° C.) | Eop ($\mu C/cm^2$) | LWR (nm) | PEB margin |
|---|---|---|---|---|---|
| Comparative Example 8a | 110 | 100 | 150 | 5.5 | B |
| Comparative Example 9a | 110 | 100 | 140 | 5.4 | B |
| Example 12a | 110 | 100 | 135 | 4.7 | A |
| Example 13a | 110 | 100 | 120 | 4.8 | A |
| Example 14a | 110 | 100 | 125 | 4.9 | A |
| Comparative Example 10a | 110 | 100 | 140 | 5.6 | B |
| Example 15a | 110 | 100 | 135 | 5.1 | A |
| Example 16a | 110 | 100 | 130 | 4.7 | A |

TABLE 7-continued

|  | PAB (° C.) | PEB (° C.) | Eop (μC/cm²) | LWR (nm) | PEB margin |
|---|---|---|---|---|---|
| Example 17a | 110 | 100 | 125 | 4.8 | A |
| Example 18a | 110 | 100 | 135 | 5.0 | A |

TABLE 8

|  | PAB (° C.) | PEB (° C.) | Eop (μC/cm²) | LWR (nm) | PEB margin |
|---|---|---|---|---|---|
| Comparative Example 11a | 110 | 100 | 125 | 6.8 | B |
| Example 19a | 110 | 100 | 120 | 5.2 | A |
| Example 20a | 110 | 100 | 110 | 5.2 | A |
| Example 21a | 110 | 100 | 105 | 4.7 | A |
| Example 22a | 110 | 100 | 115 | 5.3 | A |
| Comparative Example 12a | 110 | 100 | 105 | 5.6 | B |
| Example 23a | 110 | 100 | 100 | 5.3 | A |
| Example 24a | 110 | 100 | 95 | 5.2 | A |
| Example 25a | 110 | 100 | 100 | 5.3 | A |
| Example 26a | 110 | 100 | 90 | 5.1 | A |
| Comparative Example 13a | 110 | 100 | 120 | 5.6 | B |
| Comparative Example 14a | 110 | 100 | 125 | 6.3 | B |
| Example 27a | 110 | 100 | 100 | 4.8 | A |
| Example 28a | 110 | 100 | 120 | 4.4 | A |

TABLE 9

|  | PAB (° C.) | PEB (° C.) | Eop (μC/cm²) | LWR (nm) | PEB margin |
|---|---|---|---|---|---|
| Comparative Example 15a | 110 | 100 | 130 | 5.5 | B |
| Example 29a | 110 | 100 | 115 | 4.6 | A |
| Example 30a | 110 | 100 | 110 | 4.8 | A |
| Example 31a | 110 | 100 | 120 | 4.7 | A |
| Comparative Example 16a | 110 | 100 | 120 | 5.8 | B |
| Example 32a | 110 | 100 | 90 | 5.1 | A |
| Example 33a | 110 | 100 | 115 | 4.9 | A |
| Example 34a | 110 | 100 | 110 | 4.8 | A |
| Example 35a | 110 | 100 | 115 | 5.0 | A |
| Example 36a | 110 | 100 | 105 | 4.6 | A |

Based on the results shown in Tables 6 to 9, it was confirmed that, according to the resist compositions of the examples to which the present invention was applied, high sensitivity was achieved in the formation of the resist pattern and a resist pattern having a favorable shape with reduced roughness was formed.

In addition, in the resist compositions of the examples to which the present invention was applied, it was confirmed that the PEB margin in the formation of the resist pattern was wide and favorable.

Embodiment b

Production Example of Monomer (a0-1b7)>

With reference to synthesis examples according to paragraph 0087 and paragraph 0090 in PCT International Publication No. WO 2013/042694, synthesis was performed using methyl 2,2-dimethyl-3-methoxypropionate or the like as a raw material, and a desired monomer (a0-1b7), that is, 1-(2'-methoxy-1',1'-dimethylethyl)cyclopentan-1-yl-methacrylate having the following NMR characteristics was obtained.

[Chem. 194]

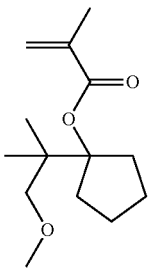

(a0-1b7)

NMR measurement was performed for the obtained monomer (a0-1b7), and structures thereof were identified from the following results.

$^1$H-NMR(CDCl$_3$) δ(ppm)=6.00 (m, 1H), 5.47 (m, 1H), 3.10 (s, 3H), 3.08 (s, 2H), 2.20-2.12 (m, 2H) 2.05-1.95 (m, 4H), 1.93 (t, 3H), 1.60-1.50 (m, 2H), 1.02 (s, 6H).

Production Example of Copolymer (A1b-1-1)

10.0 g of the monomer (a01-1pre), 9.5 g of the monomer (a0-1b1), and 1.4 g of azobis(isobutyric acid)dimethyl (V-601) as a polymerization initiator were dissolved in 50.0 g of MEK (methyl ethyl ketone) and heated at 85° C. under a nitrogen atmosphere and stirred for 5 hours. Then, 9.4 g of acetic acid and 160 g of methanol were added to the reaction solution, and a deprotection reaction was caused at 30° C. for 8 hours. After the reaction was completed, the obtained reaction solution was precipitated in 2,500 g of heptane and washed. The obtained white solid substance was filtered off and dried under a reduced pressure overnight to obtain 10.1 g of a desired copolymer (A1b-1-1).

[Chem. 195]

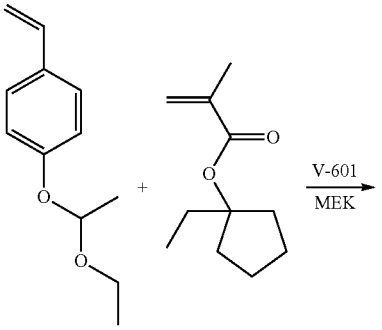

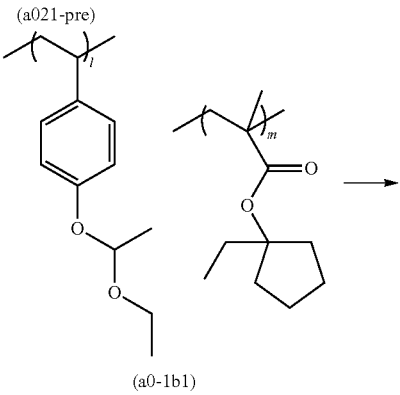

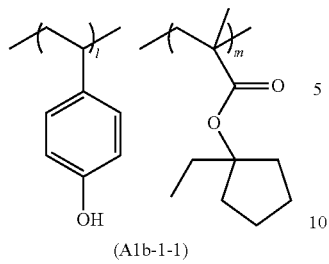

(A1b-1-1)

Regarding the obtained copolymer (A1b-1-1), a weight average molecular weight (Mw) in terms of polystyrene standards obtained through GPC measurement was 7,200 and a molecular weight dispersity (Mw/Mn) was 1.69. The copolymer composition ratio (ratio (molar ratio) of respective structural units in the structural formula) obtained through $^{13}$C-NMR was l/m=50/50.

Production Examples of Copolymer (A1b-1-2) to Copolymer (A1b-1-22), and Copolymer (A2b-1) to Copolymer (A2b-4)

The copolymer (A1b-1-2) to copolymer (A1b-1-22), and copolymer (A2b-1) to copolymer (A2b-4) were synthesized in the same method of the above production example of copolymer (A1b-1-1) except that the following monomers deriving structural units constituting the copolymers were used in a predetermined molar ratio.

[Chem. 196]

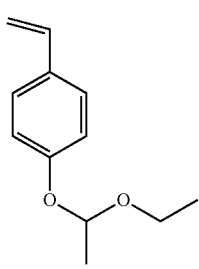
(a021-pre)

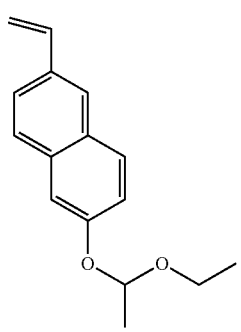
(a022-pre)

[Chem. 197]

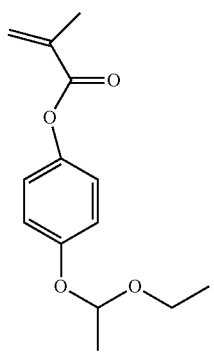
(a023-pre)

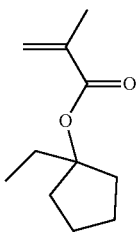
(a0-1b1)

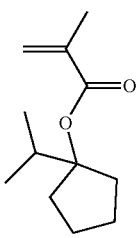
(a0-1b2)

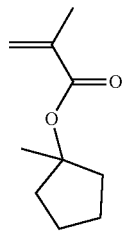
(a0-1b3)

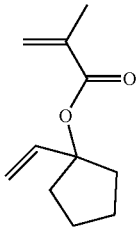
(a0-1b4)

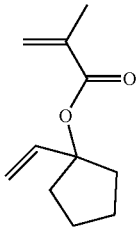
(a0-1b5)

(a0-1b6) 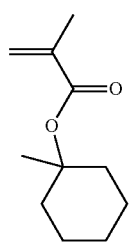
(a0-1b7) 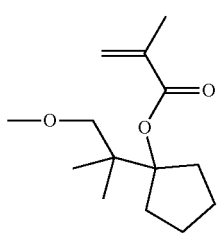
(a0-1b8) 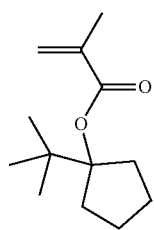
(a0-1b9) 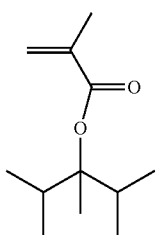
(a0-1b10) 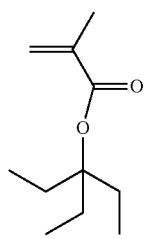
(a0-1b11) 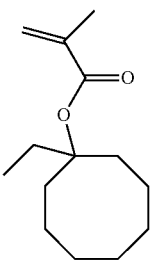
(a0-1b12) 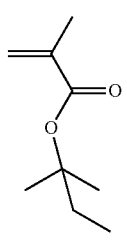
(a0-1b13) 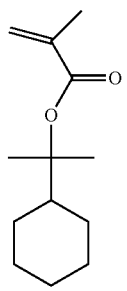
(a0-1b14) 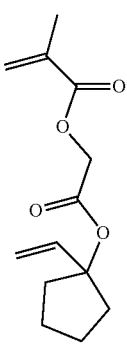
(a0-1b15) 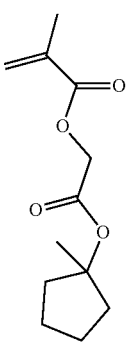
[Chem. 198]
(a31) 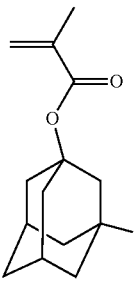

(a21) 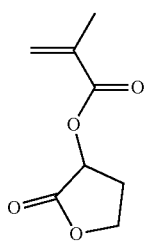

(a22) 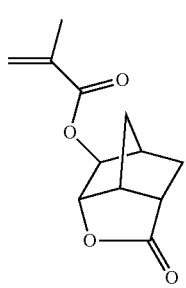

(a1-1b) 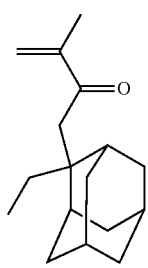

(a1-2b) 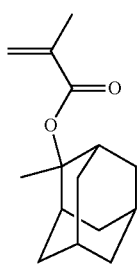

Production Example of Copolymer (A2b-5p

The copolymer (A2b-5) was obtained using predetermined amounts of the monomer (a0-1b1) and the monomer (a22) and 2,2'-azobis(2-methylpropionic acid)dimethyl (V-601) as a polymerization initiator according to known radical polymerization.

The copolymer (A1b-1-1) to copolymer (A1b-1-22), and copolymer (A2b-1) to copolymer (A2b-5) obtained according to the above production examples are shown below.

[Chem. 199]

(A1b-1-1) 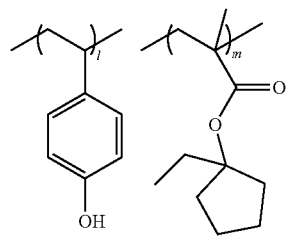

(A1b-1-2) 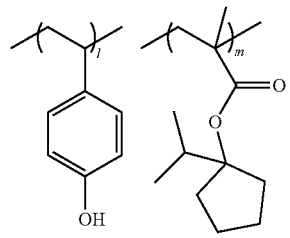

(A1b-1-3) 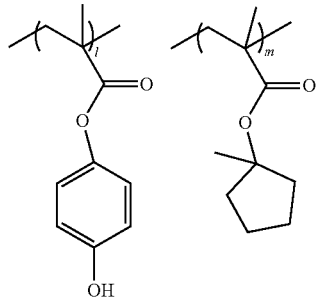

(A1b-1-4) 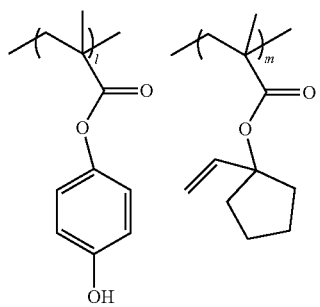

(A1b-1-5) 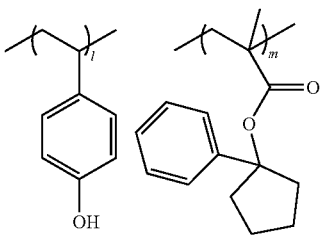

(A1b-1-6) 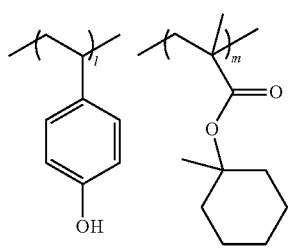

(A1b-1-7)
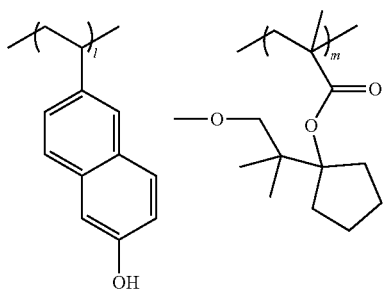
(A1b-1-8)
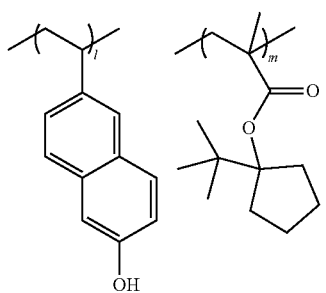
(A1b-1-9)
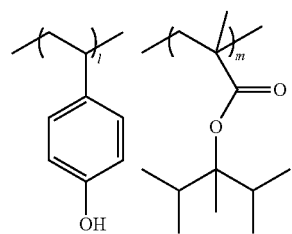
(A1b-1-10)
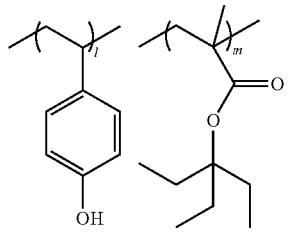
(A1b-1-11)
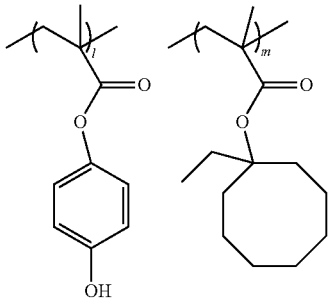
(A1b-1-12)
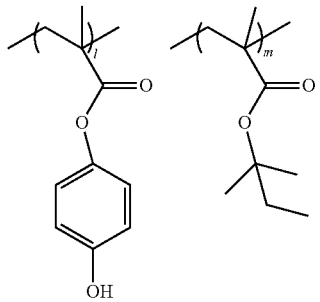
(A1b-1-13)
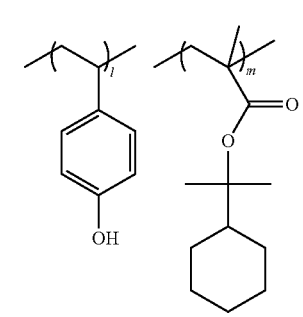
(A1b-1-14)
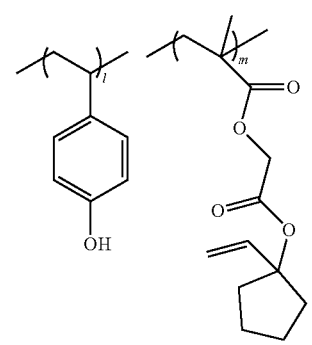
(A1b-1-15)
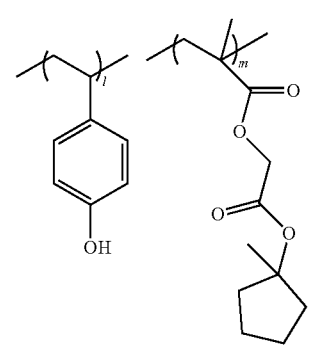
[Chem. 200]
(A1b-1-16)
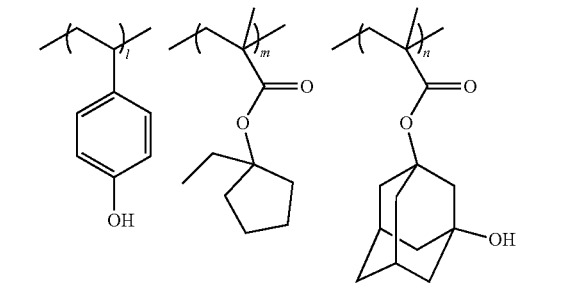

(A1b-1-17)
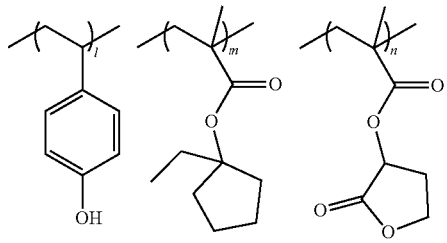
(A1b-1-18)
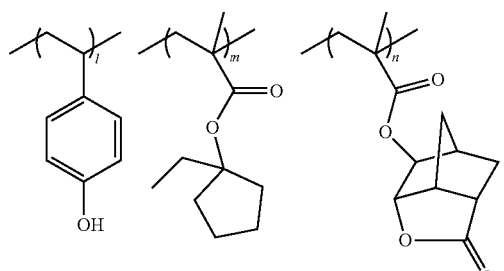
(A1b-1-19)
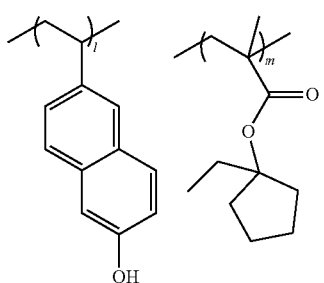
(A1b-1-20)
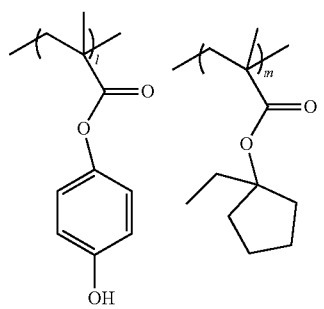
(A1b-1-21)
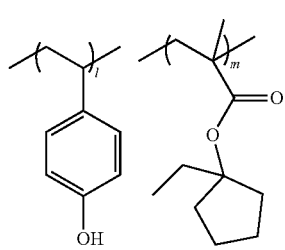
(A1b-1-22)
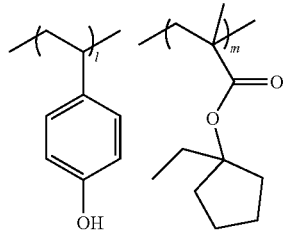
[Chem. 201]
(A2b-1)
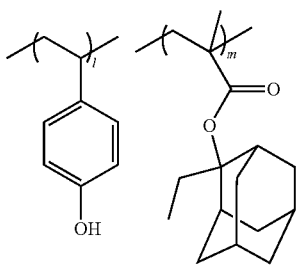
(A2b-2)
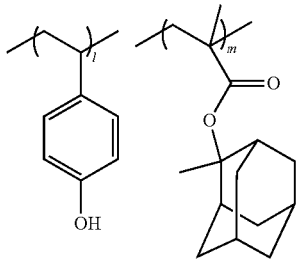
(A2b-3)
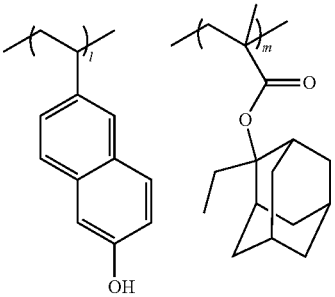
(A2b-4)
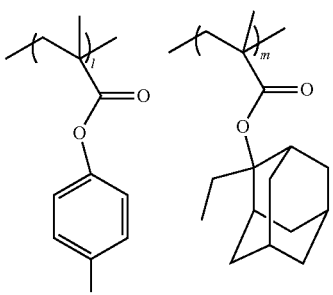
(A2b-5)
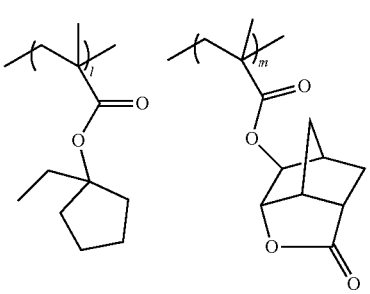
Regarding the obtained copolymers, a copolymer composition ratio (a ratio (molar ratio) of structural units derived from monomers) of the copolymer obtained through $^{13}$C-NMR, a weight average molecular weight (Mw) and a molecular weight dispersity (Mw/Mn) in terms of polystyrene standards obtained through GPC measurement are shown together in Table 10.

Here, a structural unit represented by the following chemical formula (a021) constituting the copolymer is a structural unit derived from the monomer represented by the chemical formula (a021-pre). Similarly, a structural unit represented by the following chemical formula (a022) is a structural unit derived from the monomer represented by the chemical formula (a022-pre). A structural unit represented by the following chemical formula (a023) is a structural unit derived from the monomer represented by the chemical formula (a023-pre).

[Chem. 202]

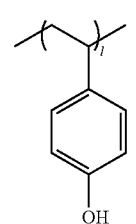

(a021)

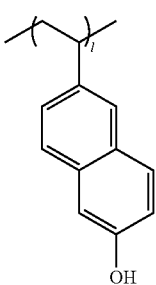

(a022)

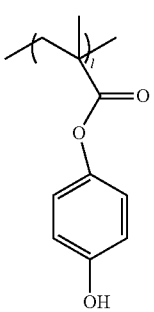

(a023)

TABLE 10

| Copolymer | Copolymer composition ratio (molar ratio) of copolymer | Weight average molecular weight (Mw) | Molecular weight dispersity (Mw/Mn) |
|---|---|---|---|
| (A1b-1-1) | (a021)/(a0-1b1) = 50/50 | 7200 | 1.69 |
| (A1b-1-2) | (a021)/(a0-1b2) = 50/50 | 6100 | 1.59 |
| (A1b-1-3) | (a023)/(a0-1b3) = 50/50 | 7900 | 1.74 |
| (A1b-1-4) | (a023)/(a0-1b4) = 50/50 | 7300 | 1.70 |
| (A1b-1-5) | (a021)/(a0-1b5) = 50/50 | 7200 | 1.71 |
| (A1b-1-6) | (a021)/(a0-1b6) = 50/50 | 7500 | 1.78 |
| (A1b-1-7) | (a022)/(a0-1b7) = 50/50 | 6500 | 1.67 |
| (A1b-1-8) | (a022)/(a0-1b8) = 50/50 | 8200 | 1.62 |
| (A1b-1-9) | (a021)/(a0-1b9) = 50/50 | 8300 | 1.61 |
| (A1b-1-10) | (a021)/(a0-1b10) = 50/50 | 6900 | 1.67 |

TABLE 10-continued

| Copolymer | Copolymer composition ratio (molar ratio) of copolymer | Weight average molecular weight (Mw) | Molecular weight dispersity (Mw/Mn) |
|---|---|---|---|
| (A1b-1-11) | (a023)/(a0-1b11) = 50/50 | 7800 | 1.76 |
| (A1b-1-12) | (a023)/(a0-1b12) = 50/50 | 8200 | 1.62 |
| (A1b-1-13) | (a021)/(a0-1b13) = 50/50 | 8500 | 1.62 |
| (A1b-1-14) | (a021)/(a0-1b14) = 50/50 | 7000 | 1.72 |
| (A1b-1-15) | (a021)/(a0-1b15) = 50/50 | 7300 | 1.72 |
| (A1b-1-16) | (a021)/(a0-1b1)/(a31) = 30/60/10 | 6800 | 1.69 |
| (A1b-1-17) | (a021)/(a0-1b1)/(a21) = 30/60/10 | 7200 | 1.77 |
| (A1b-1-18) | (a021)/(a0-1b1)/(a22) = 30/60/10 | 7500 | 1.76 |
| (A1b-1-19) | (a022)/(a0-1b1) = 50/50 | 7400 | 1.73 |
| (A1b-1-20) | (a023)/(a0-1b1) = 50/50 | 7100 | 1.68 |
| (A1b-1-21) | (a021)/(a0-1b1) = 40/60 | 6700 | 1.80 |
| (A1b-1-22) | (a021)/(a0-1b1) = 30/70 | 7500 | 1.69 |
| (A2b-1) | (a021)/(a1-1b) = 50/50 | 7200 | 1.62 |
| (A2b-2) | (a021)/(a1-2b) = 50/50 | 6800 | 1.73 |
| (A2b-3) | (a022)/(a1-1b) = 50/50 | 8100 | 1.71 |
| (A2b-4) | (a023)/(a1-1b) = 50/50 | 7100 | 1.79 |
| (A2b-5) | (a0-1b1)/(a22) = 50/50 | 6300 | 1.58 |

Production of Compounds

Production Examples 1b to 8b

Precursors (Bpre-1) to (Bpre-8) were obtained in the same manner as in the production examples 1a to 8a Here, Bre-6 in the production example 6a was obtained as follows.

The intermediate 3 (6.0 g, 22 mmol), 5-hydroxy norbornane 2,6-lactone (4.0 g, 26 mmol), and dichloromethane (120 g) were put into a 100 mL 3-neck flask, and stirred and dissolved at room temperature. Next, dimethylaminopyridine (0.13 g, 1 mmol) and triethylamine (5.5 g, 54 mmol) were put thereinto, and the mixture was reacted at room temperature for 24 hours. Ultra pure water (120 g) was put thereinto and stirred, and hydrochloric acid was then added so that an aqueous layer became acidic for neutralization, and stirring was additionally performed for 30 minutes, and the aqueous layer was dien removed. An organic layer was washed with ultra pure water (120 g) 3 times, and the organic layer was concentrated using a rotary evaporator to obtain an intermediate 4 (7.2 g, yield=77.1%).

[Chem. 203]

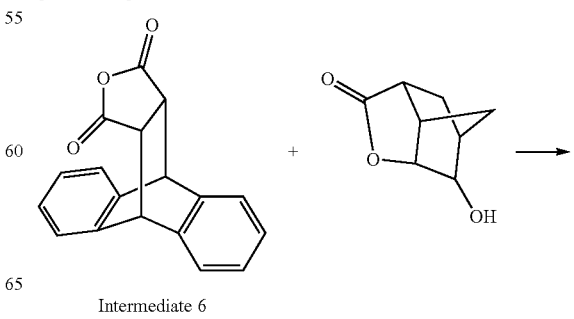

Intermediate 6

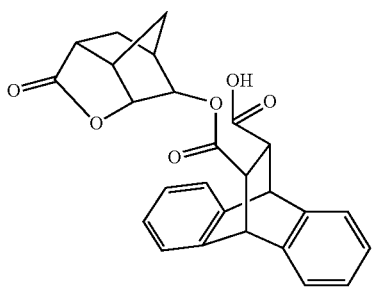

Intermediate 5

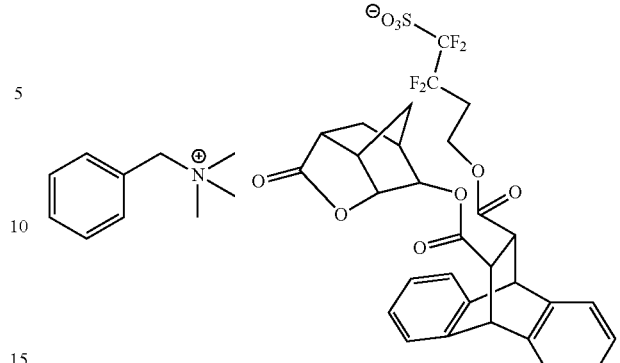

Bpre-6

The intermediate 5 (4.0 g, 16 mmol), the compound (Ib-1) (6.0 g, 16 mmol), and dichloromethane (87 g) were put into a 100 mL 3-neck flask, and stirred and dissolved at room temperature.

Next, diisopropylcarbodiimide (2.2 g, 18 mmol) and dimethylaminopyridine (0.098 g, 0.8 mmol) were put thereinto, and the mixture was reacted at room temperature for 5 hours. The reaction solution was filtered, and the filtrate was concentrated using a rotary evaporator. The concentrate was dissolved in acetonitrile (17 g) and dien added dropwise to MTBE (170 g), and the precipitated solid was filtered off. The filtrate was dissolved again in acetonitrile (17 g), and added dropwise to MTBE (170 g), and the precipitated solid was filtered off. This operation was repeated twice, and the filtrate was then dried under a reduced pressure to obtain a precursor (Bpre-6) (6.6 g, yield=53.1%).

[Chem. 204]

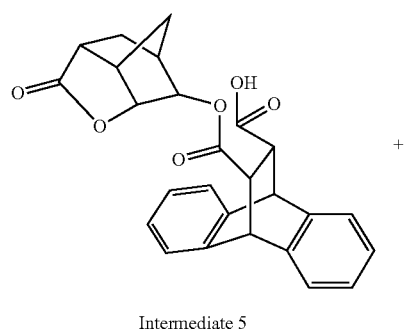

Intermediate 5

+

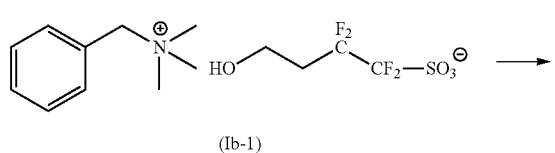

(Ib-1)

Production Example 9b

Carbon dioxide was introduced into a Grignard reagent at 25 to 35° C. prepared using 9-bromotriptycene (20.0 g, 60 mmol), magnesium (1.6 g, 66 mmol), and THF (400 g) by a general method, and the mixture was reacted at room temperature for 2 hours. Ultra pure water (400 g) was added to the reaction solution, stirring was performed for 1 hour, and hydrochloric acid was then added thereto until the solution became acidic, and the precipitate was filtered off. The filtrate was washed with ultra pure water (100 g) twice, and washed with methanol (50 g) twice. Drying was performed under a reduced pressure to obtain an intermediate 7. The intermediate 7 (5.0 g, 17 mmol), sodium hydroxide (0.74 g, 18 mmol), and benzyltrimethylammonium chloride (3.1 g, 17 mmol) were dissolved in ultra pure water (100 g). Then, dichloromethane (50 g) was added thereto, and the mixture was stirred for 30 minutes, and an aqueous layer was then removed. An organic layer was washed with ultra pure water (50 g) 3 times and the organic layer was concentrated using a rotary evaporator to obtain a precursor B-pre9 (2.6 g, yield=34.0%).

[Chem. 205]

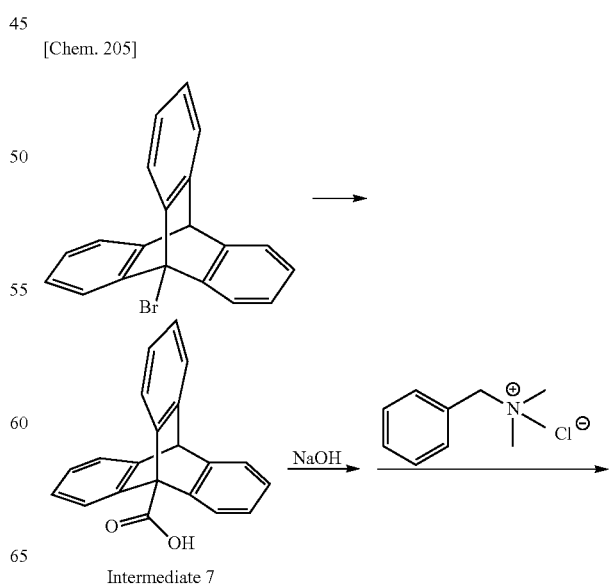

Intermediate 7

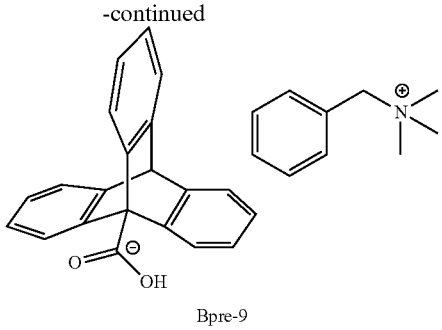

Bpre-9

Production Example of Compound (B1b-3)

The precursor (Bpre-4) (3.8 g, 9.2 mmol) and the compound A for salt exchange (2.8 g, 9.2 mmol) were dissolved in dichloromethane (60 g) and ultra pure water (60 g) was added thereto, and the mixture was reacted at room temperature for 30 minutes. After the reaction was completed, an aqueous phase was removed and an organic phase was then washed with ultra pure water (60 g) 4 times. The organic phase was concentrated and dried using a rotary evaporator to obtain a compound (B1b-3) (5.4 g, yield=89.0%).

[Chem. 206]

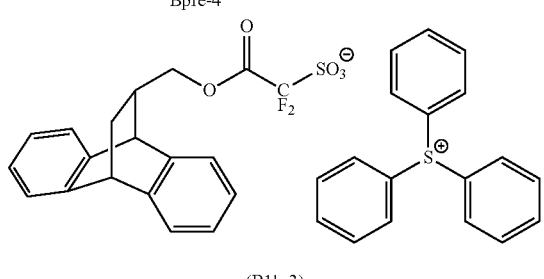

Compound A

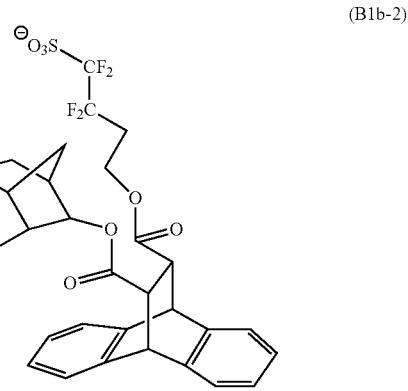

Bpre-4

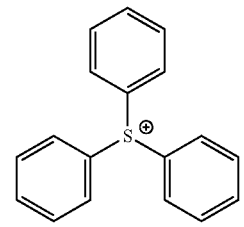

(B1b-3)

Production Examples of Other Compounds

The following compound (B1b-1) to compound (B1b-6), and compound (D1b-1) to compound (D1b-3) were obtained in the same manner as in the above "production example of compound (B1b-3)" except that combinations of the precursor (Bpre-1) to precursor (Bpre-9), and the compound A for salt exchange were changed.

NMR measurement was performed for the obtained compounds, and structures thereof were identified from the following analysis results.

[Chem. 207]

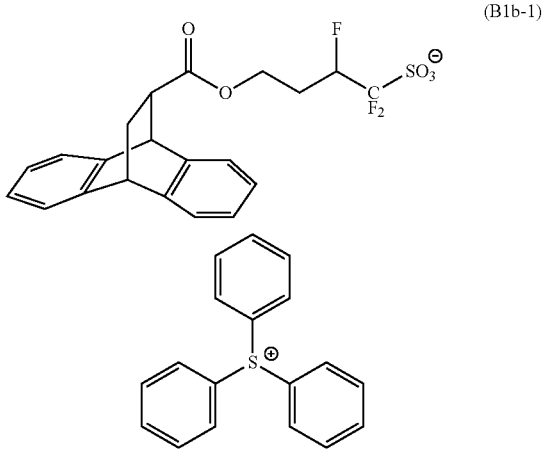

(B1b-1)

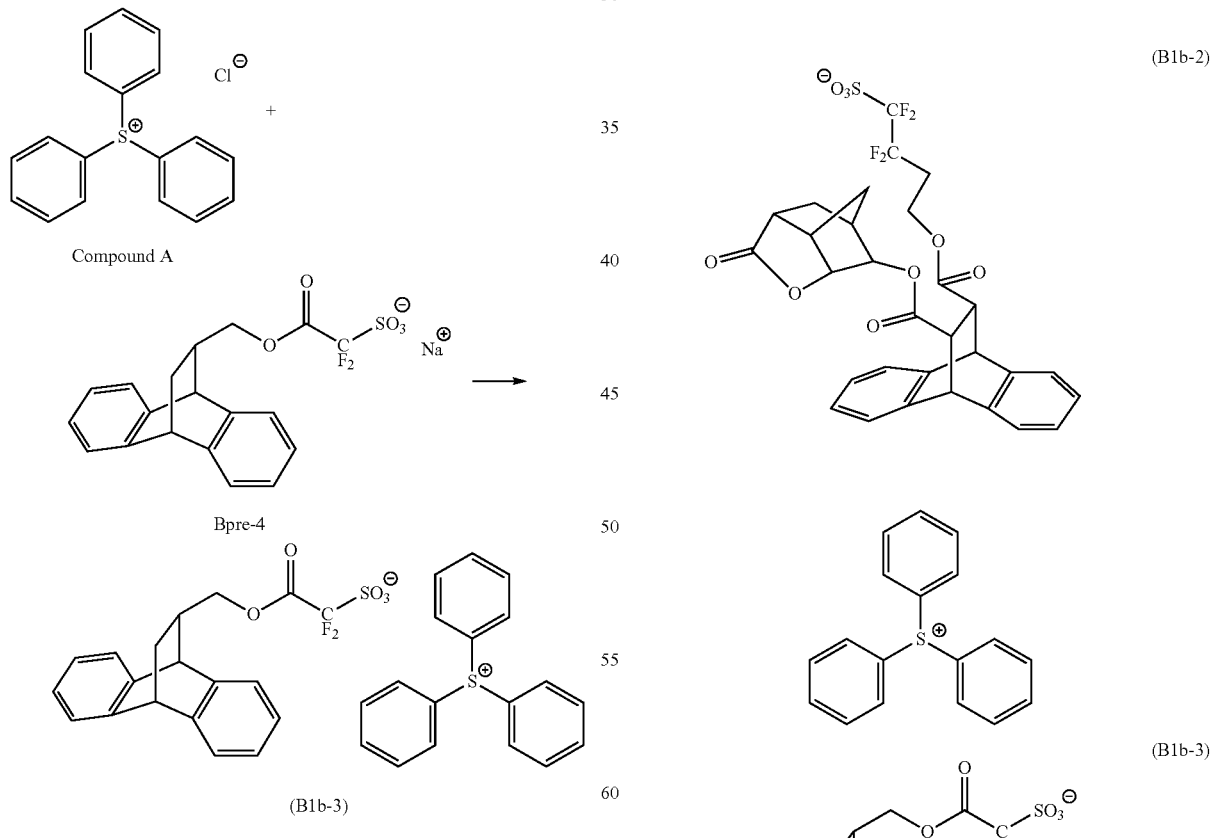

(B1b-2)

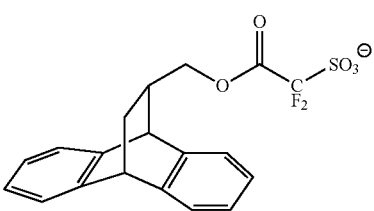

(B1b-3)

-continued

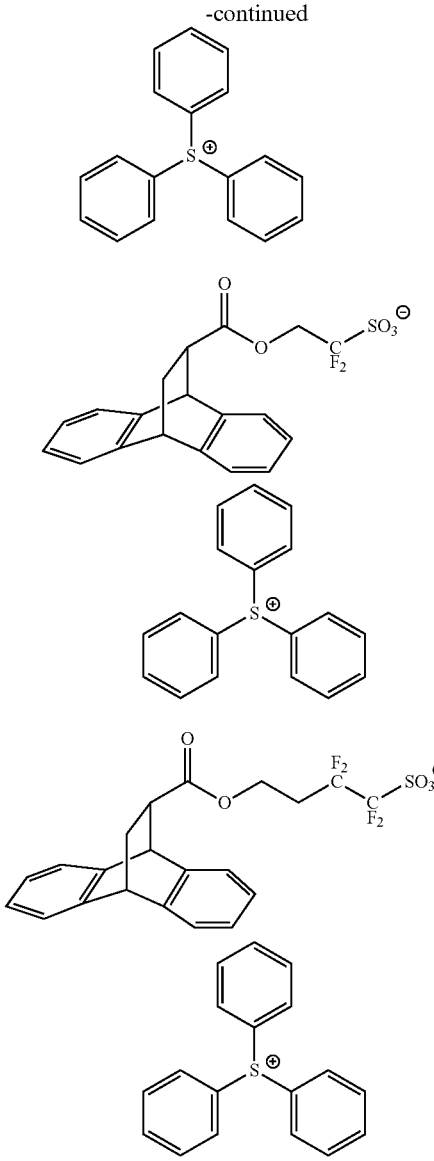

(B1b-4)

(B1b-5)

(B1b-6)

[Chem. 208]

(D1b-1)

-continued

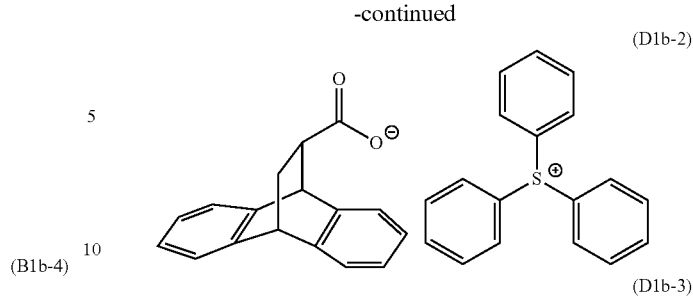

(D1b-2)

(D1b-3)

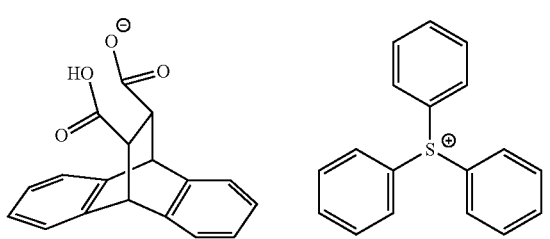

Compound (B1b-1): Combination of the Precursor (Bpre-2) and the Compound a for Salt Exchange The analysis result of NMR measurement was the same as that of the compound (B1a-6).

Compound (B1b-2): Combination of the Precursor (Bpre-6) and the Compound a for Salt Exchange The analysis result of NMR measurement was the same as that of the compound (B1a-6).

Compound (B1b-3): Combination of the Precursor (Bpre-4) and the Compound a for Salt Exchange The analysis result of NMR measurement was the same as that of the compound (B1a-4).

Compound (B1b-4): Combination of the Precursor (Bpre-1) and the Compound a for Salt Exchange The analysis result of NMR measurement was the same as that of the compound (B1a-1).

Compound (B1b-5): Combination of the Precursor (Bpre-3) and the Compound a for Salt Exchange The analysis result of NMR measurement was the same as that of the compound (B1a-3).

Compound (B1b-6): Combination of the Precursor (Bpre-5) and the Compound a for Salt Exchange The analysis result of NMR measurement was the same as that of the compound (B1a-5).

Compound (D1b-1): Combination of the Precursor (Bpre-7) and the Compound a for Salt Exchange The analysis result of NMR measurement was the same as that of the compound (D1a-1).

Compound (D1 b-2): Combination of the Precursor (Bpre-8) and the Compound a for Salt Exchange The analysis result of NMR measurement was the same as that of the compound (D1a-2).

Compound (D1 b-3): Combination of the Precursor (Bpre-9) and the Compound a for Salt Exchange $^1$H-NMR (DMSO, 400 MHz): δ(ppm)=7.74-7.90 (m, ArH, 15H), 7.68-7.82 (m, Ph, 6H), 6.60-6.80 (m, Ph, 6H), 5.47 (s, CH, 1H)

Preparation of Resist Compositions

Examples 1b to 27b and Comparative Examples 1b to 11b)

Components shown in Tables 11 to 13 were mixed and dissolved to prepare resist compositions of respective examples.

TABLE 11

| | Component (A) | Component (B1b) | Component (D2b) | Component (S) |
|---|---|---|---|---|
| Example 1b | (A1b)-1 [100] | (B1b)-1 [20.0] | (D2b)-1 [4.6] | (S)-1 [6400] |
| Example 2b | (A1b)-2 [100] | (B1b)-2 [25.6] | (D2b)-2 [3.8] | (S)-1 [6400] |
| Example 3b | (A1b)-3 [100] | (B1b)-3 [18.8] | (D2b)-3 [4.1] | (S)-1 [6400] |
| Example 4b | (A1b)-4 [100] | (B1b)-5 [20.5] | (D2b)-2 [3.8] | (S)-1 [6400] |
| Example 5b | (A1b)-5 [100] | (B1b)-2 [25.6] | (D2b)-2 [3.8] | (S)-1 [6400] |
| Example 6b | (A1b)-6 [100] | (B1b)-4 [18.8] | (D2b)-1 [4.6] | (S)-1 [6400] |
| Example 7b | (A1b)-7 [100] | (B1b)-5 [20.5] | (D2b)-2 [3.8] | (S)-1 [6400] |
| Example 8b | (A1b)-8 [100] | (B1b)-5 [20.5] | (D2b)-2 [3.8] | (S)-1 [6400] |
| Example 9b | (A1b)-9 [100] | (B1b)-3 [18.8] | (D2b)-3 [4.1] | (S)-1 [6400] |
| Example 10b | (A1b)-10 [100] | (B1b)-3 [18.8] | (D2b)-3 [4.1] | (S)-1 [6400] |
| Example 11b | (A1b)-11 [100] | (B1b)-3 [18.8] | (D2b)-3 [4.1] | (S)-1 [6400] |
| Example 12b | (A1b)-12 [100] | (B1b)-2 [25.6] | (D2b)-2 [3.8] | (S)-1 [6400] |
| Example 13b | (A1b)-13 [100] | (B1b)-4 [18.8] | (D2b)-2 [3.8] | (S)-1 [6400] |
| Example 14b | (A1b)-14 [100] | (B1b)-6 [18.5] | (D2b)-1 [4.6] | (S)-1 [6400] |
| Example 15b | (A1b)-15 [100] | (B1b)-6 [18.5] | (D2b)-1 [4.6] | (S)-1 [6400] |

TABLE 12

| | Component (A) | Component (B) | | Component (D) | | Component (S) |
|---|---|---|---|---|---|---|
| | | Component (B1b) | Component (B2b) | Component (D1b) | Component (D2b) | |
| Example 16b | (A1b)-16 [100] | (B1b)-2 [25.6] | — | — | (D2b)-2 [3.8] | (S)-1 [6400] |
| Example 17b | (A1b)-17 [100] | (B1b)-2 [25.6] | — | — | (D2b)-2 [3.8] | (S)-1 [6400] |
| Example 18b | (A1b)-18 [100] | (B1b)-2 [25.6] | — | — | (D2b)-2 [3.8] | (S)-1 [6400] |
| Example 19b | (A1b)-19 [100] | (B1b)-1 [20.0] | — | — | (D2b)-1 [4.6] | (S)-1 [6400] |
| Example 20b | (A1b)-20 [100] | (B1b)-1 [20.0] | — | — | (D2b)-1 [4.6] | (S)-1 [6400] |
| Example 21b | (A1b)-21 [100] | (B1b)-1 [20.0] | — | — | (D2b)-1 [4.6] | (S)-1 [6400] |
| Example 22b | (A1b)-22 [100] | (B1b)-1 [20.0] | — | — | (D2b)-1 [4.6] | (S)-1 [6400] |
| Example 23b | (A1b)-1 [100] | (B1b)-2 [25.6] | — | — | (D2b)-2 [3.8] | (S)-1 [6400] |
| Example 24b | (A1b)-1 [100] | (B1b)-2 [25.6] | — | (D1b)-1 [5.3] | — | (S)-1 [6400] |
| Example 25b | (A1b)-1 [100] | (B1b)-1 [20.0] | — | (D1b)-2 [4.8] | — | (S)-1 [6400] |
| Example 26b | (A1b)-1 [100] | (B1b)-6 [18.5] | — | (D1b)-2 [4.8] | — | (S)-1 [6400] |
| Example 27b | (A1b)-1 [100] | — | (B2b)-1 [17.4] | (D1b)-3 [5.3] | — | (S)-1 [6400] |

TABLE 13

| | Component (A) | | Component (B) | | Component (D) | | Component (S) |
|---|---|---|---|---|---|---|---|
| | Component (A1b) | Component (A2b) | Component (B1b) | Component (B2b) | Component (D1b) | Component (D2b) | |
| Comparative Example 1b | — | (A2b)-1 [100] | (B1b)-1 [20.0] | — | — | (D2b)-1 [4.6] | (S)-1 [6400] |
| Comparative Example 2b | — | (A2b)-2 [100] | (B1b)-1 [20.0] | — | — | (D2b)-1 [4.6] | (S)-1 [6400] |

TABLE 13-continued

| | Component (A) | | Component (B) | | Component (D) | | |
|---|---|---|---|---|---|---|---|
| | Component (A1b) | Component (A2b) | Component (B1b) | Component (B2b) | Component (D1b) | Component (D2b) | Component (S) |
| Comparative Example 3b | — | (A2b)-3 [100] | (B1b)-1 [20.0] | — | — | (D2b)-1 [4.6] | (S)-1 [6400] |
| Comparative Example 4b | — | (A2b)-4 [100] | (B1b)-1 [20.0] | — | — | (D2b)-1 [4.6] | (S)-1 [6400] |
| Comparative Example 5b | — | (A2b)-1 [100] | (B1b)-2 [25.6] | — | — | (D2b)-2 [3.8] | (S)-1 [6400] |
| Comparative Example 6b | — | (A2b)-1 [100] | (B1b)-2 [25.6] | — | (D1b)-1 [5.3] | — | (S)-1 [6400] |
| Comparative Example 7b | — | (A2b)-1 [100] | (B1b)-1 [20.0] | — | (D1b)-2 [4.8] | — | (S)-1 [6400] |
| Comparative Example 8b | — | (A2b)-1 [100] | (B1b)-6 [18.5] | — | (D1b)-2 [4.8] | — | (S)-1 [6400] |
| Comparative Example 9b | — | (A2b)-1 [100] | — | (B2b)-1 [17.4] | (D1b)-3 [5.3] | — | (S)-1 [6400] |
| Comparative Example 10b | — | (A2b)-5 [100] | (B1b)-2 [25.6] | — | — | (D2b)-2 [3.8] | (S)-1 [6400] |
| Comparative Example 11b | (A1b)-1 [100] | — | — | (B2b)-1 [17.4] | — | (D2b)-2 [3.8] | (S)-1 [6400] |

In Tables 11 to 13, respective abbreviations have the following meanings. The values in brackets [ ] indicate the amount (in terms of parts by mass) of the component added.

(A1b)-1 to (A1b)-22: the copolymers (A1b-1-1) to (A1b-1-22)

(A2b)-1 to (A2b)-5: the copolymers (A2b-1) to (A2b-5)

(B1b)-1 to (B1b)-6: acid generators including compounds represented by the chemical formulae (B1b-1) to (B1b-6)

(D1b)-1 to (D1b)-3: acid diffusion control agents including compounds represented by the chemical formulae (D1b-1) to (D1b-3)

(B2b)-1: acid generator including a compound represented by the following chemical formula (B2b-1)

(D2b)-1 to (D2b)-3: acid diffusion control agents including compounds represented by the following chemical formulae (D2b-1) to (D2b-3)

(S)-1: a mixed solvent containing propylene glycol monomethyl ether acetate/propylene glycol monomethyl ether=6/4 (mass ratio)

[Chem. 209]

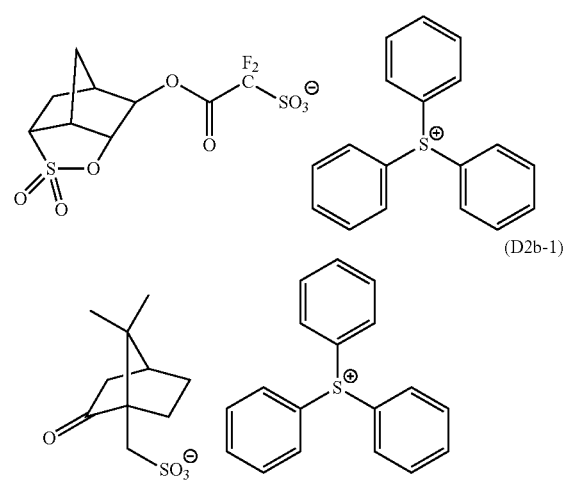

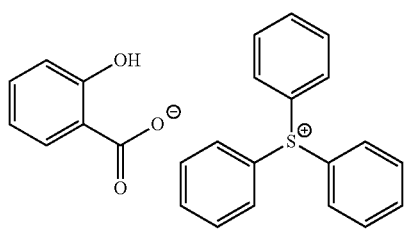

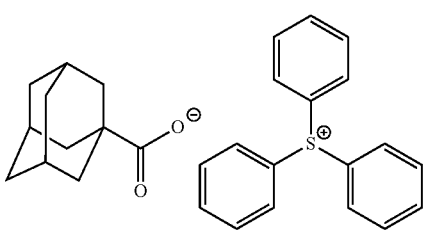

<Formation of Resist Pattern>

The resist compositions of respective examples were implied to 8-inch silicon substrates subjected to a hexamethyldisilazane (HMDS) treatment using a spinner, and a pre-baking (FAB) treatment was performed on a hot plate at a temperature of 110° C. for 60 seconds, and drying was performed, and thereby resist films with a film thickness of 50 nm were formed.

Next, drawing (exposure) was performed on the resist film using an electron beam lithography system JEOL JBX-9300FS (commercially available from JEOL Ltd.) at an acceleration voltage of 100 kV to obtain a 1:1 line and space pattern (hereinafter referred to as an "LS pattern") with a target size of a line width of 50 nm. Then, a heating (PEB) treatment was performed after exposure at 100° C. for 60 seconds.

Next, alkali developing was performed using in a 2.38 mass % tetramethylammonium hydroxide (TMAH) aqueous solution "NMD-3" (product name, commercially available from Tokyo Ohka Kogyo Co., Ltd.) at 23° C. for 60 seconds.

Then, water rinsing was conducted for 15 seconds using pure water.

As a result, a 1:1 LS pattern with a line width of 50 nm was formed.

[Evaluation of Optimum Exposure Dose (Eop)]

An optimum exposure dose Eop ($\mu C/cm^2$) at which an LS pattern with a target size was formed according to the method of forming a resist pattern was obtained. This is shown as "Eop($\mu C/cm^2$)" in Table 14 and Table 15.

[Evaluation of Line Width Roughness (LWR)]

3σ which is a scale showing LWR was obtained from the LS pattern formed in the above <Formation of resist pattern>. This is shown as "LWR (nm)" in Table 5 and Table 6.

"3σ" (unit: nm) indicates a value of 3 times (3σ) the standard deviation (σ) obtained from measurement results when the line positions at 400 points in the longitudinal direction of the line were measured using a scanning electron microscope (an acceleration voltage of 800 V, product name: S-9380, commercially available from Hitachi High-Technologies Corporation).

The smaller this 3σ value, the lower the level of roughness on the side walls of the line, indicating that an LS pattern with a more uniform width was obtained.

TABLE 14

|  | PAB (° C.) | PEB (° C.) | Eop ($\mu C/cm^2$) | LWR (nm) |
| --- | --- | --- | --- | --- |
| Example 1b | 110 | 100 | 100 | 4.8 |
| Example 2b | 110 | 100 | 95 | 5.2 |
| Example 3b | 110 | 100 | 80 | 5.5 |
| Example 4b | 110 | 100 | 80 | 5.3 |
| Example 5b | 110 | 100 | 95 | 5.6 |
| Example 6b | 110 | 100 | 105 | 5.0 |
| Example 7b | 110 | 100 | 95 | 4.9 |
| Example 8b | 110 | 100 | 95 | 4.5 |
| Example 9b | 110 | 100 | 85 | 5.7 |
| Example 10b | 110 | 100 | 90 | 5.5 |
| Example 11b | 110 | 100 | 90 | 5.1 |
| Example 12b | 110 | 100 | 90 | 5.6 |
| Example 13b | 110 | 100 | 95 | 4.8 |
| Example 14b | 110 | 100 | 80 | 5.5 |
| Example 15b | 110 | 100 | 85 | 5.7 |
| Example 16b | 110 | 100 | 105 | 5.2 |
| Example 17b | 110 | 100 | 95 | 5.0 |
| Example 18b | 110 | 100 | 105 | 5.1 |
| Example 19b | 110 | 100 | 85 | 5.6 |
| Example 20b | 110 | 100 | 85 | 5.2 |
| Example 21b | 110 | 100 | 110 | 4.4 |
| Example 22b | 110 | 100 | 115 | 4.2 |
| Example 23b | 110 | 100 | 105 | 5.7 |
| Example 24b | 110 | 100 | 95 | 5.2 |
| Example 25b | 110 | 100 | 95 | 4.5 |
| Example 26b | 110 | 100 | 90 | 4.3 |
| Example 27b | 110 | 100 | 110 | 5.5 |

TABLE 15

|  | PAB (° C.) | PEB (° C.) | Eop ($\mu C/cm^2$) | LWR (nm) |
| --- | --- | --- | --- | --- |
| Comparative Example 1b | 110 | 100 | 115 | 6.6 |
| Comparative Example 2b | 110 | 100 | 125 | 6.8 |
| Comparative Example 3b | 110 | 100 | 120 | 7.1 |
| Comparative Example 4b | 110 | 100 | 105 | 6.6 |
| Comparative Example 5b | 110 | 100 | 120 | 6.7 |
| Comparative Example 6b | 110 | 100 | 115 | 6.5 |
| Comparative Example 7b | 110 | 100 | 110 | 6.2 |
| Comparative Example 8b | 110 | 100 | 105 | 6.0 |
| Comparative Example 9b | 110 | 100 | 135 | 7.0 |
| Comparative Example 10b | 110 | 100 | 150 | 5.5 |
| Comparative Example 11b | 110 | 100 | 120 | 6.3 |

Based on the results shown in Table 14 and Table 15, it was confirmed that, according to the resist compositions of the examples to which the present invention was applied, high sensitivity was achieved in die formation of the resist pattern, and a resist pattern having a favorable shape with reduced roughness was formed.

Embodiment c

Production Examples of Copolymer (A1c-1-1) to Copolymer (A1c-1-7), and Copolymer (A2c-1) to Copolymer (A2c-3)

Compounds shown in Table 16 were used in a predetermined molar ratio to synthesize copolymer according to radical polymerization.

Regarding the obtained copolymers, a copolymer composition ratio (a ratio (molar ratio) of respective structural units in the high-molecular-weight compound) of the high-molecular-weight compound obtained through $^{13}C$-NMR, and a mass average molecular weight (Mw) and a molecular weight dispersity (Mw/Mn) in terms of polystyrene standards obtained through GPC measurement are shown together in Table 16.

[Chem. 210]

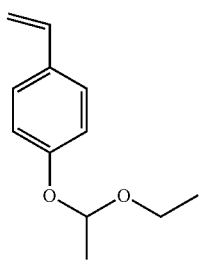

(a021-pre)

[Chem. 211]

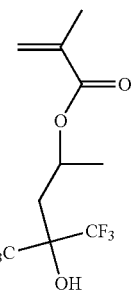

(a03-1)

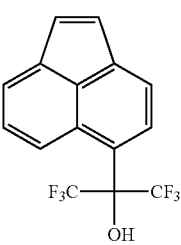

(a03-2)

-continued
(a03-3)
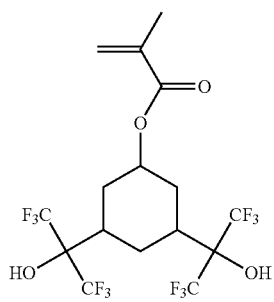
(a03-4)
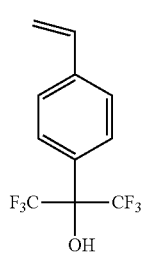
(a0-1b2)
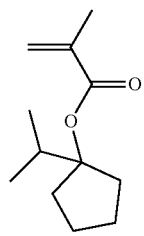
(a0-1b1)
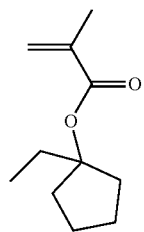
(a0-1a1)
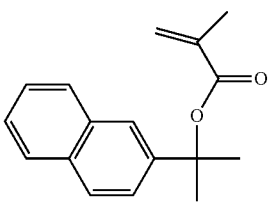
(a21)
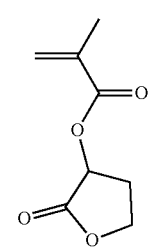
-continued
(a31)
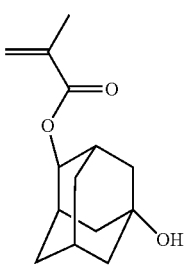
The copolymer (A1c-1-1) to copolymer (A1c-1-7), and copolymer (A2c-1) to (A2c-3) obtained by die above synthesis examples are shown below.
[Chem. 212]
(A1c-1-1)
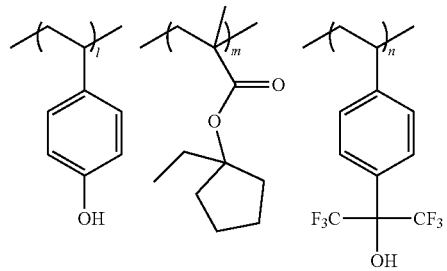
(A1c-1-2)
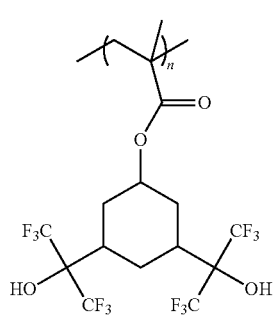
(A1c-1-3)
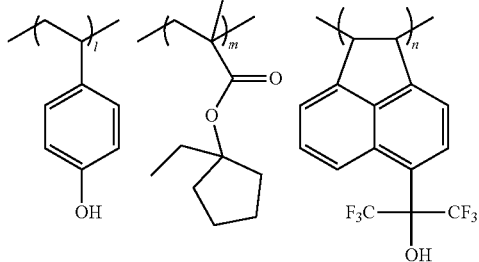

-continued (A1c-1-4)
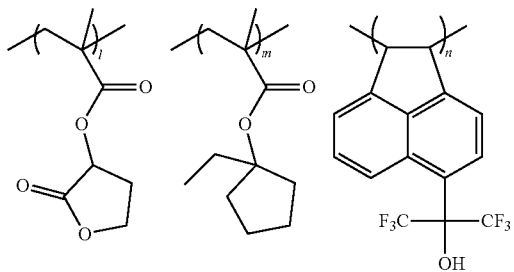

(A1c-1-5)

(A1c-1-6)

(A1c-1-7)

[Chem. 213]

(A2c-1)
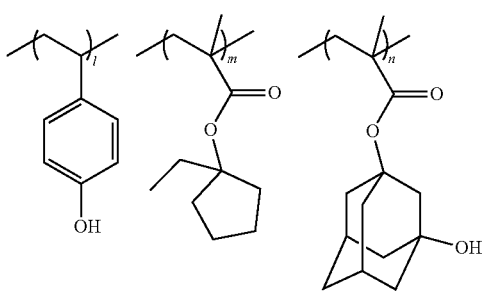

-continued (A2c-2)
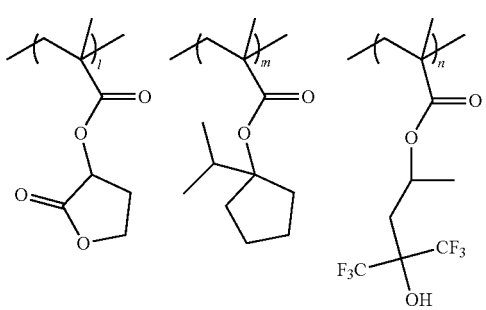

(A2c-3)
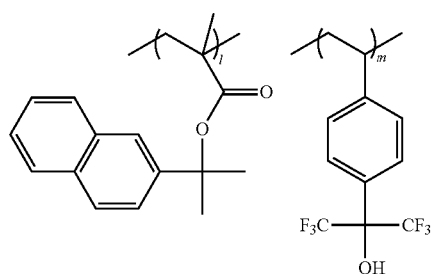

Here, a structural unit represented by the following chemical formula (a021) constituting the copolymer is a structural unit derived from the monomer represented by the chemical formula (a021-pre).

[Chem. 214]

(a021)
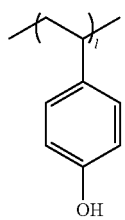

TABLE 16

| Copolymer | Copolymer composition ratio (molar ratio) of copolymer | Weight average molecular weight (Mw) | Molecular weight Dispersity (Mw/Mn) |
| --- | --- | --- | --- |
| (A1c-1-1) | (a021)/(a01-b1)/(a03-4) = 30/60/10 | 7100 | 1.72 |
| (A1c-1-2) | (a021)/(a01-b2)/(a03-3) = 30/60/10 | 7300 | 1.75 |
| (A1c-1-3) | (a021)/(a01-b1)/(a03-2) = 30/60/10 | 7100 | 1.72 |
| (A1c-1-4) | (a21)/(a01-b1)/(a03-2) = 30/60/10 | 7000 | 1.70 |
| (A1c-1-5) | (a21)/(a01-b2)/(a03-1) = 30/60/10 | 7200 | 1.74 |
| (A1c-1-6) | (a01-b1)/(a03-2) = 50/50 | 6700 | 1.68 |
| (A1c-1-7) | (a0-1a1)/(a03-4) = 50/50 | 6900 | 1.70 |
| (A2c-1) | (a021)/(a01-b1)/(a31) = 30/60/10 | 6800 | 1.69 |
| (A2c-2) | (a21)/(a01-b1)/(a31) = 30/60/10 | 6800 | 1.65 |
| (A2c-3) | (a021)/(a0-1a1) = 50/50 | 7100 | 1.69 |

Production of Compounds

Production Examples 1c to 6c

Precursors (Bpre-1), (Bpre-3), and (Bpre-5) to (Bpre-8) were obtained in die same manner as in the production examples 1a, 3a, and 5a to 8a

Production Example of Compound (B1c-1)

The precursor (Bpre-1) (15.0 g, 24.7 mmol) and the compound A for salt exchange (7.4 g, 24.7 mmol) were dissolved in dichloromethane (100 g), and ultra pure water (35 g) was added thereto, and the mixture was reacted at room temperature for 30 minutes. After the reaction was completed, an aqueous phase was removed and an organic phase was then washed with ultra pure water (35 g) 4 times. The organic phase was concentrated and dried using a rotary evaporator to obtain a compound (B1c-1) (16.5 g, yield=92.5%).

[Chem. 215]

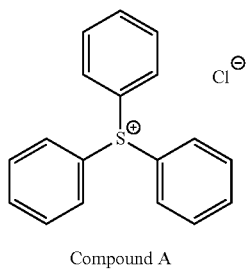

Compound A

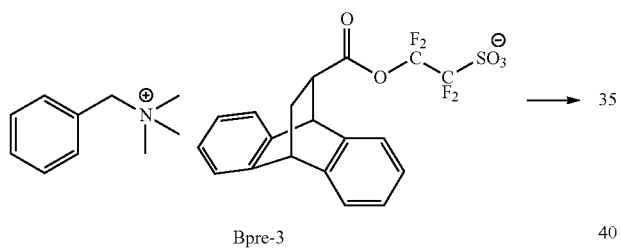

Bpre-3

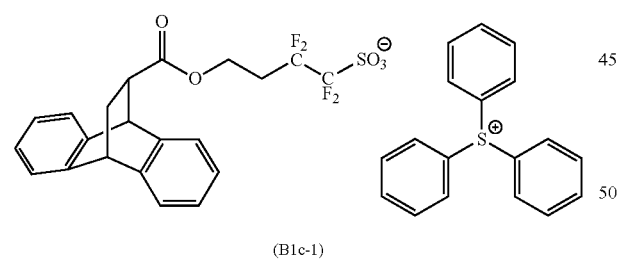

(B1c-1)

Production Examples of Other Compounds

The following compound (B1c-1) to compound (B1c-4), and compound (D1c-1), and compound (D1c-2) were obtained in the same manner as in the above "production example of compound (B1c-1)" except that combinations of the precursor (Bpre-1) to precursor (Bpre-6), and the compound A for salt exchange were changed.

NMR measurement was performed for the obtained compounds, and structures thereof were identified from the following analysis results.

[Chem. 216]

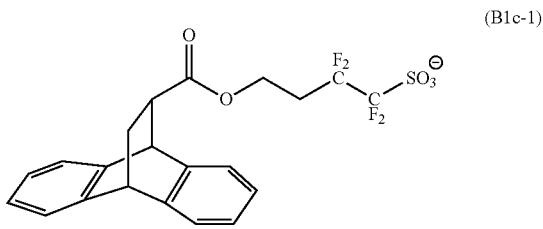

(B1c-1)

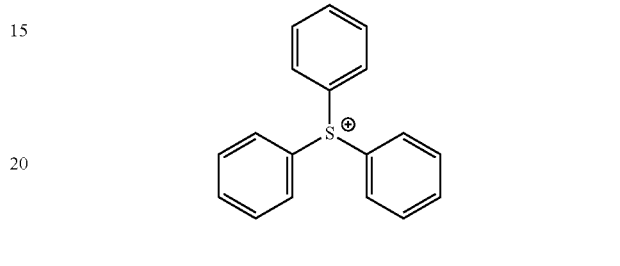

(B1c-2)

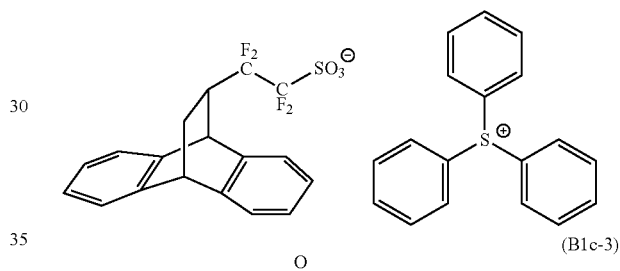

(B1c-3)

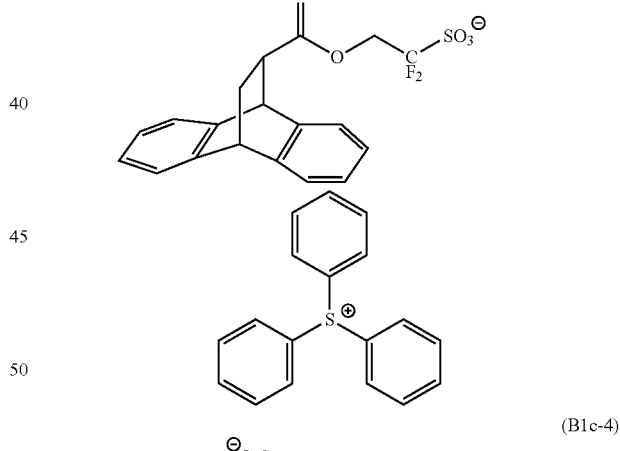

(B1c-4)

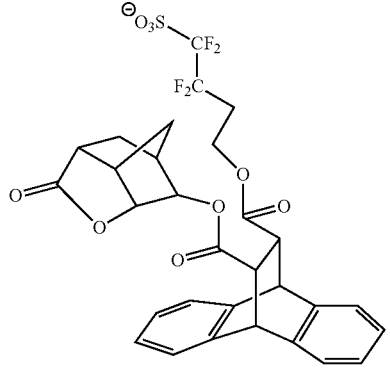

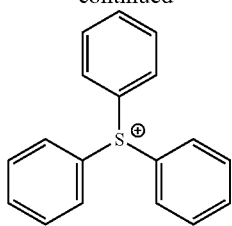

[Chem. 217]

(D1c-1)

(D1c-2)

Compound (B1c-1): Combination of the Precursor (Bpre-3) and the Compound A for Salt Exchange The analysis result of NMR measurement was the same as that of the compound (B1a-3).

Compound (B1c-2): Combination of the Precursor (Bpre-5) and the Compound A for Salt Exchange The analysis result of NMR measurement was the same as that of the compound (B1a-5).

Compound (B1c-3): Combination of the Precursor (Bpre-1) and the Compound A for Salt Exchange The analysis result of NMR measurement was the same as that of the compound (B1a-1).

COMPOUND (B1c-4): Combination of the Precursor (Bpre-6) and the Compound A for Salt Exchange The analysis result of NMR measurement was the same as that of the compound (B1a-6).

Compound (D1c-1): Combination of the Precursor (Bpre-8) and the Compound A for Salt Exchange The analysis result of NMR measurement was the same as that of the compound (D1a-2).

Compound (D1c-2): Combination of the Precursor (Bpre-7) and the Compound A for Salt Exchange The analysis result of NMR measurement was the same as that of the compound (D1a-1).

Preparation of Resist Compositions

Examples 1c to 39c and Comparative Examples 1c to 11c

Components shown in Tables 17 to 19 were mixed and dissolved to prepare resist compositions of respective examples.

TABLE 17

| | Component (A) | | Component (B) | | Component (D) | | |
|---|---|---|---|---|---|---|---|
| | Component (A1c) | Component (A2c) | Component (B1c) | Component (B2c) | Component (D1c) | Component (D2c) | Component (S) |
| Reference Example 1c | — | (A2c)-1 [100] | (B1c)-1 [20.5] | — | (D1c)-1 [4.8] | — | (S)-1 [6400] |
| Reference Example 2c | — | (A2c)-1 [100] | — | (B2c)-2 [18.5] | (D1c)-1 [4.8] | — | (S)-1 [6400] |
| Reference Example 3c | — | (A2c)-1 [100] | (B1c)-4 [25.6] | — | (D1c)-2 [5.3] | — | (S)-1 [6400] |
| Reference Example 4c | — | (A2c)-1 [100] | — | (B2c)-2 [18.5] | (D1c)-2 [5.3] | — | (S)-1 [6400] |
| Comparative Example 1c | — | (A2c)-2 [100] | (B1c)-1 [20.5] | — | (D1c)-1 [4.8] | — | (S)-1 [6400] |
| Comparative Example 2c | — | (A2c)-2 [100] | — | (B2c)-2 [18.5] | (D1c)-1 [4.8] | — | (S)-1 [6400] |
| Comparative Example 3c | — | (A2c)-2 [100] | (B1c)-4 [25.6] | — | (D1c)-2 [5.3] | — | (S)-1 [6400] |
| Comparative Example 4c | — | (A2c)-2 [100] | — | (B2c)-2 [18.5] | (D1c)-2 [5.3] | — | (S)-1 [6400] |
| Reference Example 5c | — | (A2c)-3 [100] | (B1c)-3 [18.5] | — | (D1c)-1 [4.8] | — | (S)-1 [6400] |
| Reference Example 6c | — | (A2c)-3 [100] | — | (B2c)-1 [16.7] | (D1c)-1 [4.8] | — | (S)-1 [6400] |
| Comparative Example 5c | (A1c)-1 [100] | — | — | (B2c)-2 [18.5] | — | (D2c)-1 [3.8] | (S)-1 [6400] |
| Comparative Example 6c | (A1c)-2 [100] | — | — | (B2c)-2 [18.5] | — | (D2c)-1 [3.8] | (S)-1 [6400] |
| Comparative Example 7c | (A1c)-3 [100] | — | — | (B2c)-2 [18.5] | — | (D2c)-1 [3.8] | (S)-1 [6400] |

TABLE 17-continued

| | Component (A) | | Component (B) | | Component (D) | | |
| --- | --- | --- | --- | --- | --- | --- | --- |
| | Component (A1c) | Component (A2c) | Component (B1c) | Component (B2c) | Component (D1c) | Component (D2c) | Component (S) |
| Comparative Example 8c | (A1c)-4 [100] | — | — | (B2c)-2 [18.5] | — | (D2c)-1 [3.8] | (S)-1 [6400] |
| Comparative Example 9c | (A1c)-5 [100] | — | — | (B2c)-2 [18.5] | — | (D2c)-1 [3.8] | (S)-1 [6400] |
| Comparative Example 10c | (A1c)-6 [100] | — | — | (B2c)-2 [18.5] | — | (D2c)-1 [3.8] | (S)-1 [6400] |
| Comparative Example 11c | (A1c)-7 [100] | — | — | (B2c)-2 [18.5] | — | (D2c)-1 [3.8] | (S)-1 [6400] |

TABLE 18

| | Component (A) | | Component (B) | | Component (D) | | |
| --- | --- | --- | --- | --- | --- | --- | --- |
| | Component (A1c) | Component (A2c) | Component (B1c) | Component (B2c) | Component (D1c) | Component (D2c) | Component (S) |
| Example 1c | (A1c)-1 [100] | — | (B1c)-1 [20.5] | — | (D1c)-1 [4.8] | — | (S)-1 [6400] |
| Example 2c | (A1c)-1 [100] | — | (B1c)-1 [20.5] | — | — | (D2c)-1 [3.8] | (S)-1 [6400] |
| Example 3c | (A1c)-1 [100] | — | (B1c)-2 [18.5] | — | — | (D2c)-1 [3.8] | (S)-1 [6400] |
| Example 4c | (A1c)-1 [100] | — | (B1c)-3 [18.5] | — | — | (D2c)-1 [3.8] | (S)-1 [6400] |
| Example 5c | (A1c)-1 [100] | — | — | (B2c)-1 [16.7] | (D1c)-1 [4.8] | — | (S)-1 [6400] |
| Example 6c | (A1c)-1 [100] | — | (B1c)-4 [25.6] | — | (D1c)-2 [5.3] | — | (S)-1 [6400] |
| Example 7c | (A1c)-1 [100] | — | — | (B2c)-2 [18.5] | (D1c)-2 [5.3] | — | (S)-1 [6400] |
| Example 8c | (A1c)-2 [100] | — | (B1c)-1 [20.5] | — | — | (D2c)-1 [3.8] | (S)-1 [6400] |
| Example 9c | (A1c)-2 [100] | — | (B1c)-2 [20.5] | — | (D1c)-1 [4.8] | — | (S)-1 [6400] |
| Example 10c | (A1c)-2 [100] | — | (B1c)-2 [20.5] | — | — | (D2c)-1 [3.8] | (S)-1 [6400] |
| Example 11c | (A1c)-2 [100] | — | (B1c)-3 [18.5] | — | — | (D2c)-1 [3.8] | (S)-1 [6400] |
| Example 12c | (A1c)-2 [100] | — | — | (B2c)-1 [16.7] | (D1c)-1 [4.8] | — | (S)-1 [6400] |
| Example 13c | (A1c)-2 [100] | — | (B1c)-4 [25.6] | — | (D1c)-2 [5.3] | — | (S)-1 [6400] |
| Example 14c | (A1c)-2 [100] | — | — | (B2c)-2 [18.5] | (D1c)-2 [5.3] | — | (S)-1 [6400] |
| Example 15c | (A1c)-3 [100] | — | (B1c)-1 [20.5] | — | — | (D2c)-1 [3.8] | (S)-1 [6400] |
| Example 16c | (A1c)-3 [100] | — | (B1c)-2 [20.5] | — | — | (D2c)-1 [3.8] | (S)-1 [6400] |
| Example 17c | (A1c)-3 [100] | — | (B1c)-3 [18.5] | — | (D1c)-1 [4.8] | — | (S)-1 [6400] |
| Example 18c | (A1c)-3 [100] | — | (B1c)-3 [18.5] | — | — | (D2c)-1 [3.8] | (S)-1 [6400] |
| Example 19c | (A1c)-3 [100] | — | — | (B2c)-1 [16.7] | (D1c)-1 [4.8] | — | (S)-1 [6400] |
| Example 20c | (A1c)-3 [100] | — | (B1c)-4 [25.6] | — | (D1c)-2 [5.3] | — | (S)-1 [6400] |
| Example 21c | (A1c)-3 [100] | — | — | (B2c)-2 [18.5] | (D1c)-2 [5.3] | — | (S)-1 [6400] |

TABLE 19

| | Component (A) | | Component (B) | | Component (D) | | |
| --- | --- | --- | --- | --- | --- | --- | --- |
| | Component (A1c) | Component (A2c) | Component (B1c) | Component (B2c) | Component (D1c) | Component (D2c) | Component (S) |
| Example 22c | (A1c)-4 [100] | — | (B1c)-1 [20.5] | — | (D1c)-1 [4.8] | — | (S)-1 [6400] |
| Example 23c | (A1c)-4 [100] | — | — | (B2c)-2 [18.5] | (D1c)-1 [4.8] | — | (S)-1 [6400] |

TABLE 19-continued

| | Component (A) | | Component (B) | | Component (D) | | |
|---|---|---|---|---|---|---|---|
| | Component (A1c) | Component (A2c) | Component (B1c) | Component (B2c) | Component (D1c) | Component (D2c) | Component (S) |
| Example 24c | (A1c)-4 [100] | — | (B1c)-4 [25.6] | — | (D1c)-2 [5.3] | — | (S)-1 [6400] |
| Example 25c | (A1c)-4 [100] | — | — | (B2c)-2 [18.5] | (D1c)-2 [5.3] | — | (S)-1 [6400] |
| Example 26c | (A1c)-5 [100] | — | (B1c)-3 [18.5] | — | (D1c)-1 [4.8] | — | (S)-1 [6400] |
| Example 27c | (A1c)-5 [100] | — | (B1c)-3 [18.5] | — | — | (D2c)-1 [3.8] | (S)-1 [6400] |
| Example 28c | (A1c)-5 [100] | — | (B1c)-3 [18.5] | — | (D1c)-2 [5.3] | — | (S)-1 [6400] |
| Example 29c | (A1c)-5 [100] | — | — | (B2c)-2 [18.5] | (D1c)-2 [5.3] | — | (S)-1 [6400] |
| Example 30c | (A1c)-6 [100] | — | (B1c)-4 [25.6] | — | (D1c)-2 [5.3] | — | (S)-1 [6400] |
| Example 31c | (A1c)-6 [100] | — | — | (B2c)-2 [18.5] | (D1c)-2 [5.3] | — | (S)-1 [6400] |
| Example 32c | (A1c)-7 [100] | — | (B1c)-3 [18.5] | — | (D1c)-1 [4.8] | — | (S)-1 [6400] |
| Example 33c | (A1c)-7 [100] | — | — | (B2c)-1 [16.7] | (D1c)-1 [4.8] | — | (S)-1 [6400] |

In Tables 17 to 19, respective abbreviations have the following meanings. The values in brackets [ ] indicate the amount (in terms of parts by mass) of the component added.

(A1c)-1 to (A1c)-7: the copolymers (A1c-1-1) to (A1c-1-7)

(A2c)-1 to (A2c)-3: the copolymers (A2c-1) to (A2c-3)

(B1c)-1 to (B1c)-4: acid generators including compounds represented by the chemical formulae (B1c-1) to (B1c-4)

(D1c)-1 and (D1c)-2: acid diffusion control agents including compounds represented by the chemical formulae (Die-1) and (D1c-2)

(B2c)-1 and (B2c)-2: acid generators including compounds represented by the following chemical formulae (B2c-1) and (B2c-2)

(D2c)-1: an acid diffusion control agent including a compound represented by the following chemical formula (D2c-1)

(S)-1: a mixed solvent containing propylene glycol monomethyl ether acetate/propylene glycol monomethyl ether=60/40 (mass ratio)

[Chem. 218]

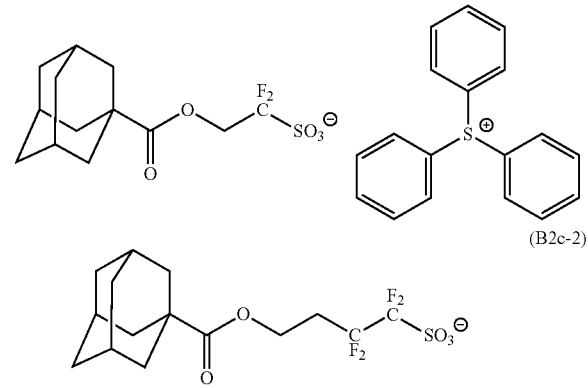

(B2c-1)

(B2c-2)

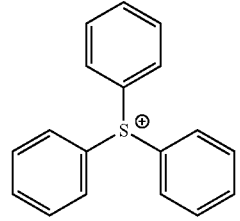

-continued

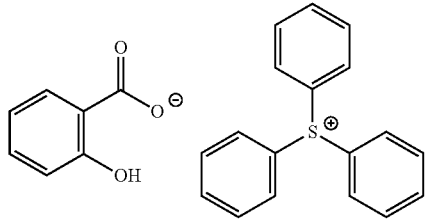

(D2c-1)

<Formation of Resist Pattern>

The resist compositions of respective examples were implied to 8-inch silicon substrates subjected to a hexamethyldisilazane (HMDS) treatment using a spinner, and a pre-baking (FAB) treatment was performed on a hot plate at a temperature of 110° C. for 60 seconds, and drying was performed, and thereby resist films with a film thickness of 50 nm were formed.

Next, drawing (exposure) was performed on the resist film using an electron beam lithography system JEOL JBX-9300FS (commercially available from JEOL Ltd.) at an acceleration voltage of 100 kV to obtain a 1:1 line and space pattern (hereinafter referred to as an "LS pattern") with a target size of a line width of 50 nm. Then, a heating (PEB) treatment was performed after exposure at 100° C. for 60 seconds.

Next, alkali developing was performed using in a 2.38 mass % tetramethylammonium hydroxide (TMAH) aqueous solution "NMD-3" (product name, commercially available from Tokyo Ohka Kogyo Co., Ltd.) at 23° C. for 60 seconds. Then, water rinsing was conducted for 15 seconds using pure water.

As a result, a 1:1 LS pattern with a line width of 50 nm was formed.

[Evaluation of Optimum Exposure Dose (Eop)]

An optimum exposure dose Eop ($\mu C/cm^2$) at which an LS pattern with a target size was formed according to the method of forming a resist pattern was obtained. This is shown as "Eop($\mu C/cm^2$)" in Tables 20 to 22.

[Evaluation of Line Width Roughness (LWR)]

$3\sigma$ which is a scale showing LWR was obtained from the LS pattern formed in the above <Formation of resist pattern>. This is shown as "LWR (nm)" in Tables 20 to 22.

"$3\sigma$" (unit: nm) indicates a value of 3 times ($3\sigma$) the standard deviation ($\sigma$) obtained from measurement results when the line positions at 400 points in the longitudinal direction of the line were measured using a scanning electron microscope (an acceleration voltage of 800 V, product name: S-9380, commercially available from Hitachi High-Technologies Corporation).

The smaller this $3\sigma$ value, the lower the level of roughness on the side walls of the line, indicating that an LS pattern with a more uniform width was obtained.

[Evaluation of LS Pattern Shape]

The cross-sectional shape of the LS pattern formed in die above <Formation of resist pattern> was observed under a scanning electron microscope (SEM, product name: SU-8000, commercially available from Hitachi High-Technologies Corporation) at an acceleration voltage of 8 kV, and a line width (Lt) at the top of the resist pattern and a line width (Lm) in the middle were measured. This is shown as a "shape" in Tables 20 to 22.

The rectangularity of the cross-sectional shape is better when the value of Lt/Lm is closer to 1. When the rectangularity of the cross-sectional shape was 0.95≤(Lt/Lm)≤1.05, it was evaluated as "A: particularly favorable," when the rectangularity of the cross-sectional shape was 0.90<(Lt/Lm)<0.95 or 1.05<(Lt/Lm)≤1.10, it was evaluated as "B: favorable," and when the rectangularity of the cross-sectional shape was (Lt/Lm)<0.90 or 1.10<(Lt/Lm), it was evaluated as "C: poor."

TABLE 20

|  | Eop ($\mu C/cm^2$) | LWR (nm) | Shape |
| --- | --- | --- | --- |
| Reference Example 1c | 105 | 5.2 | C |
| Reference Example 2c | 110 | 5.3 | C |
| Reference Example 3c | 110 | 5.1 | C |
| Reference Example 4c | 110 | 5.4 | C |
| Comparative Example 1c | 140 | 5.5 | C |
| Comparative Example 2c | 145 | 5.8 | C |
| Comparative Example 3c | 140 | 5.6 | C |
| Comparative Example 4c | 140 | 5.7 | C |
| Reference Example 5c | 105 | 5.6 | C |
| Reference Example 6c | 110 | 5.9 | C |
| Comparative Example 5c | 105 | 6.3 | B |
| Comparative Example 6c | 110 | 6.5 | B |
| Comparative Example 7c | 100 | 6.2 | B |
| Comparative Example 8c | 120 | 6.4 | B |
| Comparative Example 9c | 130 | 6.6 | B |
| Comparative Example 10c | 120 | 6.4 | B |
| Comparative Example 11c | 125 | 6.2 | B |

TABLE 21

|  | Eop ($\mu C/cm^2$) | LWR (nm) | Shape |
| --- | --- | --- | --- |
| Example 1c | 100 | 4.6 | A |
| Example 2c | 95 | 4.7 | A |
| Example 3c | 95 | 4.8 | A |
| Example 4c | 100 | 4.9 | A |
| Example 5c | 100 | 4.8 | A |
| Example 6c | 95 | 4.7 | A |
| Example 7c | 95 | 4.8 | A |
| Example 8c | 100 | 4.9 | A |
| Example 9c | 95 | 4.7 | A |
| Example 10c | 95 | 5.1 | A |
| Example 11c | 105 | 5.0 | A |
| Example 12c | 105 | 4.9 | A |
| Example 13c | 95 | 4.8 | A |
| Example 14c | 100 | 4.9 | A |
| Example 15c | 95 | 4.9 | A |
| Example 16c | 90 | 4.8 | A |
| Example 17c | 100 | 4.7 | A |
| Example 18c | 100 | 4.9 | A |
| Example 19c | 100 | 4.6 | A |
| Example 20c | 95 | 4.7 | A |
| Example 21c | 100 | 4.8 | A |

TABLE 22

|  | Eop ($\mu C/cm^2$) | LWR (nm) | Shape |
| --- | --- | --- | --- |
| Example 22c | 115 | 4.9 | A |
| Example 23c | 120 | 5.1 | A |
| Example 24c | 110 | 4.9 | A |
| Example 25c | 115 | 5.2 | A |
| Example 26c | 130 | 5.0 | A |
| Example 27c | 135 | 5.2 | A |
| Example 28c | 120 | 4.8 | A |
| Example 29c | 130 | 5.0 | A |
| Example 30c | 120 | 4.9 | A |
| Example 31c | 120 | 5.1 | A |
| Example 32c | 115 | 4.9 | A |
| Example 33c | 115 | 5.2 | A |

Based on the results shown in Tables 20 to 22, it was confirmed that, according to the resist compositions of the examples to which the present invention was applied, a resist pattern having a favorable shape with reduced roughness was formed. In addition, when the resin component (A1) has the structural unit (a0-3), it is possible to form a resist pattern having a favorable shape with reduced roughness.

Embodiment d

Production of Compounds

Production Examples 1d to 7d

Precursors (Bpre-1) to (Bpre-6), and (Bpre-8) were obtained in the same manner as in the production examples 1a to 6a, and 8a.

Production Example 8d

A precursor (Bpre-9) was obtained in the same manner as in the production example 9b.

Production Example 9d

The compound (Id-1) (10.0 g, 32 mmol), para-toluene sulfonyl chloride (6.7 g, mmol), and dichloromethane (100 g) were put into a 100 mL 3-neck flask, and stirred and dispersed at room temperature. Next, pyridine (3.0 g, 39 mmol) was put thereinto for 30 minutes, and the mixture was reacted at room temperature for 6 hours. The reaction solution was washed with ultra pure water (100 g) 4 times, and MTBE (150 g) was put into an organic layer, and the mixture was stirred for 30 minutes. The precipitate was filtered off and dried under a reduced pressure to obtain an intermediate 8 (5.8 g, yield=66.8%).

[Chem. 219]

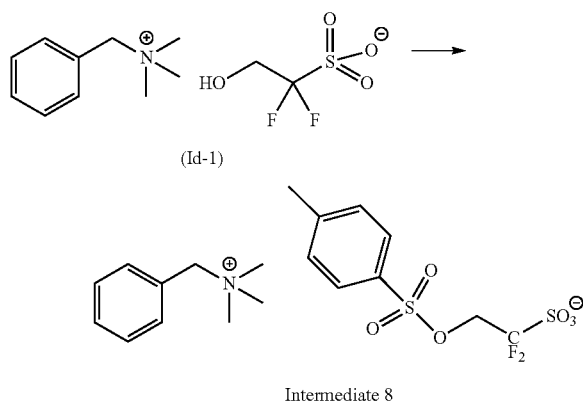

(Id-1)

Intermediate 8

9-Bromotriptycene (10.0 g, 30 mmol) and THF (100 g) were put into a 200 mL 3-neck flask, and stirred and dissolved. After cooling to −78° C., a 1.6 M n-butyl lithium hexane solution (20.6 ml, 33 mmol) was put thereinto, and stirring was performed at −78° C. for 1 hour. Next, the intermediate 8 (12.6 g, 27 mmol) dissolved in THF (126 g) was put thereinto, and the mixture was reacted at −50° C. for 3 hours. The reaction solution was put into ultra pure water (250 g) for 1 hour, dichloromethane (160 g) was then added thereto, and the mixture was stirred for 30 minutes, and an aqueous layer was then removed. An organic layer was washed with ultra pure water (150 g) 3 times and an organic layer was then added dropwise to MTBE (160 g), and the precipitated solid was filtered off. The filtrate was dissolved in acetonitrile (70 g) and added dropwise to MTBE (140 g), and the precipitated solid was filtered off. This operation was repeated twice, and the filtrate was dien dried under a reduced pressure to obtain a precursor (Bpre-10) (6.0 g, yield=36.7%).

[Chem. 220]

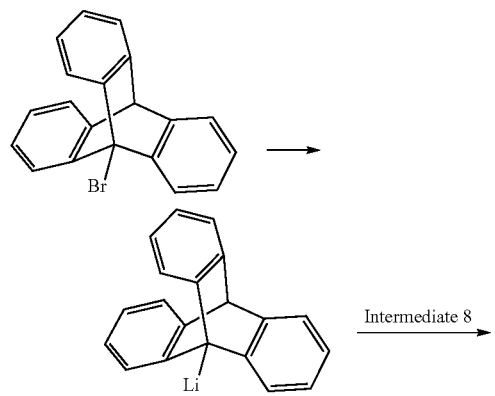

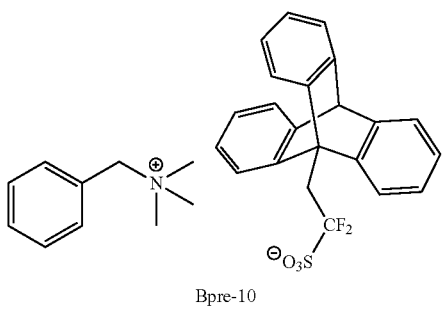

Bpre-10

Production Example 10d

Carbon dioxide was introduced into a Grignard reagent at 25 to 35° C. prepared using 9-bromotriptycene (20.0 g, 60 mmol), magnesium (1.6 g, 66 mmol), and THF (400 g) by a general method, and the mixture was reacted at room temperature for 2 hours. Ultra pure water (400 g) was added to the reaction solution, stirring was performed for 1 hour, and hydrochloric acid was then added thereto until the solution became acidic, and the precipitate was filtered off. The filtrate was washed with ultra pure water (100 g) twice, and washed with methanol (50 g) twice, and dried under a reduced pressure to obtain an intermediate 7 (10.0 g, yield=55.8%).

[Chem. 221]

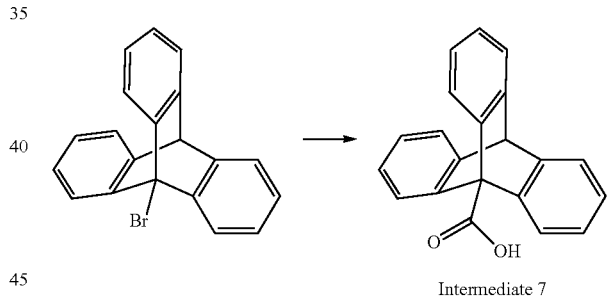

Intermediate 7

A precursor (Bpre-11) (7.9 g, yield=83.8%) was obtained in the same manner as in the production example of the precursor (Bpre-1) in the production example 1a except that the intermediate 7 (4.8 g, 16 mmol) was used in place of the intermediate 2 (4.0 g, 16 mmol).

[Chem. 222]

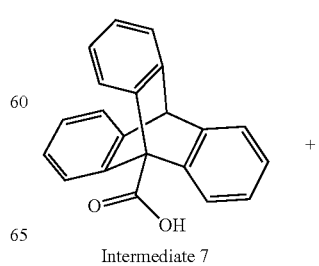

Intermediate 7

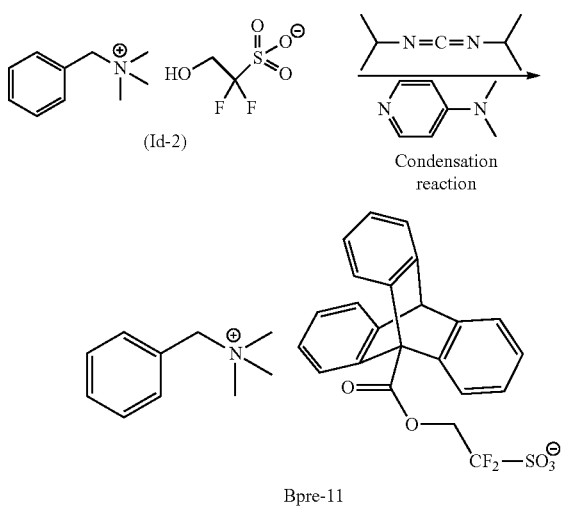

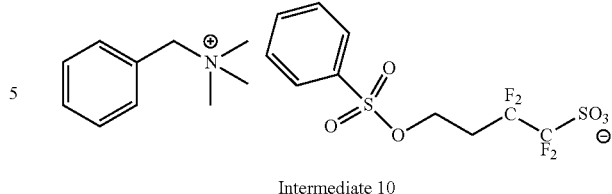

Intermediate 10

The intermediate 9 (4.0 g, 15 mmol) and THF (100 g) were put into a 200 mL 3-neck flask and stirred and dissolved. After cooling to −78° C., a 1.6 M n-butyl lithium hexane solution (8.6 ml, 14 mmol) was put thereinto, and the mixture was stirred at −78° C. for 1 hour. Next, the intermediate 10 (7.5 g, 15 mmol) dissolved in THF (150 g) was put thereinto, and the mixture was reacted at −50° C. for 3 hours. The reaction solution was put into ultra pure water (250 g) for 1 hour, dichloromethane (180 g) was then added thereto, and the mixture was stirred for 30 minutes, and an aqueous layer was then removed. The organic layer was washed with ultra pure water (200 g) 3 times, and the organic layer was then added dropwise to MTBE (160 g), and the precipitated solid was filtered off. The filtrate was dissolved in acetonitrile (70 g) and added dropwise to MTBE (140 g), and the precipitated solid was filtered off. This operation was repeated twice, and the filtrate was dien dried under a reduced pressure to obtain a precursor (Bpre-12) (5.2 g, yield=56.5%).

[Chem. 225]

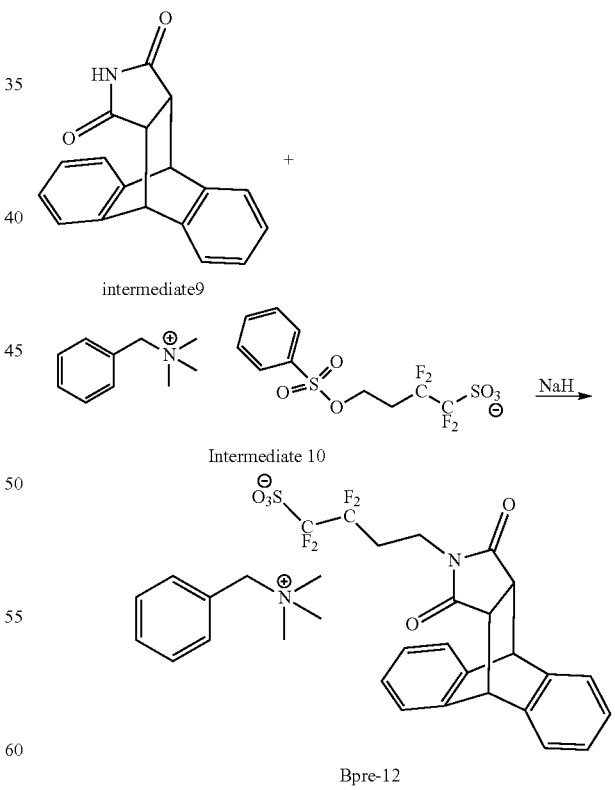

Production Example 11d

An intermediate 9 (6.4 g, yield=82.3%) was obtained in the same manners in the production example of the intermediate 1 except that maleimide (4.1 g, 42 mmol) was used in place of methyl acrylate (3.6 g, 42 mmol).

[Chem. 223]

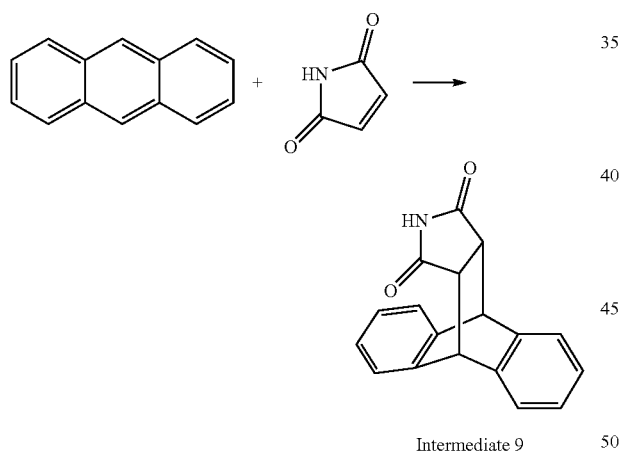

An intermediate 10 (8.0 g, yield=48.4%) was obtained in the same manner as in the production example of the intermediate 8 except that the compound (Id-3) (12.5 g, 32 mmol) was used in place of the compound (Id-2) (10.0 g, 32 mmol).

[Chem. 224]

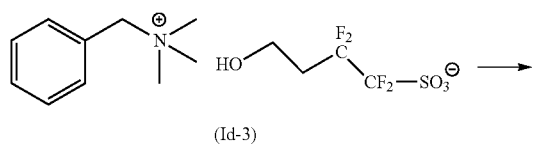

Production Example 12d

The intermediate 6 (4.1 g, 15 mmol), the compound (Id-4) (9.0 g, 33 mmol), p-toluenesulfonic acid monohydrate (0.28 g, 1.5 mmol), and toluene (200 g) were put into a 100 mL 3-neck flask, and the mixture was refluxed at 110° C. for 48 hours. After cooling, filtration was performed, acetonitrile (160 g) was added to the residue, the mixture was stirred at room temperature for 30 minutes, and filtering was performed. The filtrate was concentrated, methyl ethyl ketone (78 g) was added to the residue, and stirring was performed, and filtering was performed. This operation was repeated 4 times, and the filtrate was dried to obtain a precursor (Bpre-13) (4.1 g, yield=34.3%).

[Chem. 226]

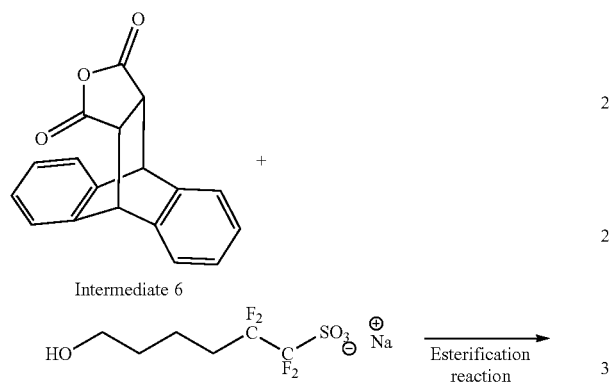

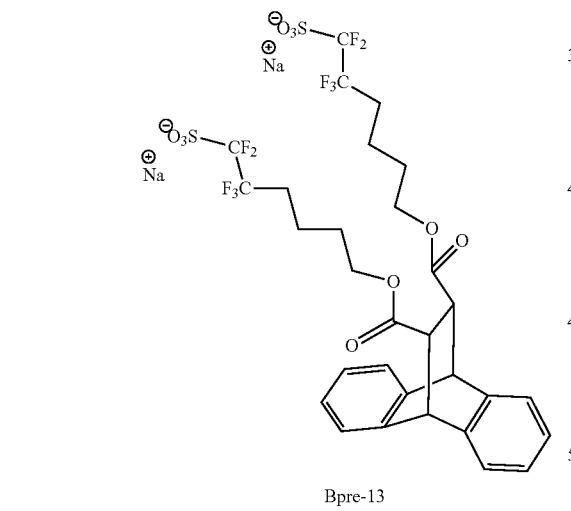

Bpre-13

Production Example of Compound (B1d-1)

The precursor (Bpre-4) (3.8 g, 9.2 mmol) and the compound A for salt exchange (2.8 g, 9.2 mmol) were dissolved in dichloromethane (60 g), and ultra pure water (60 g) was added thereto, and the mixture was reacted at room temperature for 30 minutes. After the reaction was completed, an aqueous phase was removed and an organic phase was then washed with ultra pure water (60 g) 4 times. The organic phase was concentrated and dried using a rotary evaporator to obtain a compound (B1d-1) (5.4 g, yield=89.0%).

[Chem. 227]

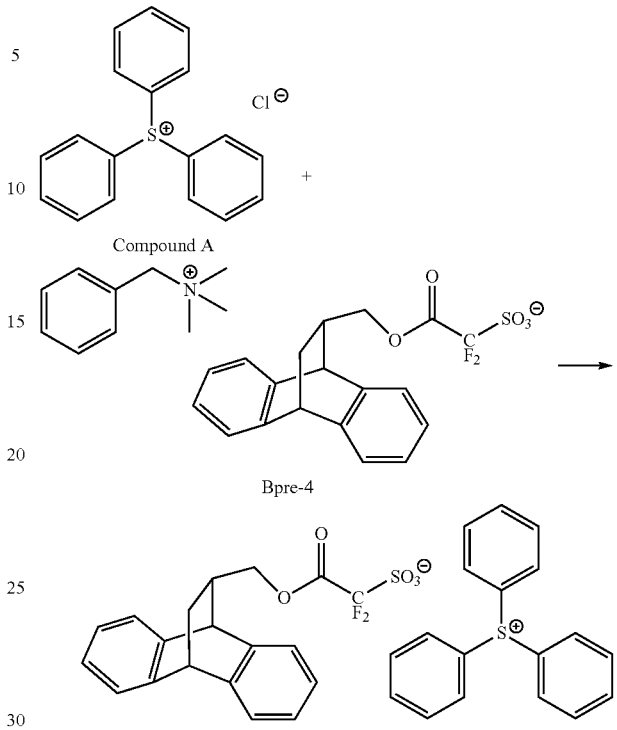

Production Examples of Other Compounds

The following compound (B1d-1) to compound (B1d-7), compounds (B1d'-1) to (B1d'-3) and compounds (D1d-1) to (D1d-2) were obtained in the same manner as in the above "production example of the compound (B1d-1)" except that combinations of the precursor (Bpre-1) to precursor (Bpre-6), precursor (Bpre-8) to precursor (Bpre-13) and the compound A for salt exchange were changed.

NMR measurement was performed for the obtained compounds, and structures thereof were identified from the following analysis results.

[Chem. 228]

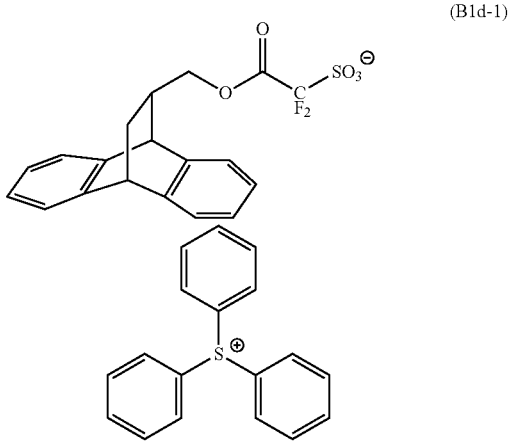

(B1d-1)

-continued
(B1d-2)
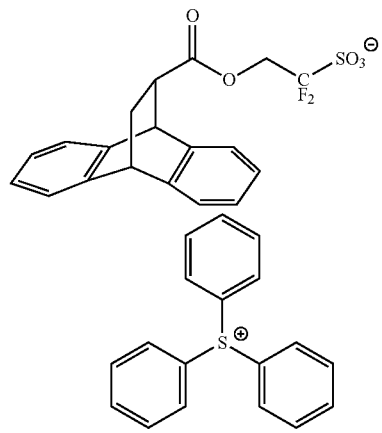
(B1d-3)
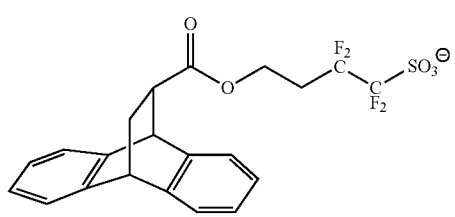
(B1d-4)
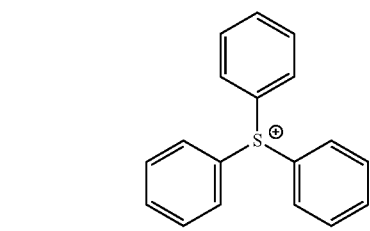
(B1d-5)
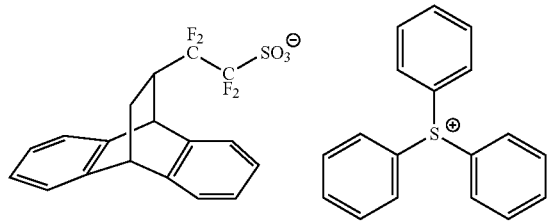
-continued
(B1d-6)
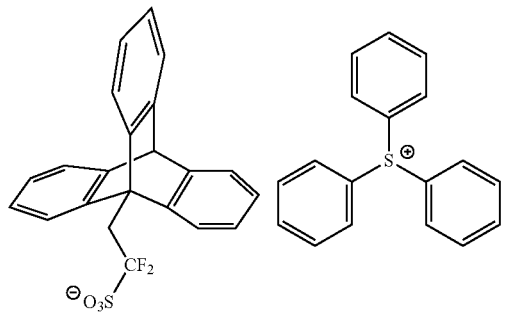
(B1d-7)
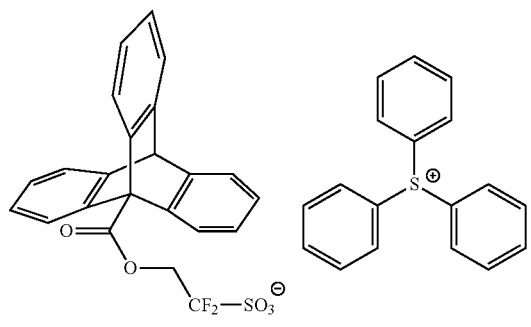
[Chem. 229]
(B1d'-1)
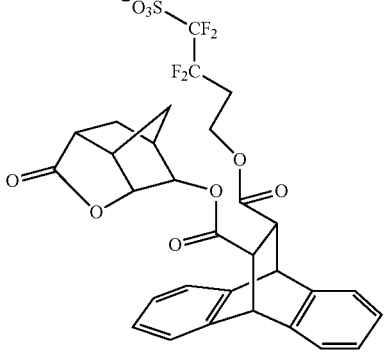
(B1d'-2)
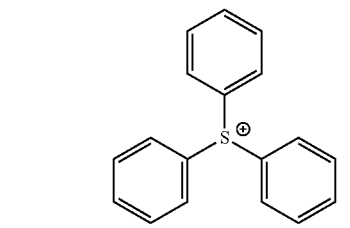

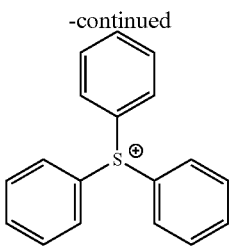

(B1d'-3)

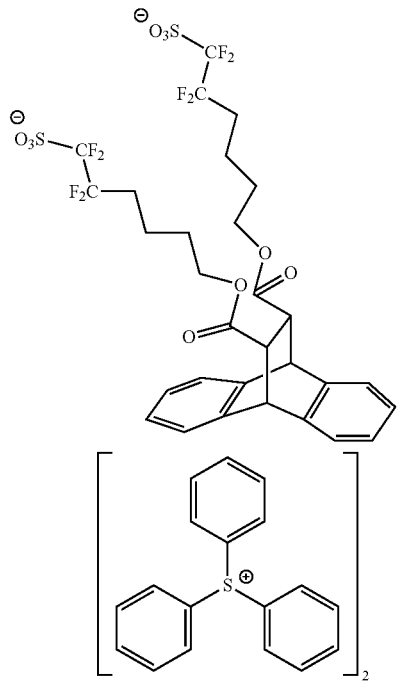

[Chem. 230]

(D1d-1)

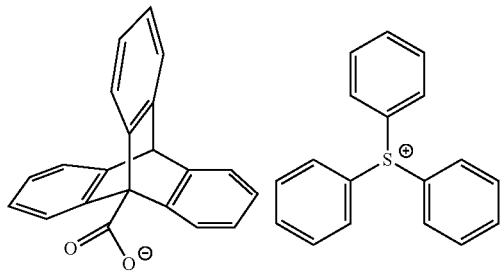

(D1d-2)

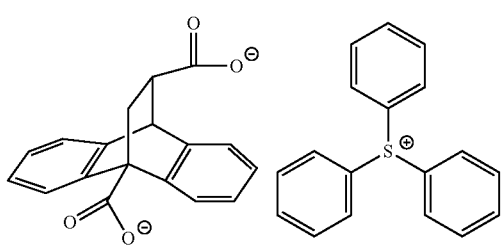

Compound (B1d-1): Combination of the Precursor (Bpre-4) and the Compound A for Salt Exchange The analysis result of NMR measurement was the same as that of the compound (B1a-4).

Compound (B1 d-2): Combination of the Precursor (Bpre-1) and the Compound A for Salt Exchange The analysis result of NMR measurement was the same as that of the compound (B1a-1).

Compound (B1 d-3): Combination of the Precursor (Bpre-3) and the Compound A for Salt Exchange The analysis result of NMR measurement was the same as that of the compound (B1a-3).

Compound (B1 d-4): Combination of the Precursor (Bpre-5) and the Compound A for Salt Exchange The analysis result of NMR measurement was the same as that of the compound (B1a-5).

Compound (B1 d-5): Combination of the Precursor (Bpre-2) and the Compound A for Salt Exchange The analysis result of NMR measurement was the same as that of the compound (B1a-2).

Compound (B1 d-6): Combination of the Precursor (Bpre-10) and the Compound A for Salt Exchange $^1$H-NMR (DMSO, 400 MHz): δ(ppm)=7.74-7.90 (m, 15H, ArH), 7.68-7.82 (m, ArH, 6H), 6.60-6.80 (m, ArH, 6H), 5.54 (s, CH, 1H), 2.42-2.47 (t, CF2CH2, 2H)

$^{19}$F-NMR (DMSO, 376 MHz): δ(ppm)=−105.6

Compound (B1d-7): Combination of the Precursor (Bpre-11) and the Compound A for Salt Exchange $^1$H-NMR (DMSO, 400 MHz): δ(ppm)=7.74-7.90 (m, 15H, ArH), 7.68-7.82 (m, ArH, 6H), 6.60-6.80 (m, Ph, 6H), 5.52 (s, CH, 1H), 4.54 (t, CF2CH2, 2H) $^{19}$F-NMR (DMSO, 376 MHz): δ(ppm)=−111.4

Compound (B1d'-1): Combination of the Precursor (Bpre-6) and Die Compound A for Salt Exchange The analysis result of NMR measurement was the same as that of the compound (B1a-6).

Compound (B1d'-2): Combination of the Precursor (Bpre-12) and the Compound a for Salt Exchange $^1$H-NMR (DMSO, 400 MHz): δ(ppm)=7.74-7.90 (m, 15H, ArH), 7.01-7.47 (m, ArH, 8H), 4.62 (d, CH, 2H), 3.56 (t, NCH2, 2H), 3.14 (t, COCH, 2H), 2.63-2.73 (m, CF2CH2, 2H)

$^{19}$F-NMR (DMSO, 376 MHz): δ(ppm)=−111.3, −117.6

Compound (B1d'-3): Combination of the Precursor (Bpre-12) and the Compound A for Salt Exchange $^1$H-NMR (DMSO, 400 MHz): δ(ppm)=7.74-7.90 (m, 15H, ArH), 7.01-7.47 (m, ArH, 8H), 4.52 (d, CH, 2H), 4.12

(t, OCH2, 4H), 3.18 (t, COCH, 2H), 2.66-2.76 (m, CH2CH2, 8H) 1.45-1.70 (m, CF2CH2, 4H)

$^{19}$F-NMR (DMSO, 376 MHz): δ(ppm)=−111.3, −117.6

Compound (D1d-1): Combination of the Precursor (Bpre-9) and the Compound A for Salt Exchange The analysis result of NMR measurement was the same as that of the compound (D1b-3).

Compound (D1d-2): Combination of the Precursor (Bpre-8) and the Compound a for Salt Exchange The analysis result of NMR measurement was the same as that of the compound (D1a-2).

Preparation of Resist Compositions

Examples 1d to 25d and Comparative Example Id

Components shown in Tables 23 to 25 were mixed and dissolved to prepare resist compositions of respective examples.

TABLE 23

|  | Component (A) | Component (B) ||| Component (D) || Component (S) |
|  |  | Component (B1) || Component (B2) | |||
|  |  | Component (B1d) | Component (B1d') | Component (B2d) | Component (D1d) | Component (D2d) |  |
| Example 1d | (A1d)-1 [100] | (B1d)-1 [18.7] | — | — | — | (D2d)-1 [6.0] | (S)-1 [6400] |
| Example 2d | (A1d)-1 [100] | (B1d)-2 [18.7] | — | — | — | (D2d)-1 [6.0] | (S)-1 [6400] |
| Example 3d | (A1d)-1 [100] | (B1d)-3 [20.5] | — | — | — | (D2d)-1 [6.0] | (S)-1 [6400] |
| Example 4d | (A1d)-1 [100] | (B1d)-4 [18.5] | — | — | — | (D2d)-1 [6.0] | (S)-1 [6400] |
| Example 5d | (A1d)-1 [100] | (B1d)-5 [20.0] | — | — | — | (D2d)-1 [6.0] | (S)-1 [6400] |
| Example 6d | (A1d)-1 [100] | (B1d)-6 [18.8] | — | — | — | (D2d)-1 [6.0] | (S)-1 [6400] |
| Example 7d | (A1d)-1 [100] | (B1d)-7 [19.7] | — | — | — | (D2d)-1 [6.0] | (S)-1 [6400] |
| Comparative Example 1d | (A1d)-1 [100] | — | — | (B2d)-1 [17.4] | — | (D2d)-1 [6.0] | (S)-1 [6400] |
| Example 8d | (A1d)-1 [100] | — | (B1d')-1 [25.6] | — | — | (D2d)-1 [6.0] | (S)-1 [6400] |
| Example 9d | (A1d)-1 [100] | — | (B1d')-2 [21.2] | — | — | (D2d)-1 [6.0] | (S)-1 [6400] |
| Example 10d | (A1d)-1 [100] | — | (B1d')-3 [18.4] | — | — | (D2d)-1 [6.0] | (S)-1 [6400] |

TABLE 24

|  | Component (A) | Component (B) ||| Component (D) || Component (S) |
|  |  | Component (B1) || Component (B2) | |||
|  |  | Component (B1d) | Component (B1d') | Component (B2d) | Component (D1d) | Component (D2d) |  |
| Example 11d | (A1d)-2 [100] | (B1d)-4 [18.5] | — | — | — | (D2d)-1 [6.0] | (S)-1 [6400] |
| Example 12d | (A1d)-2 [100] | (B1d)-6 [18.8] | — | — | — | (D2d)-1 [6.0] | (S)-1 [6400] |
| Example 13d | (A1d)-2 [100] | (B1d)-7 [19.7] | — | — | — | (D2d)-1 [6.0] | (S)-1 [6400] |
| Example 14d | (A1d)-2 [100] | — | (B1d')-1 [25.6] | — | — | (D2d)-1 [6.0] | (S)-1 [6400] |
| Example 15d | (A1d)-2 [100] | — | (B1d')-2 [21.2] | — | — | (D2d)-1 [6.0] | (S)-1 [6400] |
| Example 16d | (A1d)-2 [100] | — | (B1d')-3 [18.4] | — | — | (D2d)-1 [6.0] | (S)-1 [6400] |

TABLE 25

| | Component (A) | Component (B) | | Component (B2) | Component (D) | | Component (S) |
| | | Component (B1) | | | | | |
| | | Component (B1d) | Component (B1d') | Component (B2d) | Component (D1d) | Component (D2d) | |
|---|---|---|---|---|---|---|---|
| Example 17d | (A1d)-3 [100] | (B1d)-4 [18.5] | — | — | — | (D2d)-1 [6.0] | (S)-1 [6400] |
| Example 18d | (A1d)-3 [100] | (B1d)-6 [18.8] | — | — | — | (D2d)-1 [6.0] | (S)-1 [6400] |
| Example 19d | (A1d)-3 [100] | (B1d)-7 [19.7] | — | — | — | (D2d)-1 [6.0] | (S)-1 [6400] |
| Example 20d | (A1d)-3 [100] | (B1d)-1 [18.7] | — | — | (D1d)-1 [7.7] | — | (S)-1 [6400] |
| Example 21d | (A1d)-3 [100] | (B1d)-2 [18.7] | — | — | (D1d)-2 [8.4] | — | (S)-1 [6400] |
| Example 22d | (A1d)-3 [100] | — | (B1d')-1 [25.6] | — | — | (D2d)-1 [6.0] | (S)-1 [6400] |
| Example 23d | (A1d)-3 [100] | — | (B1d')-2 [21.2] | — | — | (D2d)-1 [6.0] | (S)-1 [6400] |
| Example 24d | (A1d)-3 [100] | — | (B1d')-3 [18.4] | — | — | (D2d)-1 [6.0] | (S)-1 [6400] |

In Tables 23 to 25, respective abbreviations have the following meanings. The values in brackets [ ] indicate the amount (in terms of parts by mass) of the component added.

(A1d)-1: A high-molecular-weight compound represented by the following chemical formula (A1d)-1. The high-molecular-weight compound (A1 d)-1 was obtained by performing radical polymerization using monomers deriving structural units constituting the high-molecular-weight compound in a predetermined molar ratio. Regarding the high-molecular-weight compound (A1d)-1, a weight average molecular weight (Mw) in terms of polystyrene standards obtained through GPC measurement was 6,900, and a molecular weight dispersity (Mw/Mn) was 1.72. The copolymer composition ratio (ratio (molar ratio) of respective structural units in the structural formula) obtained through $^{13}$C-NMR was l/m/n=30/60/10.

(A1d)-2: A high-molecular-weight compound represented by the following chemical formula (A1 d)-2. The high-molecular-weight compound (A1 d)-2 was obtained by performing radical polymerization using monomers deriving structural units constituting the high-molecular-weight compound in a predetermined molar ratio. Regarding the high-molecular-weight compound (A1d)-2, a weight average molecular weight (Mw) in terms of polystyrene standards obtained through GPC measurement was 7,200, and the molecular weight dispersity (Mw/Mn) was 1.69. The copolymer composition ratio (ratio (molar ratio) of respective structural units in the structural formula) obtained through $^{13}$C-NMR was l/m=50/50.

(A1d)-3: A high-molecular-weight compound represented by the following chemical formula (A1 d)-3. The high-molecular-weight compound (A1 d)-3 was obtained by performing radical polymerization using monomers deriving structural units constituting the high-molecular-weight compound in a predetermined molar ratio. Regarding the high-molecular-weight compound (A1d)-3, a weight average molecular weight (Mw) in terms of polystyrene standards obtained through GPC measurement was 7,100, and the molecular weight dispersity (Mw/Mn) was 1.78. The copolymer composition ratio (ratio (molar ratio) of respective structural units in the structural formula) obtained through $^{13}$C-NMR was l/m/n/o=15/30/50/5.

[Chem. 231]

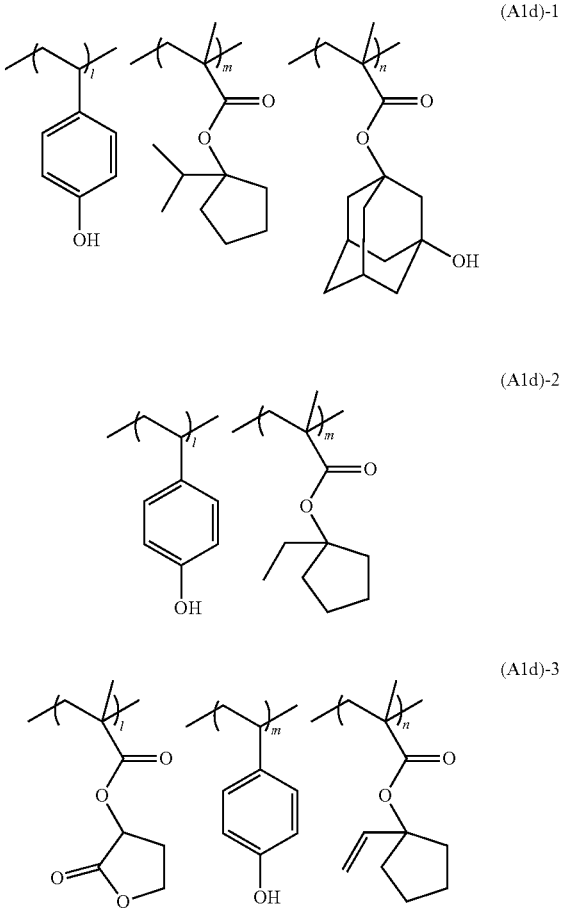

-continued

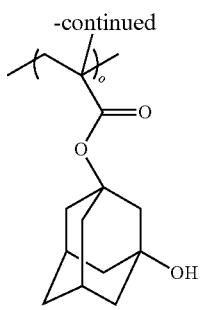

(B1d)-1 to (B1d)-7: acid generators including the compound (B1d-1) to compound (B1d-7)

(B1d')-1 to (B1d')-3: acid generators including the compound (B1d'-1) to compound (B1d'-3)

(B2d)-1: acid generator including the following compound (B2d-1)

[Chem. 232]

(B2d-1)

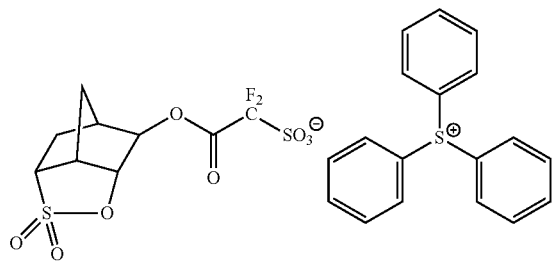

(D1d)-1: acid diffusion control agent including a compound represented by the following chemical formula (D1d-1)

(D1d)-2: acid diffusion ornitrol agent including a compound represented by the following chemical formula (D1d-2)

(D2d)-1: acid diffusion ornitrol agent including a compound represented by the following chemical formula (D2d-1)

(S)-1: a mixed solvent containing propylene glycol monomethyl ether acetate/propylene glycol monomethyl ether=60/40 (mass ratio)

[Chem. 233]

(D2d-1)

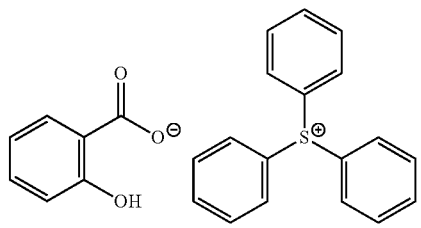

<Formation of Resist Pattern>

The resist compositions of respective examples were applied to 8-inch silicon substrates subjected to a hexamethyldisilazane (HMDS) treatment using a spinner, and a pre-baking (FAB) treatment was performed on a hot plate at a temperature of 110° C. for 60 seconds, and drying was performed, and thereby resist films with a film thickness of 50 nm were formed.

Next, drawing (exposure) was performed on the resist film using an electron beam lithography system JEOL-JBX-9300FS (commercially available from JEOL Ltd.) at an acceleration voltage of 100 kV to obtain a 1:1 line and space pattern (hereinafter referred to as an "LS pattern") with a target size of a line width of 30 nm. Then, a heating (PEB) treatment was performed after exposure at 110° C. for 60 seconds.

Next, alkali developing was performed using in a 2.38 mass % tetramethylammonium hydroxide (TMAH) aqueous solution "NMD-3" (product name, commercially available from Tokyo Ohka Kogyo Co., Ltd.) at 23° C. for 60 seconds.

Then, water rinsing was conducted for 15 seconds using pure water.

As a result, a 1:1 LS pattern with a line width of 30 nm was formed.

[Evaluation of Optimum Exposure Dose (Eop)]

An optimum exposure dose Eop ($\mu C/cm^2$) at which an LS pattern with a target size was formed according to the method of forming a resist pattern was obtained. This is shown as "Eop($\mu C/cm^2$)" in Tables 26 to 28.

[Evaluation of Line Width Roughness (LWR)]

3σ which is a scale showing LWR was obtained from the LS pattern formed in the above <Formation of resist pattern>. This is shown as "LWR (nm)" in Tables 26 to 28.

"3σ" (unit: nm) indicates a value of 3 times (3σ) the standard deviation (σ) obtained from measurement results when the line positions at 400 points in the longitudinal direction of the line were measured using a scanning electron microscope (an acceleration voltage of 800 V, product name: S-9380, commercially available from Hitachi High-Technologies Corporation).

The smaller this 3σ value, the lower the level of roughness on the side walls of the line, indicating that an LS pattern with a more uniform width was obtained.

TABLE 26

| | PAB (° C.) | PEB (° C.) | Eop ($\mu C/cm^2$) | LWR (nm) |
|---|---|---|---|---|
| Example 1d | 110 | 110 | 120 | 3.8 |
| Example 2d | 110 | 110 | 120 | 3.8 |
| Example 3d | 110 | 110 | 120 | 3.8 |
| Example 4d | 110 | 110 | 120 | 3.7 |
| Example 5d | 110 | 110 | 115 | 3.5 |
| Example 6d | 110 | 110 | 115 | 3.4 |
| Example 7d | 110 | 110 | 115 | 3.6 |
| Comparative Example 1d | 110 | 110 | 145 | 5.7 |
| Example 8d | 110 | 110 | 120 | 4.6 |
| Example 9d | 110 | 110 | 125 | 4.4 |
| Example 10d | 110 | 110 | 130 | 4.8 |

TABLE 27

| | PAB (° C.) | PEB (° C.) | Eop ($\mu C/cm^2$) | LWR (nm) |
|---|---|---|---|---|
| Example 11d | 110 | 110 | 115 | 3.7 |
| Example 12d | 110 | 110 | 110 | 3.6 |
| Example 13d | 110 | 110 | 115 | 3.7 |
| Example 14d | 110 | 110 | 115 | 4.8 |
| Example 15d | 110 | 110 | 120 | 4.7 |
| Example 16d | 110 | 110 | 125 | 4.8 |

TABLE 28

| | PAB (° C.) | PEB (° C.) | Eop (μC/cm²) | LWR (nm) |
|---|---|---|---|---|
| Example 17d | 110 | 110 | 125 | 3.4 |
| Example 18d | 110 | 110 | 120 | 3.2 |
| Example 19d | 110 | 110 | 125 | 3.6 |
| Example 20d | 110 | 110 | 125 | 3.2 |
| Example 21d | 110 | 110 | 125 | 3.2 |
| Example 22d | 110 | 110 | 130 | 4.6 |
| Example 23d | 110 | 110 | 135 | 4.5 |
| Example 24d | 110 | 110 | 135 | 4.6 |

Based on the results shown in Tables 26 to 28, it was confirmed that, according to the resist compositions of the examples to which the present invention was applied, high sensitivity was achieved in the formation of the resist pattern, and a resist pattern having a favorable shape with reduced roughness was formed. In addition, it was confirmed that, when the component (B) in which the number of carbonyl groups of the anion moiety was 1 or 0 was used, higher sensitivity was achieved, and a resist pattern having a favorable shape with reduced roughness was formed.

What is claimed is:

1. A resist composition that generates an acid upon exposure and exhibits a changed solubility in a developing solution under the action of an acid, comprising:
    a resin component (A1) that exhibits a changed solubility in a developing solution under the action of an acid and a compound (BD1) which is represented by the following general formula (bd1) and has an anion moiety and a cation moiety,
    wherein the resin component (A1) contains the following resin component (a) or (b):
    the resin component (a) having a structural unit (a0-1a) in which a polymerizable group at the $W^1$ site in a compound represented by the following general formula (a0-1a-1) is converted into a main; or
    the resin component (b), provided that the resin component (a) is excluded, having a structural unit (a0-1b) in which a polymerizable group at the $W^1$ in a compound represented by the following general formula (a0-1b-1) is converted into a main chain and at least one structural unit selected from the group consisting of a structural unit (a0-2) in which a polymerizable group at the $W^2$ site in the compound represented by the following general formula (a0-2-1) is converted into a main chain, and a structural unit (a0-3) having a partial structure represented by the following general formula (a0-3):

[Chem 1]

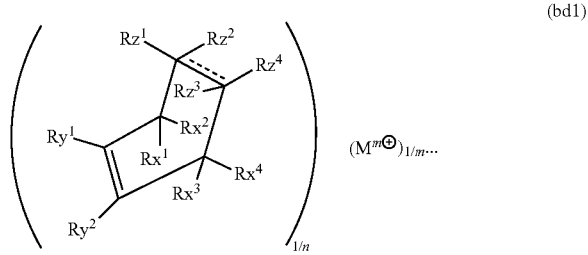

(bd1)

wherein $Rx^1$ to $Rx^4$ each independently represent a hydrocarbon group which may have a substituent or a hydrogen atom, or two or more of $Rx^1$ to $Rx^4$ may be mutually bonded to form a ring structure; $Ry^1$ to $Ry^2$ each independently represent a hydrocarbon group which may have a substituent or a hydrogen atom, or may be mutually bonded to form a ring structure; ----- is a double bond or a single bond; $Rz^1$ to $Rz^4$ each independently represent, where valence allows, a hydrocarbon group which may have a substituent or a hydrogen atom, provided that two or more of $Rz^1$ to $Rz^4$ are mutually bonded to form a ring structure, provided that at least one of $Rx^1$ to $Rx^4$, $Ry^1$ to $Ry^2$ and $Rz^1$ to $Rz^4$ has an anion group, and the entire anion moiety may be an n-valent anion; n is an integer of 1 or more; and m is an integer of 1 or more and $M^{m+}$ represents an m-valent organic cation, and

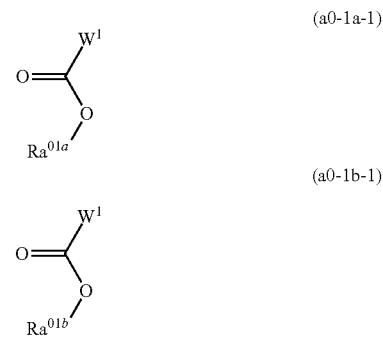

(a0-1a-1)

(a0-1b-1)

wherein $W^1$ represents a polymerizable group-containing group; $Ra^{01a}$ represents an acid dissociable group which has a carbon atom constituting a carbon-carbon unsaturated bond at the α-position of a carbon atom which is bonded to the oxy group (—O—) in the general formula (a0-1a-1); and $Ra^{01b}$ represents an acid dissociable group represented by the following general formula (a01-r-1) or general formula (a01-r-2), and

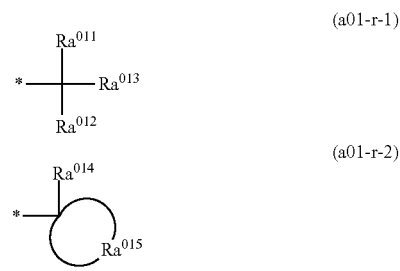

(a01-r-1)

(a01-r-2)

wherein $Ra^{011}$ to $Ra^{013}$ each independently represent a linear or branched aliphatic hydrocarbon group, an alicyclic group having no crosslinked structure, or an aromatic hydrocarbon group; $Ra^{014}$ represents a linear or branched aliphatic hydrocarbon group having 1 to 12 carbon atoms in which some atoms may be substituted with a halogen atom or a hetero atom-containing group or an aryl group having 6 to 12 carbon atoms in which some atoms may be substituted with a halogen atom or a hetero atom-containing group; $Ra^{015}$ represents a group that forms a monocyclic aliphatic cyclic group together with a carbon atom to which $Ra^{014}$ is bonded; and * indicates a bond, and

[Chem. 5]

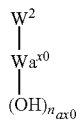
(a0-2-1)

wherein $W^2$ represents a polymerizable group-containing group; $Wa^{x0}$ represents an $(n_{ax0}+1)$-valent aromatic cyclic group which may have a substituent; $Wa^{x0}$ may form a condensed ring with $W^2$; and $n_{ax0}$ is an integer of 1 to 3, and

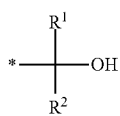
(a0-3)

wherein $R^1$ represents a fluorinated alkyl group having 1 to 12 carbon atoms; $R^2$ represents an organic group having 1 to 12 carbon atoms which may have a fluorine atom, or a hydrogen atom; and * indicates a bond.

2. The resist composition according to claim 1, wherein the resin component (A1) is the resin component (a).

3. The resist composition according to claim 2, wherein the compound (BD1) is an acid-generator component (B) that generates an acid upon exposure, and wherein at least one of $Rx^1$ to $Rx^4$, $Ry^1$ to $Ry^2$ and $Rz^1$ to $Rz^4$ has an anion group represented by the following general formula (an-1), the entire anion moiety in the general formula (bd1) is an n-valent anion, and the number of carbonyl groups in the entire anion moiety is 1 or 0:

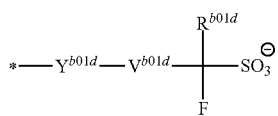
(an-1)

wherein $R^{b01d}$ represents a fluorine atom or a fluorinated alkyl group having 1 to 5 carbon atoms; $Y^{b01d}$ represents a single bond or a bivalent linking group, provided that when $Y^{b01d}$ is a bivalent linking group, the number of carbonyl groups contained in $Y^{b01d}$ is 1 or 0; $V^{b01d}$ represents a single bond, an alkylene group or a fluorinated alkylene group; and * indicates a bond.

4. The resist composition according to claim 1, wherein a proportion of the structural unit (a0-1a) is 20 to 80 mol % with respect to all structural units (100 mol %) constituting the resin component (A1).

5. The resist composition according to claim 2, wherein the resin component (a) further has the structural unit (a0-3).

6. The resist composition according to claim 1, wherein the resin component (A1) is the resin component (b) and has the structural unit (a0-1b) and the structural unit (a0-2).

7. The resist composition according to claim 6, wherein the structural unit (a0-2) is a structural unit represented by the following general formula (a0-2-u1):

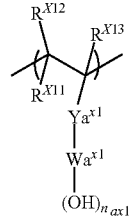
(a0-2-u1)

wherein $R^{x11}$, $R^{x12}$ and $R^{x13}$ each independently represent a hydrogen atom, an alkyl group having 1 to 5 carbon atoms, or a halogenated alkyl group having 1 to 5 carbon atoms; $Ya^{x1}$ represents a single bond or a bivalent linking group; $Wa^{x1}$ represents an $(n_{ax1}+1)$-valent aromatic cyclic group which may have a substituent, provided that $Ya^{x1}$ and $Wa^{x1}$ may form a condensed ring, or $R^{x11}$, $Ya^{x1}$, and $Wa^{x1}$ may form a condensed ring; and $n_{ax1}$ is an integer of 1 to 3.

8. The resist composition according to claim 6, wherein a proportion of the structural unit (a0-1b) is 30 to 70 mol % with respect to all structural units (100 mol %) constituting the resin component (A1).

9. The resist composition according to claim 6, wherein the resin component (b) further has the structural unit (a0-3).

10. The resist composition according to claim 6, wherein the compound (BD1) is an acid-generator component (B) that generates an acid upon exposure, and wherein at least one of $Rx^1$ to $Rx^4$, $Ry^1$ to $Ry^2$ and $Rz^1$ to $Rz^4$ has an anion group represented by the following general formula (an-1), the entire anion moiety in the general formula (bd1) is an n-valent anion, and the number of carbonyl groups in the entire anion moiety is 1 or 0:

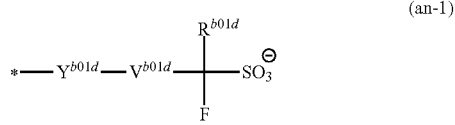
(an-1)

wherein $R^{b01d}$ represents a fluorine atom or a fluorinated alkyl group having 1 to 5 carbon atoms; $Y^{b01d}$ represents a single bond or a bivalent linking group, provided that when $Y^{b01d}$ is a bivalent linking group, the number of carbonyl groups contained in $Y^{b01d}$ is 1 or 0; $V^{b01d}$ represents a single bond, an alkylene group or a fluorinated alkylene group; and * indicates a bond.

11. The resist composition according to claim 1, wherein the resin component (A1) is the resin component (b) and has the structural unit (a0-1b) and the structural unit (a0-3).

12. The resist composition according to claim 11, wherein the structural unit (a0-3) is a structural unit (a0-3-1) in which a polymerizable group at the $W^3$ site in a compound represented by the following general formula (a0-3-1) is converted into a main chain, or a structural unit (a0-3-2) in which a polymerizable group at the $W^4$ site in a compound represented by the following general formula (a0-3-2) is converted into a main chain:

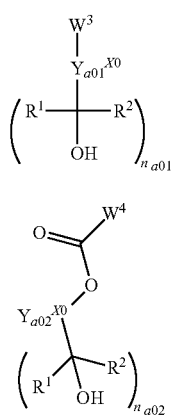

wherein $R^1$ represents a fluorinated alkyl group having 1 to 12 carbon atoms; $R^2$ represents an organic group having 1 to 12 carbon atoms which may have a fluorine atom, or a hydrogen atom; $W^3$ and $W^4$ each independently represent a polymerizable group-containing group; $Y_{a01}^{x0}$ represents a single bond or an $(n_{a01}+1)$-valent linking group, provided that $Y_{a01}^{x0}$ and $W^3$ may form a condensed ring; $Y_{a02}^{x0}$ represents a single bond or an $(n_{a02}+1)$-valent linking group; and $n_{a01}$ and $n_{a02}$ each independently represent an integer of 1 to 3.

13. The resist composition according to claim 11, wherein the structural unit (a0-3) is a structural unit (a0-3-1a) in which a polymerizable group at the $W^3$ site in a compound represented by the following general formula (a0-3-1a) is converted into a main chain:

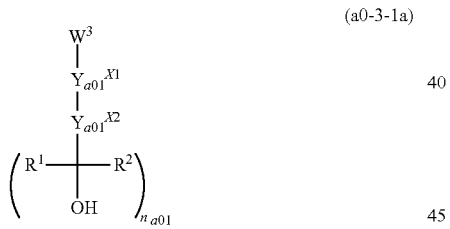

wherein $R^1$ represents a fluorinated alkyl group having 1 to 12 carbon atoms; $R^2$ represents an organic group having 1 to 12 carbon atoms which may have a fluorine atom or a hydrogen atom; $W^3$ represents a polymerizable group-containing group; $Y_{a01}^{x1}$ represents a single bond or a bivalent linking group; $Y_{a01}^{x2}$ represents an $(n_{a01}+1)$-valent aromatic hydrocarbon group which may have a substituent, provided that $W^3$ and $Y_{a01}^{x1}$ may form a condensed ring, or $W^3$, $Y_{a01}^{x1}$ and $Y_{a01}^{x2}$ may form a condensed ring; and $n_{a01}$ represents an integer of 1 to 3.

14. The resist composition according to claim 11, wherein $R^2$ is an organic group having 1 to 12 carbon atoms which has a fluorine atom.

15. The resist composition according to claim 11, wherein $R^1$ and $R^2$ are a trifluoromethyl group.

16. The resist composition according to claim 11, wherein a proportion of the structural unit (a0-3) is 10 to 80 mol % with respect to all structural units (100 mol %) constituting the resin component (A1).

17. The resist composition according to claim 11, wherein the compound (BD1) is an acid-generator component (B) that generates an acid upon exposure, and wherein at least one of $Rx^1$ to $Rx^4$, $Ry^1$ to $Ry^2$ and $Rz^1$ to $Rz^4$ has an anion group represented by the following general formula (an-1), the entire anion moiety in the general formula (bd1) is an n-valent anion, and the number of carbonyl groups in the entire anion moiety is 1 or 0:

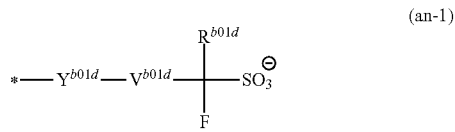

wherein $R^{b01d}$ represents a fluorine atom or a fluorinated alkyl group having 1 to 5 carbon atoms; $Y^{b01d}$ represents a single bond or a bivalent linking group, provided that when $Y^{b01d}$ is a bivalent linking group, the number of carbonyl groups contained in $Y^{b01d}$ is 1 or 0; $V^{b01d}$ represents a single bond, an alkylene group or a fluorinated alkylene group; and * indicates a bond.

18. The resist composition according to claim 1, wherein the compound (BD1) is an acid-generator component (B) that generates an acid upon exposure, and wherein at least one of $Rx^1$ to $Rx^4$, $Ry^1$ to $Ry^2$ and $Rz^1$ to $Rz^4$ has an anion group represented by the following general formula (an-1), the entire anion moiety in the general formula (bd1) is an n-valent anion, and the number of carbonyl groups in the entire anion moiety is 1 or 0:

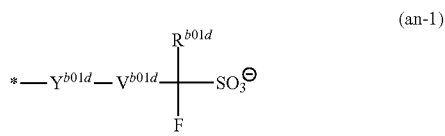

wherein $R^{b01d}$ represents a fluorine atom or a fluorinated alkyl group having 1 to 5 carbon atoms; $Y^{b01d}$ represents a single bond or a bivalent linking group, provided that when $Y^{b01d}$ is a bivalent linking group, the number of carbonyl groups contained in $Y^{b01d}$ is 1 or 0; $V^{b01d}$ represents a single bond, an alkylene group or a fluorinated alkylene group; and * indicates a bond.

19. The resist composition according to claim 18, wherein the number of anion groups represented by the general formula (an-1) in the entire anion moiety is 1, and n is 1.

20. The resist composition according to claim 18, wherein one of $Rz^1$ to $Rz^4$ has an anion group represented by the general formula (an-1).

21. The resist composition according to claim 1, wherein at least one of $Rx^1$ to $Rx^2$ and at least one of $Rx^3$ to $Rx^4$ are mutually bonded to form a ring structure.

22. The resist composition according to claim 1, wherein the anion moiety in the compound (BD1) is an anion represented by the following general formula (bd1-an1):

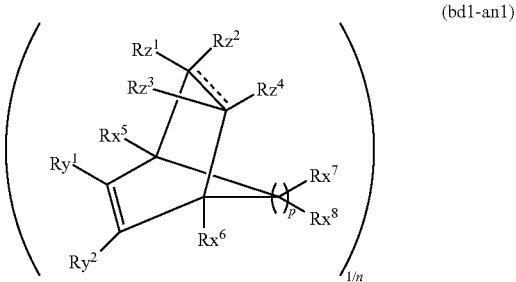

(bd1-an1)

wherein $Rx^5$ to $Rx^6$ each independently represent a hydrocarbon group which may have a substituent or a hydrogen atom; $Rx^7$ to $Rx^8$ each independently represent a hydrocarbon group which may have a substituent or a hydrogen atom, or may be mutually bonded to form a ring structure; p is 1 or 2, and when p=2, a plurality of $Rx^7$ to $Rx^8$ may be different from each other; $Ry^1$ to $Ry^2$ each independently represent a hydrocarbon group which may have a substituent or a hydrogen atom, or may be mutually bonded to form a ring structure; and

- - - - - represents a double bond or a single bond; $Rz^1$ to $Rz^4$ each independently represent, where valence allows, a hydrocarbon group which may have a substituent or a hydrogen atom, provided that two or more of $Rz^1$ to $Rz^4$ are mutually bonded to form a ring structure, provided that at least one of $Rx^5$ to $Rx^8$, $Ry^1$ to $Ry^2$ and $Rz^1$ to $Rz^4$ has an anion group, and the entire anion moiety may be an n-valent anion, and n is an integer of 1 or more.

23. The resist composition according to claim 22, wherein the anion moiety in the compound (BD1) is an anion represented by the following general formula (bd1-an2):

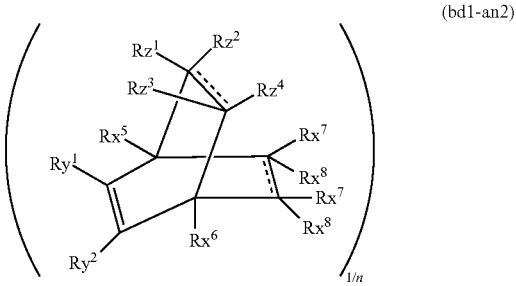

(bd1-an2)

wherein $Rx^5$ to $Rx^6$ each independently represent a hydrocarbon group which may have a substituent or a hydrogen atom; a plurality of $Rx^7$ to $Rx^8$ each independently represent a hydrocarbon group which may have a substituent or a hydrogen atom, or two or more of $Rx^7$ to $Rx^8$ may be mutually bonded to form a ring structure; and $Ry^1$ to $Ry^2$ each independently represent a hydrocarbon group which may have a substituent or a hydrogen atom, or may be mutually bonded to form a ring structure;

- - - - - represents a double bond or a single bond; Rz1 to Rz4 each independently represent, where valence allows, a hydrocarbon group which may have a substituent or a hydrogen atom, provided that two or more of $Rz^1$ to $Rz^4$ are mutually bonded to form a ring structure, provided that at least one of $Rx^5$ to $Rx^8$, $Ry^1$ to $Ry^2$ and $Rz^1$ to $Rz^4$ has an anion group, and the entire anion moiety may be an n-valent anion, and n is an integer of 1 or more.

24. The resist composition according to claim 22, wherein $Rx^7$ to $Rx^8$ are mutually bonded to form a ring structure.

25. The resist composition according to claim 22, wherein at least one of $Rx^5$ to $Rx^6$ has an anion group.

26. The resist composition according to claim 1, wherein $Ry^1$ to $Ry^2$ are mutually bonded to form a ring structure.

27. The resist composition according to claim 1, wherein at least one of $Rz^1$ to $Rz^4$ has an anion group.

28. The resist composition according to claim 1, wherein the cation moiety in the compound (BD1) is a cation represented by any of the following general formulae (ca-1) to (ca-4)

(ca-1)

(ca-2)

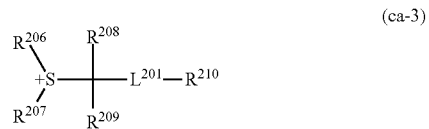

(ca-3)

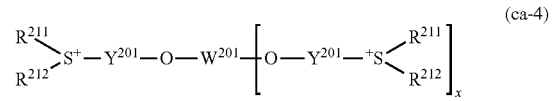

(ca-4)

wherein $R^{201}$ to $R^{207}$ and $R^{211}$ to $R^{212}$ each independently represent an aryl group which may have a substituent, an alkyl group which may have a substituent, or an alkenyl group which may have a substituent, and $R^{201}$ to $R^{203}$, $R^{206}$ to $R^{207}$, and $R^{211}$ to $R^{212}$ may be mutually bonded to form a ring together with a sulfur atom in the formula; $R^{208}$ to $R^{209}$ each independently represent a hydrogen atom or an alkyl group having 1 to 5 carbon atoms or may be mutually bonded to form a ring together with a sulfur atom in the formula; $R^{210}$ represents an aryl group which may have a substituent, an alkyl group which may have a substituent, an alkenyl group which may have a substituent, or an —SO$_2$— containing cyclic group which may have a substituent; $L^{201}$ represents —C(=O)— or —C(=O)—O; a plurality of $Y^{201}$'s each independently represent an arylene group, an alkylene group or an alkenylene group; x is 1 or 2; and $W^{201}$ represents an (x+1)-valent linking group.

29. The resist composition according to claim 1, wherein the compound (BD1) has only one anionic group, and wherein $Rx^1$ to $Rx^4$, $Ry^1$ and $Ry^2$ and $Rz^1$ to $Rz^4$ have only one anionic group, and the entire anion moiety is a monovalent anion; n represents an integer of 1; m represents an integer of 1; and $M^{m+}$ represents a monovalent organic cation.

30. A method of forming a resist pattern, comprising: forming a resist film using the resist composition according to claim 1 on a support;

exposing the resist film; and developing the resist film after exposure and forming a resist pattern.

31. The method of forming a resist pattern according to claim 30, wherein the resist film is exposed with extreme ultraviolet (EUV) or an electron beam (EB).

* * * * *